US011194203B2

(12) United States Patent
    Umezaki

(10) Patent No.: US 11,194,203 B2
(45) Date of Patent: Dec. 7, 2021

(54) LIQUID CRYSTAL DISPLAY DEVICE

(71) Applicant: Semiconductor Energy Laboratory Co., Ltd., Atsugi (JP)

(72) Inventor: Atsushi Umezaki, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 16/828,217

(22) Filed: Mar. 24, 2020

(65) Prior Publication Data

US 2020/0241373 A1    Jul. 30, 2020

Related U.S. Application Data

(60) Continuation of application No. 16/438,666, filed on Jun. 12, 2019, now Pat. No. 10,606,140, which is a
(Continued)

(30) Foreign Application Priority Data

Aug. 31, 2006   (JP) .................................. 2006-236392

(51) Int. Cl.
    *G09G 3/36*         (2006.01)
    *G02F 1/1362*       (2006.01)
    (Continued)

(52) U.S. Cl.
    CPC ...... *G02F 1/136286* (2013.01); *G02F 1/1368* (2013.01); *G02F 1/13306* (2013.01);
    (Continued)

(58) Field of Classification Search
    CPC ......... G09G 2310/0286; G09G 3/3674; G09G 2310/0289; G09G 3/3677; G09G 3/3266;
    (Continued)

(56) References Cited

U.S. PATENT DOCUMENTS 5,222,082 A    6/1993    Plus
5,434,899 A    7/1995    Huq et al.
(Continued)

FOREIGN PATENT DOCUMENTS

CN    001323025 A    11/2001
CN    001428759 A     7/2003
(Continued)

OTHER PUBLICATIONS

Han.H et al., "15.3: Reliable Integrated A-Si Select Line Driver for 2.2-In. QVGA TFT-LCD", SID Digest '05 : SID International Symposium Digest of Technical Papers, 2005, vol. 36, pp. 946-949.
(Continued)

*Primary Examiner* — Duc Q Dinh
(74) *Attorney, Agent, or Firm* — Fish & Richardson P.C.

(57) ABSTRACT

A first transistor, a second transistor, a third transistor, a fourth transistor are provided. In the first transistor, a first terminal is electrically connected to a first wiring; a second terminal is electrically connected to a gate terminal of the second transistor; a gate terminal is electrically connected to a fifth wiring. In the second transistor, a first terminal is electrically connected to a third wiring; a second terminal is electrically connected to a sixth wiring. In the third transistor, a first terminal is electrically connected to a second wiring; a second terminal is electrically connected to the gate terminal of the second transistor; a gate terminal is electrically connected to a fourth wiring. In the fourth transistor, a first terminal is electrically connected to the second wiring; a second terminal is electrically connected to the sixth wiring; a gate terminal is connected to the fourth wiring.

6 Claims, 105 Drawing Sheets

Related U.S. Application Data continuation of application No. 16/143,059, filed on Sep. 26, 2018, now Pat. No. 10,401,699, which is a continuation of application No. 15/624,987, filed on Jun. 16, 2017, now Pat. No. 10,088,725, which is a continuation of application No. 15/140,577, filed on Apr. 28, 2016, now Pat. No. 9,684,215, which is a continuation of application No. 14/934,243, filed on Nov. 6, 2015, now Pat. No. 9,335,599, which is a continuation of application No. 14/168,058, filed on Jan. 30, 2014, now Pat. No. 9,184,183, which is a continuation of application No. 13/904,147, filed on May 29, 2013, now Pat. No. 8,643,586, which is a continuation of application No. 13/307,131, filed on Nov. 30, 2011, now Pat. No. 8,462,100, which is a continuation of application No. 12/977,556, filed on Dec. 23, 2010, now Pat. No. 8,456,396, which is a division of application No. 11/845,415, filed on Aug. 27, 2007, now Pat. No. 7,859,510.

(51) Int. Cl.

| | | |
|---|---|---|
| *G09G 3/34* | (2006.01) | |
| *G11C 19/28* | (2006.01) | |
| *H01L 27/06* | (2006.01) | |
| *H01L 27/15* | (2006.01) | |
| *H01L 27/12* | (2006.01) | |
| *H01L 29/24* | (2006.01) | |
| *H01L 29/786* | (2006.01) | |
| *G02F 1/133* | (2006.01) | |
| *G02F 1/1345* | (2006.01) | |
| *G02F 1/1368* | (2006.01) | |
| *H01L 27/32* | (2006.01) | |
| *G02F 1/1337* | (2006.01) | |
| *G02F 1/139* | (2006.01) | |
| *G02F 1/1335* | (2006.01) | |
| *H01L 21/67* | (2006.01) | |
| *H01L 51/52* | (2006.01) | |
| *H01L 51/56* | (2006.01) | |

(52) U.S. Cl.
CPC .... *G02F 1/13452* (2013.01); *G02F 1/136213* (2013.01); *G09G 3/342* (2013.01); *G09G 3/3674* (2013.01); *G09G 3/3677* (2013.01); *G09G 3/3685* (2013.01); *G11C 19/28* (2013.01); *H01L 27/06* (2013.01); *H01L 27/124* (2013.01); *H01L 27/1222* (2013.01); *H01L 27/1225* (2013.01); *H01L 27/1255* (2013.01); *H01L 27/15* (2013.01); *H01L 27/156* (2013.01); *H01L 29/247* (2013.01); *H01L 29/78693* (2013.01); *G02F 1/1393* (2013.01); *G02F 1/133622* (2021.01); *G02F 1/133753* (2013.01); *G02F 2202/103* (2013.01); *G09G 3/3655* (2013.01); *G09G 2300/0426* (2013.01); *G09G 2300/0452* (2013.01); *G09G 2310/024* (2013.01); *G09G 2310/0286* (2013.01); *G09G 2310/08* (2013.01); *G09G 2320/0252* (2013.01); *G09G 2330/021* (2013.01); *H01L 21/67167* (2013.01); *H01L 27/3211* (2013.01); *H01L 27/3213* (2013.01); *H01L 27/3216* (2013.01); *H01L 27/3248* (2013.01); *H01L 27/3258* (2013.01); *H01L 27/3262* (2013.01); *H01L 27/3265* (2013.01); *H01L 27/3276* (2013.01); *H01L 51/5246* (2013.01); *H01L 51/56* (2013.01); *H01L 2251/5307* (2013.01); *H01L 2251/5315* (2013.01); *H01L 2251/5323* (2013.01)

(58) Field of Classification Search
CPC ......... G09G 2310/0275; G09G 3/3685; G09G 3/3275; G11C 19/28; G11C 19/287; G11C 27/04
USPC .................................................. 345/98–100
See application file for complete search history.

(56) References Cited

U.S. PATENT DOCUMENTS

| | | | |
|---|---|---|---|
| 5,708,455 | A | 1/1998 | Maekawa |
| 5,812,284 | A | 9/1998 | Mizutani et al. |
| 5,949,271 | A | 9/1999 | Fujikura |
| 5,949,398 | A | 9/1999 | Kim |
| 6,052,426 | A | 4/2000 | Maurice |
| 6,144,466 | A | 11/2000 | Mizutani et al. |
| 6,300,928 | B1 * | 10/2001 | Kim ..................... G09G 3/3677 345/92 |
| 6,335,211 | B1 | 1/2002 | Lee |
| 6,380,687 | B1 | 4/2002 | Yamazaki |
| 6,426,743 | B1 | 7/2002 | Yeo et al. |
| 6,483,889 | B2 | 11/2002 | Kim et al. |
| 6,552,496 | B2 | 4/2003 | Yamazaki |
| 6,556,646 | B1 | 4/2003 | Yeo et al. |
| 6,587,086 | B1 | 7/2003 | Koyama |
| 6,611,248 | B2 | 8/2003 | Kanbara et al. |
| 6,621,886 | B2 | 9/2003 | Kawahata |
| 6,661,722 | B2 | 12/2003 | Lee et al. |
| 6,664,943 | B1 | 12/2003 | Nakajima et al. |
| 6,690,347 | B2 | 2/2004 | Jeon et al. |
| 6,724,361 | B1 | 4/2004 | Washio et al. |
| 6,750,835 | B2 | 6/2004 | Azami |
| 6,774,573 | B2 | 8/2004 | Yamazaki |
| 6,788,108 | B2 | 9/2004 | Miyake et al. |
| 6,789,514 | B2 | 9/2004 | Suh et al. |
| 6,813,332 | B2 | 11/2004 | Nagao et al. |
| 6,845,140 | B2 | 1/2005 | Moon et al. |
| 6,900,856 | B2 | 5/2005 | Kim et al. |
| 6,919,874 | B1 | 7/2005 | Maurice |
| 6,922,217 | B2 | 7/2005 | Kim |
| 6,928,136 | B2 | 8/2005 | Nagao et al. |
| 6,963,336 | B2 | 11/2005 | Kimura |
| 6,995,742 | B2 | 2/2006 | Park et al. |
| 7,023,408 | B2 | 4/2006 | Chen et al. |
| 7,023,410 | B2 | 4/2006 | Lee et al. |
| 7,038,653 | B2 | 5/2006 | Moon |
| 7,042,430 | B2 | 5/2006 | Isami et al. |
| 7,046,240 | B2 | 5/2006 | Kimura |
| 7,050,036 | B2 | 5/2006 | Kim et al. |
| 7,061,014 | B2 | 6/2006 | Hosono et al. |
| 7,068,076 | B2 | 6/2006 | Azami |
| 7,091,749 | B2 | 8/2006 | Miyake et al. |
| 7,098,882 | B2 | 8/2006 | Kitani et al. |
| 7,116,748 | B2 | 10/2006 | Nagao et al. |
| 7,133,017 | B2 | 11/2006 | Hayashi et al. |
| 7,151,520 | B2 | 12/2006 | Maki |
| 7,180,356 | B2 | 2/2007 | Kanbara et al. |
| 7,190,338 | B2 | 3/2007 | Kubota et al. |
| 7,190,342 | B2 | 3/2007 | Matsuda et al. |
| 7,202,863 | B2 | 4/2007 | Kimura et al. |
| 7,209,130 | B2 | 4/2007 | Tsujino et al. |
| 7,212,184 | B2 | 5/2007 | Washio et al. |
| 7,245,503 | B2 | 7/2007 | Koga |
| 7,256,422 | B2 | 8/2007 | Yamazaki |
| 7,274,351 | B2 | 9/2007 | Washio et al. |
| 7,282,782 | B2 | 10/2007 | Hoffman et al. |
| 7,289,096 | B2 | 10/2007 | Jeon et al. |
| 7,289,594 | B2 | 10/2007 | Moon |
| 7,297,977 | B2 | 11/2007 | Hoffman et al. |
| 7,298,355 | B2 | 11/2007 | Koyama |
| 7,317,779 | B2 | 1/2008 | Moon et al. |
| 7,319,452 | B2 | 1/2008 | Moon |
| 7,333,586 | B2 | 2/2008 | Jang |

(56) References Cited

U.S. PATENT DOCUMENTS

| | | | |
|---|---|---|---|
| 7,339,570 B2 | 3/2008 | Kubota et al. | |
| 7,342,568 B2 * | 3/2008 | Wei | G11C 19/28 326/97 |
| 7,362,139 B2 | 4/2008 | Miyake et al. | |
| 7,365,713 B2 | 4/2008 | Kimura | |
| 7,365,727 B2 | 4/2008 | Satoh et al. | |
| 7,369,113 B2 | 5/2008 | Washio et al. | |
| 7,379,148 B2 | 5/2008 | Kim | |
| 7,400,698 B2 * | 7/2008 | Chang | G11C 19/28 377/64 |
| 7,403,038 B2 | 7/2008 | Azami | |
| 7,405,716 B2 | 7/2008 | Lee et al. | |
| 7,408,535 B2 | 8/2008 | Fujita | |
| 7,411,586 B2 | 8/2008 | Kimura | |
| 7,420,402 B2 | 9/2008 | Washio et al. | |
| 7,436,384 B2 | 10/2008 | An | |
| 7,462,862 B2 | 12/2008 | Hoffman et al. | |
| 7,486,268 B2 | 2/2009 | Jang et al. | |
| 7,486,269 B2 | 2/2009 | Moon | |
| RE40,673 E | 3/2009 | Kanbara et al. | |
| 7,499,042 B2 | 3/2009 | Shirasaki et al. | |
| 7,508,479 B2 | 3/2009 | Kim et al. | |
| 7,528,820 B2 | 5/2009 | Yoon et al. | |
| 7,529,334 B2 | 5/2009 | Jang | |
| 7,532,701 B2 | 5/2009 | Moon | |
| 7,538,753 B2 | 5/2009 | Tanada | |
| 7,548,027 B2 | 6/2009 | Yamazaki | |
| 7,576,723 B2 | 8/2009 | Lee et al. | |
| 7,646,841 B2 | 1/2010 | Moon et al. | |
| 7,659,877 B2 | 2/2010 | Murakami et al. | |
| 7,674,650 B2 | 3/2010 | Akimoto et al. | |
| 7,688,302 B2 | 3/2010 | Hayashi et al. | |
| 7,688,933 B2 | 3/2010 | Morosawa | |
| 7,692,617 B2 | 4/2010 | Kim et al. | |
| 7,696,974 B2 | 4/2010 | Moon et al. | |
| 7,728,832 B2 | 6/2010 | Okamura | |
| 7,732,819 B2 | 6/2010 | Akimoto et al. | |
| 7,733,321 B2 | 6/2010 | Hayashi et al. | |
| 7,777,701 B2 | 8/2010 | Eom | |
| 7,786,985 B2 | 8/2010 | Kimura et al. | |
| 7,859,510 B2 | 12/2010 | Umezaki | |
| 8,035,109 B2 | 10/2011 | Kimura | |
| 8,044,906 B2 | 10/2011 | Kimura et al. | |
| 8,059,078 B2 | 11/2011 | Kimura et al. | |
| 8,102,340 B2 | 1/2012 | Lee et al. | |
| RE43,401 E | 5/2012 | Miyake et al. | |
| 8,378,356 B2 | 2/2013 | Kimura | |
| 8,482,491 B2 | 7/2013 | Kimura | |
| 8,564,523 B2 | 10/2013 | Moon | |
| 8,619,207 B2 | 12/2013 | Kim | |
| 8,659,027 B2 | 2/2014 | Kimura | |
| 8,704,736 B2 | 4/2014 | Kimura | |
| 8,982,021 B2 | 3/2015 | Kimura | |
| 8,994,029 B2 | 3/2015 | Kimura | |
| 9,310,657 B2 | 4/2016 | Kim et al. | |
| 9,454,049 B2 | 9/2016 | Kim | |
| 2002/0044111 A1 | 4/2002 | Yamazaki et al. | |
| 2002/0056838 A1 | 5/2002 | Ogawa | |
| 2003/0052848 A1 | 3/2003 | Yamaguchi | |
| 2004/0046729 A1 | 3/2004 | Moon | |
| 2004/0140839 A1 | 7/2004 | Nagao et al. | |
| 2004/0188685 A1 | 9/2004 | Lin et al. | |
| 2004/0239600 A1 | 12/2004 | Lin | |
| 2005/0008114 A1 | 1/2005 | Moon | |
| 2005/0017302 A1 | 1/2005 | Hoffman | |
| 2005/0134545 A1 * | 6/2005 | Jang | G09G 3/3688 345/100 |
| 2005/0220262 A1 | 10/2005 | Moon | |
| 2005/0264514 A1 | 12/2005 | Kim et al. | |
| 2005/0285840 A1 | 12/2005 | Jang et al. | |
| 2006/0001637 A1 | 1/2006 | Pak et al. | |
| 2006/0001638 A1 | 1/2006 | Jeon et al. | |
| 2006/0007102 A1 | 1/2006 | Yasuoka et al. | |
| 2006/0043377 A1 | 3/2006 | Hoffman et al. | |
| 2006/0056267 A1 | 3/2006 | Kim et al. | |
| 2006/0091793 A1 | 5/2006 | Baude et al. | |
| 2006/0132051 A1 | 6/2006 | Fish et al. | |
| 2006/0132182 A1 | 6/2006 | Kikuchi | |
| 2006/0139293 A1 | 6/2006 | Cho | |
| 2006/0145998 A1 | 7/2006 | Cho et al. | |
| 2006/0164376 A1 | 7/2006 | Moon | |
| 2006/0208977 A1 | 9/2006 | Kimura | |
| 2006/0244107 A1 | 11/2006 | Sugihara et al. | |
| 2006/0280279 A1 | 12/2006 | Nagao et al. | |
| 2007/0146354 A1 | 6/2007 | Kubota et al. | |
| 2007/0194379 A1 | 8/2007 | Hosono et al. | |
| 2009/0278122 A1 | 11/2009 | Hosono et al. | |
| 2009/0280600 A1 | 11/2009 | Hosono et al. | |
| 2010/0026619 A1 | 2/2010 | Umezaki | |
| 2011/0101352 A1 | 5/2011 | Hosono et al. | |
| 2011/0187694 A1 | 8/2011 | Umezaki | |
| 2011/0201162 A1 | 8/2011 | Hosono et al. | |
| 2012/0012838 A1 | 1/2012 | Hosono et al. | |
| 2012/0032943 A1 | 2/2012 | Kimura et al. | |
| 2015/0090996 A1 | 4/2015 | Kimura | |
| 2016/0223850 A1 | 8/2016 | Kim et al. | |
| 2017/0017106 A1 | 1/2017 | Kim | |

FOREIGN PATENT DOCUMENTS

| | | |
|---|---|---|
| CN | 001588555 A | 3/2005 |
| CN | 001707595 A | 12/2005 |
| EP | 0535569 A | 4/1993 |
| EP | 1065723 A | 1/2001 |
| EP | 1096467 A | 5/2001 |
| EP | 1160796 A | 12/2001 |
| EP | 1231594 A | 8/2002 |
| EP | 1445862 A | 8/2004 |
| EP | 1560332 A | 8/2005 |
| EP | 1600929 A | 11/2005 |
| EP | 1684310 A | 7/2006 |
| EP | 1737044 A | 12/2006 |
| EP | 1895545 A | 3/2008 |
| EP | 2226847 A | 9/2010 |
| EP | 2246894 A | 11/2010 |
| EP | 2413366 A | 2/2012 |
| GB | 2360651 | 9/2001 |
| JP | 05-267636 A | 10/1993 |
| JP | 06-162790 A | 6/1994 |
| JP | 10-500243 | 1/1998 |
| JP | 2000-155550 A | 6/2000 |
| JP | 2001-076868 A | 3/2001 |
| JP | 2001-325798 A | 11/2001 |
| JP | 2001-350438 A | 12/2001 |
| JP | 2002-055644 A | 2/2002 |
| JP | 2002-133890 A | 5/2002 |
| JP | 2002-372722 A | 12/2002 |
| JP | 2003-043976 A | 2/2003 |
| JP | 2003-101406 A | 4/2003 |
| JP | 2003-122313 A | 4/2003 |
| JP | 2003-177710 A | 6/2003 |
| JP | 2003-186045 A | 7/2003 |
| JP | 2003-198146 A | 7/2003 |
| JP | 2003-202834 A | 7/2003 |
| JP | 2003-208132 A | 7/2003 |
| JP | 2003-216064 A | 7/2003 |
| JP | 2004-078172 A | 3/2004 |
| JP | 2004-103226 A | 4/2004 |
| JP | 2004-220021 A | 8/2004 |
| JP | 2004-246358 A | 9/2004 |
| JP | 2005-050502 A | 2/2005 |
| JP | 2005-192081 A | 7/2005 |
| JP | 2005-522734 | 7/2005 |
| JP | 2005-257997 A | 9/2005 |
| JP | 2005-527856 | 9/2005 |
| JP | 2005-293817 A | 10/2005 |
| JP | 2005-352455 A | 12/2005 |
| JP | 2005-354036 A | 12/2005 |
| JP | 2006-039111 A | 2/2006 |
| JP | 2006-039524 A | 2/2006 |
| JP | 2006-079041 A | 3/2006 |
| JP | 2006-156820 A | 6/2006 |
| JP | 2006-178165 A | 7/2006 |
| JP | 2006-189762 A | 7/2006 |

(56) References Cited

FOREIGN PATENT DOCUMENTS

| | | |
|---|---|---|
| JP | 2006-190437 A | 7/2006 |
| JP | 2007-200452 A | 8/2007 |
| JP | 2008-083692 A | 4/2008 |
| KR | 2005-0117057 A | 12/2005 |
| TW | 494266 | 7/2002 |
| TW | 525139 | 3/2003 |
| TW | 538400 | 6/2003 |
| TW | 200305848 | 11/2003 |
| TW | 565838 | 12/2003 |
| TW | 567452 | 12/2003 |
| TW | 577176 | 2/2004 |
| TW | 200405235 | 4/2004 |
| TW | 588369 | 5/2004 |
| TW | 200417782 | 9/2004 |
| TW | I228696 | 3/2005 |
| TW | I230309 | 4/2005 |
| TW | 200521913 | 7/2005 |
| TW | I253233 | 4/2006 |
| WO | WO-2002/065062 | 8/2002 |
| WO | WO-2003/042964 | 5/2003 |
| WO | WO-2003/087921 | 10/2003 |
| WO | WO-2003/100511 | 12/2003 |
| WO | WO-2003/107314 | 12/2003 |
| WO | WO-2004/114391 | 12/2004 |
| WO | WO-2005/088726 | 9/2005 |
| WO | WO-2007/086601 | 8/2007 |

OTHER PUBLICATIONS

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Kikuchi.H et al., "Polymer-Stabilized Liquid Crystal Blue Phases", Nature Materials, Sep. 2, 2002, vol. 1, pp. 64-68.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Oh.J et al., "15.2: 2.0 Inch A-Si:H TFT-LCD With Low Noise Integrated Gate Driver", SID Digest '05 : SID International Symposium Digest of Technical Papers, May 24, 2005, vol. 36, pp. 942-945.

Search Report (Application No. 07016494.2) dated Jul. 16, 2009.

Chinese Office Action (Application No. 201110285452.5) dated Jun. 27, 2013.

Taiwanese Office Action (Application No. 96131686) dated Sep. 18, 2013.

Taiwanese Office Action (Application No. 100146380) dated Jan. 27, 2014.

Korean Office Action (Application No. 2013-0167535) dated Apr. 9, 2014.

Maurice.F et al., "High Resolution Projection Valve With the Amorphous Silicon AMLCD Technology", Proceedings of SPIE—Conference on Projection Displays IV, 1998, vol. 3296, pp. 92-99.

* cited by examiner

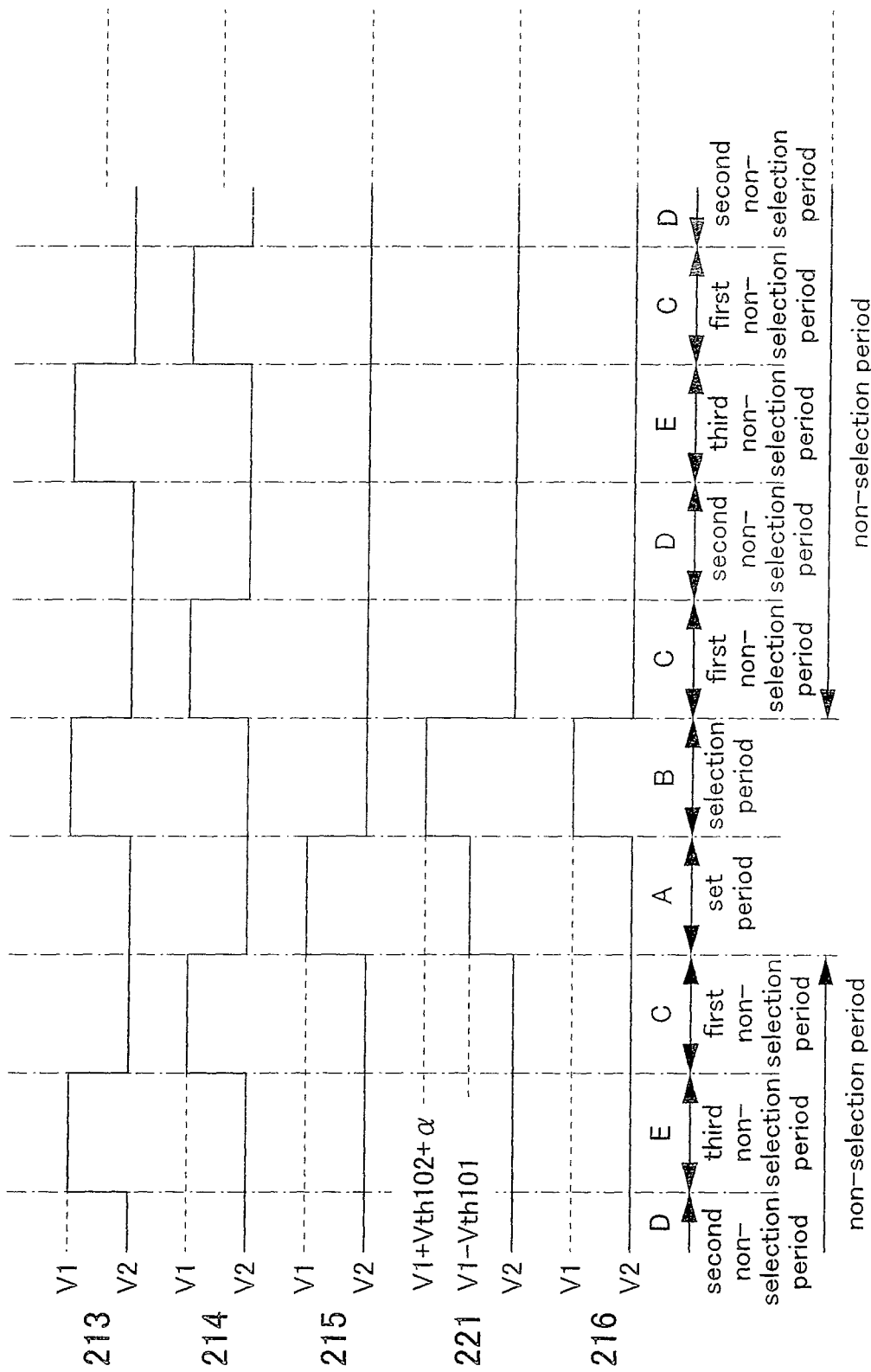

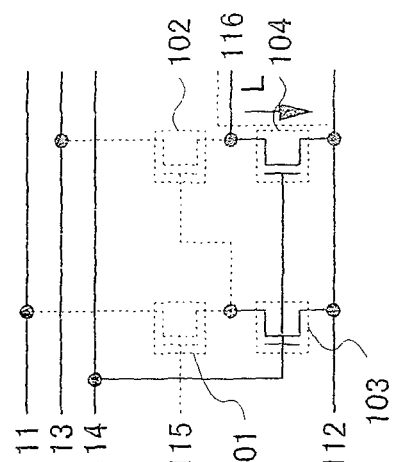
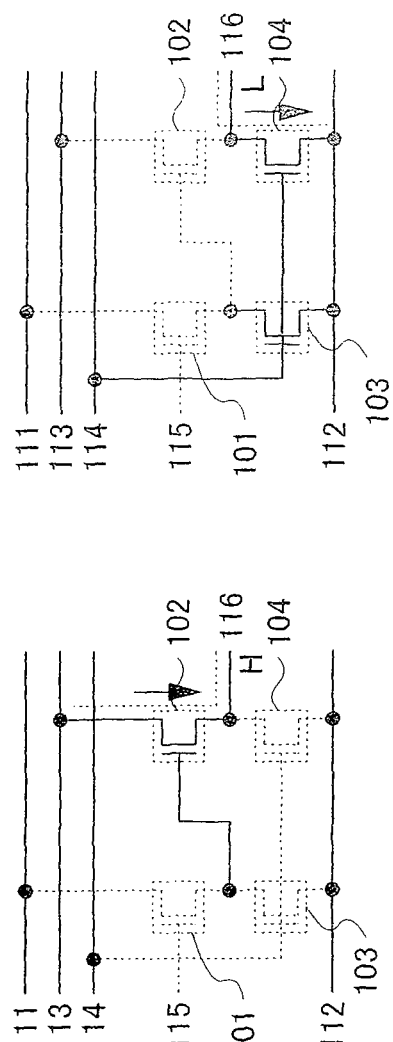
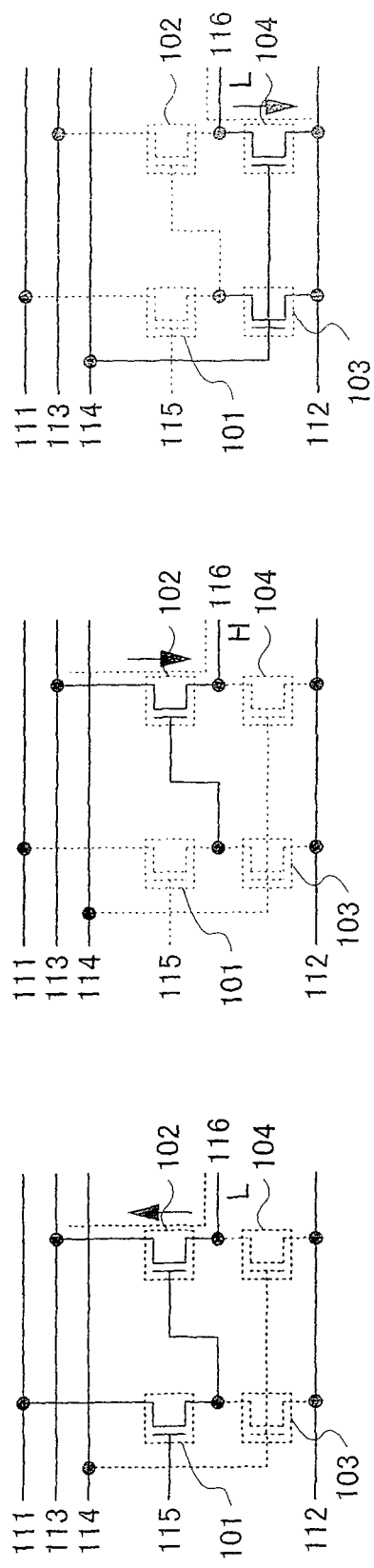
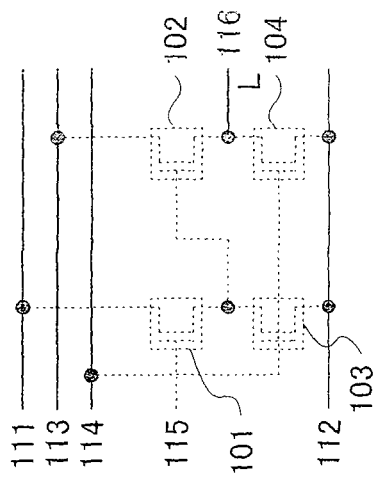
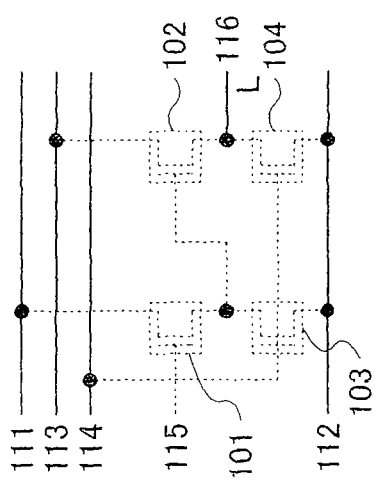

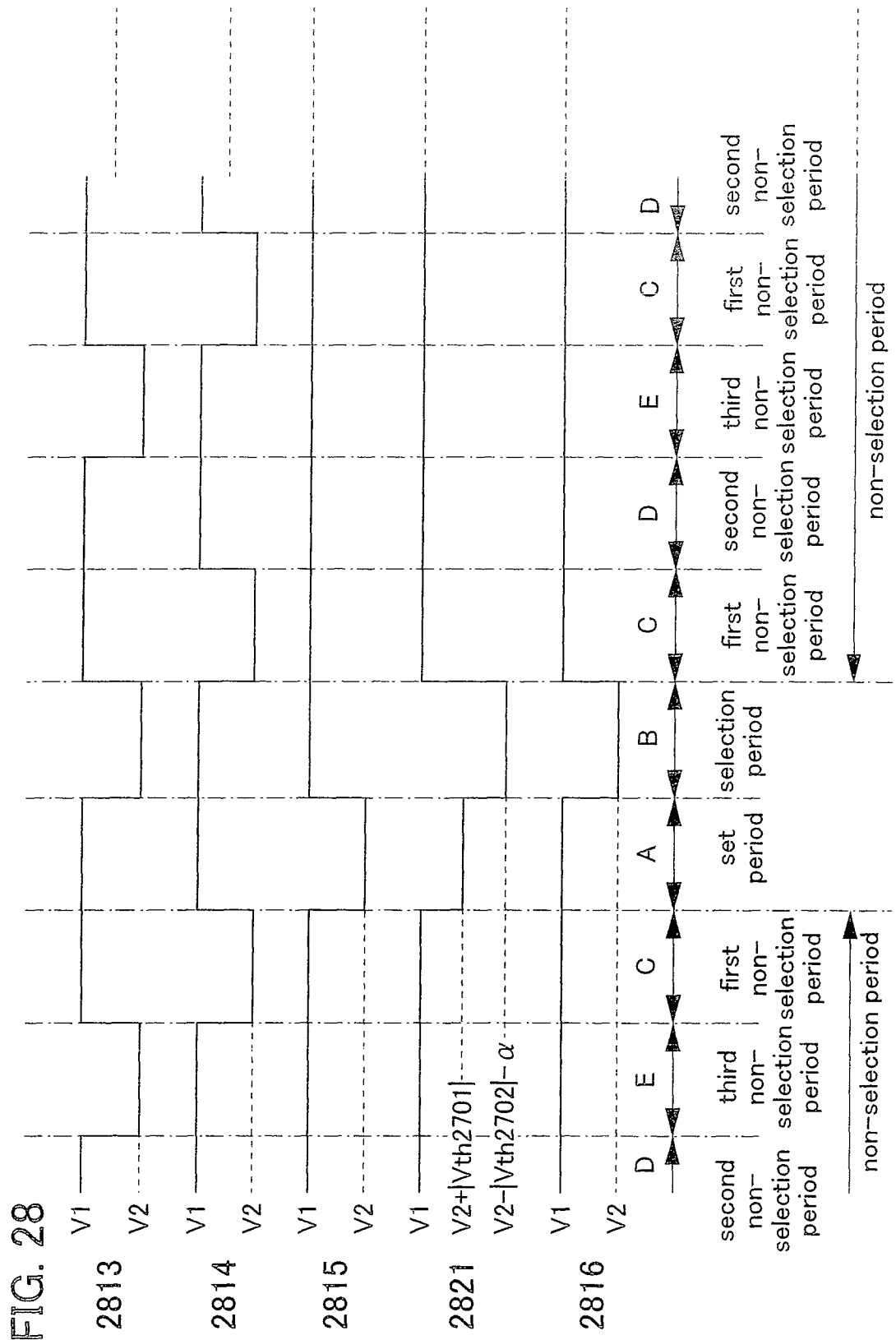

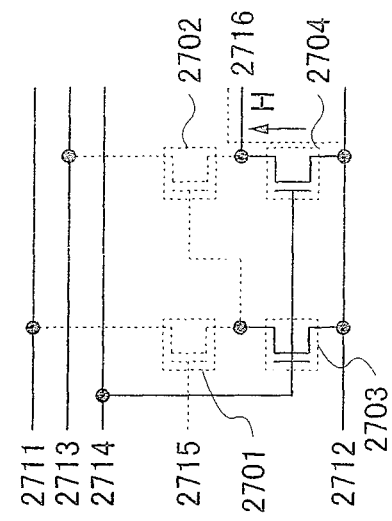
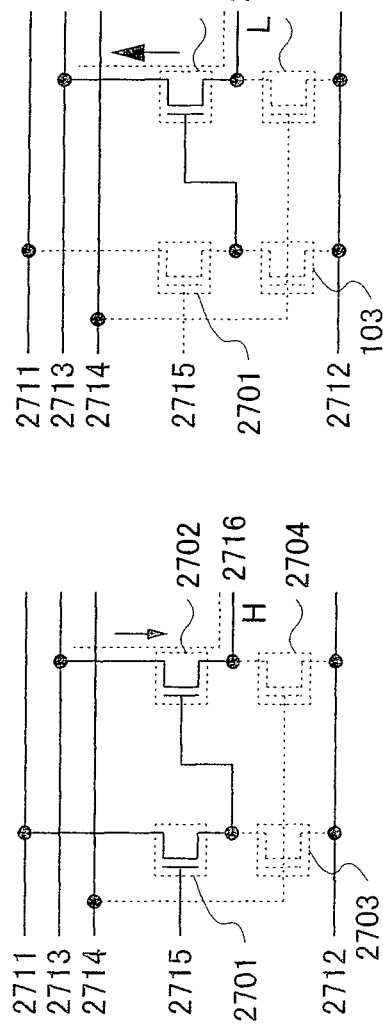
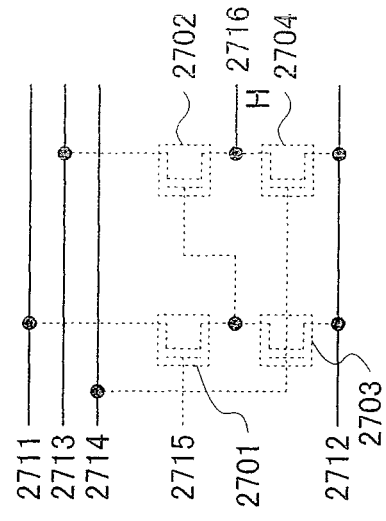
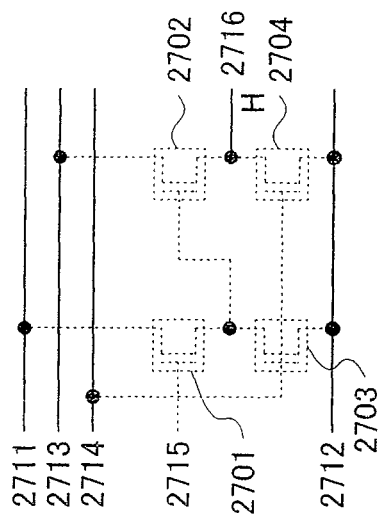

5001  5002  5003  5004

5011  5012  5013  5014  5015  5016

5021  5022  5023  5024  5025  5026  5027  5028

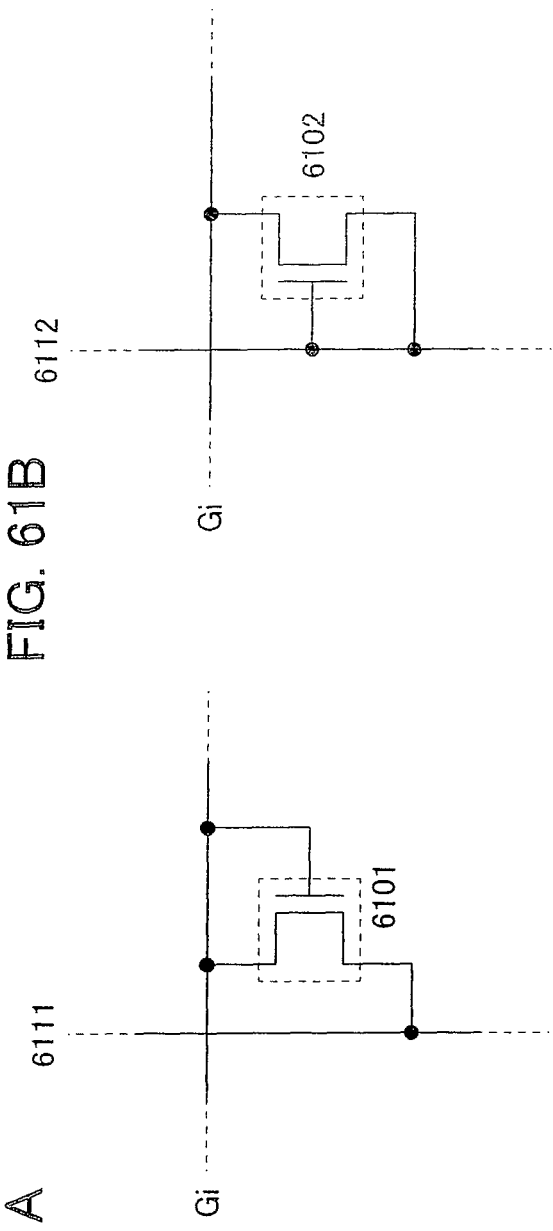
FIG. 61A
FIG. 61B
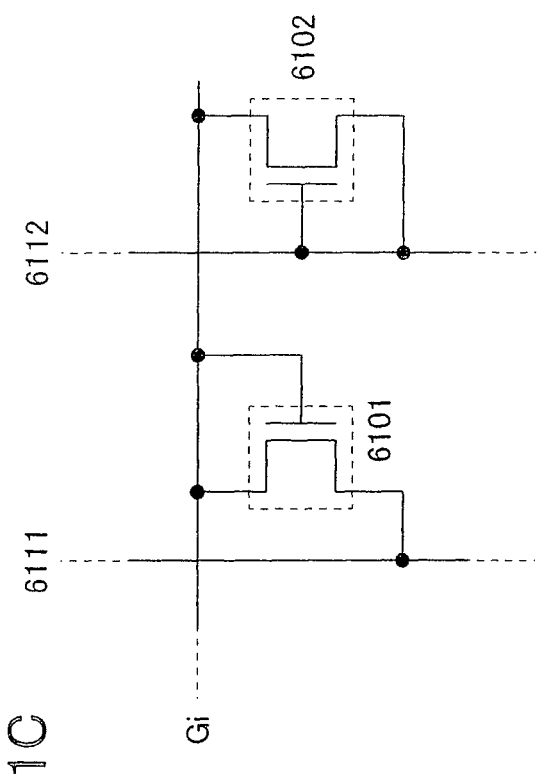
FIG. 61C

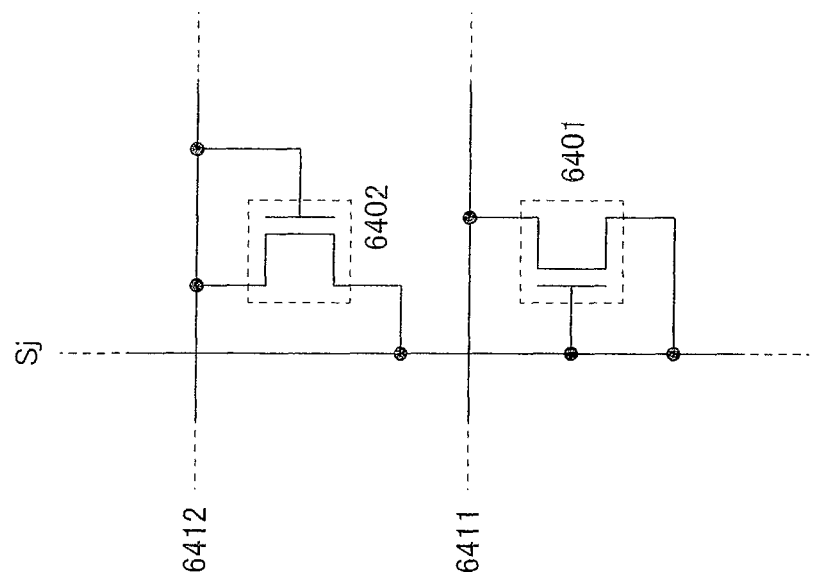
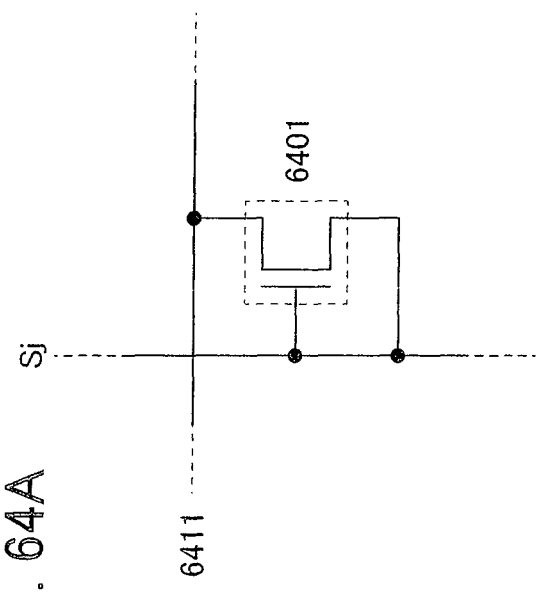
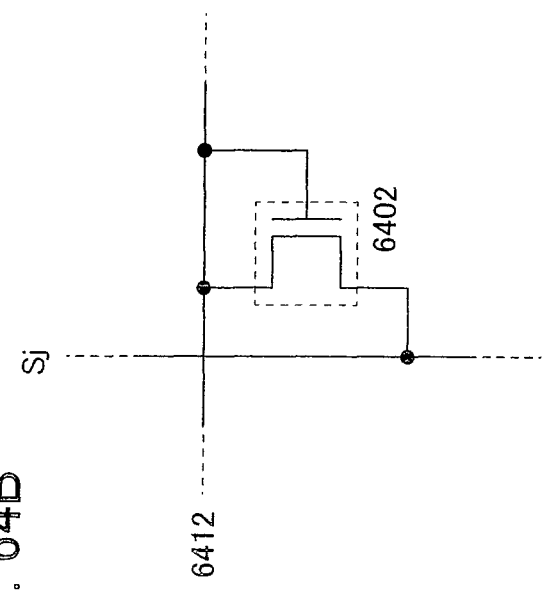

- ☐ Semiconductor layer
- ▨ Gate metal
- ▧ Wiring
- ▥ Light-transmitting conductive film

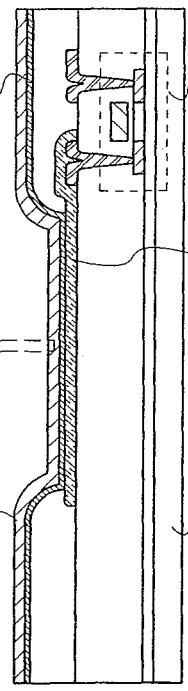
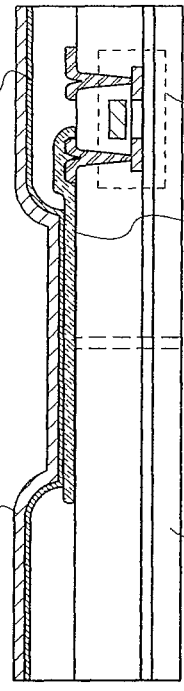
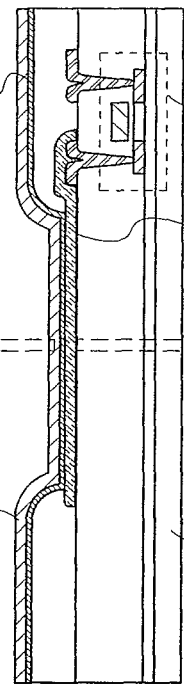

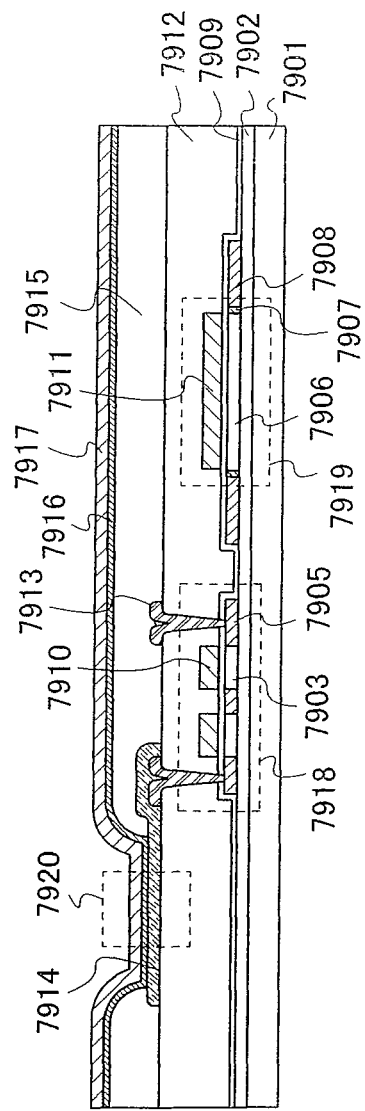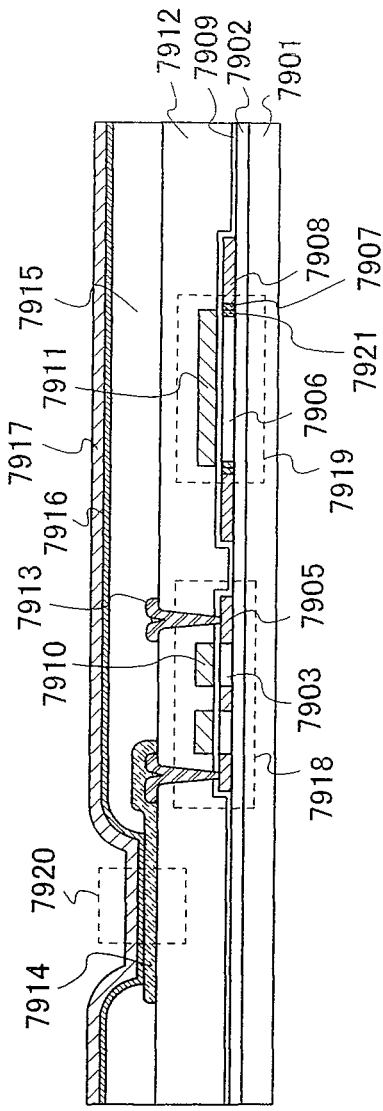

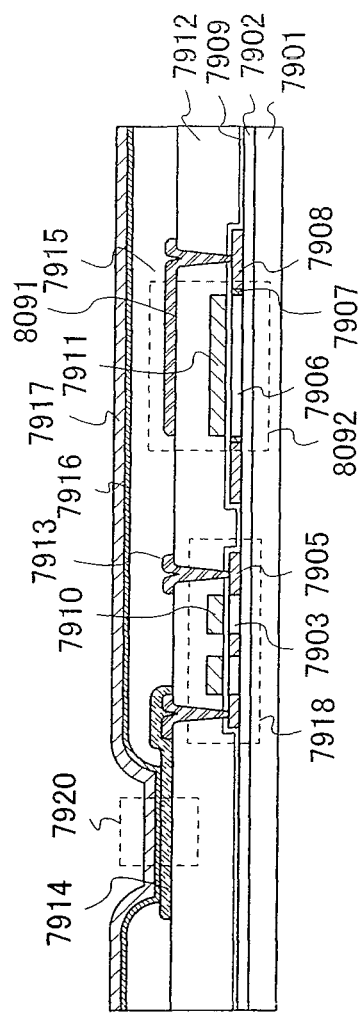
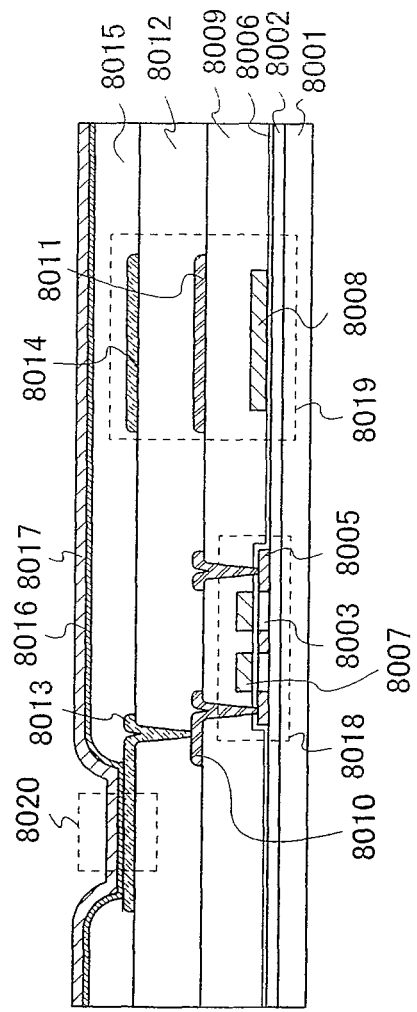
FIG. 80A
FIG. 80B

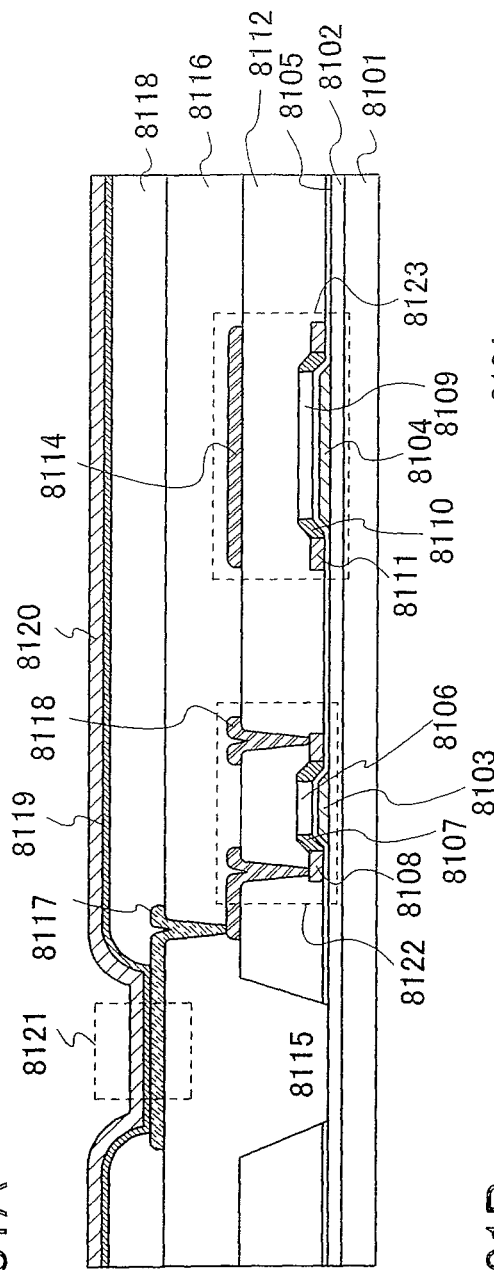
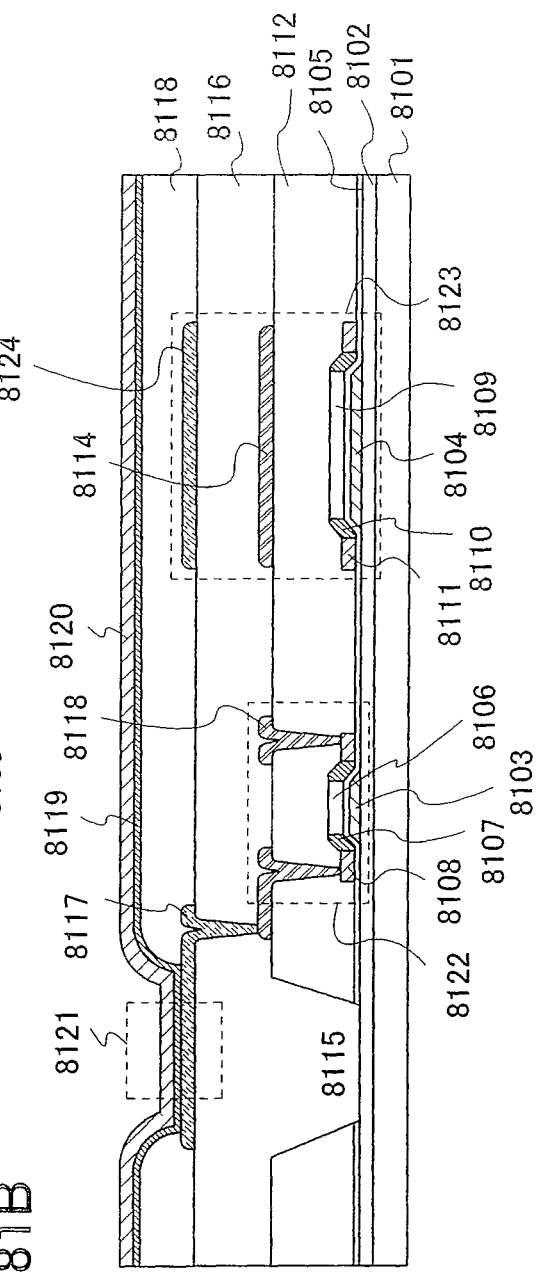
FIG. 81A
FIG. 81B

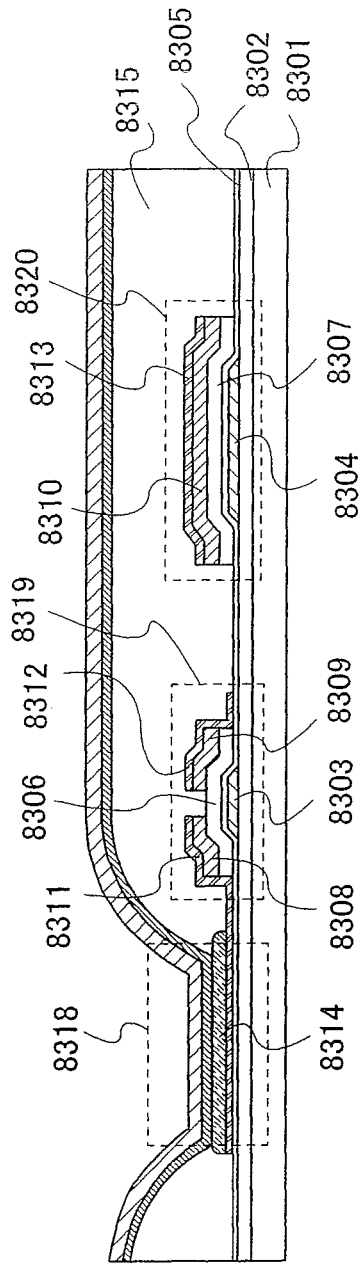
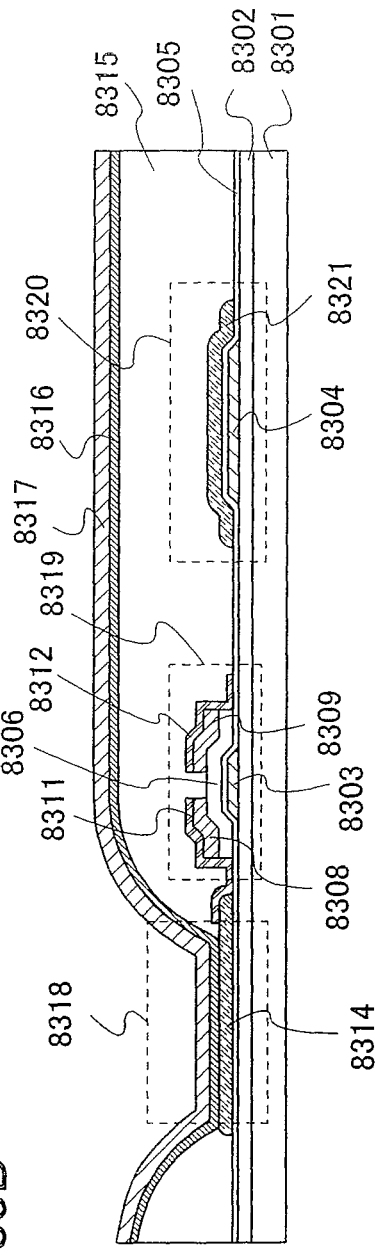
FIG. 83A
FIG. 83B

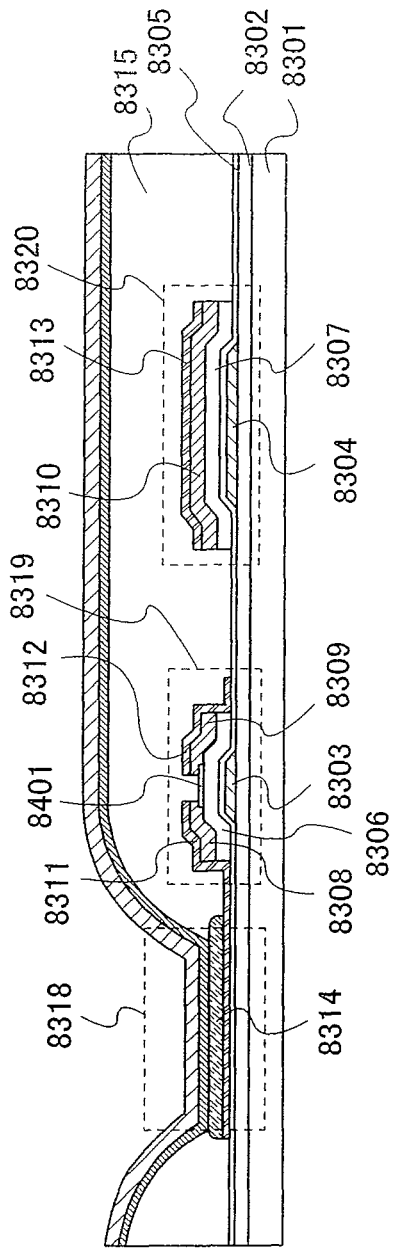
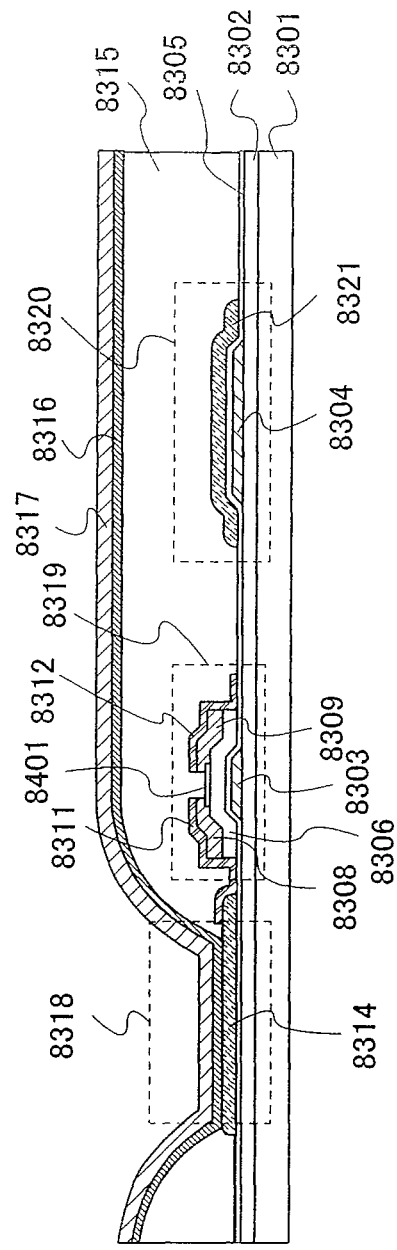
FIG. 84A
FIG. 84B

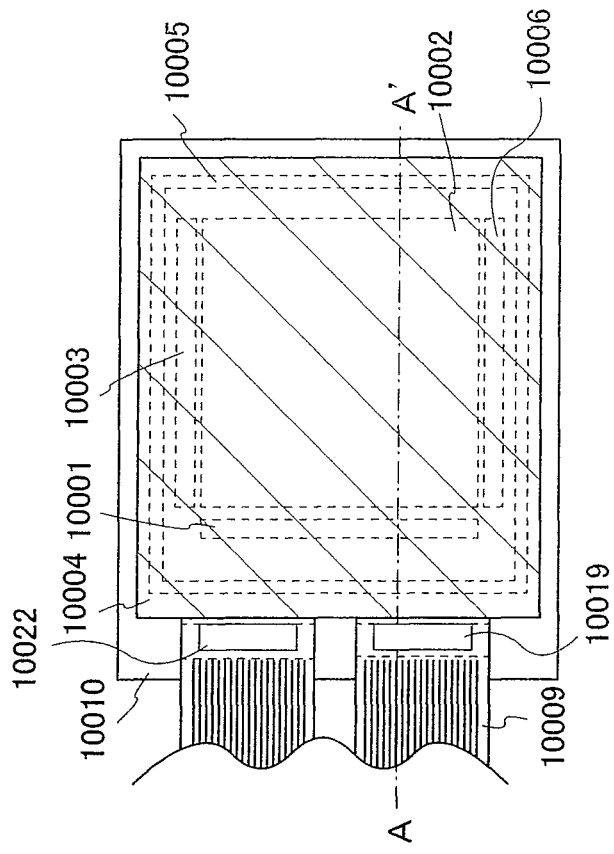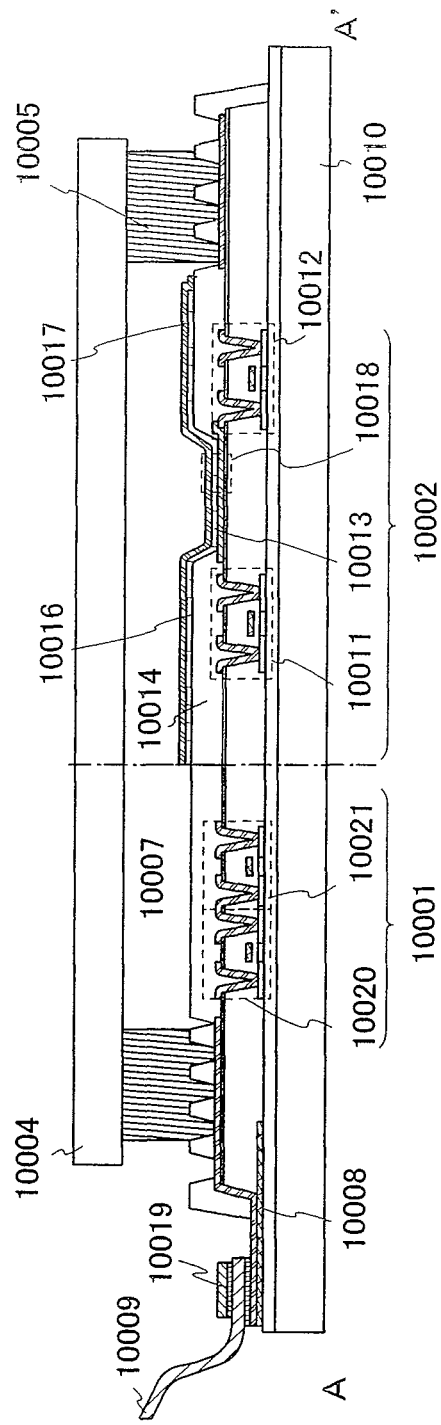

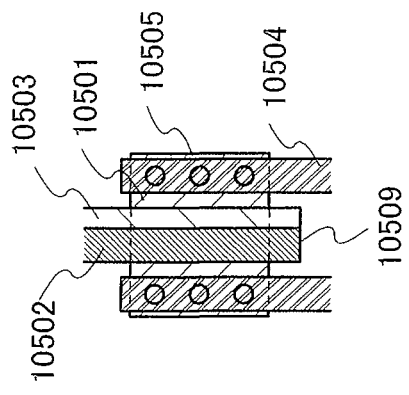
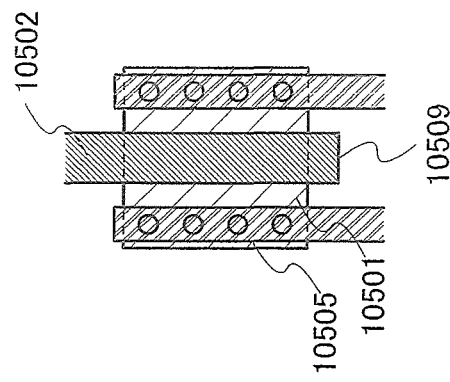
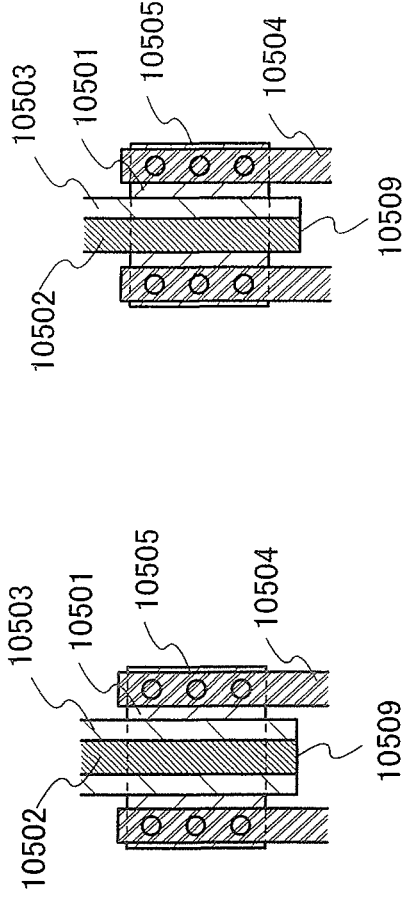
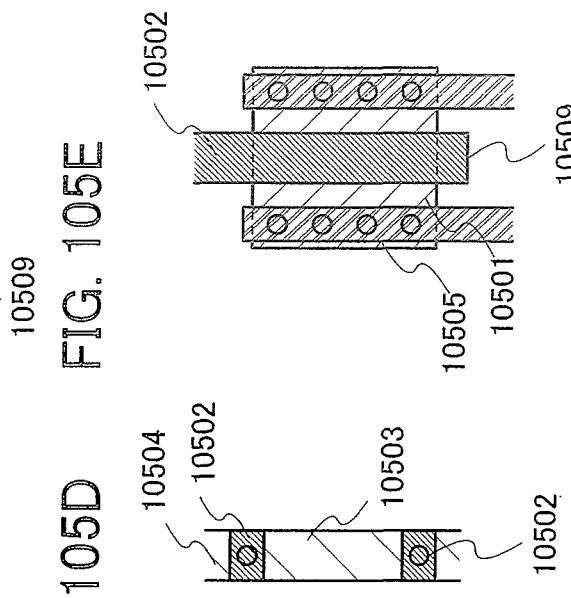
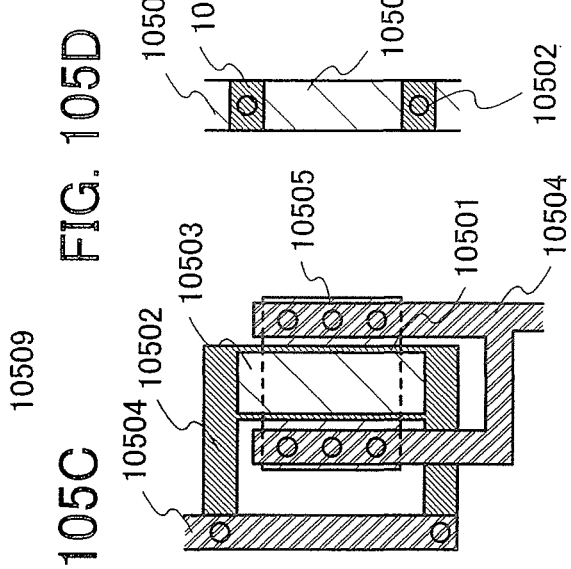

LIQUID CRYSTAL DISPLAY DEVICE

CROSS-REFERENCE TO RELATED APPLICATIONS

This application is a continuation of U.S. application Ser. No. 16/438,666, filed Jun. 12, 2019, now allowed, which is a continuation of U.S. application Ser. No. 16/143,059, filed Sep. 26, 2018, now U.S. Pat. No. 10,401,699, which is a continuation of U.S. application Ser. No. 15/624,987, filed Jun. 16, 2017, now U.S. Pat. No. 10,088,725, which is a continuation of U.S. application Ser. No. 15/140,577, filed Apr. 28, 2016, now U.S. Pat. No. 9,684,215, which is a continuation of U.S. application Ser. No. 14/934,243, filed Nov. 6, 2015, now U.S. Pat. No. 9,335,599, which is a continuation of U.S. application Ser. No. 14/168,058, filed Jan. 30, 2014, now U.S. Pat. No. 9,184,183, which is a continuation of U.S. application Ser. No. 13/904,147, filed May 29, 2013, now U.S. Pat. No. 8,643,586, which is a continuation of U.S. application Ser. No. 13/307,131, filed Nov. 30, 2011, now U.S. Pat. No. 8,462,100, which is a continuation of U.S. application Ser. No. 12/977,556, filed Dec. 23, 2010, now U.S. Pat. No. 8,456,396, which is a divisional of U.S. application Ser. No. 11/845,415, filed Aug. 27, 2007, now U.S. Pat. No. 7,859,510, which claims the benefit of a foreign priority application filed in Japan as Serial No 2006-236392 on Aug. 31, 2006, all of which are incorporated by reference.

BACKGROUND OF THE INVENTION

1. Field of the Invention

The present invention relates to a liquid crystal display device. In particular, the present invention relates to a liquid crystal display device having a shift register formed by using a transistor. In addition, the present invention relates to a method for driving the liquid crystal display device. Further, the present invention relates to an electronic device having the liquid crystal display device in a display portion.

2. Description of the Related Art

In recent years, with the increase of large display devices such as liquid crystal televisions, liquid crystal display devices have been actively developed. In particular, a technique for forming a pixel circuit and a driver circuit including a shift register or the like (hereinafter also referred to as an internal circuit) over the same insulating substrate by using transistors formed of a non-crystalline semiconductor (hereinafter also referred to as amorphous silicon) has been actively developed, because the technique greatly contributes to low power consumption and low cost. The internal circuit formed over the insulating substrate is connected to a controller IC or the like (hereinafter also referred to as an external circuit) through an FPC or the like, and its operation is controlled.

A shift register which is formed by using transistors formed of a non-crystalline semiconductor has been devised among the above-described internal circuits (for example, see Reference 1: Japanese Translation of PCT International Application No. H10-500243). Since in a shift register disclosed in Reference 1, a period an which an output terminal is in a floating state is long, there has been a problem in that noise easily occurs in an output signal of the shift register. In order to solve the problem of the shift register disclosed in Reference 1, a structure of a shift register in which an output terminal does not get into a floating state has been devised (for example, sec Reference 2: 2.0 inch a-Si:H TFT-LCD with Low Noise integrated Gate Driver SID '05 DIGEST pp. 942 to 945).

SUMMARY OF THE INVENTION

In Reference 2, a transistor connected between an output terminal and a negative voltage source is turned on in a non-selection period. Therefore, the output terminal of the shift register disclosed in Reference 2 does not get into a floating state, so that noise of an output signal in the shift register disclosed in Reference 2 can be reduced.

However, it is known that characteristics of a transistor formed of a non-crystalline semiconductor deteriorate in accordance with the amount of time for which the transistor is turned on, voltage applied, or the like. Among causes of deterioration, a threshold voltage shift where the threshold voltage is shifted (raised) is one of the major causes of a malfunction of a shift register. Therefore, since the transistor connected between the output terminal and the negative voltage source is turned on in the non-selection period in the shift register disclosed in Reference 2, the shift register malfunctions because of deterioration in characteristics of the transistor.

In view of the aforementioned problems, it is an object of the present invention to provide a liquid crystal display device including a shift register where noise of an output signal is reduced in a non-selection period and deterioration in characteristics of a transistor can be suppressed, and an electronic device having the liquid crystal display device.

A liquid crystal display device of the present invention includes a pixel portion formed over an insulating substrate and a shift register formed over the insulating substrate, in addition, the shift register includes a plurality of flip-flops, and each of the plurality of flip-flops includes a transistor which is turned on at regular intervals in a non-selection period and outputs a power supply potential to an output terminal (a scan line). The transistor is turned on at regular intervals and outputs the power supply potential to the scan line, so that each of the plurality of flip-flops suppresses fluctuation in a potential of the scan line and deterioration in characteristics of the transistor.

A liquid crystal display device of the present invention includes first and second pixels each having a liquid crystal element, a driver circuit, a first wiring, a second wiring, a third wiring, a fourth wiring, a fifth wiring, and a sixth wiring. The first pixel is electrically connected to the driver circuit through the fifth wiring and the second pixel is electrically connected to the driver circuit through the sixth wiring. The driver circuit includes a shift register. The shift register includes a plurality of flip-flops. At least one of the plurality of flip-flops includes a first transistor, a second transistor, a third transistor, and a fourth transistor. A first terminal of the first transistor is electrically connected to the first wiring; a second terminal of the first transistor is electrically connected to a gate terminal of the second transistor; and a gate terminal of the first transistor is electrically connected to the fifth wiring. A first terminal of the second transistor is electrically connected to the third wiring and a second terminal of the second transistor is electrically connected to the sixth wiring. A first terminal of the third transistor is electrically connected to the gate terminal of the second transistor; a second terminal of the third transistor is electrically connected to the second wiring; and a gate terminal of the third transistor is electrically connected to the fourth wiring A first terminal of the fourth transistor is electrically connected to the sixth wiring; a second terminal of the fourth transistor is electrically connected to the second wiring; and a gate terminal of the fourth transistor is electrically connected to the fourth wiring.

A liquid crystal display device of the present invention includes first and second pixels each having a liquid crystal element, a driver circuit, a first wiring, a second wiring, a third wirings a fourth wiring, and a fifth wiring. The first pixel is electrically connected to the driver circuit through the fifth wiring and the second pixel is electrically connected to the driver circuit through the first wiring. The driver circuit includes a shift register. The shift register includes a plurality of flip-flops. At least one of the plurality of flip-flops includes a first transistor, a second transistor, a third transistor, and a fourth transistor. A first terminal of the first transistor is electrically connected to the fifth wiring; a second terminal of the first transistor is electrically connected to a gate terminal of the second transistor; and a gate familial of the first transistor is electrically connected to the fifth wiring. A first terminal of the second transistor is electrically connected to the third wiring and a second terminal of the second transistor is electrically connected to the first wiring. A first terminal of the third transistor is electrically connected to the gate terminal of the second transistor; a second terminal of the third transistor is electrically connected to the second wiring; and a gate terminal of the third transistor is electrically connected to the fourth wiring. A first terminal of the fourth transistor is electrically connected to the first wiring; a second terminal of the fourth transistor is electrically connected to the second wiring; and a gate terminal of the fourth transistor is electrically connected to the fourth wiring.

Note that in the present invention, each of the first transistor, the second transistor, the third transistor, and the fourth transistor may be an N-channel transistor.

In addition, in the present invention, each of the first transistor, the second transistor, the third transistor, and the fourth transistor may have a semiconductor layer and the semiconductor layer may be amorphous silicon.

In addition, in the present invention, a capacitor may be provided between the second terminal and the gate terminal of the first transistor.

A liquid crystal display device of the present invention includes first and second pixels each having a liquid crystal element, a driver circuit, a first wiring, a second wiring, a third wiring, a fourth wiring, a fifth wiring, a sixth wiring, and a seventh wiring. The first pixel is electrically connected to the driver circuit through the fifth wiring and the second pixel is electrically connected to the driver circuit through the sixth wiring. The driver circuit includes a shift register. The shift register includes a plurality of flip-flops. At least one of the plurality of flip-flops includes a first transistor, a second transistor, a third transistor, a fourth transistor, and a fifth transistor. A first terminal of the first transistor is electrically connected to the first wiring; a second terminal of the first transistor is electrically connected to a gate terminal of the second transistor; and a gale terminal of the first transistor is electrically connected to the fifth wiring. A first terminal of the second transistor is electrically connected to the third wiring and a second terminal of the second transistor is electrically connected to the sixth wiring A first terminal of the third transistor is electrically connected to the gate terminal of the second transistor; a second terminal of the third transistor is electrically connected to the second wiring; and a gate terminal of the third transistor is electrically connected to the fourth wiring. A first terminal of the fourth transistor is electrically connected to the sixth wiring; a second terminal of the fourth transistor is electrically connected to the second wiring; and a gate terminal of the fourth transistor is electrically connected to the fourth wiring. A first terminal of the fifth transistor is electrically connected to the sixth wiring; a second terminal of the fifth transistor is electrically connected to the second wiring; and a gate terminal of the firth transistor is electrically connected to the seventh wiring.

A liquid crystal display device of the present invention includes first and second pixels each having a liquid crystal element, a driver circuit, a first wiring, a second wiring, a third wiring, a fourth wiring, a fifth wiring, and a sixth wiring. The first pixel is electrically connected to the driver circuit through the fifth wiring and the second pixel is electrically connected to the driver circuit through the first wiring. The driver circuit includes a shift register. The shift register includes a plurality of flip-flops. At least one of the plurality of flip-flops includes a first transistor, a second transistor, a third transistor, a fourth transistor, and a fifth transistor. A first terminal of the first transistor is electrically connected to the fifth wiring; a second terminal of the first transistor is electrically connected to a gate terminal of the second transistor; and a gate terminal of the first transistor is electrically connected to the fifth wiring. A first terminal of the second transistor is electrically connected to the third wiring and a second terminal of the second transistor is electrically connected to the sixth wiring. A first terminal of the third transistor is electrically connected to the second wiring; a second terminal of the third transistor is electrically connected to the gate terminal of the second transistor; and a gate terminal of the third transistor is electrically connected to the fourth wiring. A first terminal of the fourth transistor is electrically connected to the sixth wiring; a second terminal of the fourth transistor is electrically connected to the second wiring; and a gate terminal of the fourth transistor is electrically connected to the fourth wiring. A first terminal of the fifth transistor is electrically connected to the sixth wiring; a second terminal of the fifth transistor is electrically connected to the second wiring; and a gale terminal of the fifth transistor is electrically connected to the first wiring.

Note that in the present invention, each of the first transistor, the second transistor, the third transistor, the fourth transistor, and the fifth transistor may be an N-channel transistor.

In addition, in the present invention, each of the first transistor, the second transistor, the third transistor, the fourth transistor, and the fifth transistor may have a semiconductor layer and the semiconductor layer may be amorphous silicon.

In addition, in the present invention, a capacitor may be provided between the second terminal and the gate terminal of the first transistor.

A liquid crystal display device of the present invention includes first to fourth pixels each having a liquid crystal element, a first driver circuit, a second driver circuit, a first wiring, a second wiring, a third wiring, a fourth wiring, a fifth wiring, a sixth wiring, a seventh wiring, an eighth wiring, a ninth wiring, a tenth wiring, an eleventh wiring, and a twelfth wiring. The first pixel is electrically connected to the first driver circuit through the fifth wiring; the second pixel is electrically connected to the first driver circuit through the sixth wiring; the third pixel is electrically connected to the second driver circuit through the eleventh wiring; and the fourth pixel is electrically connected to the second driver circuit through the twelfth wiring. The first driver circuit includes a first shift register and the second driver circuit includes a second shift register. The first shift register includes a plurality of flip-flops. At least one of the plurality of flip-flops includes a first transistor, a second transistor, a third transistor, and a fourth transistor. A first terminal of the first transistor is electrically connected to the first wiring; a second terminal of the first transistor is electrically connected to a gate terminal of the second transistor; and a gate terminal of the first transistor is electrically connected to the fifth wiring. A first terminal of the second transistor is electrically connected to the third wiring and a second terminal of the second transistor is electrically connected to the sixth wiring. A first terminal of the third transistor is electrically connected to the second wiring; a second terminal of the third transistor is electrically connected to the gate terminal of the second transistor; and a gate terming of the third transistor is electrically connected to the fourth wiring. A first terminal of the fourth transistor is electrically connected to the second wiring; a second terminal of the fourth transistor is electrically connected to the sixth wiring; and a gate terminal of the fourth transistor is electrically connected to the fourth wiring. The second shift register includes a plurality of flip-flops. At least one of the plurality of flip-flops includes a fifth transistor, a sixth transistor, a seventh transistor, and an eighth transistor. A first terminal of the fifth transistor is electrically connected to the seventh wiring; a second terminal of the fifth transistor is electrically connected to a gate terminal of the sixth transistor; and a gate terminal of the firth transistor is electrically connected to the eleventh wiring. A first terminal of the sixth transistor is electrically connected to the ninth wiring and a second terminal of the sixth transistor is electrically connected to the twelfth wiring. A first terminal of the seventh transistor is electrically connected to the eighth wiring; a second terminal of the seventh transistor is electrically connected to the gate terminal of the sixth transistor; and a gate terminal of the seventh transistor is electrically connected to the tenth wiring. A first terminal of the eighth transistor is electrically connected to the eighth wiring; a second terminal of the eighth transistor is electrically connected to the twelfth wiring; and a gale terminal of the eighth transistor is electrically connected to the tenth wiring.

Note that in the present invention, the fifth wiring and the eleventh wiring may be electrically connected and the sixth wiring and the twelfth wiring may be electrically connected.

Note that in the present invention, the fifth wiring and the eleventh wiring may be the same wiring and the sixth wiring and the twelfth wiring may be the same wiring.

Note that in the present invention, the first wiring and the seventh wiring may be electrically connected; the second wiring and the eighth wiring may be electrically connected; the third wiring and the ninth wiring may be electrically connected; and the fourth wiring and the tenth wiring may be electrically connected.

Note that in the present invention, the first wiring and the seventh wiring may be the same wiring; the second wiring and the eighth wiring may be the same wiring; the third wiring and the ninth wiring may be the same wiring; and the fourth wiring and the tenth wiring may be the same wiring.

Note that in the present invention, the first wiring and the seventh wiring may be electrically connected; the second wiring and the eighth wiring may be electrically connected; the third wiring and the ninth wiring may be electrically connected; the fourth wiring and the tenth wiring may be electrically connected; the fifth wiring and the eleventh wiring may be electrically connected; and the sixth wiring and the twelfth wiring may be electrically connected.

Note that in the present invention, the first wiring and the seventh wiring may be the same wiring; the second wiring and the eighth wiring may be the same wiring; the third wiring and the ninth writing may be the same wiring; the fourth wiring and the tenth wiring may be the same wiring; the fifth wiring and the eleventh wiring may be the same wiring; and the sixth wiring and the twelfth wiring may be the same wiring.

A liquid crystal display device of the present invention includes first to fourth pixels each having a liquid crystal element a first driver circuit, a second driver circuit, a first wiring, a second wiring, a third wiring, a fourth wiring, a fifth wiring, a sixth wiring, a seventh wiring, an eighth wiring, a ninth wiring, and a tenth wiring. The first pixel is electrically connected to the first driver circuit through the fifth wiring; the second pixel is electrically connected to the first driver circuit through the first wiring; the third pixel is electrically connected to the second driver circuit through the tenth wiring; and the fourth pixel is electrically connected to the second driver circuit through the sixth wiring. The first driver circuit includes a first shift register and the second driver circuit includes a second shift register. The first shift register includes a plurality of flip-flops. At least one of the plurality of flip-flops includes a first transistor, a second transistor, a third transistor, and a fourth transistor. A first terminal of the first transistor is electrically connected to the fifth wiring; a second terminal of the first transistor is electrically connected to a gate terminal of the second transistor; and a gate terminal of the first transistor is electrically connected to the fifth wiring. A first terminal of the second transistor is electrically connected to the third wiring and a second terminal of the second transistor is electrically connected to the first wiring. A first terminal of the third transistor is electrically connected to the gate terminal of the second transistor, a second terminal of the third transistor is electrically connected to the second wiring; and a gate terminal of the third transistor is electrically connected to the fourth wiring. A first terminal of the fourth transistor is electrically connected to the first, wiring; a second terminal of the fourth transistor is electrically connected to the second wiring; and a gate terminal of the fourth transistor is electrically connected to the fourth wiring. The second shift register includes a plurality of flip-flops. At least one of the plurality of flip-flops includes a fifth transistor, a sixth transistor, a seventh transistor, and an eighth transistor. A first terminal of the fifth transistor is electrically connected to the tenth wiring; a second terminal of the fifth transistor is electrically connected to a gate terminal of the sixth transistor; and a gate terminal of the fifth transistor is electrically connected to the tenth wiring. A first terminal of the sixth transistor is electrically connected to the eighth wiring and a second terminal of the sixth transistor is electrically connected to the sixth wiring. A first terminal of the seventh transistor is electrically connected to the gate terminal of the sixth transistor; a second terminal of the seventh transistor is electrically connected to the seventh wiring; and a gate terminal of the seventh transistor is electrically connected to the ninth wiring. A first terminal of the eighth transistor is electrically connected to the sixth wiring; a second terminal of the eighth transistor is electrically connected to the seventh wiring; and a gate terminal of the eighth transistor is electrically connected to the ninth wiring.

Note that in the present invention, the first wiring and the sixth wiring may be electrically connected and the fifth wiring and the tenth wiring may be electrically connected.

Note that in the present invention, the first wiring and the sixth wiring may be the same wiring and the fifth wiring and the tenth wiring may be the same wiring.

In addition, in the present invention, the second wiring and the seventh wiring may be electrically connected; the third wiring and the eighth wiring may be electrically connected; and the fourth wiring and the ninth wiring may be electrically connected.

In addition, in the present invention, the second wiring and the seventh wiring may be the same wiring; the third wiring and the eighth wiring may be the same wiring; and the fourth wiring and the ninth wiring may be the same wiring.

In addition, in the present invention, the first wiring and the sixth wiring may be electrically connected; the second wiring and the seventh wiring may be electrically connected; the third wiring and the eighth wiring may be electrically connected; the fourth wiring and the ninth wiring may be electrically connected; and the fifth wiring and the tenth wiring may be electrically connected.

Note that in the present invention, the first wiring and the sixth wiring may be the same wiring; the second wiring and the seventh wiring may be the same wiring; the third wiring and the eighth wiring may be the same wiring; the fourth wiring and the ninth wiring may be the same wiring; and the fifth wiring and the tenth wiring may be the same wiring.

In addition, in the present invention, each of the first transistor, the second transistor, the third transistor, the fourth transistor, the fifth transistor, the sixth transistor, the seventh transistor, and the eighth transistor may be an N-channel transistor.

In addition, in the present invention, each of the first transistor, the second transistor, the third transistor, the fourth transistor, the fifth transistor, the sixth transistor, the seventh transistor, and the eighth transistor may have a semiconductor layer and the semiconductor layer may be amorphous silicon.

In addition, in the present invention, a first capacitor may be provided between the second terminal and the gate terminal of the first transistor and a second capacitor may be provided between the second terminal and the gate terminal of the fifth transistor.

A liquid crystal display device of the present invention includes first to fourth pixels each having a liquid crystal element, a to driver circuit, a second driver circuit, a first wiring, a second wiring, a third wiring, a fourth wiring, a fifth wiring, a sixth wiring, a seventh wiring, an eighth wiring, a ninth wiring, a tenth wiring, an eleventh wiring, a twelfth wiring, a thirteenth wiring, and a fourteenth wiring. The first pixel is electrically connected to the first driver circuit through the fifth wiring; the second pixel is electrically connected to the first driver circuit through the sixth wiring; the third pixel is electrically connected to the second driver circuit through the twelfth wiring; and the fourth pixel is electrically connected to the second driver circuit through the thirteenth wiring. The first driver circuit includes a first shift register and the second driver circuit includes a second shift register. The first shift register includes a plurality of flip-flops. At least one of the plurality of flip-flops includes a first transistor, a second transistor, a third transistor, a fourth transistor, and a fifth transistor. A first terminal of the first transistor is electrically connected to the first wiring; a second terminal of the first transistor is electrically connected to a gate terminal of the second transistor; and a gate terminal of the first transistor is electrically connected to the fifth wiring. A first terminal of the second transistor is electrically connected to the third wiring and a second terminal of the second transistor is electrically connected to the sixth wiring. A first terminal of the third transistor is electrically connected to the second wiring; a second terminal of the third transistor is electrically connected to the gate terminal of the second transistor; and a gate terminal of the third transistor is electrically connected to the fourth wiring. A first terminal of the fourth transistor is electrically connected to the second wiring; a second terminal of the fourth transistor is electrically connected to the sixth wiring; and a gate terminal of the fourth transistor is electrically connected to the fourth wiring. A first terminal of the fifth transistor is electrically connected to the second wiring; a second terminal of the fifth transistor is electrically connected to the sixth wiring; and a gate terminal of the fifth transistor is electrically connected to the seventh wiring. The second shift register includes a plurality of flip-flops. At least one of the plurality of flip-flops includes a sixth transistor, a seventh transistor, an eighth transistor, a ninth transistor, and a tenth transistor. A first terminal of the sixth transistor is electrically connected to the eighth wiring; a second terminal of the sixth transistor is electrically connected to a gate terminal of the seventh transistor; and a gate terminal of the sixth transistor is electrically connected to the twelfth wiring. A first terminal of the seventh transistor is electrically connected to the tenth wiring and a second terminal of the seventh transistor is electrically connected to the thirteenth wiring. A first terminal of the eighth transistor is electrically connected to the ninth wiring; a second terminal of the eighth transistor is electrically connected to the gate terminal of the seventh transistor; and a gate terminal of the eighth transistor is electrically connected to the eleventh wiring. A first terminal of the ninth transistor is electrically connected to the thirteenth wiring; a second terminal of the ninth transistor is electrically connected to the ninth wiring; and a gate terminal of the ninth transistor is electrically connected to the eleventh wiring. A first terminal of the tenth transistor is electrically connected to the thirteenth wiring; a second terminal of the tenth transistor is electrically connected to the ninth wiring; and a gate terminal of the tenth transistor is electrically connected to the fourteenth wiring.

Note that in the present invention, the fifth wiring and the twelfth wiring may be electrically connected and the sixth wiring and the thirteenth wiring may be electrically connected.

Note that in the present invention, the fifth wiring and the twelfth wiring may be the same wiring and the sixth wiring and the thirteenth wiring may be the same wiring.

In addition, in the present invention, the first wiring and the eighth wiring may be electrically connected; the second wiring and the ninth wiring may be electrically connected; the third wiring and the tenth wiring may be electrically connected; the fourth wiring and the eleventh wiring may be electrically connected; and the seventh wiring and the fourteenth wiring may be electrically connected.

Note that in the present invention, the first wiring and the eighth wiring may be the same wiring; the second wiring and the ninth wiring may be the same wiring; the third wiring and the tenth wiring may be the same wiring; the fourth wiring and the eleventh wiring may be the same wiring; and the seventh wiring and the fourteenth wiring may be the same wiring.

In addition, in the present invention, the first wiring and the eighth wiring may be electrically connected; the second wiring and the ninth wiring may be electrically connected; the third wiring and the tenth wiring may be electrically connected; the fourth wiring and the eleventh wiring may be electrically connected; the fifth wiring and the twelfth wiring may be electrically connected; the sixth wiring and the thirteenth wiring may be electrically connected; and the seventh wiring and the fourteenth wiring may be electrically connected.

In addition, in the present invention, the first wiring and the eighth wiring may be the same wiring; the second wiring and the ninth wiring may be the same wiring; the third wiring and the tenth wiring may be the same wiring; the fourth wiring and the eleventh wiring may be the same wiring; the fifth wiring and the twelfth wiring may be the same wiring; the sixth wiring and the thirteenth wiring may be the same wiring; and the seventh wiring and the fourteenth wiring may be the same wiring.

A liquid crystal display device of the present invention includes first to fourth pixels each having a liquid crystal element, a first driver circuit, a second driver circuit, a first wiring, a second wiring, a third wiring, a fourth wiring, a fifth wiring, a sixth wiring, a seventh wiring, an eighth wiring, a ninth wiring, a tenth wiring, an eleventh wiring, and a twelfth wiring. The first pixel is electrically connected to the first driver circuit through the fifth wiring; the second pixel is electrically connected to the first driver circuit through the sixth wiring; the third pixel is electrically connected to the second driver circuit through the eleventh wiring; and the fourth pixel is electrically connected to the second driver circuit through the twelfth wiring. The first driver circuit includes a first shift register and the second driver circuit includes a second shift register. The first shift register includes a plurality of flip-flops. At least one of the plurality of flip-flops includes a first transistor, a second transistor, a third transistor, a fourth transistor, and a fifth transistor. A first terminal of the first transistor is electrically connected to the fifth wiring; a second terminal of the first transistor is electrically connected to a gate terminal of the second transistor; and a gate terminal of the first transistor is electrically connected to the fifth wiring. A first terminal of the second transistor is electrically connected to the third wiring and a second terminal of the second transistor is electrically connected to the sixth wiring. A first terminal of the third transistor is electrically connected to the gate terminal of the second transistor; a second terminal of the third transistor is electrically connected to the second wiring; and a gate terminal of the third transistor is electrically connected to the fourth wiring. A first terminal of the fourth transistor is electrically connected to the sixth wiring; a second terminal of the fourth transistor is electrically connected to the second wiring; and a gate terminal of the fourth transistor is electrically connected to the fourth wiring. A first terminal of the fifth transistor is electrically connected to the sixth wiring; a second terminal of the fifth transistor is electrically connected to the second wiring; and a gate terminal of the fifth transistor is electrically connected to the first wiring. The second shift register includes a plurality of flip-flops. At least one of the plurality of flip-flops includes a sixth transistor, a seventh transistor, an eighth transistor, a ninth transistor, and a tenth transistor. A first terminal of the sixth transistor is electrically connected to the eleventh wiring; a second terminal of the sixth transistor is electrically connected to a gate terminal of the seventh transistor, and a gate terminal of the sixth transistor is electrically connected to the eleventh wiring. A first terminal of the seventh transistor is electrically connected to the ninth wiring and a second terminal of the seventh transistor is electrically connected to the twelfth wiring. A first terminal of the eighth transistor is electrically connected to the eighth wiring; a second terminal of the eighth transistor is electrically connected to the gate terminal of the seventh transistor; and a gate terminal of the eighth transistor is electrically connected to the tenth wiring. A first terminal of the ninth transistor is electrically connected to the eighth wiring; a second terminal of the ninth transistor is electrically connected to the twelfth wiring; and a gate terminal of the ninth transistor is electrically connected to the tenth wiring. A first terminal of the tenth transistor is electrically connected to the eighth wiring; a second terminal at the tenth transistor is electrically connected to the twelfth wiring; and a gate terminal of the tenth transistor is electrically connected to the seventh wiring.

Note that in the present invention, the fifth wiring and the eleventh wiring may be electrically connected and the sixth wiring and the twelfth wiring may be electrically connected.

Note that in the present invention, the fifth wiring and the eleventh wiring may be the same wiring and the sixth wiring and the twelfth wiring may be the same wiring.

In addition, in the present invention, the first wiring and the seventh wiring may be electrically connected; the second wiring and the eighth wiring may be electrically connected; the third wiring and the ninth wiring may be electrically connected; and the fourth wiring and the tenth wiring may be electrically connected.

In addition, in the present invention, the first wiring and the seventh wiring may be the same wiring; the second wiring and the eighth wiring may be the same wiring; the third wiring and the ninth wiring may be the same wiring; and the fourth wiring and the tenth wiring may be the same wiring.

In addition, in the present invention, the first wiring and the seventh wiring may be electrically connected; the second wiring and the eighth wiring may be electrically connected; the third wiring and the ninth wiring may be electrically connected; the fourth wiring and the tenth wiring may be electrically connected; the fifth wiring and the eleventh wiring may be electrically connected; and the sixth wiring and the twelfth wiring may be electrically connected.

Note that in the present invention, the find wiring and the seventh wiring may be the same wiring; the second wiring and the eighth wiring may be the same wiring; the third wiring and the ninth wiring may be the same wiring; the fourth wiring and the tenth wiring may be the same wiring; the fifth wiring and the eleventh wiring may be the same wiring; and the sixth wiring and the twelfth wiring may be the same wiring.

Note that in the present invention, each of the first transistor, the second transistor, the third transistor, the fourth transistor, the fifth transistor, the sixth transistor, the seventh transistor, the eighth transistor, the ninth transistor, and the tenth transistor may be an N-channel transistor.

Note that in the present invention, each of the first transistor, the second transistor, the third transistor, the fourth transistor, the fifth transistor, the sixth transistor, the seventh transistor, the eighth transistor, the ninth transistor, and the tenth transistor may have a semiconductor layer and the semiconductor layer may be amorphous silicon.

Note that in the present invention, a first capacitor may be provided between the second terminal and the gate terminal of the first transistor and a second capacitor may be provided between the second terminal and the gate terminal of the sixth transistor.

An electronic device having any of the above-described liquid crystal display devices is included in the present invention.

Note that various types of switches can be used as a switch shown in this specification, and an electrical switch, a mechanical switch, and the like are given as examples.

That is, any element can be used as long as it can control a current flow, without limiting to a certain element. For example, it may be a transistor, a diode (e.g., a PN diode, a PIN diode, a Schottky diode, or a diode-connected transistor), a thyristor, or a logic circuit combining such elements. In the case of using a transistor as a switch, polarity (a conductivity type) of the transistor is not particularly limited to a certain type because it operates just as a switch. However, a transistor of polarity with smaller off-current is preferably used when off-current is preferably small A transistor provided with an LDD region, a transistor with a multi-gate structure, and the like are given as examples of a transistor with smaller off-current. In addition, it is preferable that an N-channel transistor be used when a potential of a source terminal of the transistor which is operated as a switch is closer to a low-potential-side power supply (e.g., Vss, GND, or 0 V), while a P-channel transistor be used when the potential of the source terminal is closer to a high-potential-side power supply (e.g., Vdd). This is because the absolute value of gate-source voltage of the transistor is increased, so that the transistor can more accurately operate as a switch.

Note that a CMOS switch may be employed by using both N-channel and P-channel transistors. By employing the CMOS switch, the switch can more precisely operate as a switch because current can flow through the switch when the P-channel switch or the N-channel switch is turned on. For example, voltage can be appropriately output regardless of whether voltage of an input signal of the switch is high or low. In addition, since a voltage amplitude value of a signal for turning on or off the switch can be made small, power consumption can be reduced. Note that also that when a transistor is employed as a switch, the switch includes an input terminal (one of a source terminal and a drain terminal), an output terminal (the other of the source terminal and the drain terminal), and a terminal for controlling electrical conduction (a gate terminal). On the other hand, when a diode is employed as a switch, the switch does not have a terminal for controlling electrical conduction in some cases. Therefore, the number of wirings for controlling terminals can be reduced.

Note that in this specification, the description "be connected" includes the case where elements are electrically connected, the case where elements are functionally connected, and the case where elements are directly connected. Accordingly, in the structures disclosed in this specification, another element may be interposed between elements having a predetermined connection relation. For example, one or more elements which enable electrical connection (e.g., a switch, a transistor, a capacitor, an inductor, a resistor, and/or a diode) may be provided between a certain portion and another portion, in addition, one or more circuits which enable functional connection may be provided between the portions, such as a logic circuit (e.g., an inverter, a NAND circuit, or a NOR circuit), a signal converter circuit (e.g., a DA converter circuit, an AD converter circuit, or a gamma correction circuit), a potential level converter circuit (e.g., a power supply circuit such as a boosting circuit or a voltage lower control circuit, or a level shifter circuit for changing a potential level of an H-level signal or an L-level signal), a voltage source, a current source, a switching circuit, or an amplifier circuit (e.g., a circuit which can increase the signal amplitude, the amount of current, or the like, such as an operational amplifier, a differential amplifier circuit, a source follower circuit, or a buffer circuit), a signal generating circuit, a memory circuit, or a control circuit. Alternatively, the elements may be directly connected without interposing another element or another circuit therebetween.

In the case where elements are connected without interposing another element or circuit therebetween, the description "be directly connected" is employed. In addition, in the case where the description "be electrically connected" is employed, the following cases are included therein: the case where elements are electrically connected (that is, the case where the elements are connected by interposing another element therebetween), the case where elements are functionally connected (that is, the elements are connected by interposing another circuit therebetween), and the case where elements are directly connected (that is, the elements are connected without interposing another element or another circuit therebetween).

Note that a display element, a display device, a light-emitting element, and a light-emitting device can employ various types and include various elements. For example, as a display element, a display device, a light-emitting element, and a light-emitting device, a display medium, contrast of which changes by an electromagnetic action, such as an EL element (e.g., an organic EL element, an inorganic EL element, or an EL element including both organic and inorganic materials), an electron emitter, a liquid crystal element, electronic ink, a grating light valve (GLV), a plasma display panel (POP), a digital micromirror device (DMD), a piezoelectric ceramic display, or a carbon nanotube can be employed. Note that display devices using an EL element include an EL display; display devices using an electron emitter include a field emission display (FED), an SED-type flat panel display (SED: Surface-conduction Electron-emitter Display), and the like; display devices using a liquid crystal element include a liquid crystal display, a transmissive liquid crystal display, a semi-transmissive liquid crystal display, a reflective liquid crystal display, and the like; and display devices using electronic ink include electronic paper.

Note that in this specification, various types of transistors can be employed as a transistor without limiting to a certain type. Thus, for example, a thin film transistor (TFT) including a non-single crystal semiconductor film typified by amorphous silicon or polycrystalline silicon can be employed. Therefore, such a transistor can be formed at temperature lower than that of live case of using a single crystal semiconductor film, can be formed at low cost, can be formed over a light-transmitting substrate as well as a large substrate, and can transmit light. In addition, transmission of light in a display element can be controlled by using such a transistor. Further, a transistor can be formed by using a semiconductor substrate, an SOI substrate, or the like. Alternatively, a MOS transistor; a junction transistor, a bipolar transistor, or the like can be employed. Therefore, a transistor with few variations, a transistor with high current supply capability, and a small transistor can be formed, so that a circuit with low power consumption can be formed by using such a transistor. In addition, a transistor including a compound semiconductor such as ZnO, a-InGaZnO, SiGe, or GaAs, a thin film transistor or the like obtained by thinning such a compound semiconductor can be employed. Therefore, such a transistor can be formed at low temperature, can be formed at room temperature, and can be formed directly on a low heat-resistant substrate such as a plastic substrate or a film substrate. A transistor or the like formed by an inkjet method or a printing method may also be employed. Accordingly, such a transistor can be formed at room temperature, can be formed at a low vacuum, and can be formed using a large substrate. Further, since such a transistor can be formed without using a mask (a reticle), layout of the transistor can be easily changed. Furthermore, a transistor including an organic semiconductor or a carbon nanotube, or other transistors can be employed. Accordingly, the transistor can be formed using a substrate which can be bent. Note that a non-single crystal semiconductor film may include hydrogen or halogen. Moreover, a transistor can be formed using various types of substrates. The type of a substrate is not limited to a certain type. Therefore, for example, a single crystal substrate, an SOI substrate, a glass substrate, a quartz substrate, a plastic substrate, a paper substrate, a cellophane substrate, a stone substrate, a stainless steel substrate, a substrate including a stainless steel foil, or the like can be used as a substrate. Furthermore, the transistor may be formed using one substrate, and then, the transistor may be transferred to another substrate. As another substrate to which the transistor is transferred, a single crystal substrate, an SOI substrate, a glass substrate, a quartz substrate, a plastic substrate, a paper substrate, a cellophane substrate, a stone substrate, a stainless steel substrate, a substrate including a stainless steel foil, or the like can be used. By using such a substrate, a transistor with excellent properties or a transistor with low power consumption can be formed, or a device with high durability or high heat resistance can be formed.

A structure of 3 transistor can be various modes without limiting to a certain structure. For example, a multi-gate structure having two or more gate electrodes may be used. When the multi-gate structure is used, a structure where a plurality of transistors are connected in series is provided because a structure where channel regions are connected In series is provided. By using the multi-gate, structure, off-current am be reduced; the withstand voltage of the transistor can be increased to improve reliability; or drain-source current does not fluctuate very much even if drain-source voltage fluctuates when the transistor operates in a saturation region, so that flat characteristics can be obtained. In addition, a structure where gate electrodes are formed above and below a channel may be used. By using the structure where gate electrodes are formed above and below the channel, a channel region is enlarged to increase the amount of current flowing therethrough, or a depletion layer can be easily formed to decrease the S value. When the gate electrodes are formed above and below the channel, a structure where a plurality of transistors are connected in parallel is provided.

Further, a structure where a gate electrode is formed above a channel, a structure where a gate electrode is formed below a channel, a staggered structure, an inversely staggered structure, a structure where a channel region is divided into a plurality of regions, or a structure where gate electrodes are connected in parallel or in series can be employed. A source electrode or a drain electrode may overlap with a channel (or part of it). By using the structure where the source electrode or the drain electrode may overlap with the channel (or part of it), the cave can be prevented in which electric charges are accumulated in part of the channel, which would result in an unstable operation. Moreover, a structure where an LDD region is provided can be employed. By providing the LDD region, off-current can be reduced; the withstand voltage of the transistor can be increased to improve reliability; or drain-source current does not fluctuate very much even if drain-source voltage fluctuates when the transistor operates in the saturation region so that flat characteristics can be obtained.

Note that various types of transistors can be used for a transistor in this specification and the transistor can be formed using various types of substrates. Accordingly, ail of circuits may be formed using a glass substrate, a plastic substrate, a single crystal substrate, an SOI substrate, or any other substrate. When all of the circuits are formed using the same substrate, the number of component parts can be reduced to cut cost and the number of connections to circuit components can be reduced to improve reliability. Alternatively, part of the circuits may be formed using one substrate and another part of the circuits may be formed using another substrate. That is, not all of the circuits are required to be formed using the same substrate. For example, part of the circuits may be formed with transistors using a glass substrate and another part of the circuits may be formed using a single crystal substrate, so that the IC chip may be connected to the glass substrate by COG (Chip On Glass). Alternatively, the IC chip may be connected to the glass substrate by TAB (Tape Automated Bonding) or a printed wiring board. When part of the circuits are formed using the same substrate in this manner, the number of the component parts can be reduced to cut cost and the number of connections to the circuit components can be reduced to improve reliability. In addition, by forming a portion with high driving voltage or a portion with high driving frequency, which consumes large power, over another substrate, increase in power consumption can be prevented.

Note also that one pixel corresponds to one element whose brightness can be controlled in this specification. Therefore, for example, one pixel corresponds to one color element and brightness is expressed with the one color element. Accordingly, in the case of a color display device having color elements of R (Red), G (Green), and B (Blue), a minimum unit of an image is formed of three pixels of an R pixel, a G pixel, and a B pixel. Note that the color elements are not limited to three colors, and color elements of more than three colors may be used or a color other than RGB may be added. For example, RGBW (W corresponds to white) may be used by adding white. In addition, RGB plus one or more colors of yellow, cyan, magenta emerald green, vermilion, and the like may be used. Further, a color similar to at least one of R, G, and B may be added. For example, R, G, B1, and B2 may be used. Although both B1 and B2 are blue, they have slightly different frequency. By using such color elements, display which is closer to the real object can be performed or power consumption can be reduced. Alternatively, as another example, in the case of controlling brightness of one color element by using a plurality of regions, one region corresponds to one pixel. Therefore, for example, in the case of performing area gray scale display, a plurality of regions which control brightness are provided in each color element and gray scales are expressed with the whole regions. In this case, one region which controls brightness corresponds to one pixel. Thus, in that case, one color element includes a plurality of pixels. Further, in that case, regions which contribute to display may have different area dimensions depending on pixels. Moreover, in the plurality of regions which control brightness in each color element, that is, in a plurality of pixels which form one color element, signals supplied to a plurality of the pixels may be slightly varied so that the viewing angle can be widened. Note that the description "one pixel (for three colors)" corresponds to the case where three pixels of R, G and B are considered as one pixel. Meanwhile, the description "one pixel (for one color)" corresponds to the case where a plurality of pixels are provided in each color element and collectively considered as one pixel.

Note also that in this specification, pixels may be provided (arranged) in matrix. Here, description that pixels are provided (arranged) in matrix includes the case where the pixels are arranged in a straight line and the case where the pixels are arranged in a jagged line, in a longitudinal direction or a lateral direction. Therefore, in the case of performing full color display with three color elements (e.g., RGB), the following cases are included therein: the case where the pixels are arranged in stripes and the case where dots of the three color elements are arranged in a so-called delta pattern. In addition, the case is also included therein in which dots of the three color elements are provided in Bayer arrangement. Note that the color elements axe not limited to three colors, and color elements of more than three colors may be employed. RGBW (W corresponds to white), RGB plus one or mote of yellow, cyan, magenta, and the like, or the like is given as an example. Further, the sizes of display regions may be different between respective dots of color elements. Thus, power consumption can be reduced and the life of a light-emitting element can be prolonged.

Note that a transistor is an element having at least three terminals of a gate, a drain, and a source. The transistor has a channel region between a drain region and a source region, and current can flow through the drain region, the channel region, and the source region. Here, since the source and the drain of the transistor may change depending on the structure, the operating condition, and the like of the transistor, it is difficult to define which is a source or a drain. Therefore, in this specification, a region functioning as a source and a drain may not be called the source or the drain. In such a case, for example, one of the source and the drain may be called a first terminal and the other thereof may be called a second terminal. Note also that a transistor may be an element having at least three terminals of a base, an emitter, and a collector. In this case also, one of the emitter and the collector may be similarly called a first terminal and the other terminal may be called a second terminal.

A gate corresponds to all or part of a gate electrode and a gate wiring (also referred to as a gate line, a gate signal line, or the like). A gate electrode corresponds to a conductive film which overlaps with a semiconductor film which forms a channel region, an LDD (lightly Doped Drain) region, or the like with a gate insulating film interposed therebetween. A gate wiring corresponds to a wiring for connecting a gate electrode of each pixel to each other or a wiring for connecting a gate electrode to another wiring.

However, there is a portion which functions as both a gate electrode and a gate wiring. Such a region may be called either a gate electrode or a gate wiring. That is, there is a region where a gate electrode and a gate wiring cannot be clearly distinguished from each other. For example, in the case where a channel region overlaps with an extended gate wiring, the overlapped region functions as both a gate wiring and a gate electrode. Accordingly, such a region may be called either a gate electrode, or a gate wiring.

In addition, a region formed of the same material as a gate electrode and connected to the gate electrode may also be called a gate electrode. Similarly, a region formed of the same material as a gate wiring and connected to the gate wiring may also be called a gate wiring. In a strict sense, such a region does not overlap with a channel region, or does not have a function of connecting the gate electrode to another gate electrode in some cases. However, there is a region formed of the same material as the gate electrode or the gate wiring and connected to the gate electrode or the gate wiring because of provision of a margin in manufacturing. Thus, such a region may also be called either a gate electrode or a gate wiring.

In a multi-gate transistor, for example, a gate electrode of one transistor is often connected to a gate electrode of another transistor by using a conductive film which is formed of the same material as the gate electrode. Since such a region is a region for connecting the gate electrode to another gate electrode, it may be called a gate wiring, and it may also be called a gate electrode because a multi-gate transistor can be considered as one transistor That is, a region which is formed of the same material as the gate electrode or the gate wiring and connected thereto may be called either a gate electrode or a gate wiring. In addition, for example, part of a conductive film which connects the gate electrode and the gate wiring may also be called either a gate electrode or a gate wiring.

Note that a gate terminal corresponds to part of a gate region or a gate electrode, or part or all of a region which is electrically connected to the gate electrode.

Note also that a source corresponds to all or part of a source region, a source electrode, and a source wiring (also referred to as a source line, a source signal line, or the like). A source region corresponds to a semiconductor region containing a large amount of p-type impurities (e.g., boron or gallium) or n-type impurities (e.g., phosphorus or arsenic). Accordingly, a region containing a small amount of p-type impurities or n-type impurities, namely, an LDD (Lightly Doped Drain) region is not included in the source region. A source electrode is part of a conductive layer formed of a material different from that of a source region, and electrically connected to the source region. However, there is the case where a source electrode and a source region are collectively called a source electrode. A source wiring is a wiring for connecting a source electrode of each pixel to each other, or a wiring for connecting a source electrode to another wiring.

However, there is a portion functioning as both a source electrode and a source wiring. Such a region may be called either a source electrode of a source wiring. That is, there is a region where a source electrode and a source wiring cannot be clearly distinguished from each other. For example, in the case where a source region overlaps with an extended source wiring, the overlapped region functions as both a source wiring and a source electrode. Accordingly, such a region may be called either a source electrode or a source wiring.

In addition, a region formed of the same material as a source electrode and connected to the source electrode, or a portion for connecting a source electrode to another source electrode may also be called a source electrode. A portion which overlaps with a source region may also be called a source electrode. Similarly, a region formed of the same material as a source wiring and connected to the source wiring may be called a source wiring. In a strict sense, such a region docs not have a function of connecting the source electrode to another source electrode in some cases. However, there is a region formed of the same, material as the source electrode or the source wiring, and connected to the source electrode or the source wiring because of provision of a margin in manufacturing. Accordingly, such a region may also be called either a source electrode or a source wiring.

In addition, for example, part of a conductive film which connects a source electrode and a source wiring may be called either a source electrode or a source wiring.

Note that a source terminal corresponds to part of a source region or a source electrode, or part or all of a region which is electrically connected to the source electrode.

Note also that the same can be said for a drain.

In this specification, a semiconductor device corresponds to a device having a circuit including a semiconductor element (e.g., a transistor or a diode). The semiconductor device may also include all devices that can function by utilizing semiconductor characteristics. In addition, a display device corresponds to a device having a display element (e.g., a liquid crystal element or a light-emitting element). Note that the display device may also corresponds to a display panel itself where a plurality of pixels including display elements such as liquid crystal elements or EL elements are formed over the same substrate as a peripheral driver circuit for driving the pixels. In addition, the display device may also include a peripheral driver circuit provided over a substrate by wire bonding or bump bonding, namely, namely, an IC chip connected by chip on glass (COG) or the like. Further, the display device may also include a flexible printed circuit (FPC) or a printed wiring board (PWB) to which an IC, a resistor, a capacitor, an inductor, a transistor or the like is attached. The display device may also include an optical sheet such as a polarizing plate or a retardation plate. Moreover, the display device may include a backlight unit (which may include a light guide plate, a prism sheet, a diffusion sheet, a reflective sheet, or a light source (e.g., an LED or a cold cathode tube)). In addition, a light-emitting device corresponds to a display device having a self-luminous display element, particularly, such as an EL element or an element used for an FED. A liquid crystal display device corresponds to a display device having a liquid crystal element.

In this specification, description that an object is "formed on" or "formed over" another object does not necessarily mean that the object is formed in direct contact with another object. The description includes the case where two objects are not in direct contact with each other, that is, the case where another object is interposed therebetween. Accordingly, for example, when it is described that a layer 6 is formed on (of over) a layer A, it includes both of the case where the layer B is formed in direct contact with the layer A, and the case where another layer (e.g., a layer C or a layer D) is formed in direct contact with the layer A and the layer B is formed in direct contact with the layer C or D. Similarly, when it is described that an object is formed above another object, it does not necessarily mean that the object is in direct contact with another object, and another object may be interposed therebetween. Accordingly, for example, when it is described that a layer B is formed above a layer A, it includes both of the case where the layer B is formed in direct contact with the layer A, and the case where another layer (e.g., a layer C or a layer D) is formed in direct contact with the layer A and the layer B is formed in direct contact with the layer C or D. Similarly, when it is described that an object is formed below or under another object, it includes both of the case where the objects are in direct contact with each other, and the case where the objects are not in contact with each other.

By using the present invention, deterioration in characteristics of a transistor can be suppressed. Therefore, a malfunction of a shift register caused by deterioration in characteristics of the transistor can be prevented. In addition, a display defect of a liquid crystal display device caused by a malfunction of the shift register can be suppressed.

BRIEF DESCRIPTION OF THE DRAWINGS

In the accompanying drawings:
FIG. 2 illustrates Embodiment Mode 1;
FIGS. 3A to 3E illustrate Embodiment Mode 1;
FIG. 28 illustrates Embodiment Mode 5;
FIGS. 29A to 29E illustrate Embodiment Mode 5;
FIGS. 61A to 61C illustrate Embodiment Mode 12;
FIGS. 64A to 64C illustrate Embodiment Mode 12.

FIGS. 77A to 77C illustrate Embodiment Mode 14;
FIGS. 79A and 79B illustrate Embodiment Mode 14;
FIGS. 80A and 80B illustrate Embodiment Mode 14;
FIGS. 81A and 81B illustrate Embodiment Mode 14;
FIGS. 83A and 83B illustrate Embodiment Mode 14;
FIGS. 84A and 84B illustrate Embodiment Mode 14;
FIGS. 100A and 100B illustrate Embodiment Mode 14;
FIGS. 105A to 105E illustrate Embodiment Mode 16.

DETAILED DESCRIPTION OF THE INVENTION

Hereinafter, the present invention will be described by way of embodiment modes with reference to the drawings. However, the present invention can be implemented in various different ways and it will be easily understood by those skilled in the art that various changes and modifications are possible. Unless such changes and modifications depart from the spirit and the scope of the present invention, they should be construed as being included therein. Therefore, the present invention should not be construed as being limited to the description of the embodiment modes.

Embodiment Mode 1

Figure 1:
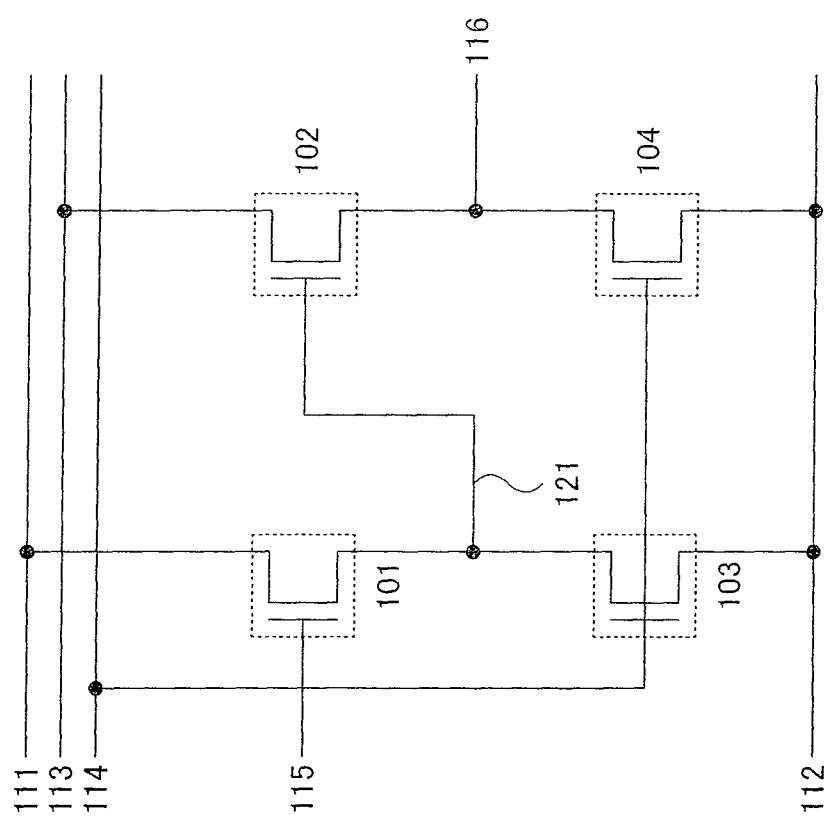
FIG. 1 illustrates Embodiment Mode 1.

In this embodiment mode, a basic structure of a shift register of a display device of the present invention is described with reference to drawings. FIG. 1 shows a flip-flop of one stage (e.g., a first stage), which is one of a plurality of flip-flops included in a shift register. The flip-flop shown in FIG. 1 includes a first transistor 101, a second transistor 102, a third transistor 103, and a fourth transistor 104. Note that the flip-flop is connected to a first wiring 111, a second wiring 112, a third wiring 113, a fourth wiring 114, a fifth wiring 115, and a sixth wiring 116. In this embodiment mode, each of the first transistor 101, the second transistor 102, the third transistor 103, and the fourth transistor 104 is an N-channel transistor and is turned on when gate-source voltage (Vgs) exceeds the threshold voltage (Vth). Note that the first wiring 111 and the second wiring 112 may be called a first power supply line and a second power supply line, respectively. In addition, the third wiring 113 and the fourth wiring 114 may be called a First signal line and a second signal line, respectively.

A first terminal (one of a source terminal and a drain terminal) of the first transistor 101 is connected to the first wiring 111; a second terminal (the other thereof) of the first transistor 101 is connected to a gate terminal of the second transistor 102; and a gate terminal of the first transistor 101 is connected to the firth wiring 115. A first terminal of the third transistor 103 is connected to the second wiring 112; a second terminal of the third transistor 103 is connected to the gate terminal of the second transistor 102; and a gate terminal of the third transistor 103 is connected to the fourth wiring 114. A first terminal of the second transistor 102 is connected to the sixth wiring 116 and a second terminal of the second transistor 102 is connected to the third wiring 113. A first terminal of the fourth transistor 104 is connected to the sixth wiring 116; a second terminal of the fourth transistor 104 is connected to the second wiring 112; and a gate terminal of the fourth transistor 104 is connected to the fourth wiring 114. Note that a connection point of the second terminal of the first transistor 101, the gate terminal of the second transistor 102, and the first terminal of the third transistor 103 is denoted by a node 121.

Note that the second terminal of the third transistor 103 and the second terminal of the fourth transistor 104 are not necessarily connected to the second wiring 112 and may be connected to different wirings. In addition, the gate terminal of the third transistor 103 and the gate terminal of the fourth transistor 104 are not necessarily connected to the fourth wiring 114 and may be connected to different wirings.

Next, operations of the flip-flop shown in FIG. 1 are described with reference to a timing chart shown in FIG. 2, and FIGS. 3A to 3E. Note that a set period, a selection period, and a non-selection period in FIG. 2 are described. Note also that the non-selection period is divided into a first non-selection period, a second non-selection period, and a third non-selection period, and the first non-selection period, the second non-selection period, and the third non-selection period axe sequentially repealed.

Note that a potential of V1 is supplied to the first wiring 111 and a potential of V2 is supplied to the second wiring 112. Note also that V1>V2 is satisfied.

Note also that the potential of V1 is not necessarily supplied to the first wiring 111. Another potential may be supplied to the first wiring 111, or a digital signal or an analog signal may be input to the first wiring 111. Further, the potential of V2 is not necessarily supplied to the second wiring 112. Another potential may be supplied to the second wiring 112, or a digital signal or an analog signal may be input to the second wiring 112.

Now that a signal is input to each of the third wiring 113, the fourth wiring 114, and the fifth wiring 115. The signal input to the third wiring 113 is a first clock signal; the signal input to the fourth wiring 114 is a second clock signal; and the signal input to the fifth wiring 115 is a start signal. In addition, the signal input to each of the third wiring 113, the fourth wiring 114, and the fifth wiring 115 is a digital signal in which a potential of an H-level signal is at V1 (hereinafter also referred to as an H level) and a potential of an L-level signal is at V2 (hereinafter also referred to as an L level).

Note also that the first clock signal is not necessarily input to the third wiring 113. Another signal may be input to the third wiring 113, or a constant potential or current may be input to the third wiring 113. In addition, the second clock signal is not necessarily input to the fourth wiring 114. Another signal may be input to the fourth wiring 114, or a constant potential or current may be input to the fourth wiring 114. Further, the start signal is not necessarily input to the fifth wiring 115. Another signal may be input to the fifth wiring 115, or a constant potential or current may be input to the fifth wiring 115.

Further, the potential of the H-level signal of the signal input to each of the third wiring 113, the fourth wiring 114, and the fifth wiring 115 is not limited to V1 and the potential of the L-level signal thereof is not limited to V2. The potentials are not particularly limited as long as the potential of the H-level signal is higher than the potential of the t-level signal.

Note that a signal is output from the sixth wiring 116. The signal output from the sixth wiring 126 is an output signal of the flip-flop and is also a start signal of the flip-flop of the next stage. In addition, the signal output from the sixth wiring 116 is input to the fifth wiring 115 of the flip-flop of the next stage. Further, the signal output from the sixth wiring 116 is a digital signal in which a potential of an H-level signal is at V1 (hereinafter also referred to as an H level) and a potential of an L-level signal is at V2 (hereinafter also referred to as an L level).

In FIG. 2, a signal 213 is a signal input to the third wiring 113; a signal 214 is a signal input to the fourth wiring 114; a signal 215 is a signal input to the fifth wiring 115; and a signal 216 is a signal output from the sixth wiring 116. In addition, a potential 221 is a potential of the node 121 in FIG. 1.

First, in the set period shown in period A of FIG. 2 and FIG. 3A, the signal 213 is at an L level, the signal 214 gets into an L level, and the signal 215 is at an H level. Therefore, the third transistor 103 and the fourth transistor 104 are turned off and the first transistor 101 is turned on. At this time, the second terminal of the First transistor 101 corresponds to the source terminal and the potential of the node 121 (the potential 221) becomes V1-Vth101 because it becomes a value obtained by subtracting the threshold voltage of the first transistor 101 (Vth101) from a potential of the fifth wiring 115. Thus, the second transistor 102 is turned on and a potential of the sixth wiring 116 becomes V2 because it becomes equal to a potential of the third wiring 113. In this manner, in the set period, an L level is output from the sixth wiring 116 while keeping the second transistor 102 on in the flip-flop.

In the selection period shown in period B of FIG. 2 and FIG. 3B, the signal 213 becomes an H level, the signal 214 remains at the L level, and the signal 215 becomes an L level. Therefore, the third transistor 103 and the fourth transistor 104 remain off and the first transistor 101 is turned off. At this time, the second terminal of the second transistor 102 corresponds to the source terminal and the potential of the sixth wiring 116 starts to rise. Since the node 121 is in a floating state, the potential of the node 121 (the potential 221) rises at the same time as the potential of the sixth wiring 116 by capacitive coupling of parasitic capacitance between the gate terminal and the second terminal of the second transistor 102 (also referred to as a bootstrap operation). Thus, the gate-source voltage Vgs of the second transistor 102 becomes Vth102+α (Vth 102 corresponds to the threshold voltage of the second transistor 102 and α corresponds to a given positive number) and the potential of the sixth wiring 116 becomes an H level (V1). In this manner, in the selection period, an H level can be output from the sixth wiring 116 by setting the potential of the node 121 to be V1+Vth102+α in the flip-flop.

In the first non-selection period shown in period C of FIG. 2 and FIG. 3C, the signal 213 gets into an L level the signal 214 gets into an H level, and the signal 215 remains at an L level Therefore, the third transistor 103 and the fourth transistor 104 are turned on and the first transistor 101 remains off. The node 121 and the sixth wiring 116 gets into an L level because a potential of the second wiring 112 is supplied to the node 121 and the sixth wiring 116 through the third transistor 103 and the fourth transistor 104, respectively.

In the second non-selection period shown in period D of FIG. 2 and FIG. 3D, the signal 213 remains at an b level, the signal 214 gets into an L level, and the signal 215 remains at an L level. Therefore, the third transistor 103 and the fourth transistor 104 are turned off and the first transistor 101 remains off. Thus, the node 121 and the sixth wiring 116 remain at an L level.

In the third non-selection period shown in period E of FIG. 2 and FIG. 3E, the signal 213 gets into an H level, and the signal 214 and the signal 215 remain at an L level Therefore, the first transistor 101, the third transistor 103, and the fourth transistor 104 remain off. Thus, the node 121 and the sixth wiring 116 remain at an L level.

As described above, since the third transistor 103 and the fourth transistor 104 are turned on only in the first non-selection period in the flip-flop in FIG. 1, deterioration in characteristics (a threshold voltage shift) of the third transistor 103 and the fourth transistor 104 can be suppressed. Note that in the flip-flop in FIG. 1, since the first transistor 101 is turned on only in the set period and the second transistor 102 is turned on only in the set period and the selection period, deterioration in characteristics of the first transistor 101 and the second transistor 102 can also be suppressed.

Further, in the flip-flop in FIG. 1, V2 is supplied to each of the node 121 and the sixth wiring 116 in the first non-selection period in the non-selection periods. Therefore, a malfunction of the flip-flop can be suppressed. This is because V2 is supplied to each of the node 121 and the sixth wiring 116 at regular intervals (in the first non-selection period) in the non-selection periods, and thus the potentials of the node 121 and the sixth wiring 116 can be stabilized at V2.

Note that in the flip-flop in FIG. 1, the first transistor 101, the second transistor 102, the third transistor 103, and the fourth transistor 104 are all N-channel transistors. Therefore, since amorphous silicon can be used for a semiconductor layer of each transistor in the flip-flop in FIG. 1, a manufacturing process can be simplified, and thus manufacturing cost can be reduced and a yield can be improved. In addition, a semiconductor device such as a large display panel can also be manufactured. Further, even when polysilicon or single crystal silicon is used for the semiconductor layer of each transistor, the manufacturing process can be simplified.

Further, since deterioration in characteristics of each transistor can be suppressed even when amorphous silicon in which characteristics easily deteriorate (the threshold voltage is easily shifted) is used for the semiconductor layer of each transistor in the flip-flop in FIG. 1, a semiconductor device such as a long-life display panel can be manufactured.

Here, functions of the first transistor 101, the second transistor 102, the third transistor 103, and the fourth transistor 104 are described. The first transistor 101 has a function of selecting timing for supplying the potential of the first wiring 111 and functions as a transistor for input. The second transistor 102 has a function of selecting timing for supplying the potential of the third wiring 113 to the sixth wiring 116 and raising the potential of the node 121 by the bootstrap operation and functions as a transistor for bootstrap. The third transistor 103 has a function of selecting timing for supplying the potential of the second wiring 112 to the node 121 and functions as a switching transistor. The fourth transistor 104 has a function of supplying the potential of the second wiring 112 to the sixth wiring 116 and functions as a switching transistor.

Note that arrangement, the number and the like of the transistors are not limited to those of FIG. 1 as long as operations which are similar to those of FIG. 1 are performed. As is apparent from FIGS. 3A to 3E which show the operations of the flip-flop in FIG. 1 in this embodiment mode, it is only necessary to have electrical continuity in the set period, the selection period, the first non-selection period, the second non-selection period, and the third non-selection period, as shown by a solid line in each of FIGS. 3A to 3E. Thus, a transistor, another element (e.g., a resistor or a capacitor), a diode, a switch, any logic circuit or the like may be additionally provided as long as a structure is employed in which a transistor or the like, is provided so as to satisfy the above-described conditions and the structure can be operated.

Figure 4:
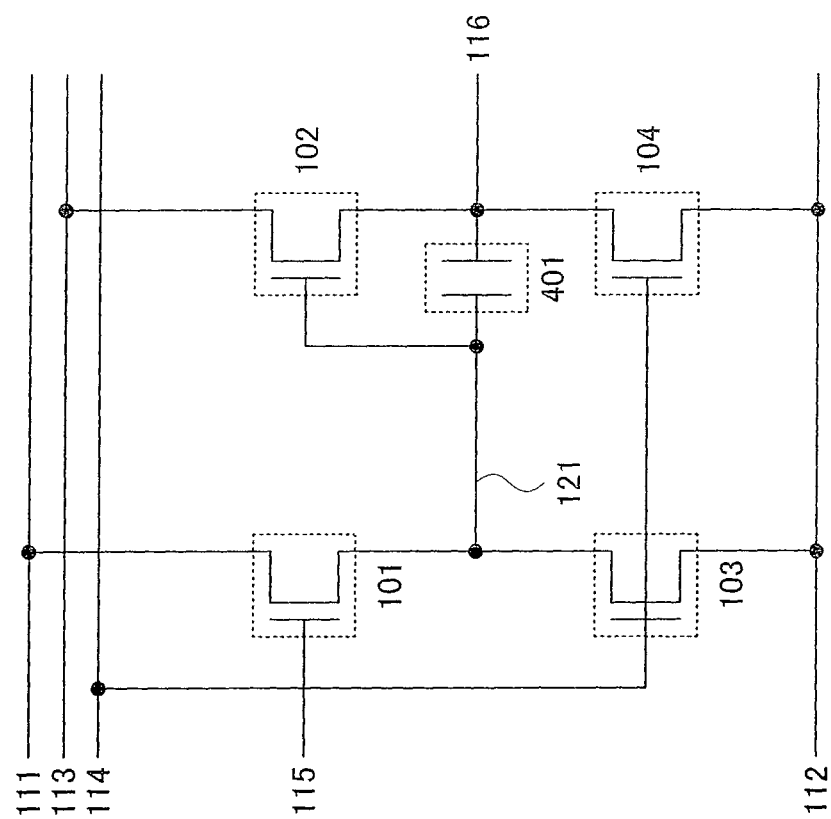
FIG. 4 illustrates Embodiment Mode 1.

For example, as shown in FIG. 4, a capacitor 401 may be provided between the gate terminal and the second terminal of the second transistor 102 shown in FIG. 1. By providing the capacitor 401, the bootstrap operation in the selection period can be performed more stably. In addition, since the parasitic capacitance between the gate terminal and the second terminal of the second transistor 102 can be reduced, each transistor can be switched at high speed. Note that in the capacitor 401, a gate insulating film may be used as an insulating layer and a gate electrode layer and a wiring layer may be used as conductive layers; a gate insulating film may be used as the insulating layer and a gate electrode layer and a semiconductor layer to which an impurity is added may be used as the conductive layers; or an interlayer film (an insulating film) may be used as the insulating layer and a wiring layer and a transparent electrode layer may be used as the conductive layers. Note that portions which are common to those in FIG. 1 are denoted by common reference numerals and description thereof is omitted.

Figure 5:
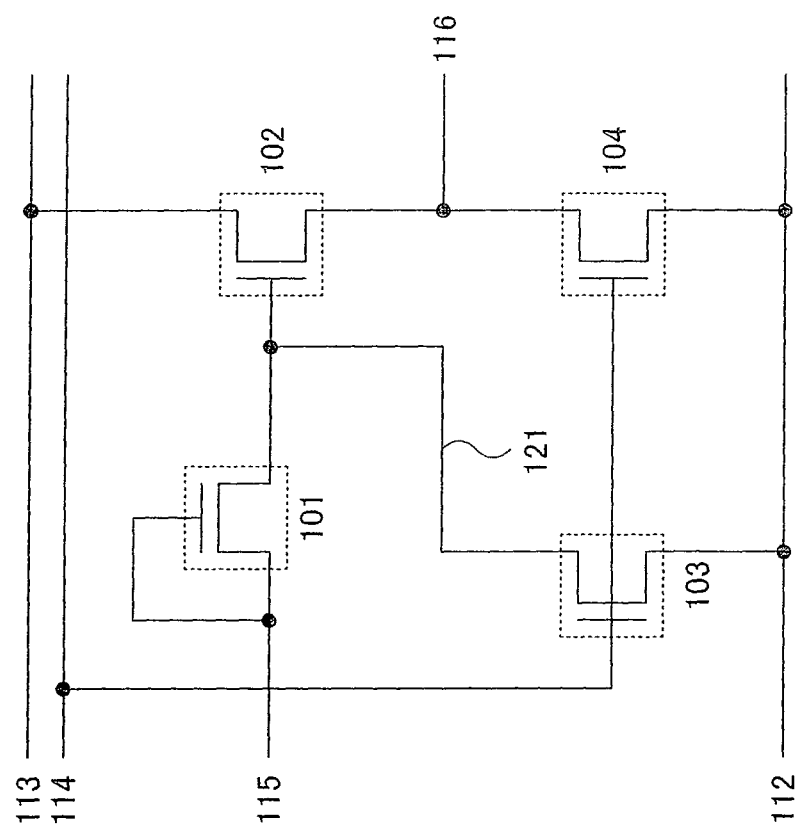
FIG. 5 illustrates Embodiment Mode 1.

Operations which are similar to those of FIG. 1 can also be performed in a flip-flop in FIG. 5. As shown in FIG. 5, the first transistor 101 shown in FIG. 1 may be diode-connected. The first transistor 101 is diode-connected, and thus the first wiring 111 is not necessary. Thus, one wiring and one power source, potential (V1) can be eliminated from the structure. Note that portions which are common to those in FIG. 1 are denoted by common reference numerals and description thereof is omitted.

Next, a shift register including the flip-flop of this embodiment mode is described with reference to FIG. 6.

The shift register includes a first firing 611, a second wiring 612, a third wiring 613, a fourth wiring 614, a fifth wiring 615, a sixth wiring 616, wirings 622_1 to 622×n, and flip-flops 601_1 to 601_n of n stages. A flip-flop 601 of a (1+3N)th stage (N corresponds to 0 or a positive number) is connected to the first wiring 611, the second wiring 612, the third wiring 613, and the fourth wiring 614. The flip-flop 601 of a (2+3N)th stage is connected to the first wiring 611, the second wiring 612, the fourth wiring 614, and the fifth wiring 615. The flip-flop 601 of a (3+3N)th stage is connected to the first wiring 611, the second wiring 612, the fifth wiring 615, and the third wiring 613. In addition, for example, the flip-flop 601_2 to a flip-flop 601_n–1 as a flip-flop 601_i of an i-th stage (any one of the flip-flops 601_1 to 601_n) are connected to a flip-flop 601_i–1 of an (i–1)th stage and a flip-flop 601_1 of an (i+1)th stage, and a connection point of the flip-flop 601_i of the i-th stage and the flip-flop 601_i+1 of the (i+1)th stage is connected to a wiring 622_i (any one of the wirings 622_1 to 622_n). Note that the flip-flop 601_1 of the first stage is connected to the sixth wiring 616 and the flip flop 601_2 of the second stage, and a connection point of the flip-flop 601_1 of the first stage and the flip-flop 601_2 of the second stage is connected to the wiring 622_1. Note also that the flip-flop 601_n of the n-th stage is connected to a flip-flop 601_n–1 of an (n–1)th stage and the wiring 622_n.

Note that in the flip-flop 601 of the (+3N)th stage, the first wiring 611, the second wiring 612, the third wiring 613, and the fourth wiring 614 are connected to the first wiring 111, the second wiring 112, the third wiring 113, and the fourth wiring 114 in FIG. 1, respectively. In the flip-flop 601 of the (2+3N)th stage, the first wiring 611, the second wiring 612, the fourth wiring 614, and the fifth wiring 615 are connected to the first wiring ill, the second wiring 112, the third wiring 113, and the fourth wiring 114 in FIG. 1, respectively. In the flip-flop 601 of the (3+3N)th stage, the first wiring 611, the second wiring 612, the fifth wiring 615, and the third wiring 613 are connected to the first wiring 111, the second wiring 112, the third wiring 113, and the fourth wiring 114 in FIG. 1, respectively. In addition, for example, in the flip-flop 601_i of the i-th stage, the fifth wiring 115 and the sixth wiring 116 shown in FIG. 1 of each of the flip-flop 601_2 to the flip-flop 601_n–1 are connected to the sixth wiring 116 shown in FIG. 1 of the flip-flop 601_i–1 of the (i–1)th stage and the fifth wiring 115 shown in FIG. 1 of the flip-flop 601_i+1 of the (i+1)th stage, respectively. Note also that the Fifth wiring 115 and the sixth wiring 116 shown in FIG. 1 of the flip-flop 601_1 of the first stage are connected to the sixth wiring 616 shown in FIG. 6 and the fifth wiring 115 shown in FIG. 1 of the flip-flop 601_2 of the second stage, respectively. Note also that the fifth wiring 115 and the sixth wiring 116 shown in FIG. 1 of the flip-flop 601_n of the n-th stage are connected to the sixth wiring 116 shown in FIG. 1 of the flip-flop 601_n–1 of the (n–1)th stage and the wiring 622_n shown in FIG. 6, respectively.

Figure 6:
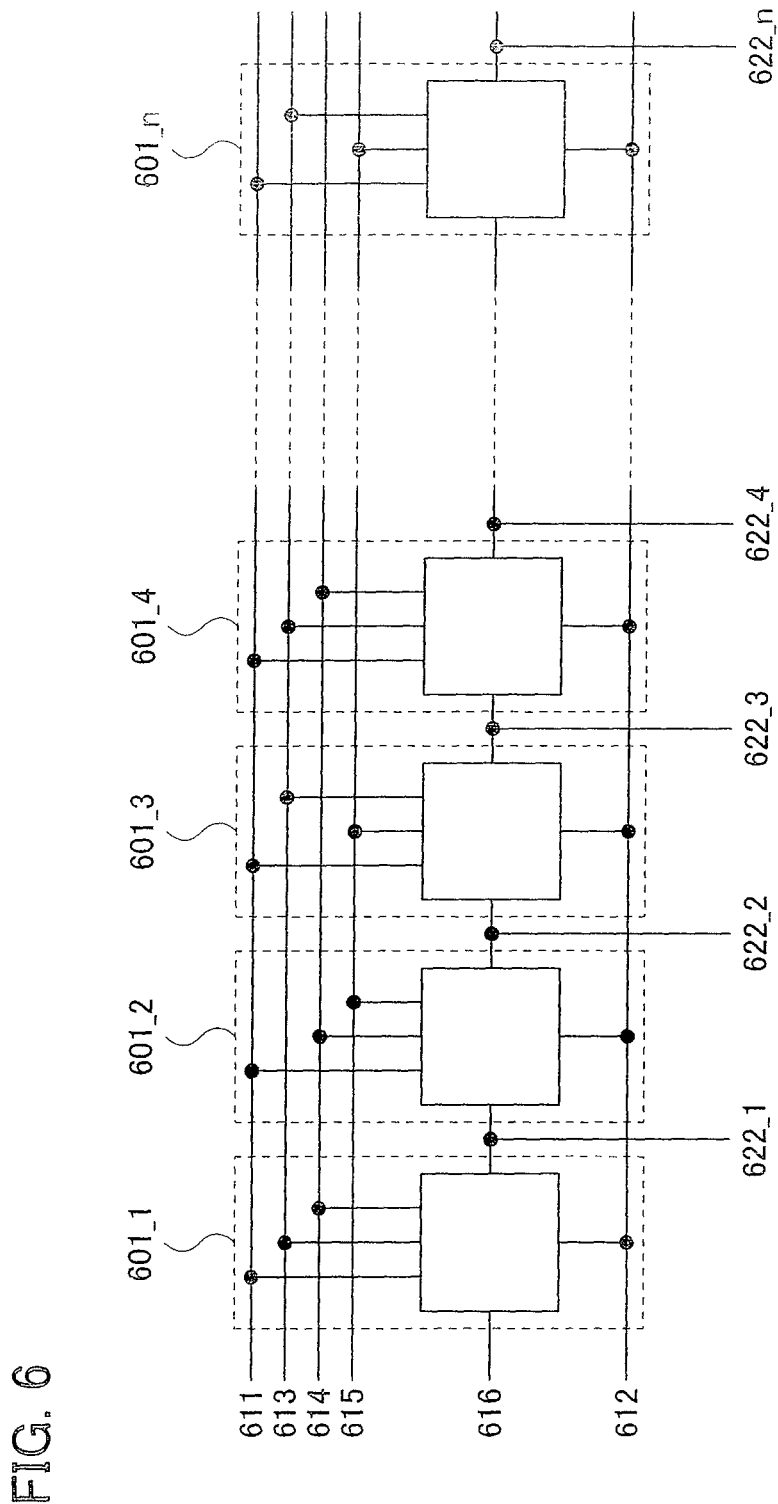
FIG. 6 illustrates Embodiment Mode 1.
Figure 92:
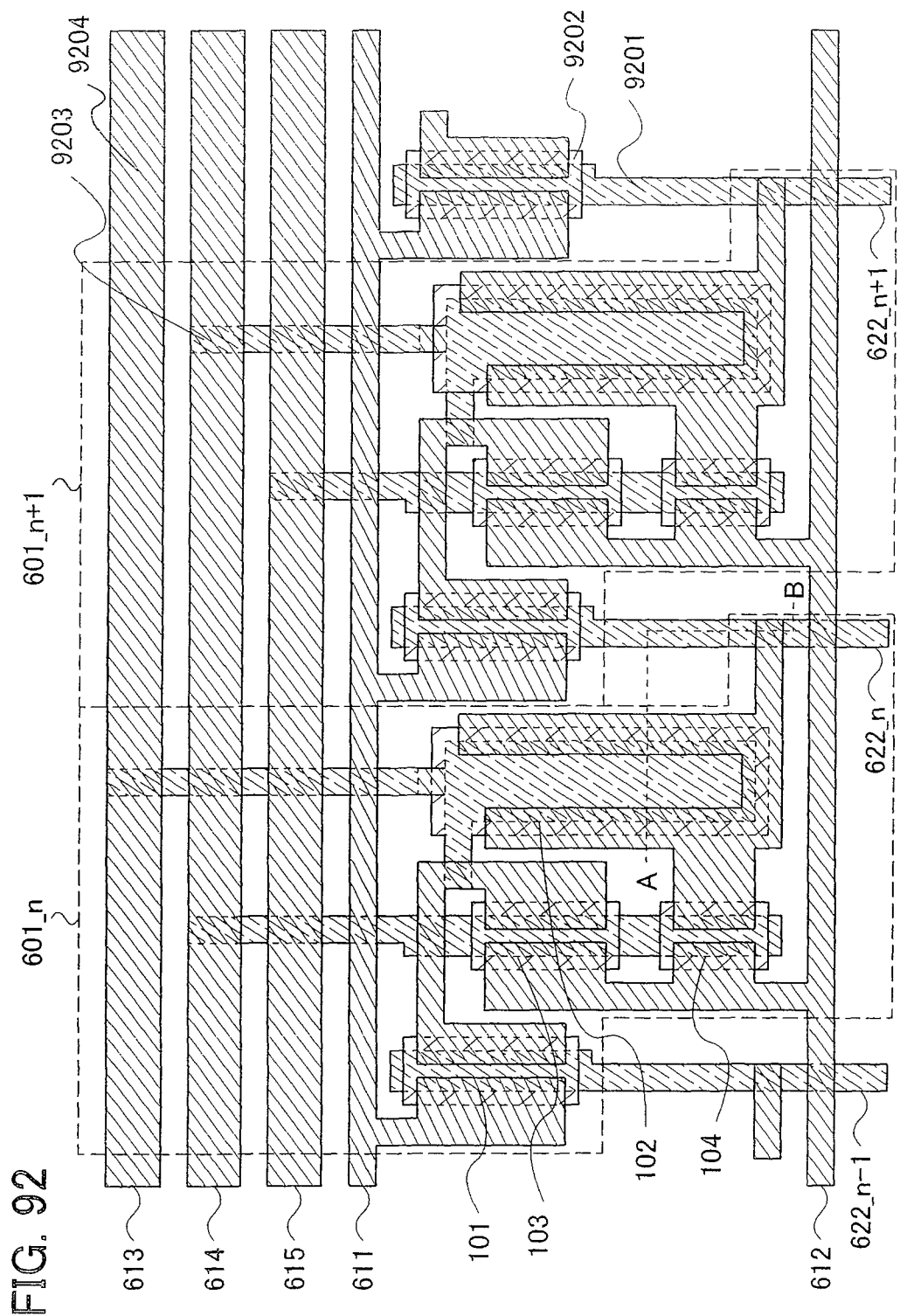
FIG. 92 illustrates Embodiment Mode 1.

Next, FIG. 92 shows one mode of a top plan view of the shift register shown in FIG. 6. Note that the shift register shown in FIG. 92 is a shift register in the case, of using the flip-flop in FIG. 1, and the flip-flop 601_n of the n-th stage and the flip-flop 601_n+1 of the (n+1)th stage are shown. Each of the flip-flops included in the shift register in FIG. 92 includes the first transistor 101, the second transistor 102, the third transistor 103, and the fourth transistor 104. In addition, the flip-flops included in the shift register in FIG. 92 are connected to the first wiring 611, the second wiring 612, the third wiring 613, the fourth wiring 614, and the fifth wiring 615. Note that each of the first transistor 101, the second transistor 102, the third transistor 103, and the fourth transistor 104 is an inversely staggered transistor and is described as a channel-etched type transistor. Note also that each of the first transistor 103, the second transistor 102, the third transistor 103, and the fourth transistor 104 may be a channel-protected type. Alternatively, each of the first transistor 101, the second transistor 102, the third transistor 103, and the fourth transistor 104 may be a top-gate transistor.

In addition, a layout diagram of the shift register shown in FIG. 92 includes a first conductive film 9201, a semiconductor layer 9202, a contact 9203, and a second conductive film 9204. Note that the first conductive film 9201 functions as a gate electrode. The semiconductor layer 9202 is an intrinsic non-crystalline semiconductor film in which an impurity is not included. The contact 9203 electrically connects the first conductive film 9201 and the second conductive film 9204.

In the shift register in FIG. 92, wiring width of the first wiring 611 can be made smaller than wiring width of the third wiring 613, wiring width of the fourth wiring 614, and wiring width of the fifth wiring 615. This is because the amount of current flowing through the first wiring 611 is smaller than the amount of current flowing through the third wiring 613, the fourth wiring 614, and the fifth wiring 615, so that operations of the shift register are hardly adversely affected even when the wiring width of the first wiring 611 is made smaller. Similarly, in the shift register in FIG. 92, wiring width of the second wiring 612 can be made smaller than the wiring width of the third wiring 613, the wiring width of the fourth wiring 614, and the wiring width of the fifth wiring 615. Note that since the amount of current flowing through the second wiring 612 is larger than the amount of the current flowing through the first wiring 611, it is preferable that the wiring width of the second wiring 612 is larger than the wiring width of the first wiring 611. Therefore, in the shift register in FIG. 92, pitch of the flip-flop fat one stage can be made small. In addition, in the shift register in FIG. 92, each transistor can be efficiently provided. Further, in the shift register in FIG. 92, channel width of each transistor can be made large.

Further, in the shift register in FIG. 92, a bootstrap operation can be easily performed by making the channel width of the second transistor 102 large. This is because when the channel width of the second transistor 102 is large, the parasitic, capacitance between the gate terminal and the second terminal of the second transistor 102 becomes large. Furthermore, in the shift register in FIG. 92, high drive capability cart be obtained by making the channel width of the second transistor 102 large. This is because when the channel width of the second transistor 102 is large, current supply capability of the second transistor 102 becomes high. Note that as described above, in the shift register in FIG. 92, an area where each transistor can be provided can be increased by making the wiring width of the first wiring 611 and the second wiring 612 small. In that case, in the shift register in FIG. 92, higher drive capability can be obtained by preferentially making the channel width of the second transistor 102 large. Therefore, it is preferable that the channel width of the second transistor 102 be made larger than the channel width of the first transistor 101, the channel width of the third transistor 103, and the channel width of the fourth wiring 104.

Moreover, in the shift register in FIG. 92, the channel width of the second transistor 102 can be made large by forming a channel of the second transistor 102 with a U-shape.

Characteristics of the layout diagram shown in FIG. 92 can also be applied to other shift registers.

Next, operations of the shift register shown in FIG. 6 are described with reference to a timing chart shown in FIG. 7.

Note that the potential of V1 is supplied to the first wiring 611 and the potential of V2 is supplied to the second wiring 612. Note also that V1>V2 is satisfied.

Note also that the potential of V1 is not necessarily supplied to the first wiring 611. Another potential may be supplied to the first wiring 611, or a digital signal or an analog signal may be input to the first wiring 611. Further, the potential of V2 is not necessarily supplied to the second wiring 612. Another potential may be supplied to the second wiring 612, or a digital signal or an analog signal may be input to the second wiring 612.

Note that a signal is input to each of the third wiring 613, the fourth wiring 614, the fifth wiring 615, the sixth wiring 616. The signals input to the third wiring 613, the fourth wiring 614, and the sixth wiring 615 are clock signals having three phases which are shifted by 120 degrees. The signal input to the sixth wiring 616 is a start signal. In addition, the signal input to each of the third wiring 613, the fourth wiring 614, the fifth wiring 615, and the sixth wiring 616 is a digital signal in which a potential of an H-level signal is at V1 and a potential of an L-level signal is at V2.

Note also that the clock signals having three phases which are shifted by 120 degrees are not necessarily input to the third wiring 613, the fourth wiring 614, and the fifth wiring 615. Another signal may be input to each of the third wiring 613, the fourth wiring 614, and the fifth wiring 615, or a constant potential or current may be input to each of the third wiring 613, the fourth wiring 614, and the fifth wiring 615. In addition, the start signal is not necessarily input to the sixth wiring 616. Another signal may be input to the sixth wiring 616, or a constant potential or current may be input to the sixth wiring 616.

Further, the potential of the H-level signal of the signals input to each of the third wiring 613, the fourth wiring 614, the fifth wiring 615, and the sixth wiring 616 is not limited to V1 and the potential of the L-level signal thereof is not limited to V2. The potentials are not particularly limited us long as the potential of the H-level signal is higher than the potential of the L-level signal.

Note that a signal is output from the wiring 622. For example, a signal output from the wiring 622_$i$ (i corresponds to a given positive number) is an output signal of the flip-flop 601_$i$ of the i-th stage and is also an input signal of the flip-flop 601_$i$+1 of the (i+1)th stage.

Figure 7:
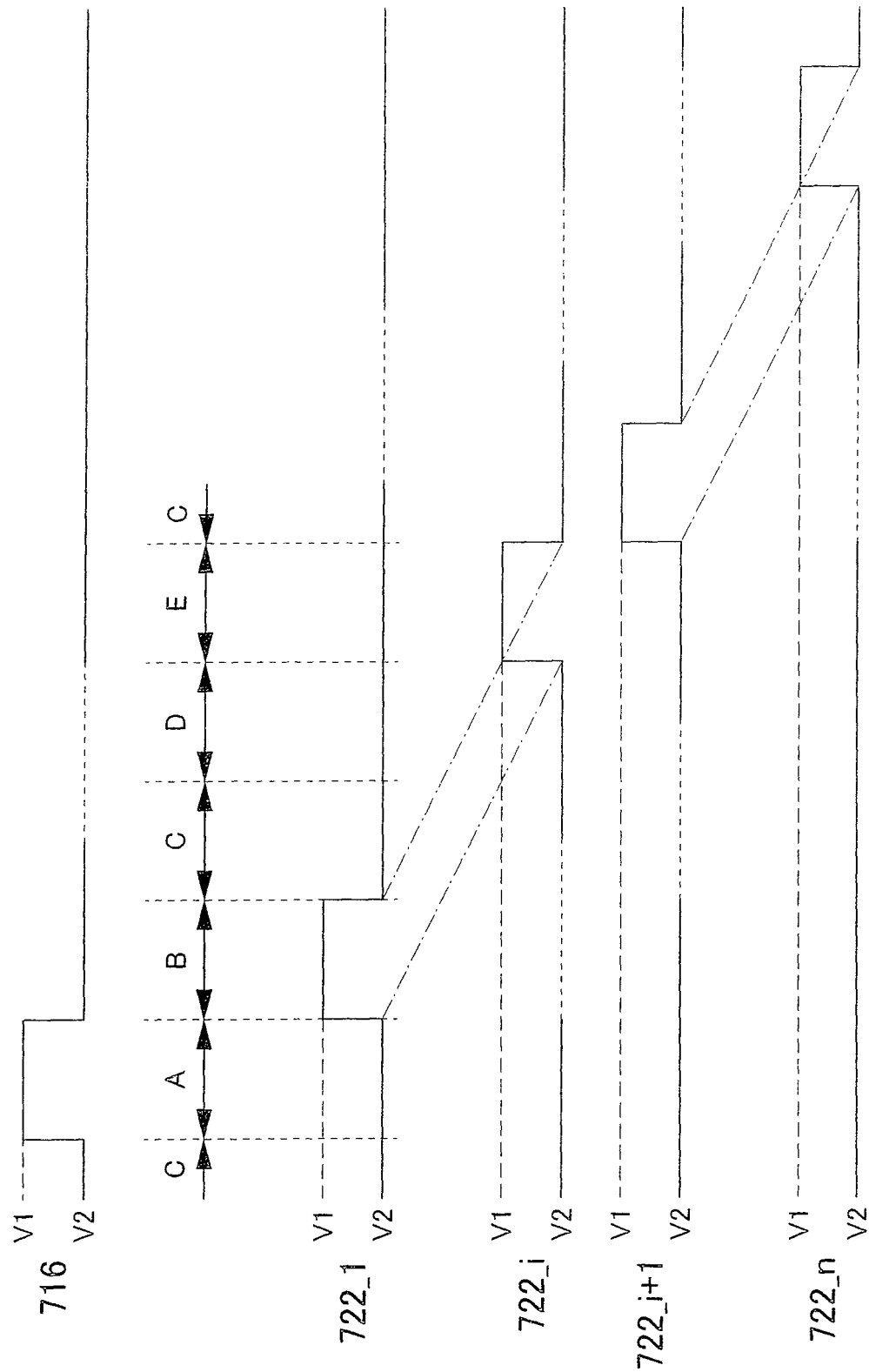
FIG. 7 illustrates Embodiment Mode 1.

In FIG. 7, a signal 716 is a signal input to the sixth wiring 616. In addition, a signal 722_1, a signal 722_$i$, a signal 722_$i$+1, and a signal 722_$n$ are signals output from the wiring 622 of a first stage, the wiring 622 of an i-th stage, the wiring 622 of an (i+1)th stage, and the wiring 622 of an n-th stage (potentials of the wiring 622), respectively.

As shown in FIG. 7, for example, when the flip-flop 601_$i$ of the i-th stage enters a selection period, the H-level signal (722_$i$) is output to the wiring 622_$i$ of an i-th row. At this time, the flip-flop 601_$i$+1 of the (i+1)th stage gets into a set period and an L-level signal is output to the wiring 622_$i$+1. After that, the flip-flop 601_$i$ of the i-th stage gets into a first non-selection period and an L-level signal is output to the wiring 622_$i$ of the i-th row. At this time, the flip-flop 601_$i$+1 of the (i+1)th stage enters the selection period and an H-level signal is output to the wiring 622_$i$+1. After that, the flip-Hop 601_$i$ of the i-th stage esters a second non-selection period and the wiring 622_$i$ gets into a floating state while being kept at an L level. At this time, the flip-flop 601_$i$+1 of the (i+1)th stage enters the first non-selection period and an L-level signal is output to the wiring 622_$i$+1. After that, the flip-flop 601_$i$ of the i-th stage enters a third non-selection period and the wiring 622_$i$ is kept in the floating state while being kept at an L level. At this time, the flip-flop 601_$i$+1 of the (i+1)th stage enters the second non-selection period and the wiring 622_$i$ gets into a floating state while being kept at an L level After that, in the flip-flop 601_$i$ of the i-th stage, the first non-selection period, the second non-selection period, and the third non-selection period are sequentially repeated until the next set period. Similarly, in the flip-flop 601_$i$+1 of the (i+1)th stage, the third non-selection period, the first non-selection period, and the second non-selection period are sequentially repeated until the next set period (the selection period of the flip-flop 601_i of the i-th stage).

As described above, since the three-phase clock signals can be used in the shift register in FIG. 6, the number of rises or falls can be reduced and power can be saved. In addition, since the number of stages of the flip-flops 601 connected to each dock signal line (each of the third wiring 613, the fourth wiring 614, and the fifth wiring 615) is reduced to two-third that of the case of using single-phase clock signals in each of the shift registers of this embodiment mode, a load of each clock signal line can be reduced.

Figure 8:
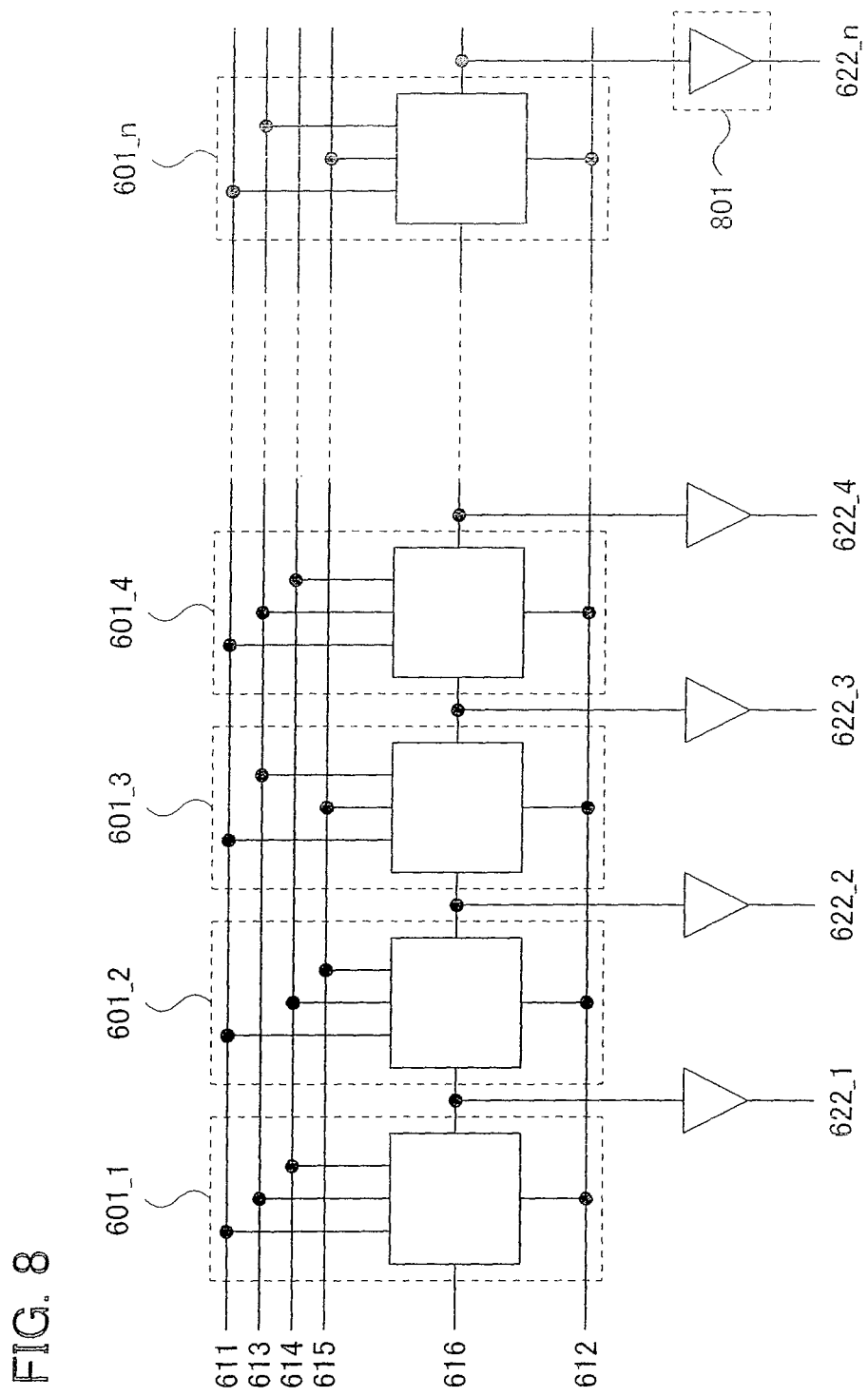
FIG. 8 illustrates Embodiment Mode 1.

Note that in the shift register in FIG. 6, an output signal of the flip-flop 601 of each stage may be output to the wiring 622 of each stage through a buffer. FIG. 8 shorn such a structure. Since the flip-flop 601 of each stage is connected to the wiring 622 of each stage through a buffer 801 in a shift register in FIG. 8, a wide margin at the time of operation can be obtained. This is because operations of the shift register are not adversely affected even when a large load is connected to the wiring 622 and delay or waveform dullness occurs in a signal of the wiring 622. Note that a logic circuit such as an inverter, a NAND, or a NOR, an operational amplifier or the like, or a circuit in which these are combined can be used as the buffer 801.

Next, a display device including the shift register of this embodiment mode is described with reference to FIG. 9.

The display device, includes a signal line driver circuit 901, a scan line driver circuit 902, and a pixel portion 903. The pixel portion 903 includes a plurality of signal lines S1 to Sm extended from the signal line driver circuit 901 in a column direction, a plurality of scan lines G1 to Gn extended from the scan line driver circuit 902 in a row direction, and a plurality of pixels 904 arranged in matrix in accordance with the signal lines S1 to Sm and the scan lines G1 to Gn. In addition, each of the pixels 904 is connected to a signal line Sj (any one of the signal lines S1 to Sm) and a scan line Gi (any one of the scan lines G1 to Gn).

Note that the scan lines G1 to Gn correspond to the wirings 622_1 to 622_n in FIGS. 6 and 8.

Note that a wiring or an electrode is formed to have one element or a plurality of elements selected from a group of aluminum (Al), tantalum (Ta), titanium (Ti), molybdenum (Mo), tungsten (W), neodymium (Nd), chromium (Cr), nickel (Ni), platinum (Pt), gold (An), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O), or a compound or an alloy material including one or a plurality of the elements selected from the above-described group as a component (e.g., indium tin oxide (ITO), indium zinc oxide (IZO), indium tin oxide to which silicon oxide is added (ITSO), zinc oxide (ZnO), aluminum neodymium (Al—Nd), or magnesium silver (Mg—Ag)), a substance in which these compounds are combined, or the like. Alternatively, the wiring or the electrode is formed to have a compound of silicon and any one of the above-described materials (silicide) (e.g., aluminum silicon, molybdenum silicon, or nickel silicide) or a compound of nitrogen and any one of the above-described materials (e.g., titanium nitride, tantalum nitride, or molybdenum nitride). Note also that a large amount of n-type impurities (e.g., phosphorus) or p-type impurities (e.g., boron) may be included in silicon (Si). By including the impurities, conductivity is improved and behavior similar to a normal conductor is exhibited, so that the wiring or the electrode can be easily utilized as a wiring or art electrode. Silicon may be single crystal silicon, polycrystal line silicon (polysilicon), or amorphous silicon. When single crystal silicon or polycrystalline silicon is used, resistance can be reduced. When amorphous silicon is used, the wiring or the electrode can be manufactured with a simple manufacturing process. Since aluminum and silver have high conductivity, signal delay can be reduced. In addition, aluminum and silver are easily etched and patterned, so that minute processing can be performed. Since copper has high conductivity, signal delay can be reduced. Molybdenum is preferable because it can be manufactured without causing a problem such as a material defect even when molybdenum is in contact with an oxide semiconductor such as ITO or IZO or silicon, patterning and etching are easily performed, and heat resistance is high. Titanium is preferable because it can be manufactured without causing a problem such as a material defect even when titanium is in contact with an oxide semiconductor such as ITO or IZO or silicon, and heat resistance is high. Tungsten is preferable because heat resistance is high. Neodymium is preferable because heat resistance is high, in particular, it is preferable, to use an alloy of neodymium and aluminum because heat resistance is improved and a hillock does not easily generated in aluminum. Silicon is preferable because it can be formed at the same time as a semiconductor layer included in a transistor and heat resistance is high. Indium tin oxide (ITO), indium zinc oxide (IZO), indium tin oxide to which silicon oxide is added (ITSO), zinc oxide (ZnO), and silicon (Si) are preferable because these materials have light-transmitting properties and can be used for a portion which transmits light. For example, these materials can be used for a pixel electrode or a common electrode.

Note that a wiring or an electrode may be formed of any one of the above-described material with a single-layer structure or a multi-layer structure. By forming the wiring or the electrode with a single-layer structure, a manufacturing process can be simplified, processing time can be shortened, and cost can be reduced. Alternatively, by forming the wiring or the electrode with a multi-layer structure, an advantage of each material is utilized and a disadvantage of one of the materials is reduced by using another material, so that a wiring or an electrode with high performance can be formed. For example, by including a material with low resistance (e.g., aluminum) in a multi-layer structure, resistance in the wiring can be reduced. In addition, by including a material with high heat resistance, for example, by employing a stacked-layer structure in which a material with low heat resistance and having a different advantage is sandwiched by materials with high heat resistance, heat resistance in the wiring or the electrode as a whole can be improved. For example, a stacked-layer structure in winch a layer including aluminum is sandwiched with layers including molybdenum or titanium is preferable. Further, when there is a portion which is in direct contact with a wiring, an electrode, or the like formed of another material, the portion and the wiring, the electrode, or the like formed of another material may adversely affect, each other. For example, in some cases, one material enters the other material and changes properties thereof, so that an original purpose cannot be achieved, or a problem in manufacturing may occurs, so that normal manufacturing cannot be performed. In such a case, by sandwiching or covering a certain layer with different layers, the problem can be solved. For example, when indium tin oxide (ITO) is to be in contact with aluminum, it is preferable to interpose titanium or molybdenum therebetween. Moreover, when silicon is to be in contact with aluminum, it is preferable to interpose titanium or molybdenum therebetween.

Note that the wiring or the electrode described above can also be applied w other display devices and shift registers.

Note also that the signal line driver circuit 901 inputs a potential or current in accordance with a video signal to each of the signal lines S1 to Sm. In addition, the signal line driver circuit 901 is not necessarily formed over the same substrate as the pixel portion 903. The signal line driver circuit 901 may be formed on a single crystal substrate such as an IC. Alternatively, part of the signal line driver circuit 901 may be formed over the same substrate as the pixel portion 903 and the rest of the signal line driver circuit 901 may be formed on a single crystal substrate such as an IC.

Note that the scan line driver circuit 902 inputs a signal to each of the scan line G1 to Gn and sequentially selects (hereinafter also referred to as scans) the scan lines G1 to Gn starting from a first row. A plurality of the pixels 904 connected to the selected scan lines are selected at the same time. Note also that a period in which one scan line is selected is called one gate selection period and a period in which one scan line is not selected is called a non-selection period. In addition, the shift register shown in FIG. 6 or FIG. 8 can be employed as the scan line driver circuit 902. Further, the scan line driver circuit 902 is formed over the same substrate as live pixel portion 903.

Note also that a potential or current in accordance with a video signal is input to the pixel 904 from the signal line driver circuit 901 through the signal line when the pixel 904 is selected. However, when the pixel 904 is not selected, a potential or current in accordance with a video signal is not input to the pixel 904.

Figure 9:
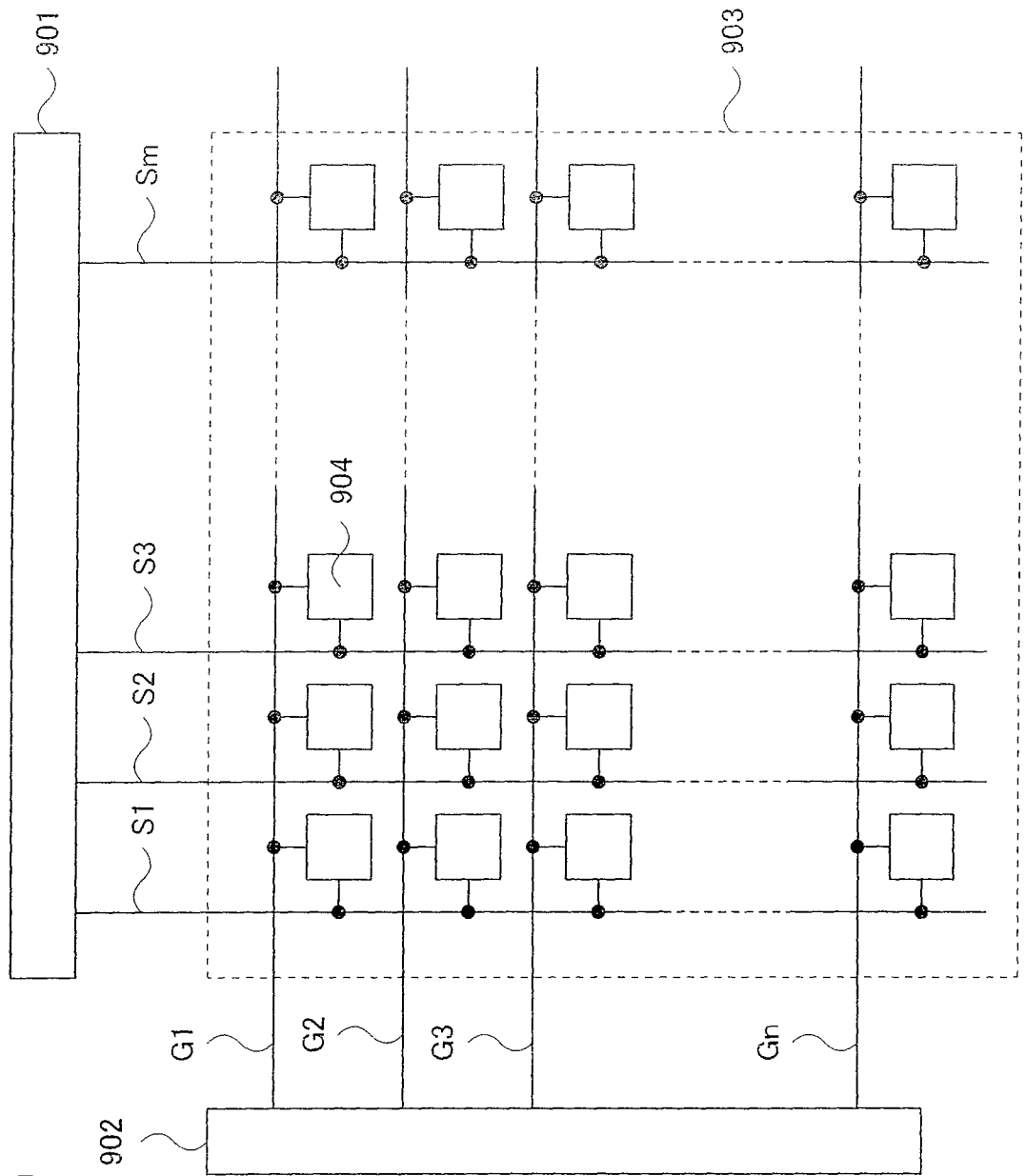
FIG. 9 illustrates Embodiment Mode 1.
Figure 10:
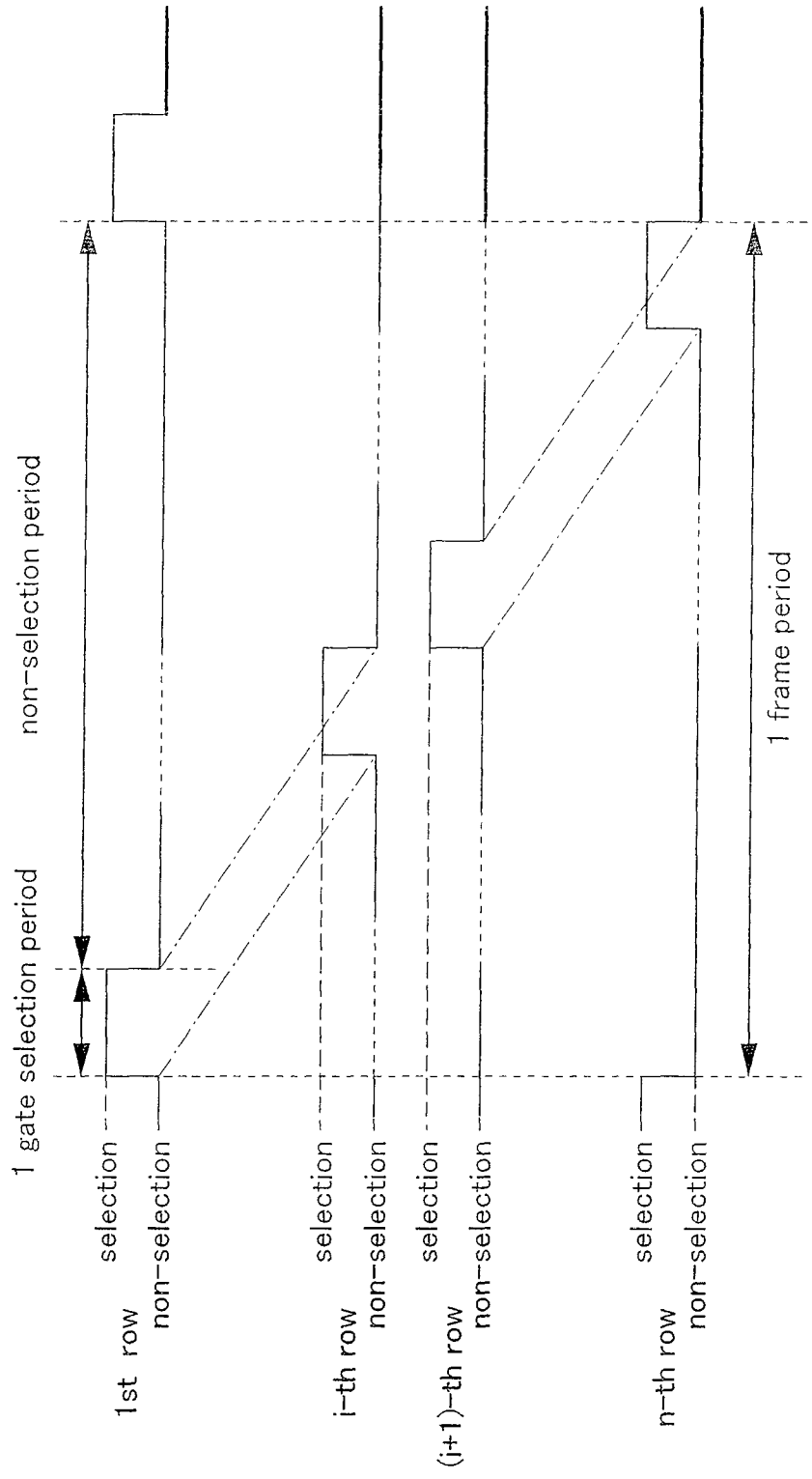
FIG. 10 illustrates Embodiment Mode 1.

Next, operations of the display device shown in FIG. 9 are described with reference to a timing chart in FIG. 10. Note that FIG. 10 shows one frame period which corresponds to a period for displaying an image for one screen. Note that although one frame period is not particularly limited, it is preferable that one frame period be 1/60 second or less so that a person viewing an image does not perceive a flicker.

Note that the tuning chart in FIG. 10 shows selection timing of each of the scan line G1 of a first row, the scan line Gi of an i-th row, the scan line Gi+1 of an (i+1)th row, and the scan line Gn of an n-th row.

In FIG. 10, for example, the scan line Gi of the i-th row is selected and a plurality of the pixels 904 connected to the scan line Gi are selected. Then, a video signal is written to each of a plurality of the pixels 904 connected to the scan line Gi, and luminance or transmittivity of each display element becomes a value which is in accordance with the video signal. After that, when the scan line Gi of the i-th row is not selected, the scan line Gi+1 of the (i+1)th row is selected and a plurality of the pixels 904 connected to the scan line Gi+1 are selected. Then, a video signal is written to each of a plurality of the pixels 904 connected to the scan line Gi+1, and luminance or transmittivity of each display element becomes a value which is in accordance with the video signal. Note that since each of the pixels 904 holds the written video signal when it is not selected, each display element keeps luminance or transmittivity in accordance with the video signal.

As described above, each of the scan lines G1 to Gn is selected in one gate selection period in one frame period, and each of the scan lines G1 so Gn enters a non-selection period in periods other than the one gate selection period and is not selected. Since length of the one gate selection period is approximately equal in length to length of the one frame period divided by n, almost all of the one frame period is the non-selection period. That is, in the case of employing the shift register shown in FIG. 6 or FIG. 8 as the scan line driver circuit 902, the first non-selection period, the second non-selection period, and the third non-selection period are sequentially repeated in almost all of one frame period in each of the flip-flops 601_1 to 601_i shown in FIG. 6 and FIG. 8. Therefore, since the scan line driver circuit 902 can suppress deterioration of the transistor included in each of the flip-flops 601_1 to 601_i shown in FIG. 6 or FIG. 8, the life of the scan line driver circuit 902 can be extended. Further, the life of the display device in FIG. 9 in which the long life scan line driver circuit 902 and the pixel portion 903 are formed over the same substrate can be extended.

Note that the number, arrangement, and the like of each driver circuit are not limited to those of FIG. 9 as long as a pixel is selected and a video signal can be written to the pixel as shown in FIG. 9.

Figure 11:
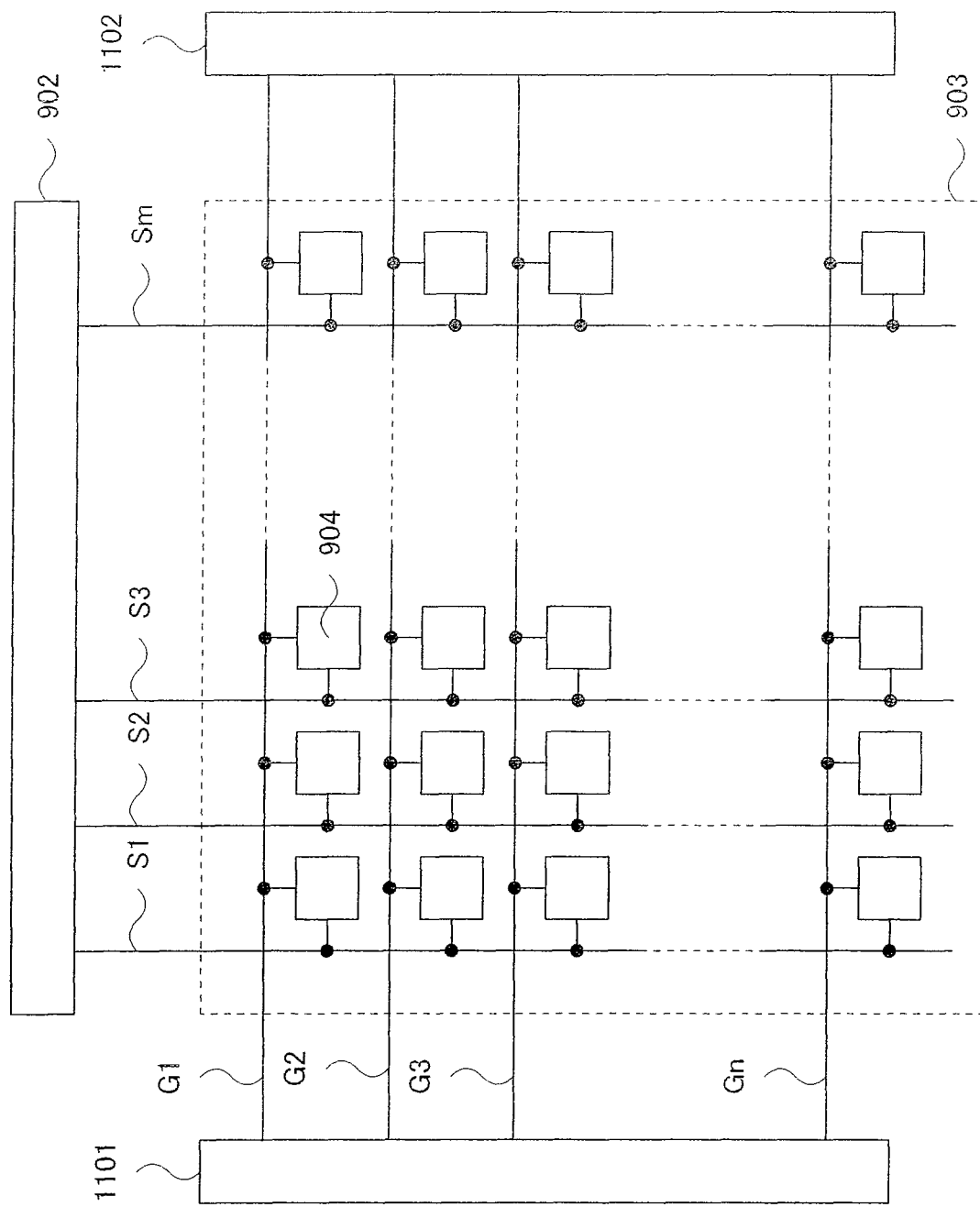
FIG. 11 illustrates Embodiment Mode 1.

For example, as shown in FIG. 11, the scan lines G1 to Gn may be scanned with a first scan line driver circuit 1101 and a second scan line driver circuit 1102. Note that each of the first scan line driver circuit 1101 and the second scan line driver circuit 1102 has a structure which is similar to that of the scan line driver circuit 902 shown in FIG. 9 and scans the scan lines G1 to Gn with the same timing. By scanning the scan lines G1 to Gn with the first scan line driver circuit 1101 and the second scan line driver circuit 1102, delay or dullness of a signal output to each of the scan lines G1 to Gn can be reduced and the scan lines G1 to Gn are scanned at high speed, that is, the display device in FIG. 11 can be made large because delay or dullness of a signal output to each of the scan lines G1 to Gn is reduced even when a panel size is increased and wiring resistance or parasitic capacitance of the scan lines G1 to Gn is increased, in addition, although it is necessary that the scan lines G1 to Gn be scanned at high speed due to increase in the panel size or increase in the number of the pixels because of making the panel high definition, the display device in FIG. 11 can be made large and can achieve high definition because the scan lines G1 to Gn can be scanned at high speed. Further, even when a defect occurs in one of the first scan line driver circuit 1101 and the second scan line driver circuit 1102, the scan lines G1 to Gn of the other thereof can be scanned. Therefore, the display device in FIG. 11 can have redundancy. Note that portions which are common to those in FIG. 9 are denoted by common reference numerals and description thereof is omitted. Note also that similarly to FIG. 9, the timing chart in FIG. 10 can be used for the display device in FIG. 11.

Figure 12:
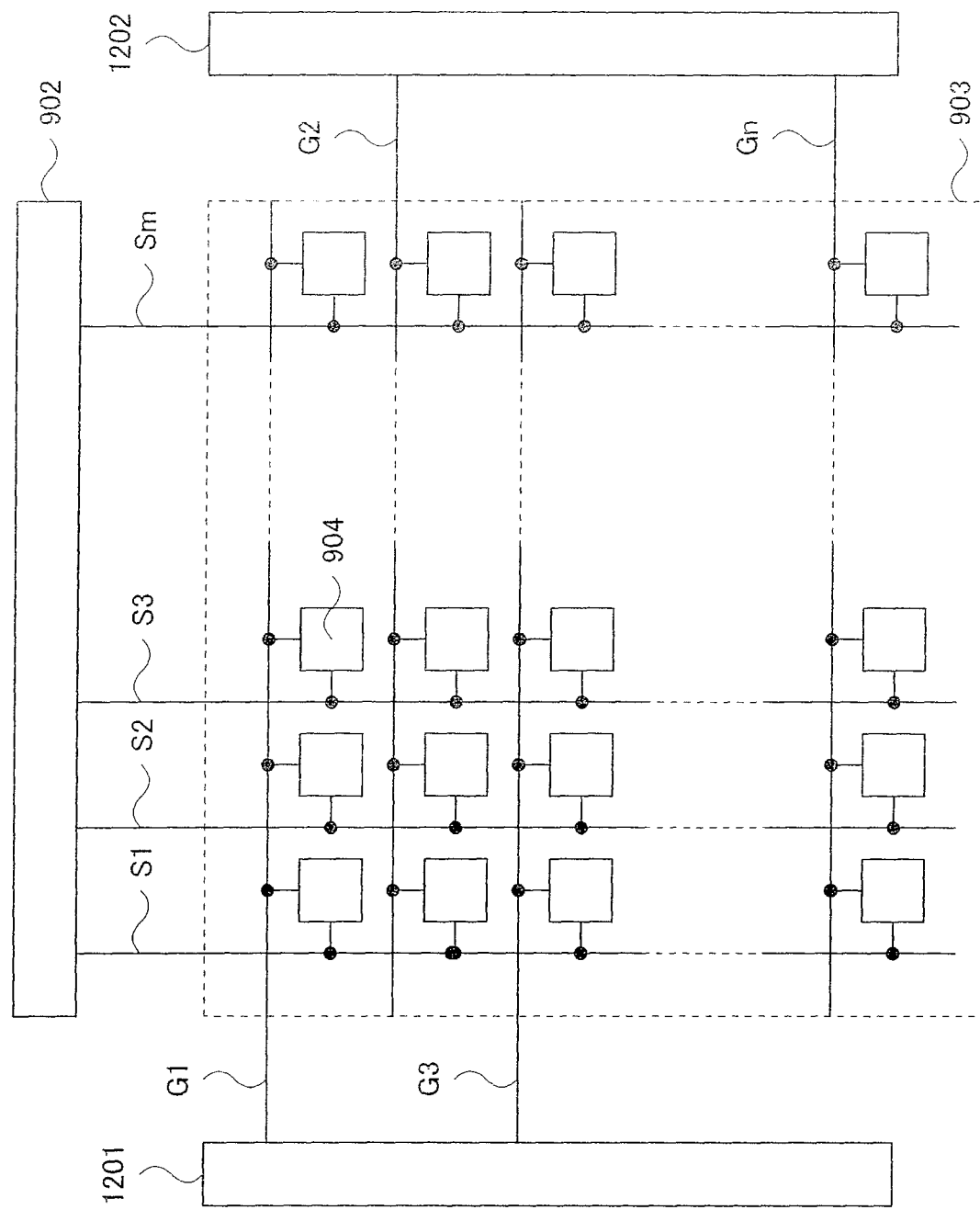
FIG. 12 illustrates Embodiment Mode 1.

A pixel is selected and a video signal can be written to the pixel similarly to FIG. 9 also in a display device shown in FIG. 12. As shown in FIG. 12, the scan lines G1 to Gn may be scanned row by row with a first scan line driver circuit 1201 and a second scan line driver circuit 1202. Note that each of the first scan line driver circuit 1201 and the second scan line driver circuit 1202 has a structure which is similar to that of the scan line driver circuit 902 shown in FIG. 9, but has different drive timing. By scanning the scan lines of odd-numbered rows with the first scan line driver circuit 1201 and scanning the scan lines of even-numbered rows with the second scan line driver circuit 1202, drive frequency of the First scan line driver circuit 1201 and the second scan line driver circuit 1202 can be decreased, and a pitch of each of the flip-flop included in the first scan line driver circuit 1201 and the second scan line driver circuit 1202 for one stage can be widened. That is, power can be saved in the display device in FIG. 12 because drive frequency of the first scan line driver circuit 1201 and the second scan line driver circuit 1202 can be decreased. In addition, since the pitch of each of the flip-flop included in the first scan line driver circuit 1201 and the second scan line driver circuit 1202 for one stage is widened in the display device in FIG. 12, layout can be efficiently performed and a frame can be made small. Further, since the first scan line driver circuit 1201 and the second scan line driver circuit 1202 are provided from side to side in the display device in FIG. 12, the frame on the left side can be made equal to the frame on the right side. Note that portions which are common to those in FIG. 9 are denoted by common reference numerals and description thereof is omitted. Note also that similarly to FIG. 9, the timing chart in FIG. 10 can be used for the display device in FIG. 12.

Figure 44:
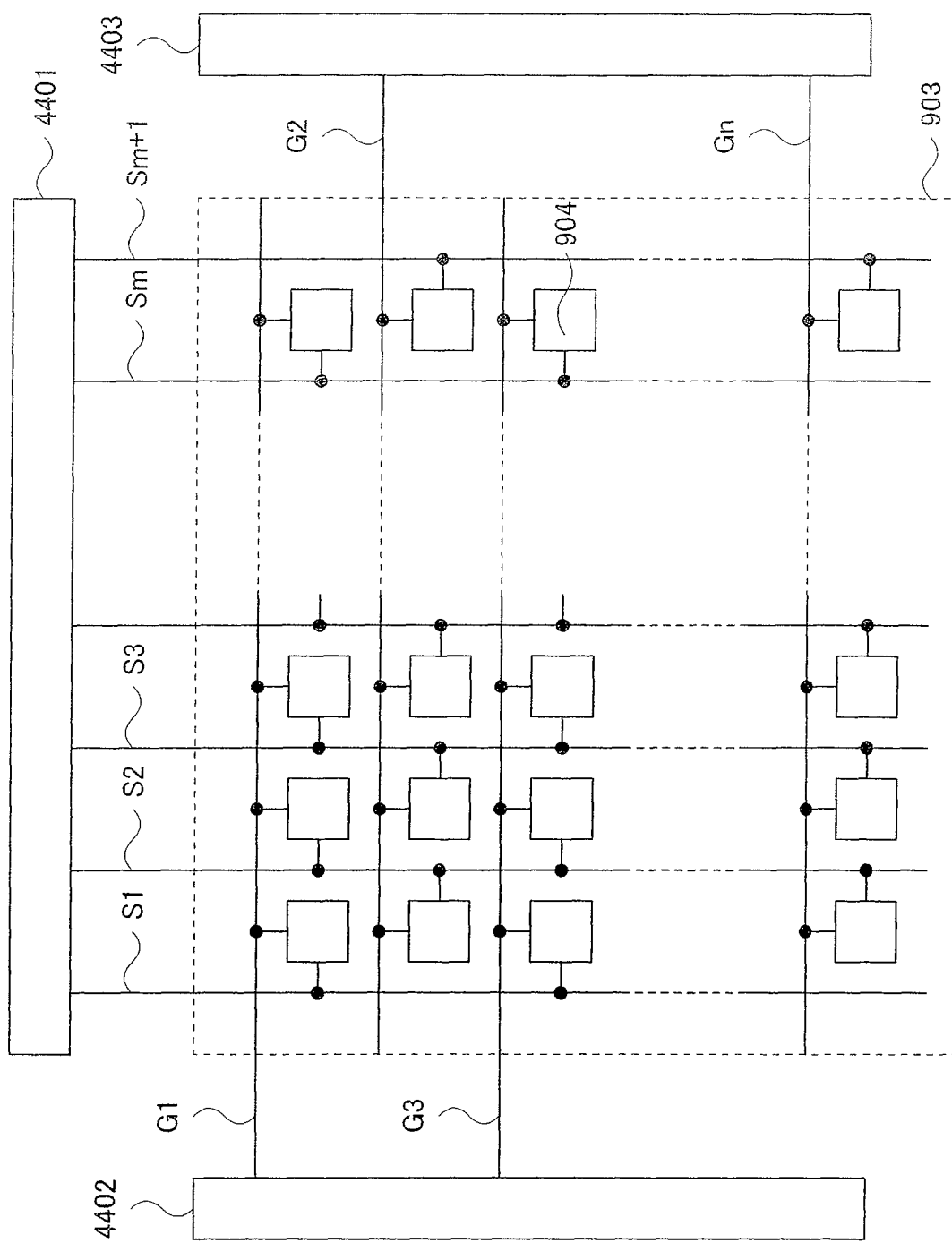
FIG. 44 illustrates Embodiment Mode 1.

In addition, a pixel is selected and a video signal can be written to the pixel similarly to FIG. 9 also in a display device shown in FIG. 44. As shown in FIG. 44, the scan lines G1 to Gn may be scanned row by row with a first scan line driver circuit 4402 and a second scan line driver circuit 4403. In addition, the pixels 904 are connected to rigid and left signal lines row by row. For example, a plurality of the pixels 904 of a j-th column are connected to a signal line Sj (any one of the signal line S1 to a signal line Sm+1) in the i-th row; the plurality of pixels 904 of the j-th column are connected to a signal line Sj+1 in the (i+1)th row; and the plurality of pixels 904 of the j-th column are connected to a signal line Sj−1 in the (i−1)th row.

Figure 45:
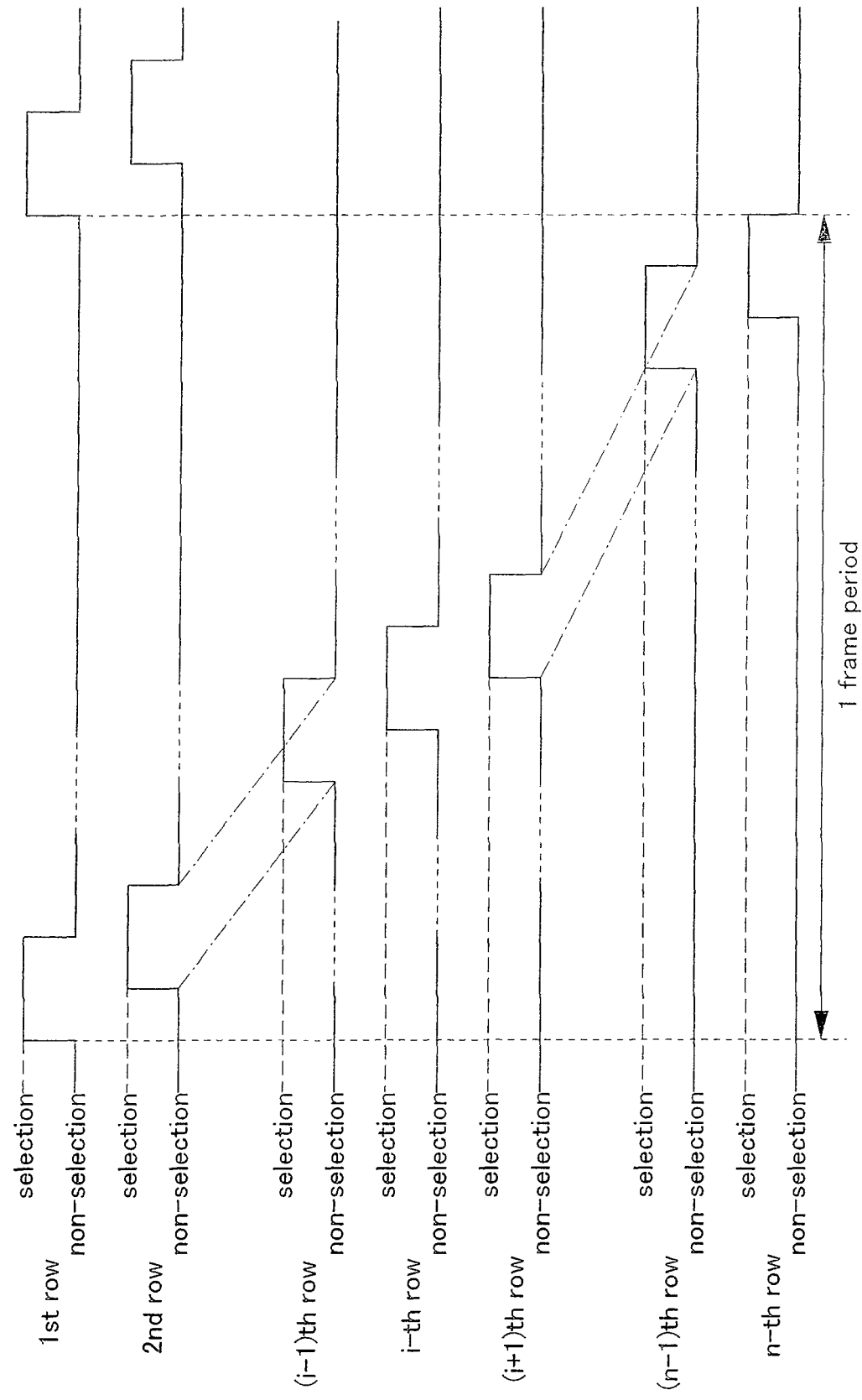
FIG. 45 illustrates Embodiment Mode 1.

Next, operations of the display device shown in FIG. 44 are described with reference to a timing chart in FIG. 45. Note that FIG. 45 shows one frame period which corresponds to a period for displaying an image for one screen. Note that although one frame period is not particularly limited, it is preferable that one frame period be 1/60 second or less so that a person viewing an image does not perceive a flicker.

Note that the timing chart in FIG. 45 shows selection timing of each of the scan line G1 of the first row, the scan line Gi−1 of the (i−1)th row, the scan line Gi of the i-th row, the scan line Gi+1 of the (i+1)th rows and the scan line Gn of the n-th row. In the timing chart in FIG. 45, one selection period is divided into a selection period Ta and a selection period Tb.

Note that in the display device in FIG. 44, dot inversion driving can be performed just by inputting a positive video signal and a negative video signal to each signal line in each column in one frame period. In addition, in the display device in FIG. 44, frame inversion driving can be performed by inverting polarity of each video signal input to each signal fine in each one frame period. Note also that the timing chart in FIG. 45 shows the case where dot inversion driving and frame inversion driving are performed in the display device.

In FIG. 45, for example, the selection period Ta of the scan line Gi of the i-th tow overlaps with the selection period of the scan line Gi−1 of the (i−1)th row, and the selection period Tb of the scan line Gi of the i-th row overlaps with the selection period of the scan line Gi+1 of the (i+1)th row. Therefore, in the selection period Ta, a video signal which is similar to a video signal input to the pixel 904 of the (i−1)th row and a (j+1)th column is input to the pixel 904 of the i-th row and the j-th column. In the selection period Tb, a video signal which is similar to the video signal input to the pixel 904 of the i-th row and the j-th column is input to the pixel 904 of the (i+1)th row and the (j−1)th column. Note that the video signal input to each of the pixels 904 in the selection period Tb is an original video signal, and the video signal input to each of the pixels 904 in the selection period Ta is a precharge video signal of each of the pixels 904. Therefore, each of the pixels 904 is precharged by the video signal input in the selection period Ta and holds the video signal input in the selection period Tb.

As described above, since the video signal can be written to each of the pixels 904 at high speed, the display device in FIG. 44 can be easily made large and can easily achieve high definition. In addition, since a video signal having the same polarity is input to each signal line in one frame period, there is not much charging and discharging of each signal line and low power consumption can be achieved. Further, since a load of an IC for supplying the video signal can be greatly reduced in the display device in FIG. 44, heat generation, power consumption, and the like can be reduced. Furthermore, drive frequency of the first scan line driver circuit 4402 and the second scan line driver circuit 4403 can be reduced approximately in half.

Note that another wiring or the like may be added to each of the display devices in FIGS. 9, 11, 12 and 44 depending on the structure of the pixels 904. For example, a constant power supply line, a scan line, a capacitor line, or the like may be added. Note also that in the case of adding a scan line, a scan line driver circuit to which the shift register shown in FIGS. 6 and 8 is applied may be added.

Note that each of the shift registers and the flip-flops shown in this embodiment mode can be freely combined with structures of display devices shown in other embodiment modes in this specification. In addition, the structures of each of the shift registers and the flip-flops shown in this embodiment mode can be freely combined.

Embodiment Mode 2

Figure 13:
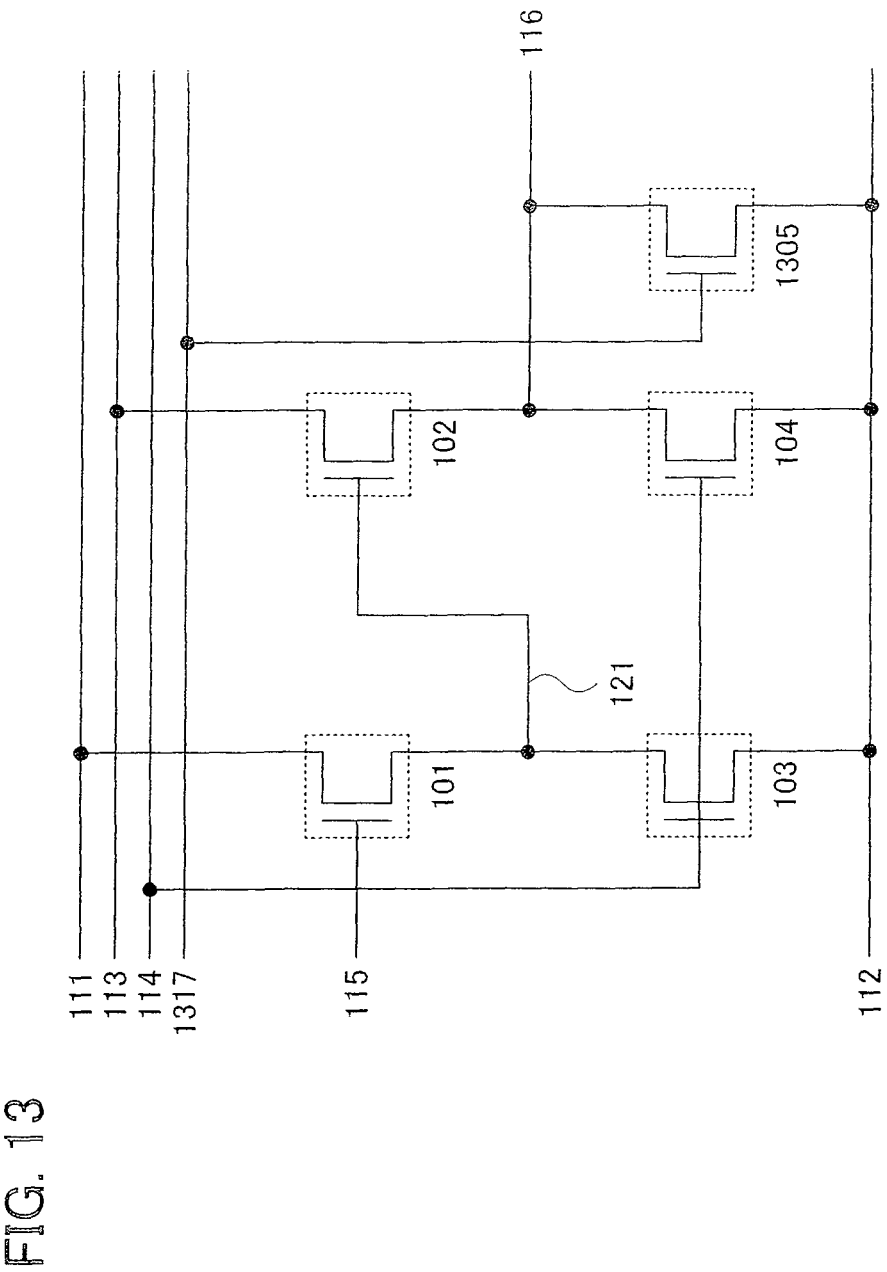
FIG. 13 illustrates Embodiment Mode 2.

In this embodiment mode, a flip-flop having a structure which is different from that of Embodiment Mode 1 is shown in FIG. 13. Note that portions which are similar to Embodiment Mode 1 are denoted by common reference numerals and detailed description of the portions which are the same and portions which have similar functions is omitted.

The flip-flop shown in FIG. 13 induces the first transistor 101, the second transistor 102, the third transistor 103, the fourth transistor 104, and a fifth transistor 1305. Note that the flip-flop is connected to the first wiring ill, the second wiring 112, the third wiring 113, the fourth wiring 114, the fifth wiring 115, the sixth wiring 116, and a seventh wiring 1317. In this embodiment mode, the fifth transistor 1305 is an N-channel transistor and is turned on when gate-source voltage (Vgs) exceeds the threshold voltage (Vth). Note that the seventh wiring 1317 may be called a third signal line.

The first terminal (one of the source terminal and the drain terminal) of the first transistor 101 is connected to the first wiring 111; the second terminal (the other thereof) of the first transistor 101 is connected to the gate terminal of the second transistor 102; and the gate terminal of the first transistor 101 is connected to the fifth wiring 115. The first terminal of the third transistor 103 is connected to the gate terminal of the second transistor 102; the second terminal of the third transistor 103 is connected to the second wiring 112; and the gate terminal of the third transistor 103 is connected to the fourth wiring 114. The first terminal of the second transistor 102 is connected to the third wiring 113 and the second terminal of the second transistor 102 is connected to the sixth wiring 116. The first terminal of the fourth transistor 104 is connected to the sixth wiring 116; the second terminal of the fourth transistor 104 is connected to the second wiring 112; and the gate terminal of the fourth transistor 104 is connected to the fourth wiring 114. A first terminal of the fifth transistor 1305 is connected to the sixth wiring 116; a second terminal of the fifth transistor 1305 is connected to the second wiring 112; and a gate terminal of the fifth transistor 1305 is connected to the seventh wiring 1317.

Note that the second terminal of the third transistor 103, the second terminal of the fourth transistor 104, and the second terminal of the fifth transistor 1305 are not necessarily connected to the second wiring 112 and may be connected to different wirings. In addition, the gate terminal of the third transistor 103 and the gate terminal of the fourth transistor 104 art not necessarily connected to the fourth wiring 114 and may be connected to different wirings.

Figure 14:
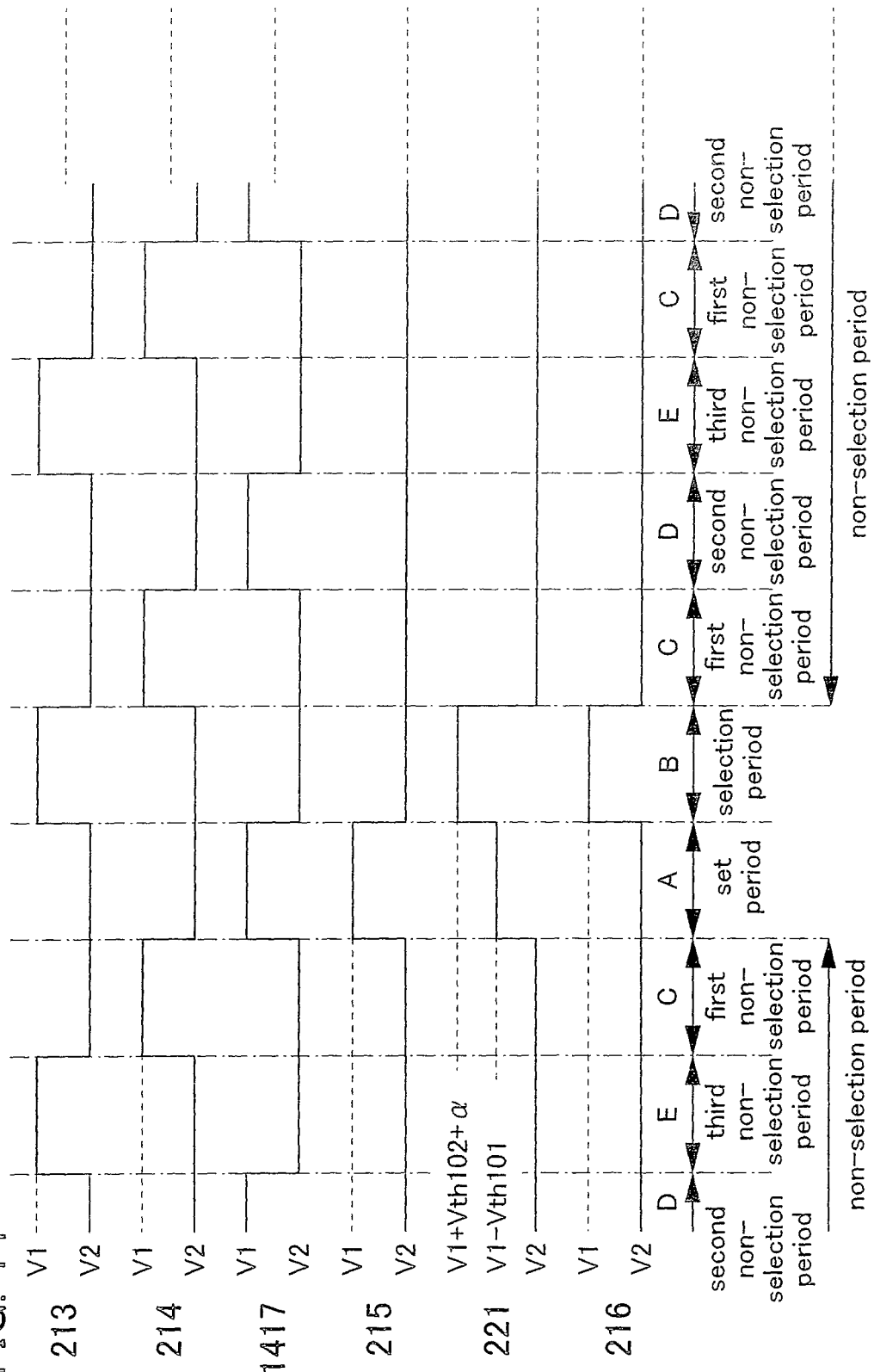
FIG. 14 illustrates Embodiment Mode 2.

Next, operations of the flip-flop shown in FIG. 13 are described with reference to a timing chart in FIG. 14. Note that FIG. 14 is a timing chart in the case where the flip-flop in FIG. 13 is operated similarly to the flip-flop shown in FIG. 1. Note that portions which are common to those in FIG. 2 are denoted by common reference numerals and description thereof is omitted.

Note that a signal is input to the seventh wiring 1317. The signal input to the seventh wiring 1317 is a third clock signal In addition, the signal input to the seventh wiring 1317 is a digital signal in which a potential of an H-level signal is at V1 (hereinafter also referred to as an H level) and a potential of an L-level signal is at V2 (hereinafter also referred to as an L level).

Note also that the third clock signal is not necessarily input to the seventh wiring 1317. Another signal may be input to the seventh wiring 1317, or a constant potential or current may be input to the seventh wiring 1317.

In FIG. 14, a signal 1417 is a signal input to the seventh wiring 1317.

In the flip-flop in FIG. 13, the fifth transistor 1305 is turned on in a set period and a second non-selection period. In addition, the sixth wiring 116 remains at an L level because a potential of the second wiring 112 is supplied to the sixth wiring 116 through the fifth transistor 1305.

As described above, in the flip-flop in FIG. 13, V2 is supplied to the sixth wiring 116 in a first non-selection period and the second non-selection period from the first non-selection period, the second non-selection period, and a third non-selection period. Therefore, a malfunction of the flip-flop can be farther suppressed. This is because V2 is supplied to the sixth wiring 116 at regular intervals (in the first non-selection period and the second non-selection period) in the non-selection period, and thus a potential of the sixth wiring 116 can be stabilized at V2.

Further, since the fifth transistor 1305 of the flip-flop in FIG. 13 is turned on only in the set period and the second non-selection period, deterioration in characteristics of the fifth transistor 1305 can be suppressed.

Note that in the flip-flop in FIG. 13, the first transistor 101, the second transistor 102, the third transistor 103, the fourth transistor 104, and the fifth transistor 1305 are all N-channel transistors. Therefore, since amorphous silicon can be used for a semiconductor layer of each transistor in the flip-flop in FIG. 13, a manufacturing process can be simplified, and thus manufacturing cost can be reduced and a yield can be improved. In addition, a semiconductor device such as a large display panel can also be manufactured. Further, even when polysilicon or single crystal silicon is used for the semiconductor layer of each transistor, the manufacturing process can be simplified.

Further, since deterioration in characteristics of each transistor can be suppressed even when amorphous silicon in which characteristics easily deteriorate (the threshold voltage is easily shifted) is used for the semiconductor layer of each transistor in the flip-flop in FIG. 13, a semiconductor device such as a long-life display panel can be manufactured.

Here, a function of the fifth transistor 1305 is described. The fifth transistor 1305 has a function of selecting timing for supplying the potential of the second wiring 112 to the sixth wiring 116 and functions as a switching transistor.

Note that arrangement, the number, and the like of the transistors are not limited to those of FIG. 13 as long as operations which are similar to those of FIG. 13 are performed. Thus, a transistor, another element (e.g., a resistor or a capacitor), a diode, a switch, any logic circuit, or the like may be additionally provided.

Figure 15:
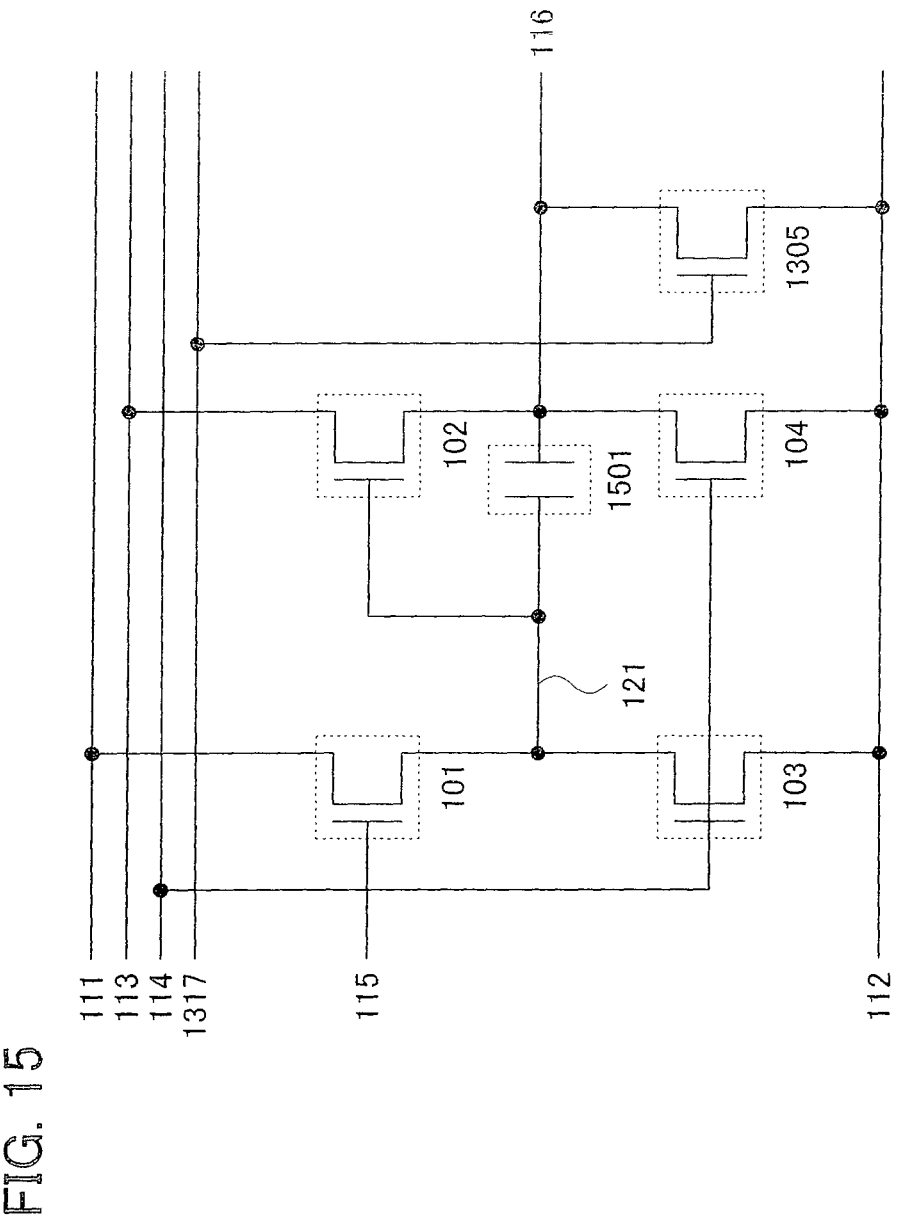
FIG. 15 illustrates Embodiment Mode 2.

For example, as shown in FIG. 15, a capacitor 1501 may be provided between the gate terminal and the second terminal of the second transistor 102 shown in FIG. 13. By proving the capacitor 1501, the bootstrap operation in the selection period can be performed more stably. In addition, since the parasitic capacitance between the gate terminal and the second terminal of the second transistor 102 can be reduced, each transistor can be switched at high speed. Note that in the capacitor 1501, a gate insulating film may be used as an insulating layer, and a gate electrode layer and a wiring layer may be used as conductive layers; a gate insulating film may be used as the insulating layer, and a gate electrode layer and a semiconductor layer to which an impurity is added may be used as the conductive layers; or an interlayer film (an insulating film) may be used as the insulating layer, and a wiring layer and a transparent electrode layer may be used as the conductive layers. Note that portions which are common to those in FIG. 13 are denoted by common reference numerals and description thereof is omitted.

Figure 16:
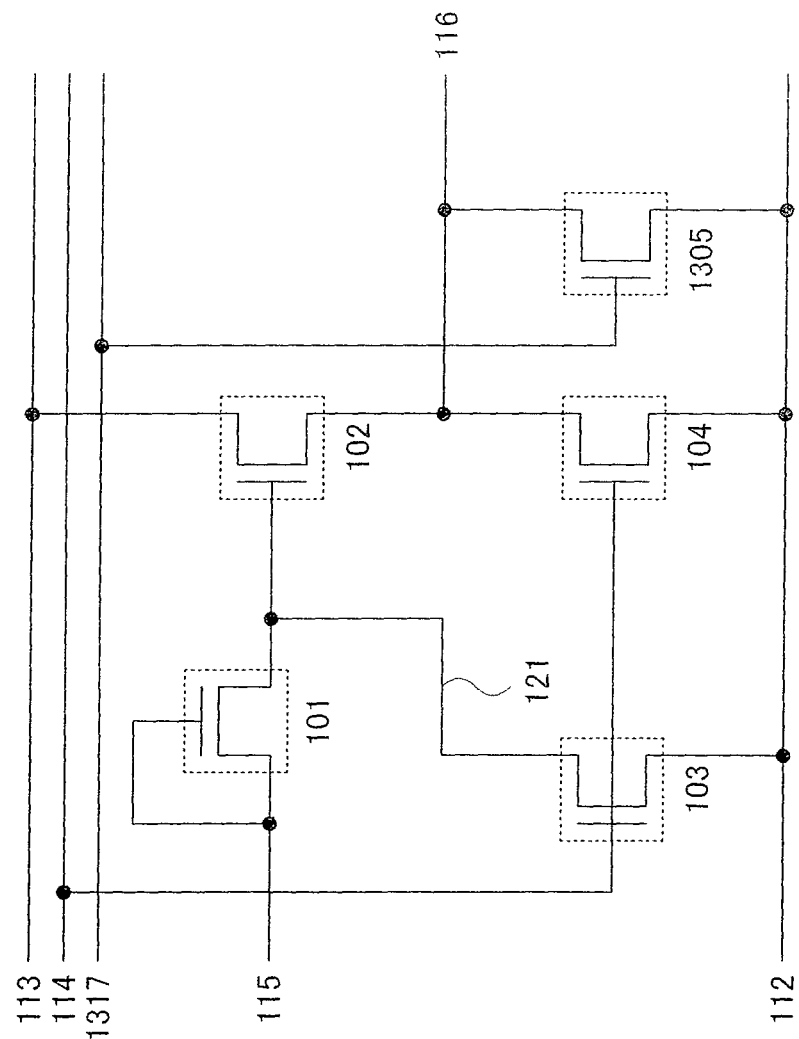
FIG. 16 illustrates Embodiment Mode 2.

Operations which are similar to those of FIG. 13 can also be performed in a flip-flop in FIG. 16. As shown in FIG. 16, the first transistor 101 shown in FIG. 13 may be diode-connected. The first transistor 101 is diode-connected, so that the first wiring 111 is not necessary. Thus, one wiring and one power source potential (V1) can be eliminated from the structure. Note that portions which are common to those in FIG. 13 are denoted by common reference numerals and description thereof is omitted.

Subsequently, a shift register including the flip-flop of this embodiment mode is described with reference to FIG. 17. Note that portions which are common to those In FIG. 6 in which the shift register including the flip-flop shown in FIG. 1 is described are denoted by common reference numerals and description thereof is omitted.

The shift register includes the first wiring 611, the second wiring 612, the third wiring 613, the fourth wiring 614, the fifth wiring 615, the sixth wiring 616, the wirings 622_1 to 622_n, and flip-flops 1701_1 to 1701_n of n stages. The flip-flops 1701_1 to 1701_n of the n stages are connected to the first wiring 611, the second wiring 612, the third wiring 613, the fourth wiring 614, and the fifth wiring 615, respectively. In addition, for example, the flip-flop 1701_2 to a flip-flop 1701_n–1 in a flip-flop 1701_i of the i-th stage (any one of the flip-flops 1701_i+1 to 1701_n) are connected to a flip-flop 170_i–1 of the (i–1)th stage and a flip-flop 1701_i+1 of the (i+1)th stage, and a connection point of the flip-flop 1701_i of the i-th stage and the flip-flop 1701_i+1 of the (i+1)th stage is connected to the wiring 622_i (any one of the wirings 622_1 to 622_n). Note that the flip-flop 1701_1 of the first stage is connected to the sixth wiring 616 and the flip-flop 1701_2 of the second stage, and a connection point of the flip-flop 1701_i–1 of the first stage and the flip-flop 1701_2 of the second stage is connected to the wiring 622_1. Note also that the flip-flop 1701_n of the n-th stage is connected to a flip-flop 1701_n−1 of the (n−1)th stage and the wiring 622_n.

Note that in the flip-flop 1701 of the (1+3N)th stage, the first wiring 611, the second wiring 612, the third wiring 613, the fourth wiring 614, and the fifth wiring 615 are connected to the first wiring 111, the second wiring 112, the third wiring 113, the fourth wiring 114, and the seventh wiring 1317 shown in FIG. 13, respectively. In the flip-flop 1701 of the (2+3N)th stage, the first wiring 611, the second wiring 612, the fourth wiring 614, the fifth wiring 615, and the third wiring 613 are connected to the first wiring 111, the second wiring 112, the third wiring 113, the fourth wiring 114, and the seventh wiring 1317 shown in FIG. 13, respectively. In the flip-flop 1701 of the (3+3N)th stage, the first wiring 611, the second wiring 612, the fifth wiring 615, the third wiring 613, and the fourth wiring 614 are connected to the first wiring 111, the second wiring 112, the third wiring 113, the fourth wiring 114, and the seventh wiring 1317 shown in FIG. 13, respectively. In addition, for example, in the flip-flop 1701_i of the i-th stage, the fifth wiring 115 and the sixth wiring 116 shown in FIG. 13 of each of the flip-flop 1701_2 to the flip-flop 1701_n−1 are connected to the sixth wiring 116 shown in FIG. 13 of the flip-flop 1701_i−1 of the (i−1)th stage and the fifth wiring 115 shown in FIG. 13 of the flip-flop 1701_i+1 of the (i+1)th stage, respectively. Note also that the fifth wiring 115 and the sixth wiring 116 shown in FIG. 13 of the flip-flop 1701_1 of the first stage are connected to the sixth wiring 616 shown in FIG. 17 and the fifth wiring 115 shown in FIG. 13 of the flip-flop 1701_2 of the second stage, respectively. Note also that the fifth wiring 115 and the sixth wiring 116 shown in FIG. 13 of the flip-flop 1701_n of the n-th stage are connected to the sixth wiring 116 shown in FIG. 13 of the flip-flop 1701_n−1 of the (n−1)th stage and the wiring 622_n shown in FIG. 17.

Figure 17:
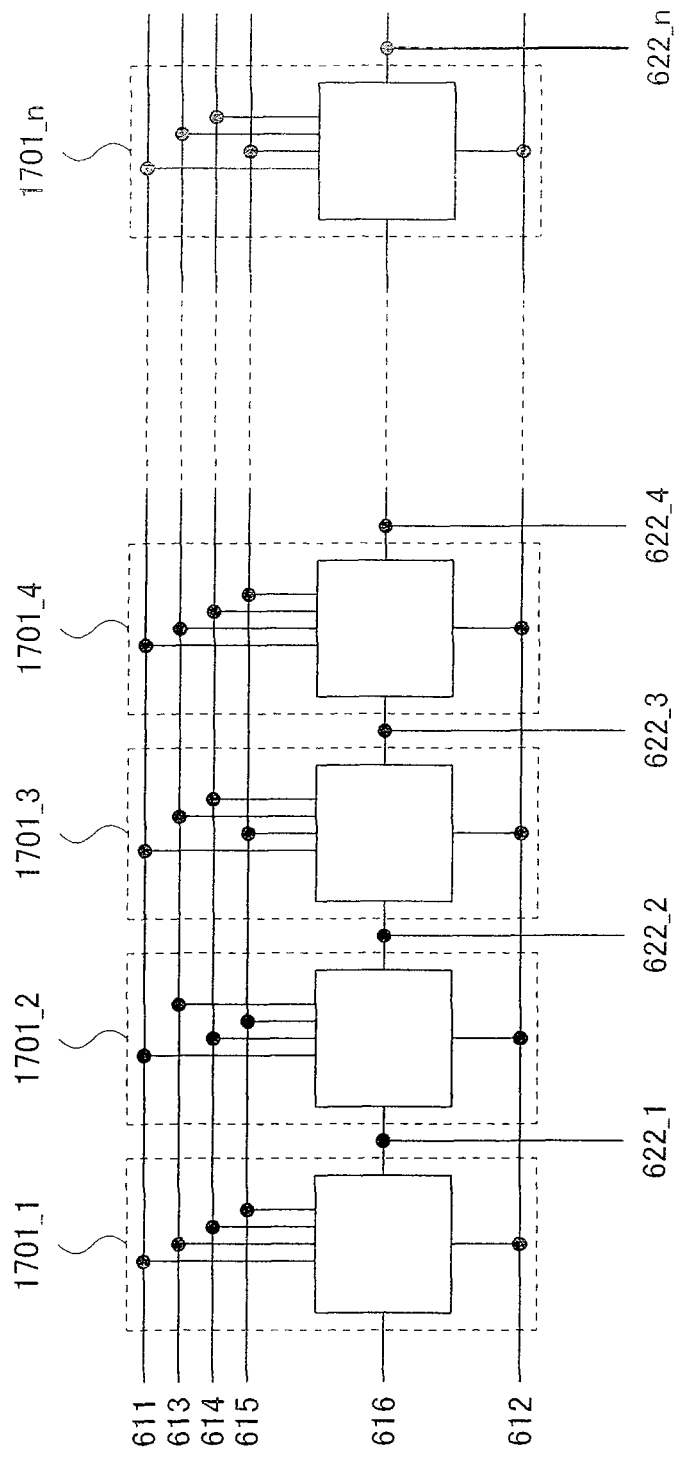
FIG. 17 illustrates Embodiment Mode 2.

Note that the shift register shown in FIG. 17 can perform operations which are similar to those of the shift register shown in FIG. 6. Therefore, the timing chart in FIG. 7 can be used for the shift register shown in FIG. 17.

Therefore, since clock signals having three phases can be used in the shift register in FIG. 17 similarly to Embodiment Mode 1, power can be saved. In addition, since the number of stages of the flip-flop 1701 connected to each clock signal line (each of the third wiring 613, the fourth wiring 614, and the fifth wiring 615) is reduced to two-third that of the case of using single-phase clock signals in each of the shift registers of this embodiment mode, a load of each clock signal line can be reduced.

Figure 18:
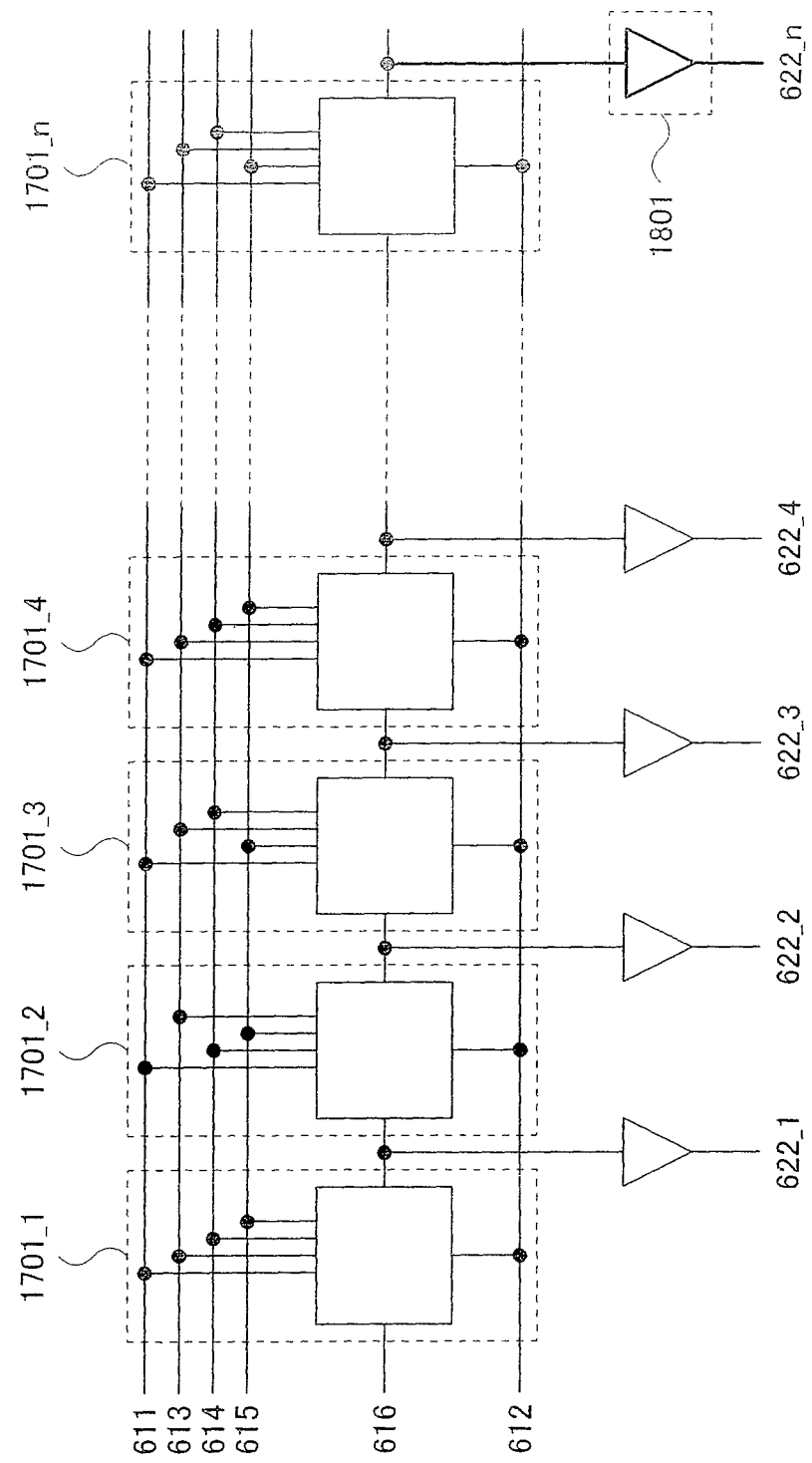
FIG. 18 illustrates Embodiment Mode 2.

Note that in the shift register in FIG. 17, an output signal of the flip-flop 1701 of each stage may be output to the wiring 622 of each stage through a buffer and FIG. 18 shows such a structure. Since the flip-flop 1701 of each stage is connected to the wiring 622 of each stage through a buffer 1801 in a shift register in FIG. 18, a wide margin at the time of operation can be obtained. This is because operations of the shift register are not adversely affected even when a large load is connected to the wiring 622 and delay or waveform dullness occurs in a signal of the wiring 622. Note that a logic circuit such as an inverter, a NAND, or a NOR, an operational amplifier or the like, or a circuit in which these are combined can be used as the buffer 1801.

Further, each of the shift registers shown in this embodiment mode can be applied to each of the display devices in FIGS. 9, 11, 12, and 44. The life of each of the display devices can be extended by applying this embodiment mode to a scan line driver circuit formed over the same substrate as a pixel portion, similarly to Embodiment Mode 1.

Note that each of the shift registers and the flip-flops shown in this embodiment mode can be freely combined with structures of display devices shown in other embodiment modes in this specification. In addition, the structures of each of the shift registers and the flip-flops shown in this embodiment mode can be freely combined.

Embodiment Mode 3

Figure 19:
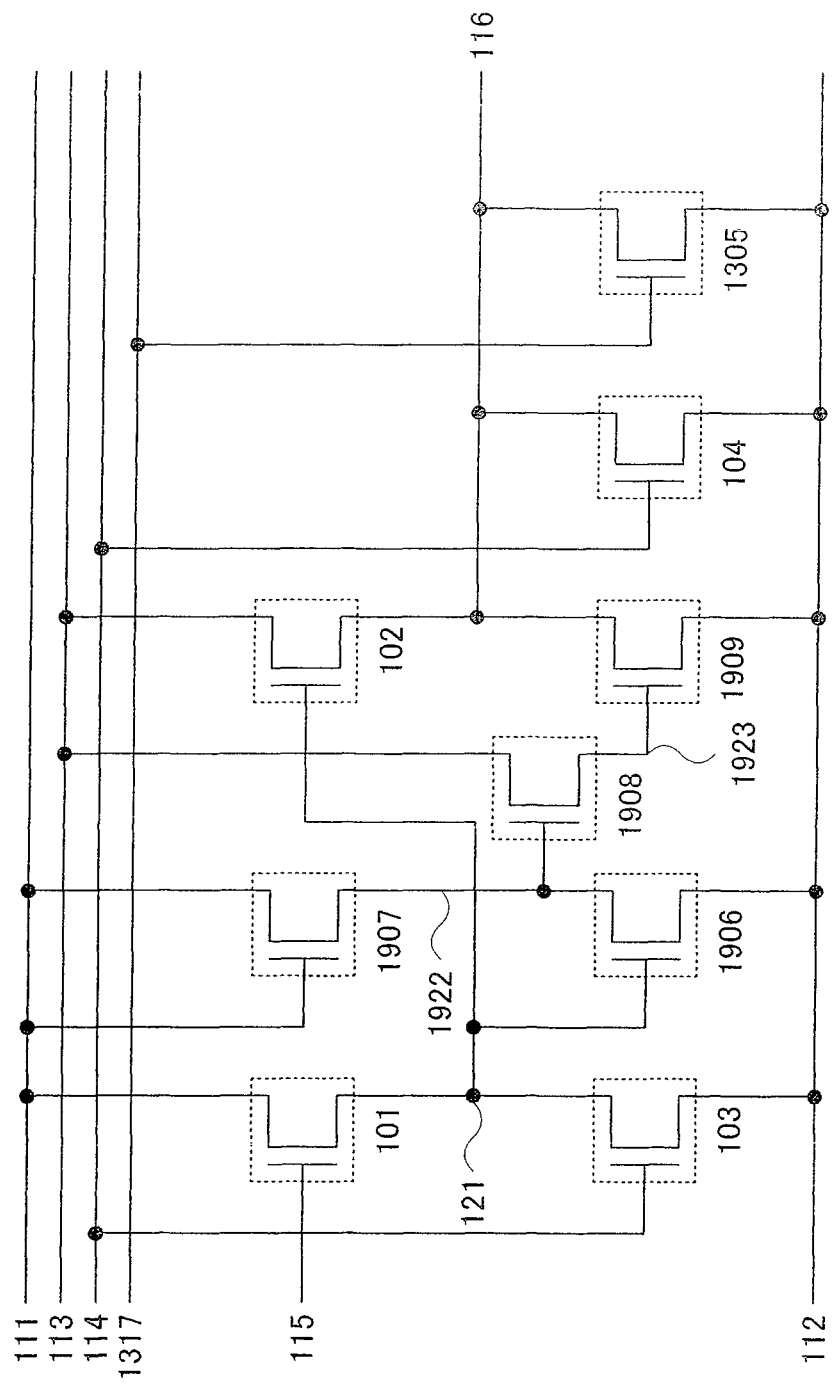
FIG. 19 illustrates Embodiment Mode 3.

In this embodiment mode, a flip-flop having a structure which is different from those of Embodiment Modes 1 and 2 is shown in FIG. 19. Note that portions which are similar to Embodiment Modes 1 and 2 are denoted by common reference numerals and detailed description of the portions which are the same and portions which have similar functions is omitted.

The flip-flop shown in FIG. 19 includes the first transistor 101, the second transistor 102, the third transistor 103, the fourth transistor 104, the fifth transistor 1305, a sixth transistor 1906, a seventh transistor 1907, an eighth transistor 1908, and a ninth transistor 1909. Note that the flip-flop is connected to the first wiring 111, the second wiring 112, the third wiring 113, the fourth wiring 114, the fifth wiring 115, the sixth wiring 116, and the seventh wiring 1317. In this embodiment mode, each of the sixth transistor 1906, the seventh transistor 1907, the eighth transistor 1908, and the ninth transistor 1909 is an N-channel transistor and is turned on when gate-source voltage (Vgs) exceeds the threshold voltage (Vth).

The first terminal (one of the source terminal and the drain terminal) of the first transistor 101 is connected to the first wiring 111; the second terminal (the other thereof) of the first transistor 101 is connected to the gate terminal of the second transistor 102; and the gate terminal of the first transistor 101 is connected to the fifth wiring 115. The first terminal of the third transistor 103 is connected to the gate terminal of the second transistor 102; the second terminal of the third transistor 103 is connected to the second wiring 112; and the gate terminal of the third transistor 103 is connected to the fourth wiring 114. The first terminal of the second transistor 102 is connected to the third wiring 113 and the second terminal of the second transistor 102 is connected to the sixth wiring 116. The first terminal of the fourth transistor 104 is connected to the sixth wiring 116; the second terminal of the fourth transistor 104 is connected to the second wiring 112; and the gate terminal of the fourth transistor 104 is connected to the fourth wiring 114. The first terminal of the fifth transistor 1305 is connected to the sixth wiring 116; the second terminal of the fifth transistor 1305 is connected to the second wiring 112; and the gate terminal of the fifth transistor 1305 is connected to the seventh wiring 1317. A first terminal of the sixth transistor 1906 is connected to a gate terminal of the eighth transistor 1908; a second terminal of the sixth transistor 1906 is connected to the second wiring 112; and a gate terminal of the sixth transistor 1906 is connected to the gate terminal of the second transistor 102. A first terminal of the seventh transistor 1907 is connected to the first wiring 111; a second terminal of the seventh transistor 1907 is connected to the gate terminal of the eighth transistor 1908; and a gate terminal of the seventh transistor 1907 is connected to the first wiring 111. A first terminal of the eighth transistor 1908 is connected to the third firing 113 and a second terminal of the eighth transistor 1908 is connected to a gate terminal of the ninth transistor 1909. A first terminal of the ninth transistor 1909 is connected to the sixth wiring 116 and a second terminal of the ninth transistor 1909 is connected to the second wiring 112. Note that a connection point of the first terminal of the sixth transistor 1906, the second terminal of the seventh transistor 1907, and the gate terminal of the eighth transistor 1908 is denoted by a node 1922. In addition, a connection point of the second terminal of the eighth transistor 1908 and the gate terminal of the ninth transistor 1909 is denoted by a node 1923.

Note that the second terminal of the third transistor 103, the second terminal of the fourth transistor 104, the second terminal of the fifth transistor 1305, the second terminal of the sixth transistor 1906, and the second terminal of the ninth transistor 3909 are not necessarily connected to the second wiring 112 and may be connected to different wirings. In addition, the gate terminal of the third transistor 103 and the gate terminal of the fourth transistor 104 are not necessarily connected to the fourth wiring 114 and may be connected to different wirings. Further, the first terminal of the first transistor 101, the first terminal of the seventh transistor 1907, and the gate terminal of the seventh transistor 1907 are not necessarily connected to the first wiring 111 and may be connected to different wirings. Furthermore, the first terminal of the second transistor 102 and the first terminal of the eighth transistor 1908 are not necessarily connected to the third wiring 113 and may be connected to different wirings.

Figure 20:
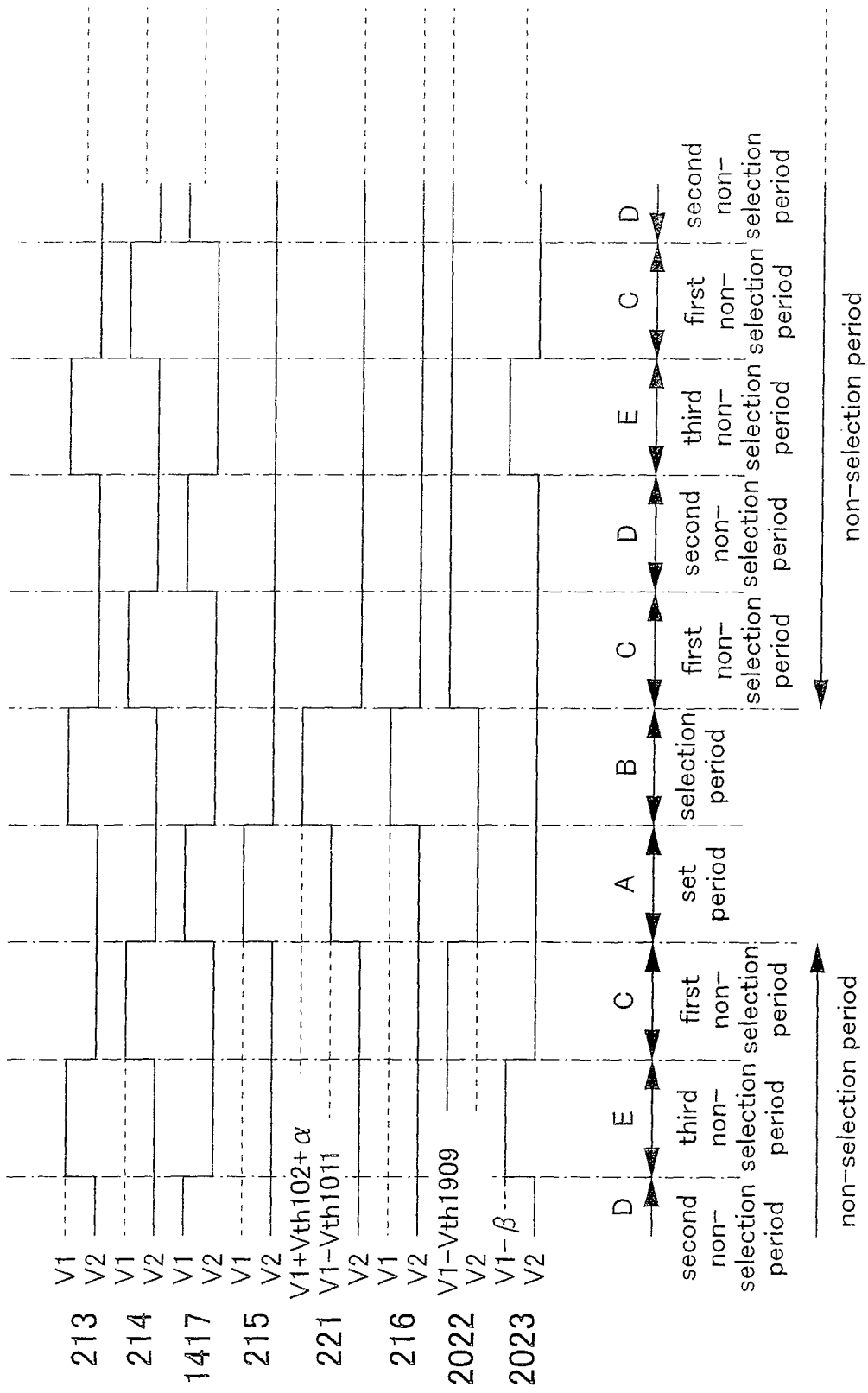
FIG. 20 illustrates Embodiment Mode 3.

Next, operations of the flip-flop shown in FIG. 19 are described with reference to a timing chart shown in FIG. 20. Note that FIG. 20 is a timing chart in the case where the flip-flop in FIG. 19 is operated similarly to the flip-flops shown in FIGS. 1 and 13. Note that portions which are common to those in the timing charts in FIGS. 2 and 14 are denoted by common reference numerals and description thereof is omitted.

In FIG. 20, a potential 2022 is a potential of the node 1922 in FIG. 19 and a potential 2023 is a potential of the node 1923 in FIG. 19.

In the flip-flop in FIG. 19, the ninth transistor 1909 is turned on in a third non-selection period. In addition, the sixth wiring 116 remains at an L level because a potential of the second wiring 112 is supplied to the sixth wiring 116 through the ninth transistor 1909.

Control of on/off of the ninth transistor 1909 is specifically described. First, the sixth transistor 1906 and the seventh transistor 1907 form an inverter, and the potential of the node 1922 (the potential 2022) becomes approximately V2 when an H-level signal is input to the gate terminal of the sixth transistor 1906. Note that since the potential 2022 at this time is determined by a resistance ratio of the sixth transistor 1906 to the seventh transistor 1907, the potential 2022 becomes a value which is slightly higher than V2. In addition, since the potential of the node 1922 becomes a value obtained by subtracting the threshold voltage of the seventh transistor 1907 (Vth1907) from the potential of the first wiring 111 when an L-level signal is input to the gate terminal of the sixth transistor 1906, the potential of the node 1922 becomes V1-Vth1907. Therefore, since the node 121 is at an L level and the node 1922 becomes an H level in the first non-selection period, the second non-selection period, and the third non-selection period, the eighth transistor 1908 is turned on. Thus, since the ninth transistor 1909 is controlled by a signal which is input to the third wiring 113, the ninth transistor 1909 is turned on in the third non-selection period and is turned off in the first non-selection period and the second non-selection period. On the other hand, since the node 121 is at an H level and the node 1922 becomes an L level in the set period and the selection period, the eighth transistor 1908 is turned off. Thus, since a potential of the gate terminal of the ninth transistor 1909 remains at a potential of the first non-selection period which is a period previous to the set period, namely, L level, the ninth transistor 1909 is turned oil.

As described above, in the flip-flop in FIG. 19, V2 is supplied to the sixth wiring 116 in the first non-selection period, the second non-selection period, and the third non-selection period. Therefore, a malfunction of the flip-flop can be further suppressed. This is because V2 can be supplied to the sixth wiring 116 in the non-selection period. In addition, since V2 is supplied to the sixth wiring 116 in the non-selection period in the flip-flop in FIG. 19, noise of the sixth wiring 116 can be reduced.

In addition, deterioration in characteristics of the sixth transistor 1906, the seventh transistor 1907, the eighth transistor 1908, and the ninth transistor 1909 can be suppressed in the flip-flop in FIG. 19. This is because the sixth transistor 1906 is turned on only in the set period and the selection period; the seventh transistor 1907 is turned on only in a period in which the potential of the node 1922 rises to V1-Vth1907 in the first non selection period which is after the selection period; the eighth transistor 1908 is turned on only in a period in which the potential of the node 1923 rises to V1-β (β corresponds to Vth1907+Vth1908) of the first non-selection period, the second non-selection period, and the third non-selection period; and the ninth transistor 1909 is turned on only in the third non-selection period.

Note that, in the flip-flop in FIG. 19, the first transistor 101, the second transistor 102, the third transistor 103, the fourth transistor 104, the fifth transistor 1305, the sixth transistor 1906, the seventh transistor 1907, the eighth transistor 1908, and the ninth transistor 1909 are ail N-channel transistors. Therefore, since amorphous silicon can be used for a semiconductor layer of each transistor in the flip-flop in FIG. 19, a manufacturing process can be simplified, and thus manufacturing cost can be reduced and a yield can be improved. In addition, a semiconductor device such as a large display panel can also be manufactured. Further, even when polysilicon or single crystal silicon is used for the semiconductor layer of each transistor, the manufacturing process can be simplified.

Further, since deterioration in characteristics of each transistor can be suppressed even when amorphous silicon in which characteristics easily deteriorate (the threshold voltage is easily shifted) is used for the semiconductor layer of each transistor in the flip-flop in FIG. 19, a semiconductor device such as a long-life display panel can be manufactured.

Here, functions of the sixth transistor 1906, the seventh transistor 1907, the eighth transistor 1908, and the ninth transistor 1909 are described. The sixth transistor 1906 has a function of selecting timing for supplying the potential of the second wiring 112 to the node 1922 and functions as a switching transistor. The seventh transistor 1907 has a function of selecting timing for supplying the potential of the first wiring 111 to the node 1922 and functions as a diode. The eighth transistor 1908 has a function of selecting timing for supplying the potential of the third wiring 113 to the node 1923 and functions as a switching transistor. The ninth transistor 1909 has a function of selecting timing for supplying the potential of the second wiring 112 to the sixth wiring 116 and functions as a switching transistor.

Note that arrangement, the number, and the like of the transistors are not limited to those of FIG. 19 as long as operations which are similar to those of FIG. 19 are performed. Thus, a transistor, another element (e.g., a resistor or a capacitor), a diode, a switch, any logic circuit, or the like may be additionally provided.

Figure 21:
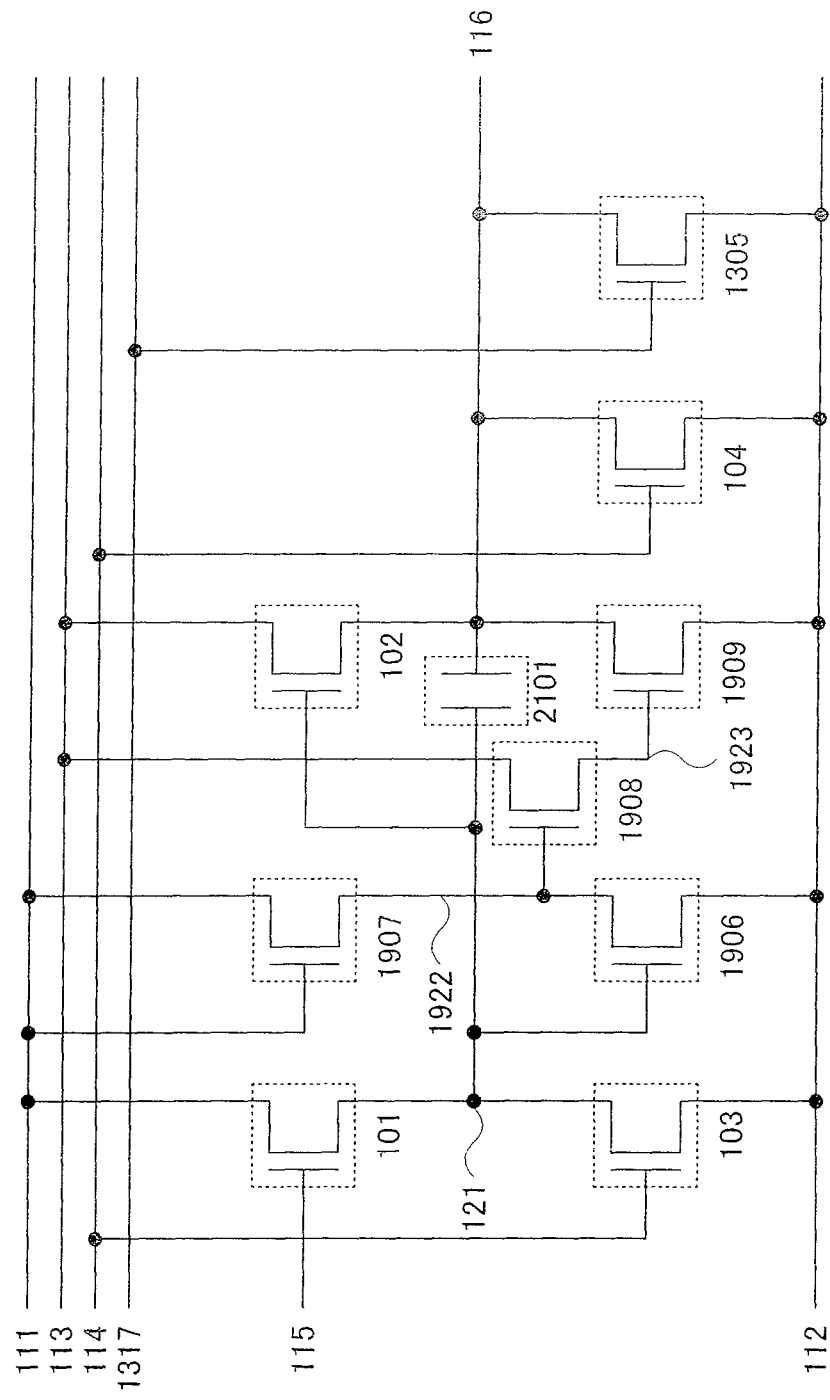
FIG. 21 illustrates Embodiment Mode 3.

For example, as shown in FIG. 21, a capacitor 2101 may be provided between the gate terminal and the second terminal of the second transistor 102 shown in FIG. 19. By proving the capacitor 2101, the bootstrap operation in the selection period can be performed more stably. In addition, since the parasitic capacitance between the gate terminal and the second terminal of the second transistor 102 can be reduced, each transistor can be switched at high speed. Note that in the capacitor 2101, a gate insulating film may be used as an insulating layer and a gate electrode layer and a wiring layer may be used as conductive layers; a gate insulating film may be used as the insulating layer and a gate electrode layer and a semiconductor layer to which an impurity is added may be used as the conductive layers; or an interlayer film (an insulating film) may be used as the insulating layer and a wiring layer and a transparent electrode layer may be used as the conductive layers. Note that portions which are common to those in FIG. 19 are denoted by common reference numerals and description thereof is omitted.

Figure 22:
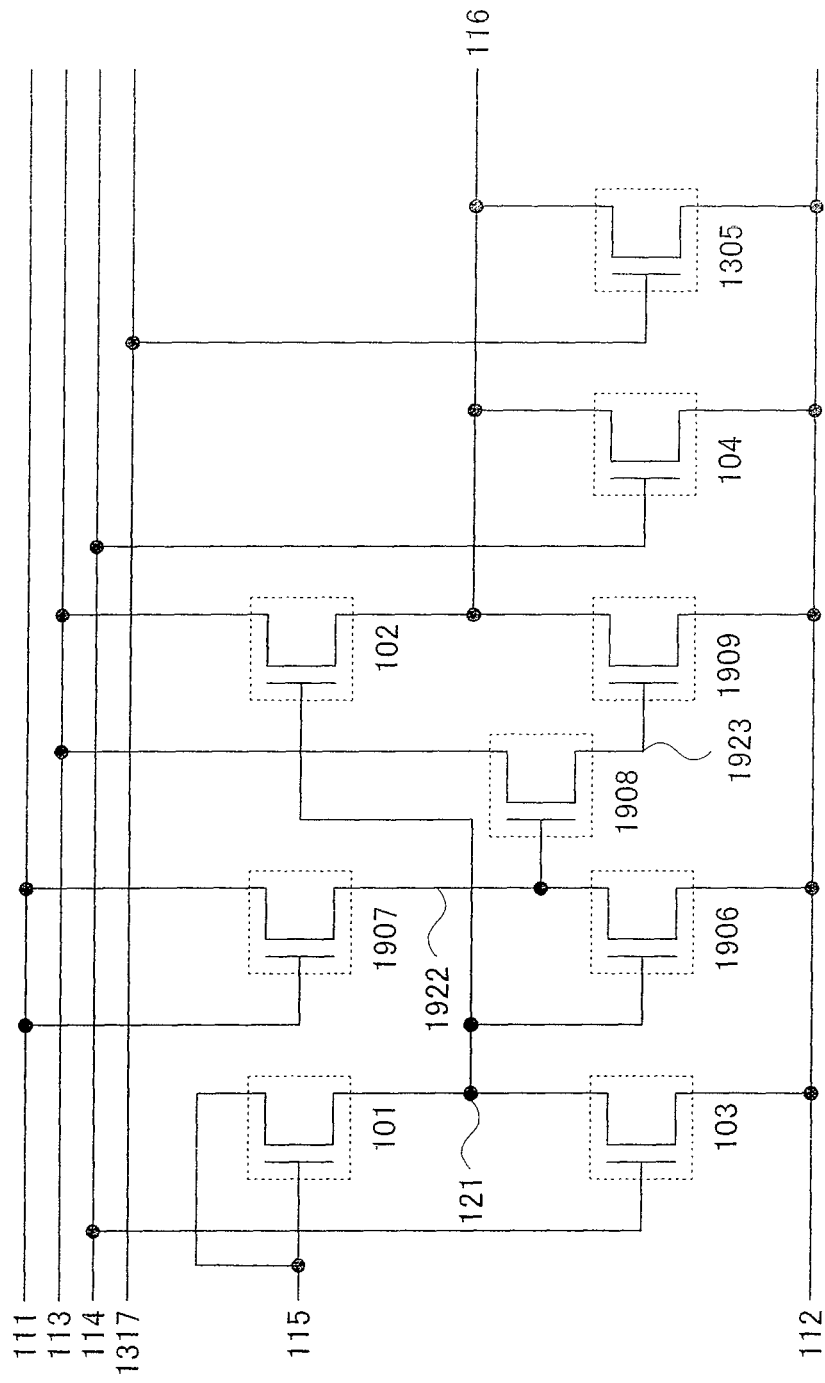
FIG. 22 illustrates Embodiment Mode 3.

Operations which are similar to those of FIG. 19 can also be performed in a flip-flop in FIG. 22. As shown in FIG. 22, the first transistor 101 shown in FIG. 19 may be diode-connected. The first transistor 101 is diode-connected, so that current flowing through the first wiring 111 is made small. Thus, the wiring width of the first wiring 111 can be made small. Note that portions which are common to those in FIG. 19 are denoted by common reference numerals and description thereof is omitted.

In addition, each of the flip-flops shown in this embodiment mode can be applied to each of the shift registers in FIGS. 17 and 18. Since clock signals having three phases can be used similarly to Embodiment Modes 1 and 2, power can be saved. Further, since the number of stages of the flip-flop 1701 connected to each clock signal line (each of the third wiring 613, the fourth wiring 614, and the fifth wiring 615) is reduced to two-third that of the case of using single-phase clock signals in each of the shift registers of this embodiment mode, a load of each clock signal line can be reduced.

Further, each of the shift registers shown in this embodiment mode can be applied to each of the display devices in FIGS. 9, 11, 12, and 44. The life of each of the display devices can be extended by applying this embodiment mode to a scan Hoe driver circuit formed over the same substrate as a pixel portion, similarly to Embodiment Modes 1 and 2.

Note that each of the shift registers and the flip-flops shown in this embodiment mode can be freely combined with structures of display devices shown in other embodiment modes in this specification. In addition, the structures of each of the shin registers and the flip-flops shown in this embodiment mode can be freely combined.

Embodiment Mode 4

Figure 23:
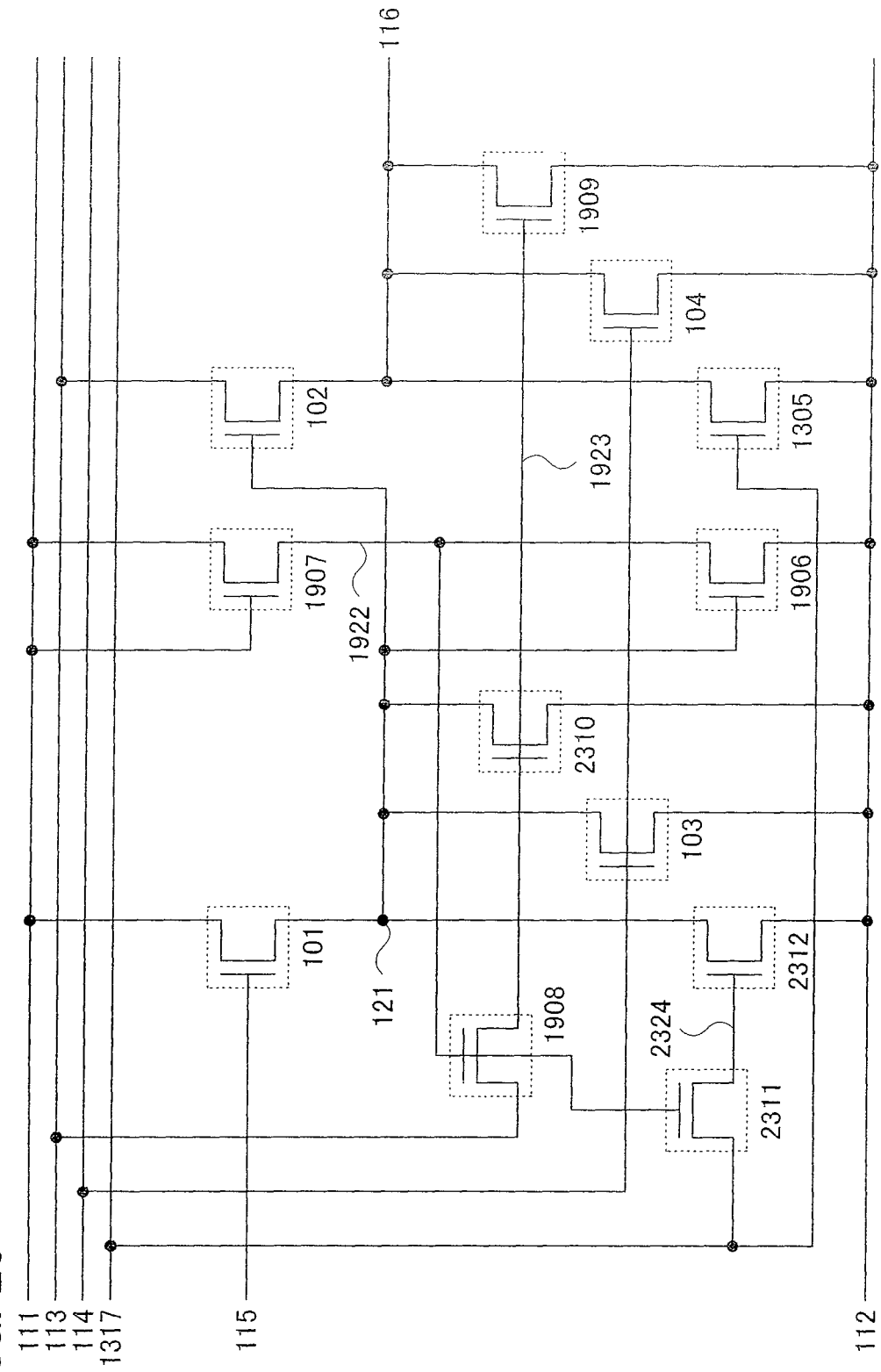
FIG. 23 illustrates Embodiment Mode 4.

In this embodiment mode, a flip-flop having a structure which is different from those of Embodiment Modes 1 to 3 is shown in FIG. 23. Note that portions which are similar to Embodiment Modes 1 to 3 are denoted by common reference numerals and detailed description of the portions which are the same and portions which have similar functions is omitted.

The flip-flop shown in FIG. 23 includes the first transistor 101, the second transistor 102, the third transistor 103, the fourth transistor 104, the fifth transistor 1305, the sixth transistor 1906, the seventh transistor 1907, the eighth transistor 1908, the ninth transistor 1909, a tenth transistor 2310, an eleventh transistor 2311, and a twelfth transistor 2312. Note that the flip-flop is connected to the first wiring 111, the second wiring 112, the third wiring 113, the fourth wiring 114, the fifth wiring 115, the sixth wiring 116, and the seventh wiring 1317. In this embodiment mode, each of the tenth transistor 2310, the eleventh transistor 2311, and the twelfth transistor 2312 is art N-channel transistor and is tamed on when gate-source voltage (Vgs) exceeds the threshold voltage (Vth).

The first terminal (one of the source terminal and the drain terminal) of the first transistor 101 is connected to the first wiring 111; the second terminal (the other thereof) of the first transistor 101 is connected to the gate terminal of the second transistor 102; and the gate terminal of the first transistor 101 is connected to the fifth wiring 115. The first terminal of the third transistor 103 is connected to the second wiring 112; the second terminal of the third transistor 103 is connected to the gate terminal of the second transistor 102; and the gate terminal of the third transistor 103 is connected to the fourth wiring 114. The first terminal of the second transistor 102 is connected to the third wiring 113 and the second terminal of the second transistor 102 is connected to the sixth wiring 116. The first terminal of the fourth transistor 104 is connected to the second wiring 112; the second terminal of the fourth transistor 104 is connected to the sixth wiring 116; and the gate terminal of the fourth transistor 104 is connected to the fourth wiring 114. The first terminal of the fifth transistor 1305 is connected to the second wiring 112; the second terminal of the fifth transistor 1305 is connected to the sixth wiring 116; and the gate terminal of the fifth transistor 1305 is connected to the seventh wiring 1317. The first terminal of the sixth transistor 1906 is connected to the second wiring 112; the second terminal of the sixth transistor 1906 is connected to the gate terminal of the eighth transistor 1908 and a gate terminal of the eleventh transistor 2311; and the gate terminal of the sixth transistor 1906 is connected to the gate terminal of the second transistor 102. The first terminal of the seventh transistor 1907 is connected to the first wiring 111; the second terminal of the seventh transistor 1907 is connected to the gate terminal of the eighth transistor 1908 and the gate terminal of the eleventh transistor 2311; and the gate terminal of the seventh transistor 1907 is connected to the first wiring 111. The first terminal of the eighth transistor 1908 is connected to the third wiring 113 and the second terminal of the eighth transistor 1908 is connected to the gate terminal of the ninth transistor 1909 and a gate terminal of the tenth transistor 2310. The first terminal of the ninth transistor 1909 is connected to the second wiring 112 and the second terminal of the ninth transistor 1009 is connected to the sixth wiring 116. A first terminal of the tenth transistor 2310 is connected to the second wiring 112 and a second terminal of the tenth transistor 2310 is connected to the gate terminal of the second transistor 102. A first terminal of the eleventh transistor 2311 is connected to the seventh wiring 1317 and a second terminal of the eleventh transistor 2311 is connected to a gate terminal of the twelfth transistor 2312. A first terminal of the twelfth transistor 2312 is connected to the second wiring 112 and a second terminal of the twelfth transistor 2312 is connected to the gate terminal of the second transistor 102. Note that a connection point of the second terminal of the eleventh transistor 231 and the gate terminal of the twelfth transistor 2312 is denoted by a node 2324.

Note that the first terminal of the third transistor 103, the first terminal of the fourth transistor 104, the first terminal of the fifth transistor 1305, the first terminal of the sixth transistor 1906, the first terminal of the ninth transistor 1909, the first terminal of the tenth transistor 2310, and the first terminal of the twelfth transistor 2312 are not necessarily connected to the second wiring 112 and may be connected to different wirings. In addition, the gate terminal of the third transistor 103 and the gate terminal of the fourth transistor 104 are not necessarily connected to the fourth wiring 114 and may be connected to different wirings. Further, the first terminal of the first transistor 101, the first terminal of the seventh transistor 1907, and the gate terminal of the seventh transistor 1907 are not necessarily connected to the first wiring 111 and may be connected to different wirings. Furthermore, the first terminal of the second transistor 102 and the first terminal of the eighth transistor 1908 are not necessarily connected to the third wiring 113 and may be connected to different wirings. Moreover, the gate terminal of the fifth transistor 1305 and the first terminal of the eleventh transistor 2311 are not necessarily connected to the seventh wiring 1317 and may be connected to different wirings.

Figure 24:
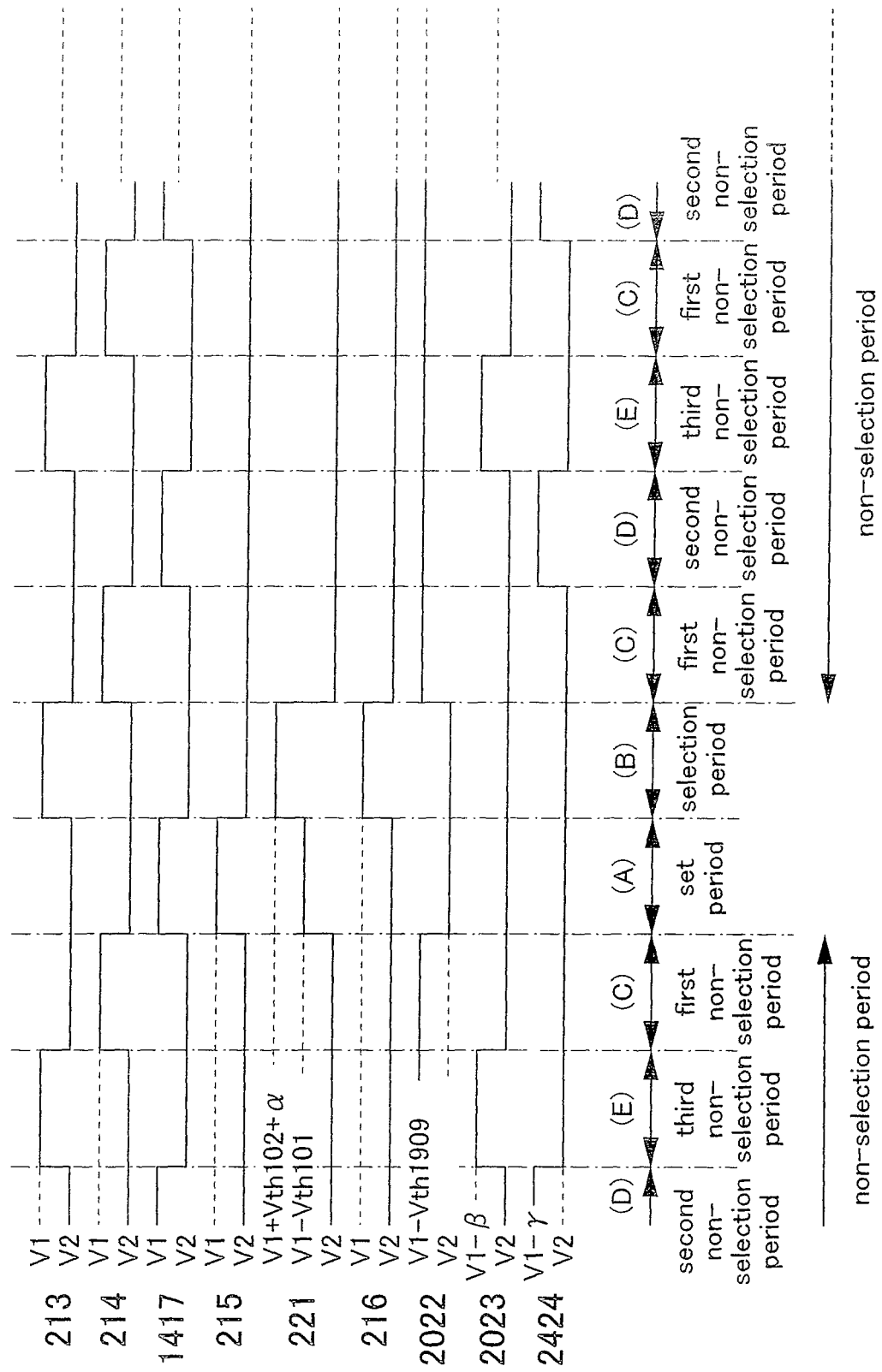
FIG. 24 illustrates Embodiment Mode 4.

Next, operations of the flip-flop shown in FIG. 23 are described with reference to a timing chart shown in FIG. 24. Note that FIG. 24 is a timing chart in the case where the flip-flop in FIG. 23 is operated similarly to the flip-flops shown in FIGS. 1, 13, and 39. Note that portions which are common to those in FIGS. 2, 14, and 20 are denoted by common reference numerals and description thereof is omitted.

In FIG. 24, a potential 2424 is a potential of the node 2324 in FIG. 23.

In the flip-flop in FIG. 23, the tenth transistor 2310 is turned on in a third non-selection period. In addition, the node 121 can be more stably kept at an L level because a potential of the second wiring 112 is supplied to the node 121 through the tenth transistor 2310. Further, in the flip-flop in FIG. 23, the twelfth transistor 2312 is turned on in a first non-selection period. Furthermore, the node 121 can be more stably kept at an L level because the potential of the second wiring 112 is supplied to the node 121 through the twelfth transistor 2312.

Control of on/off of the twelfth transistor 2312 is specifically described. Note that control of on/off of the tenth transistor 2310 is similar to control of on/off of the ninth transistor 1909, which is described in Embodiment Mode 3. First, the sixth transistor 1906 and the seventh transistor 1907 form an inverter, similarly to the flip-flop in FIG. 19. Therefore, since the node 121 is at an L level and the node 1922 becomes an H level in the first non-selection period, the second non-selection period, and the third non-selection period, the eleventh transistor 2311 is turned on. Thus, since the twelfth transistor 2312 is controlled by a signal which is input to the seventh wiring 1317, the twelfth transistor 2312 is turned on in the second non-selection period and is turned off in the first non-selection period and the third non-selection period. On the other hand, since the node 121 is at an H level and the node 1922 gets in an L level in the set period and the selection period, the eleventh transistor 2311 is turned off. Thus, since a potential of the gate terminal of the twelfth transistor 2312 remains at a potential of the first non-selection period which is a period previous to the set period, namely, an L level, the twelfth transistor 2312 is turned off.

As described above, in the flip-flop in FIG. 23, V2 is supplied to each of the sixth wiring 116 and the node 121 in the first non-selection period, the second non-selection period, and the third non-selection period. Therefore, a malfunction of the flip-flop can be further suppressed. This is because V2 can be supplied to each of the sixth wiring 116 and the node 121 in the non-selection period. In addition, since V2 is supplied to each of the sixth wiring 116 and the node 121 in the non-selection period in the flip-flop in FIG. 23, noise of the sixth wiring 116 and the node 121 can be reduced.

In addition, deterioration in characteristics of the tenth transistor 2310, the eleventh transistor 2311, and the twelfth transistor 2312 can be suppressed in the flip-flop in FIG. 23. This is because the tenth transistor 2310 is turned on only in the third non-selection period; the eleventh transistor 2311 is turned on only in a period in which the potential of the node 2324 rises to V1-γ (γ corresponds to Vth1907+Vth2311) of the first non-selection period, the second non-selection period, and the third non-selection period; and the twelfth transistor 2312 is turned on only in the second non-selection period.

Note that in the flip-flop in FIG. 23, the first transistor 101, the second transistor 102, the third transistor 103, the fourth transistor 104, the fifth transistor 1305, the sixth transistor 1906, the seventh transistor 1907, the eighth transistor 1908, the ninth transistor 1909, the tenth transistor 2310, the eleventh transistor 2311, and the twelfth transistor 2312 are all N-channel transistors. Therefore, since amorphous silicon can be used for a semiconductor layer of each transistor in the flip-flop in FIG. 23, a manufacturing process can be simplified, and thus manufacturing cost can be reduced and a yield can be improved. In addition, a semiconductor device such as a large display panel can also be manufactured. Further, even when polysilicon or single crystal silicon is used for the semiconductor layer of each transistor, the manufacturing process can be simplified.

Further, since deterioration in characteristics of each transistor can be suppressed even when amorphous silicon in which characteristics easily deteriorate (the threshold voltage is easily shifted) is used for the semiconductor layer of each transistor in the flip-flop in FIG. 23, a semiconductor device such as a long-life display panel can be manufactured.

Here, functions of the tenth transistor 2310, the eleventh transistor 2311, and the twelfth translator 2312 are described. The tenth transistor 2310 has a function of selecting timing for supplying the potential of the second wiring 112 to the node 121 and functions as a switching transistor. The eleventh transistor 2311 has a function of selecting timing for supplying a potential of the seventh wiring 1317 to the node 2324 and functions as a switching transistor. The twelfth transistor 2312 has a function of selecting timing for supplying the potential of the second wiring 112 to the node 121 and functions as a switching transistor.

Note that arrangement, the number, and the like of the transistors are not limited to those of FIG. 23 as long as operations which are similar to those of FIG. 23 are performed. Thus, a transistor, another element (e.g., a resistor or a capacitor), a diode, a switch, any logic circuit, or the like may be additionally provided.

Figure 25:
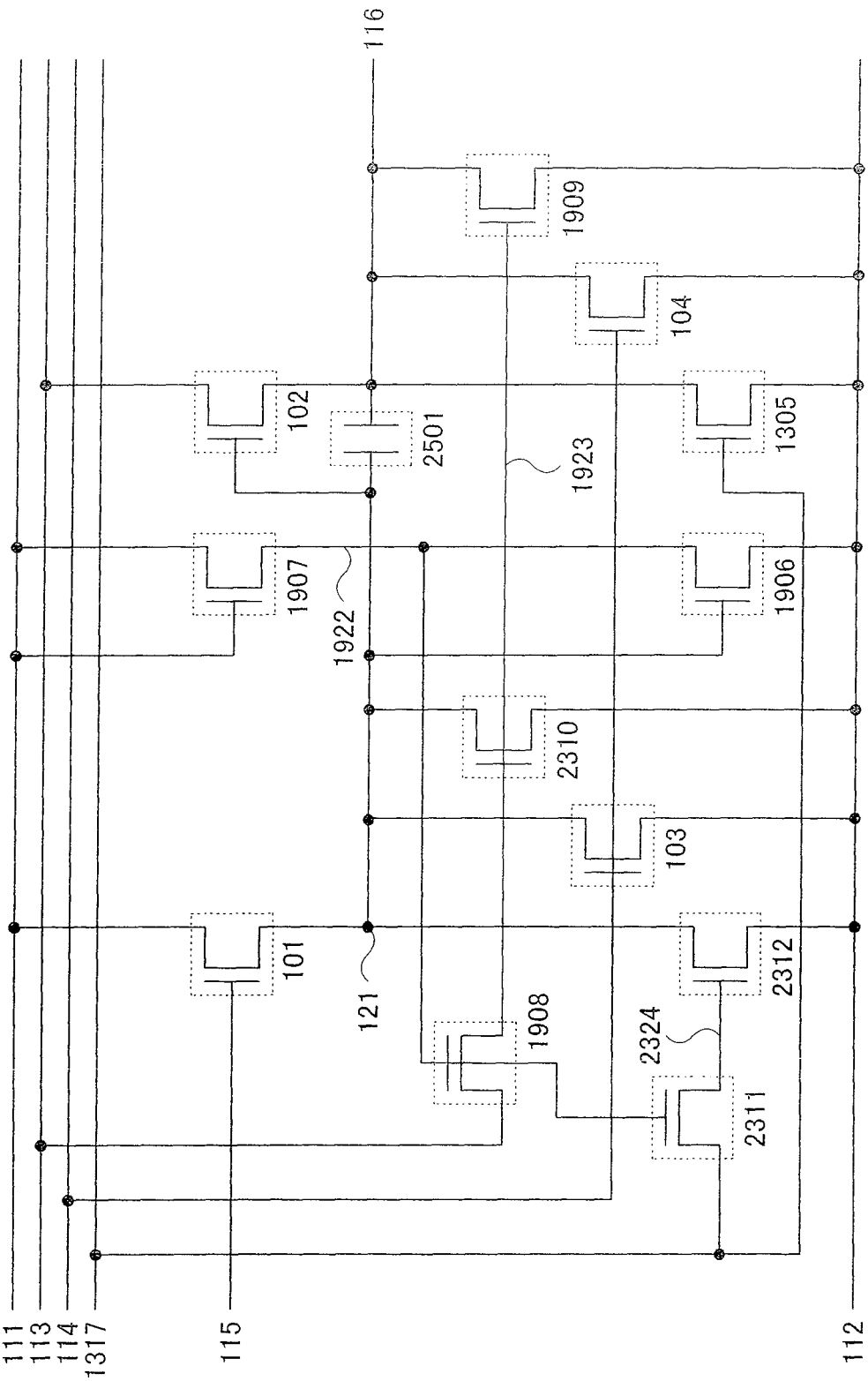
FIG. 25 illustrates Embodiment Mode 4.

For example, as shown in FIG. 25, a capacitor 2501 may be provided between the gate terminal and the second terminal of the second transistor 102 shown in FIG. 23. By proving the capacitor 2501, the bootstrap operation in the selection period can be performed more stably. In addition, since the parasitic capacitance between the gate terminal and the second terminal of the second transistor 102 can be reduced, each transistor can be switched at high speed. Note that in the capacitor 2501, a gate insulating film may be used as an insulating layer and a gate electrode layer and a wiring layer may be used as conductive layers; a gate insulating film may be used as the insulating layer and a gate electrode layer and a semiconductor layer to which an impurity is added may be used as the conductive layers; or an interlayer film (an insulating film) may be used as the insulating layer and a wiring layer and a transparent electrode layer may be used as the conductive layers. Note that portions which are common to those in FIG. 23 are denoted by common reference numerals and description thereof is omitted.

Figure 26:
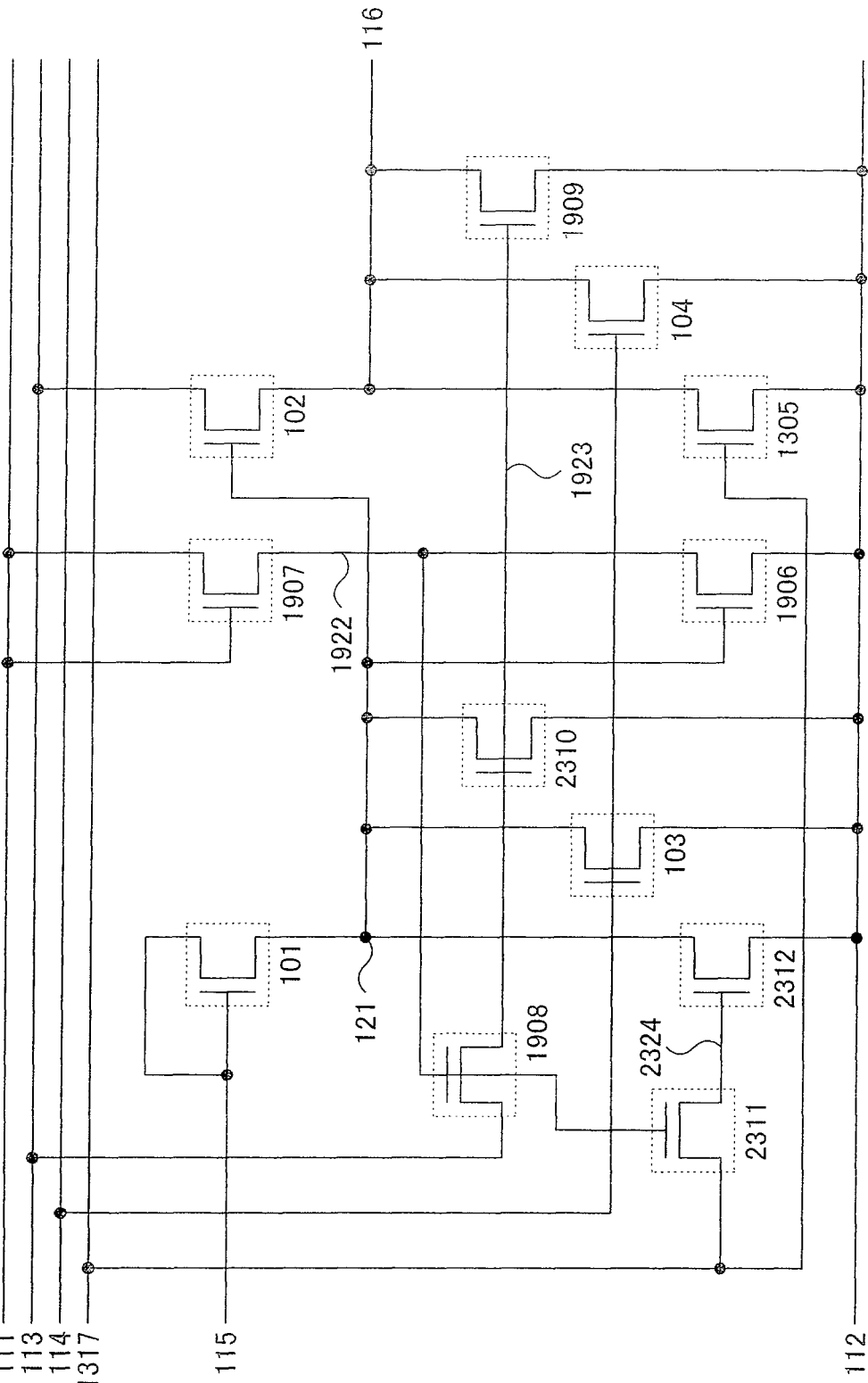
FIG. 26 illustrates Embodiment Mode 4.

Operations which are similar to those of FIG. 23 can also be performed in a flip-flop in FIG. 26. As shown in FIG. 26, the first transistor 101 shown in FIG. 23 may be diode-connected. The first transistor 101 is diode-connected, so that current flowing through the first wiring 111 is made small. Thus, the wiring width of the first wiring 111 can be made small.

In addition, each of the flip-flops shown in this embodiment mode can be applied to each of the shift registers in FIGS. 17 and 18. Since dock signals having three phases can be used similarly to Embodiment Modes 1 to 3, power can be saved. Further, since the number of stages of the flip-flops 1701 connected to each clock signal line (each of the third wiring 613, the fourth wiring 614, and the fifth wiring 615) is reduced to two-third that of the case of using single-phase, dock signals in each of the shift registers of this embodiment mode, a load of each chock signal line can be reduced.

Further, each of the shift registers shown in this embodiment mode can be applied to each of the display devices in FIGS. 9, 11, 12, and 44. The life of each of the display devices can be extended by applying this embodiment mode to a scan line driver circuit formed over the same substrate as a pixel portion, similarly to Embodiment Modes 1 to 3.

Note that each of the shift registers and the flip-flops shown in this embodiment mode can be freely combined with structures of display devices shown in other embodiment modes in this specification. In addition, the structures of each of the shift register and the flip-flops shown in this embodiment mode can be freely combined.

Embodiment Mode 5

Figure 27:
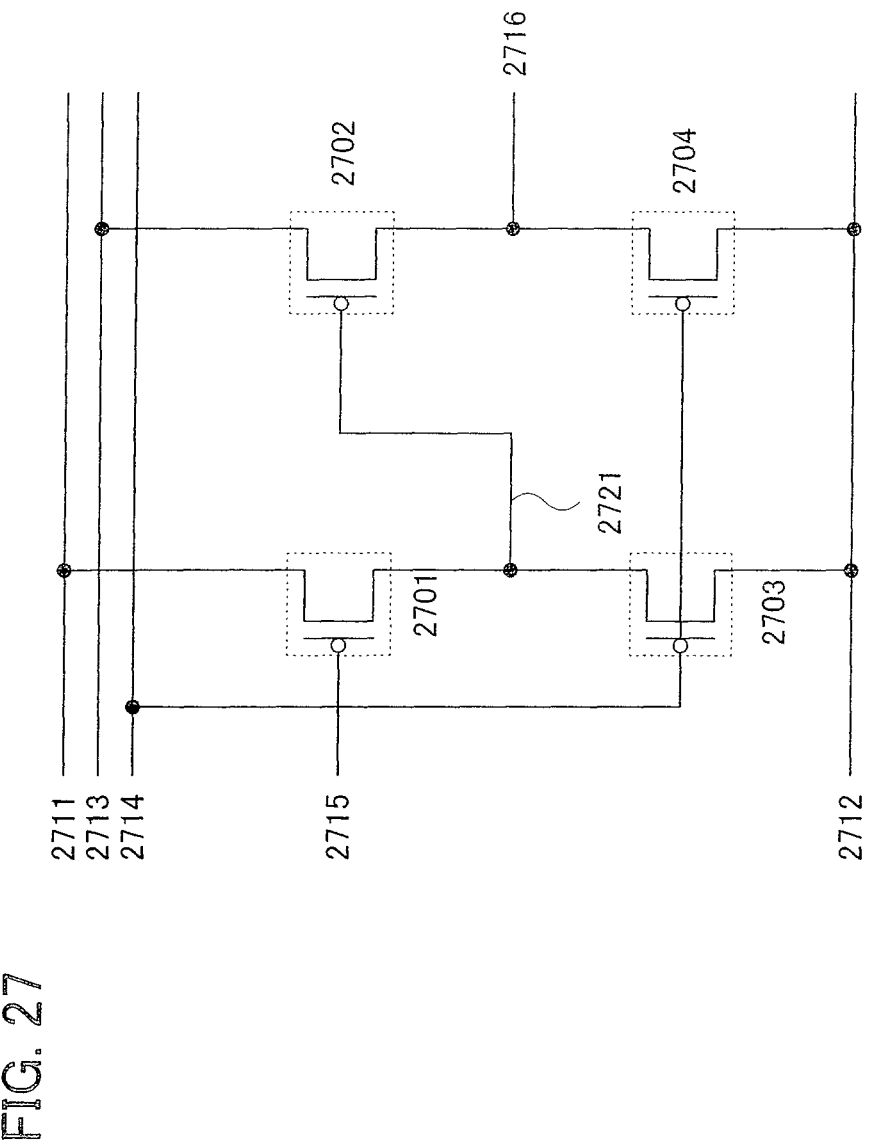
FIG. 27 illustrates Embodiment Mode 5.

In this embodiment mode, the case is described in which a P-channel transistor is employed as a transistor included in a flip-flop with reference to FIG. 27. Note that a flip-flop formed by using a P-channel transistor has a basic structure which is similar to that of a flip-flop formed by using an N-channel transistor. Note that a power supply potential, and H level and L level of a signal, are inverted.

FIG. 27 shows a flip-flop of one stage (e.g., a first stage) that is one of a plurality of flip-flops included in a shift register. The flip-flop shown in FIG. 27 includes a first transistor 2701, a second transistor 2702, a third transistor 2703, and a fourth transistor 2704. Note that the flip-flop is connected to a first wiring 2711, a second wiring 2712, the third wiring 2713, a fourth wiring 2714, a fifth wiring 2715, and a sixth wiring 2716. In this embodiment mode, each of the first transistor 2701, the second transistor 2702, the third transistor 2703, and the fourth transistor 2704 is a P-channel transistor and is turned on when the absolute value of gate-source voltage (|Vgs|) exceeds the threshold voltage (|Vth|) (when Vgs becomes lower than Vth). Note that the first wiring 2711 and the second wiring 2712 may be called a first power supply line and a second power supply line, respectively. In addition, the third wiring 2713 and the fourth wiring 2714 may be called a first signal line and a second signal line, respectively.

Note that the first transistor 2703, the second transistor 2702, the third transistor 2703, and the fourth transistor 2704 correspond to the first transistor 101, the second transistor 102, the third transistor 103, and the fourth transistor 304 in FIG. 1, respectively. In addition, the first wiring 2713, the second wiring 2712, the third wiring 2713, the fourth wiring 2714, the fifth wiring 2715, and the sixth wiring 2716 correspond to the first wiring 113, the second wiring 132, the third wiring 313, the fourth wiring 114, the fifth wiring 315, and the sixth wiring 116 in FIG. 1 respectively.

A first terminal (one of a source terminal and a drain terminal) of the first transistor 2701 is connected to the first wiring 2711; a second terminal (the other thereof) of the first transistor 2701 is connected to a gate terminal of the second transistor 2702; and a gate terminal of the first transistor 2701 is connected to the fifth wiring 2715. A first terminal of the third transistor 2703 is connected to the second wiring 2712; a second terminal of the third transistor 2703 is connected to the gate terminal of the second transistor 2702; and a gate terminal of the third transistor 2703 is connected to the fourth wiring 2714. A first terminal of the second transistor 2702 is connected to the third wiring 2713 and a second terminal of the second transistor 2702 is connected to the sixth wiring 2716. A first terminal of the fourth transistor 2704 is connected to the second wiring 2732; a second terminal of the fourth transistor 2704 is connected to the sixth wiring 2716; and a gate terminal of the fourth transistor 2704 is connected to the fourth wiring 2714. Note that a connection point of the second terminal of the first transistor 2701, the gate terminal of the second transistor 2702, and the second terminal of the third transistor 2703 is denoted by a node 2721.

Note that the second terminal of the third transistor 2703 and the second terminal of the fourth transistor 2704 are not necessarily connected to the second wiring 2712 and may be connected to different wirings. In addition, the gate terminal of the third transistor 2703 and the gate terminal of the fourth transistor 2704 are not necessarily connected to the fourth wiring 2714 and may be connected to different wirings.

Next, operations of the flip-flop shown in FIG. 27 are described with reference to a timing chart shown in FIG. 28, and FIGS. 29A to 29E. Note that a set period, a selection period, and a non-selection period in FIG. 28 are described. Note also that the non-selection period is divided into a first non-selection period, a second non-selection period, and a third non-selection period, and the first non-selection period, the second non-selection period, and the third non-selection period are sequentially repeated.

Note that a potential of V2 is supplied to the first wiring 2711 and a potential of V1 is supplied to the second wiring 2712. Note also that V1>V2 is satisfied.

Note also that the potential of V2 is not necessarily supplied to the first wiring 2711. Another potential may be supplied to the first wiring 2711, or a digital signal or an analog signal may be input to the first wiring 2711. Further, the potential of V1 is not necessarily supplied to the second wiring 2712. Another potential may be supplied to the second wiring 2712, or a digital signal or an analog signal may be input to the second wiring 2712.

Note that a signal is input to each of the third wiring 2713, the fourth wiring 2714, and the fifth wiring 2715. The signal input to the third wiring 2713 is a first clock signal; the signal input to the fourth wiring 2714 is a second dock signal; and the signal input to the fifth wiring 2715 is a start signal. In addition, the signal input to each of the third wiring 2713, the fourth wiring 2714, and the fifth wiring 2715 is a digital signal in which a potential of an H-level signal is at V1 (thereinafter also referred to as an H level) and a potential of an L-level signal is at V2 (thereinafter also referred to as an L level).

Note also that the first clock signal is not necessarily input to the third wiring 2713. Another signal may be input to the third wiring 2713, or a constant potential or current may be input to the third wiring 2713. In addition, the second clock signal is not necessarily input to the fourth wiring 2714. Another signal may be input to the fourth wiring 2714, or a constant potential or current may be input to the fourth wiring 2714. Further, the start signal is not necessarily input to the fifth wiring 2715. Another signal may be input to the fifth wiring 2715, or a constant potential or current may be input to the fifth wiring 2715.

Further, the potential of the H-level signal of the signal input to each of the third wiring 2713, the fourth wiring 2714, and the fifth wiring 2715 is not limited to V1 and the potential of the L-level signal thereof is not limited to V2. The potentials are not particularly limited as long as the potential of the H-level signal is higher than the potential of the L-level signal.

Note that a signal is output from the sixth wiring 2716. The signal output from the sixth wiring 2716 is an output signal of the flip-flop and is also a start signal of the flip-flop of the next stage. In addition, the signal output from the sixth wiring 2716 is input to the fifth wiring 2715 of the flip-flop of the next stage. Further, the signal output from the sixth wiring 2716 is a digital signal in which a potential of an H-level signal is at V1 (thereinafter also referred to as an H level) and a potential of an L-level signal is at V2 (thereinafter also referred to as an L level).

In FIG. 28, a signal 2813 is a signal input to the third wiring 2713; a signal 2814 is a signal input to the fourth wiring 2714; a signal 2815 is a signal input to the fifth wiring 2815; and a signal 2816 is a signal output from the sixth wiring 2716. In addition, a potential 2821 is a potential of the node 2721 in FIG. 27.

First, in the set period shown in period A of FIG. 28 and FIG. 29A, the signal 2813 and the signal 2814 are at an H level and the signal 2815 becomes an L level. Therefore, the third transistor 2703 and the fourth transistor 2704 are turned off and the first transistor 2701 is turned on. At this time, the second terminal of the first transistor 2701 corresponds to the source terminal and the potential of the node 2721 (the potential 2821) becomes V2+|Vth2701| because it becomes the sum of a potential of the fifth wiring 2715 and the absolute value of the threshold voltage of the first transistor 2701. Thus, the second transistor 2702 is turned on and a potential of the sixth wiring 2716 becomes V1 because it becomes equal to a potential of the third wiring 2713. In this manner in the set period, an H level is output from the sixth wiring 2716 white keeping the second transistor 2702 on in the flip flop.

In the selection period shown in period B of FIG. 28 and FIG. 29B, the signal 2813 becomes an L level, the signal 2814 remains at an H level, and the signal 2815 becomes an H level. Therefore, the third transistor 2703 and the fourth transistor 2704 remain off and the first transistor 2701 is turned off. At this time, the second terminal of the second transistor 2702 corresponds to the source terminal and the potential of the sixth wiring 2716 starts to decrease. Since the node 2721 is in a floating state, the potential of the node 2721 (the potential 2821) decreases at the same time as the potential of the sixth wiring 2716 by capacitive coupling of parasitic capacitance between the gate terminal and the second terminal of the second transistor 2702 (also referred to as a bootstrap operation). Thus, the gate-source voltage Vgs of the second transistor 2702 becomes $-|Vth2702|-\alpha$ (Vth 2702 corresponds to the threshold voltage of the second transistor 2702 and $\alpha$ corresponds to a given positive number) and the potential of the sixth wiring 2716 becomes an L level (V2). In this manner, in the selection period, an L level can be output from the sixth wiring 2716 by setting the potential of the node 2721 to be $V2-|Vth2702|-\alpha$ in the flip-flop.

In the first non-selection period shown in period C of FIG. 28 and FIG. 29C, the signal 2813 becomes an H level, the signal 2814 becomes an L level, and the signal 2815 remains an H level. Therefore, the third transistor 2703 and the fourth transistor 2704 are turned on and the first transistor 2701 remains off. The node 2721 and the sixth wiring 2716 become an H level because a potential of the second wiring 2712 is supplied to the node 2721 and the sixth wiring 2716 through the third transistor 2703 and the fourth transistor 2704, respectively.

In the second non-selection period shown in period D of FIG. 28 and FIG. 29D, the signal 2813 remains an H level, the signal 2814 becomes an H level and the signal 2815 remains an H level. Therefore, the third transistor 2703 and the fourth transistor 2704 are turned off and the first transistor 2701 remains off. Thus, the node 2721 and the sixth wiring 2716 remain an H level.

In the third non-selection period shown in period E of FIG. 28 and FIG. 29E, the signal 2813 becomes an L level, and the signal 2814 and the signal 2815 remain an H level. Therefore, the first transistor 2701, the third transistor 2703, and the fourth transistor 2704 remain off. Thus, the node 2721 and the sixth wiring 2716 remain an H level.

As described above, since the third transistor 2703 and the fourth transistor 2704 are turned on only in the first non-selection period in the flip-flop in FIG. 27, deterioration in characteristics (a threshold voltage shift) of the third transistor 2703 and the fourth transistor 2704 can be suppressed. Note that in the flip-flop in FIG. 27, since the first transistor 2701 is turned on only in the set period and the second transistor 2702 is turned on only in the set period and the selection period, deterioration in characteristics of the first transistor 2701 and the second transistor 2702 can also be suppressed.

Further, in the flip-flop in FIG. 27, V1 is supplied to each of the node 2721 and the sixth wiring 2716 in the first non-selection period in the non-selection period. Therefore, a malfunction of the flip-flop can be suppressed. This is because V1 is supplied to each of the node 2721 and the sixth wiring 2716 at regular intervals (in the first non-selection period) in the non-selection period, and thus the potentials of the node 2721 and the sixth wiring 2716 can be stabilized at V1.

Note that in the flip-flop in FIG. 27, the first transistor 2701, the second transistor 2702, the third transistor 2703, and the fourth transistor 2704 are all P-channel transistors. Therefore, a manufacturing process can be simplified, and thus manufacturing cost can be reduced and a yield can be improved in the flip-flop in FIG. 27. In addition, even when polysilicon or single crystal silicon is used for a semiconductor layer of each transistor, the manufacturing process can be simplified.

Here, functions of the first transistor 2701, the second transistor 2702, the third transistor 2703, and the fourth transistor 2704 are described. The first transistor 2703 has a function of selecting timing for supplying the potential of the first wiring 2713 and functions as a transistor for input. The second transistor 2702 has a function of selecting timing for supplying the potential of the third wiring 2713 to the sixth wiring 2716 and decreasing the potential of the node 2721 by the bootstrap operation and functions as a transistor for bootstrap. The third transistor 2703 has a function of selecting timing for supplying the potential of the second wiring 2712 to the node 2723 and functions as a switching transistor. The fourth transistor 2704 has a function of supplying the potential of the second wiring 2712 to the sixth wiring 2736 and functions as a switching transistor.

Note that arrangement, the number, and the like of the transistors are not limited to those of FIG. 27 as long as operations which are similar to those of FIG. 27 are performed. As is apparent from FIGS. 29A to 29E which show the operations of the flip-flop in FIG. 27, in this embodiment mode, it is only necessary to have electrical continuity in the set period, the selection period, the first non-selection period, the second non-selection period, and the third non-selection period, as shown by a solid line in each of FIGS. 29A to 29E. Thus, a transistor, another element (e.g., a resistor or a capacitor), a diode, a switch, any logic circuit, or the like may be additionally provided as long as a structure is employed in which a transistor or the like is provided so as to satisfy the above-described condition and the structure can be operated.

Figure 30:
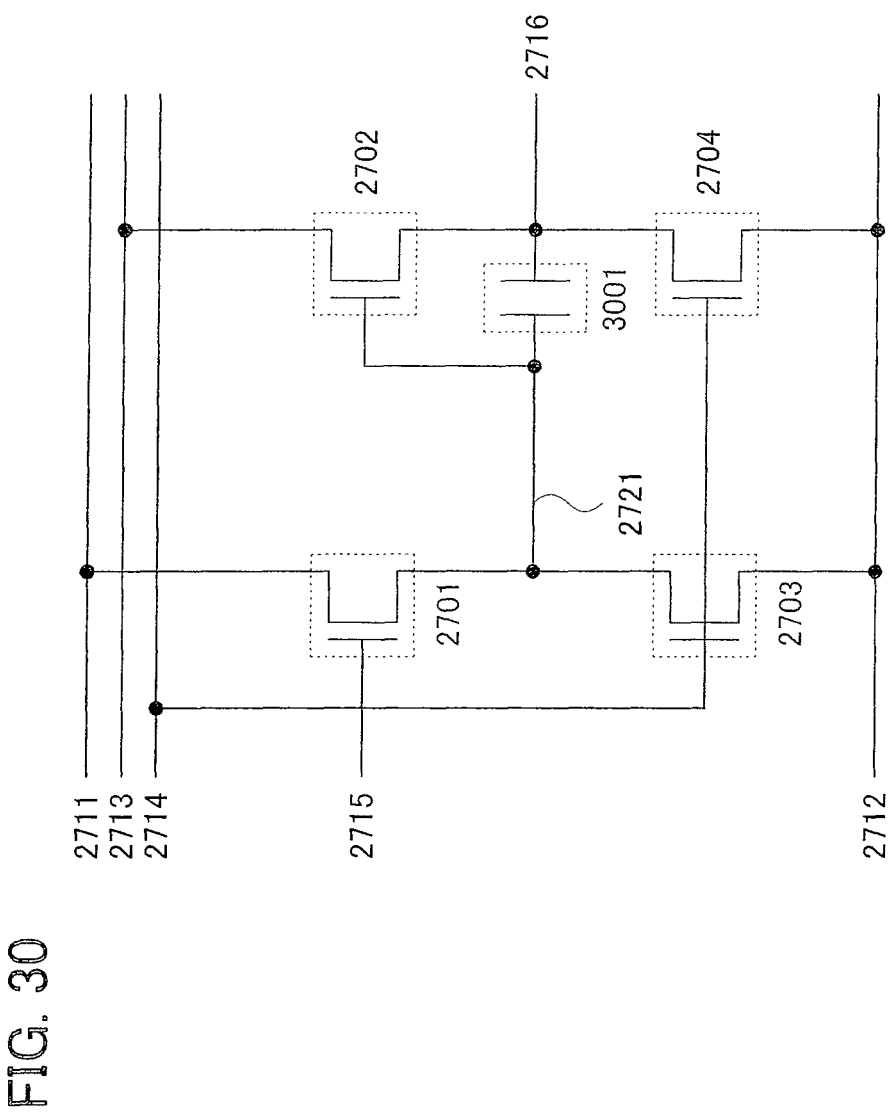
FIG. 30 illustrates Embodiment Mode 5.

For example, as shown in FIG. 30, a capacitor 3001 may be provided between the gate terminal and the second terminal of the second transistor 2702 shown in FIG. 27. By proving the capacitor 3001, the bootstrap operation in the selection period can be performed more stably. In addition, since the parasitic capacitance between the gate terminal and the second terminal of the second transistor 2702 can be reduced, each transistor can be switched at high speed. Note that in the capacitor 3001, a gate insulating film may be used as an insulating layer and a gate electrode layer and a wiring layer may be used as conductive layers; a gate insulating film may be used as the insulating layer and a gate electrode layer and a semiconductor layer to which an impurity is added may be used as the conductive layers; or an interlayer film (an insulating film) may be used as the insulating layer and a wiring layer and a transparent electrode layer may be used as the conductive layers. Note that portions which are common to those in FIG. 27 are denoted by common reference numerals and description thereof is omitted.

Note that the capacitor 3001 corresponds to the capacitor 401 in FIG. 4.

Figure 31:
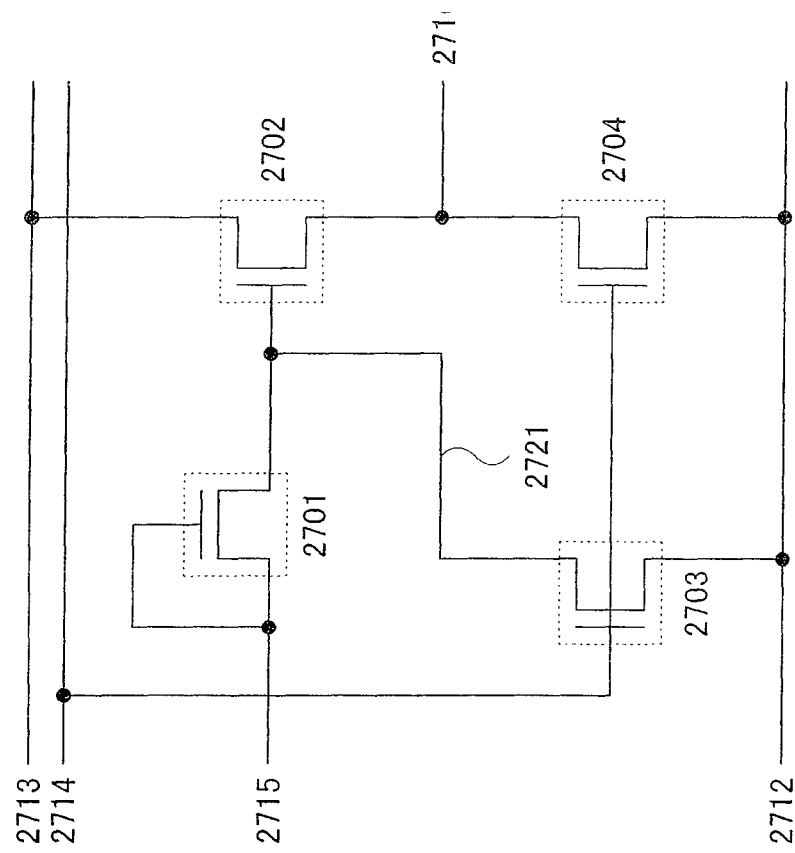
FIG. 31 illustrates Embodiment Mode 5.

Operations which are similar to those of FIG. 27 can also be performed in a flip-flop in FIG. 31. As shown in FIG. 31, the first transistor 2701 shown in FIG. 27 may be diode-connected. The first transistor 2701 is diode-connected, so that the first wiring 2711 is not necessary. Thus, one wiring and one power source potential (V2) can be eliminated from the structure. Note that portions which are common to those in FIG. 27 are denoted by common reference numerals and description thereof is omitted.

In addition, each of the flip-flops shown in this embodiment mode can be applied to each of the shift registers in FIGS. 6 and 8. Since three-phase clock signals can be used similarly to Embodiment Modes 1 to 4, power can be saved. Further, since the number of stages of the flip-flop 601 connected to each clock signal line (each of the third wiring 613, the fourth wiring 6K and the fifth wiring 615) is reduced to two-third compared with the case of using single-phase clock signals in each of the shift registers of this embodiment mode, a load of each dock signal line can be reduced. Note that in each of a potential supplied to each of the first wiring 611 and the second wiring 612, a signal input to each of the third wiring 613, the fourth wiring 614, the fifth wiring 615, and the sixth wiring 616, and a signal output to the wiring 622, an H level and an L level are inverted compared with the case where the flip-flop formed by using the N-channel transistor is applied to each of the shift registers in FIGS. 6 and 8.

Further, each of the shift registers shown in this embodiment mode can be applied to each of the display devices in FIGS. 9, 11, 12, and 44. The life of each of the display devices can be extended by applying this embodiment mode to a scan line driver circuit formed over the same substrate as a pixel portion, similarly to Embodiment Modes 1 to 4.

Note that each of the shift registers and the flip-flops shown in this embodiment mode can be freely combined with structures of display devices shown in other embodiment modes in this specification. In addition, the structures of each of the shift registers and the flip-flops shown in this embodiment mode can be freely combined.

Embodiment Mode 6

Figure 32:
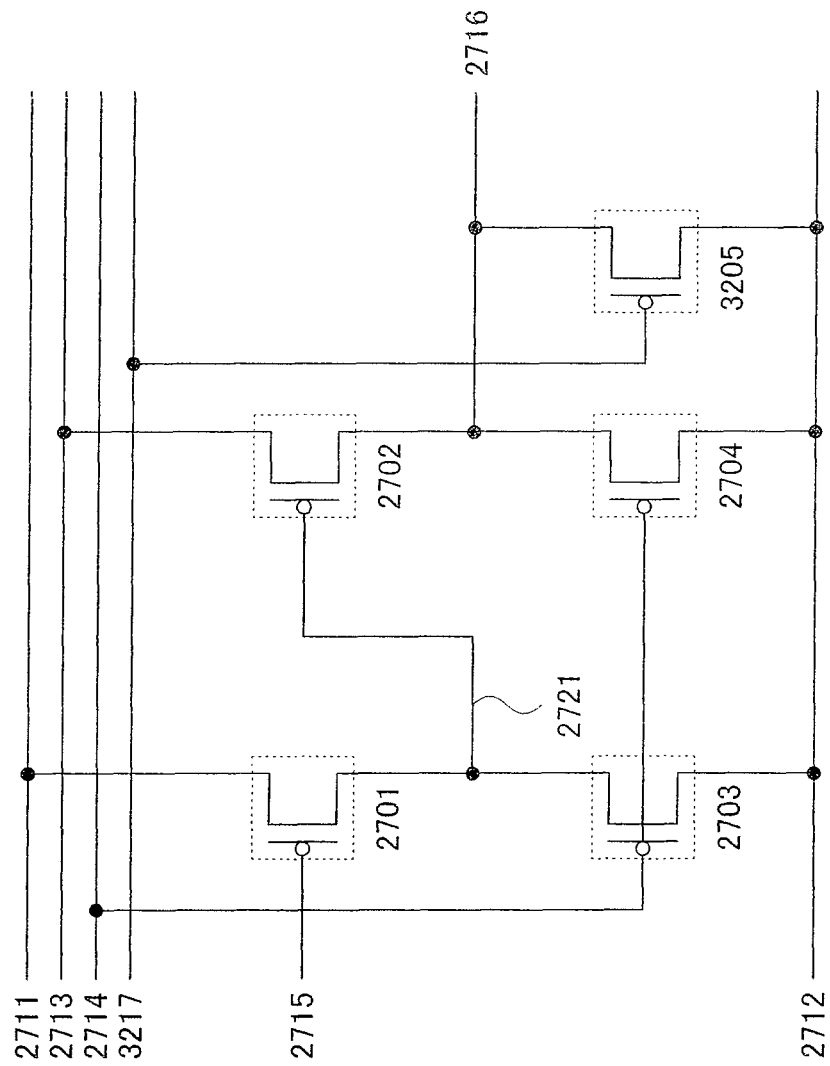
FIG. 32 illustrates Embodiment Mode 6.

In this embodiment mode, a flip-flop formed by using a P-channel transistor having a structure which is different from that of Embodiment Mode 5 is shown in FIG. 32. Note that portions which are similar to Embodiment Mode 5 are denoted by common reference numerals and detailed description of the portions which are the same and portions which have similar functions is omitted.

The flip-flop shown in FIG. 32 includes the first transistor 2701, the second transistor 2702, the third transistor 2703, the fourth transistor 2704, and a fifth transistor 3205. Note that the flip-flop is connected to the first wiring 2711, the second wiring 2712, the third wiring 2733, the fourth wiring 2714, the fifth wiring 2715, the sixth wiring 2716, and a seventh wiring 3217. In this embodiment mode, the fifth transistor 3205 is a P-channel transistor and is turned on when the absolute value of gate-source voltage (|Vgs|) exceeds the threshold voltage (|Vth|) (when Vgs becomes lower than Vth). Note that the seventh wiring 3217 may be called a third signal line.

Note that the fifth transistor 3205 corresponds to the fifth transistor 1305 in FIG. 13. In addition, the seventh wiring 3217 corresponds to the seventh wiring 1317 in FIG. 13.

The first terminal (one of the source terminal and the drain terminal) of the first transistor 2701 is connected to the first wiring 2711; the second terminal (the other thereof) of the first transistor 2701 is connected to the gate terminal of the second transistor 2702; and the gate terminal of the first transistor 2701 is connected to the fifth wiring 2715. The first terminal of the third transistor 2703 is connected to the second wiring 2712; the second terminal of the third transistor 2703 is connected to the gate terminal of the second transistor 2702; and the gate terminal of the third transistor 2703 is connected to the fourth wiring 2714. The first terminal of the second transistor 2702 is connected to the third wiring 2713 and the second terminal of the second transistor 2702 is connected to the sixth wiring 2716. The first terminal of the fourth transistor 2704 is connected to the second wiring 2712; the second terminal of the fourth transistor 2704 is connected to the sixth wiring 2716; and the gate terminal of the fourth transistor 2704 is connected to the fourth wiring 2714. A first terminal of the fifth transistor 3205 is connected to the second wiring 2712; a second terminal of the fifth transistor 3205 is connected to the sixth wiring 2716; and a gate terminal of the fifth transistor 3205 is connected to the seventh wiring 3217.

Note that the first terminal of the third transistor 2703, the first terminal of the fourth transistor 2704, and the first terminal of the fifth transistor 3205 are not necessarily connected to the second wiring 2712 and may be connected to different wirings. In addition, the gate terminal of the third transistor 2703 and the gate terminal of the fourth transistor 2704 are not necessarily connected to the fourth wiring 2714 and may be connected to different wirings.

Figure 33:
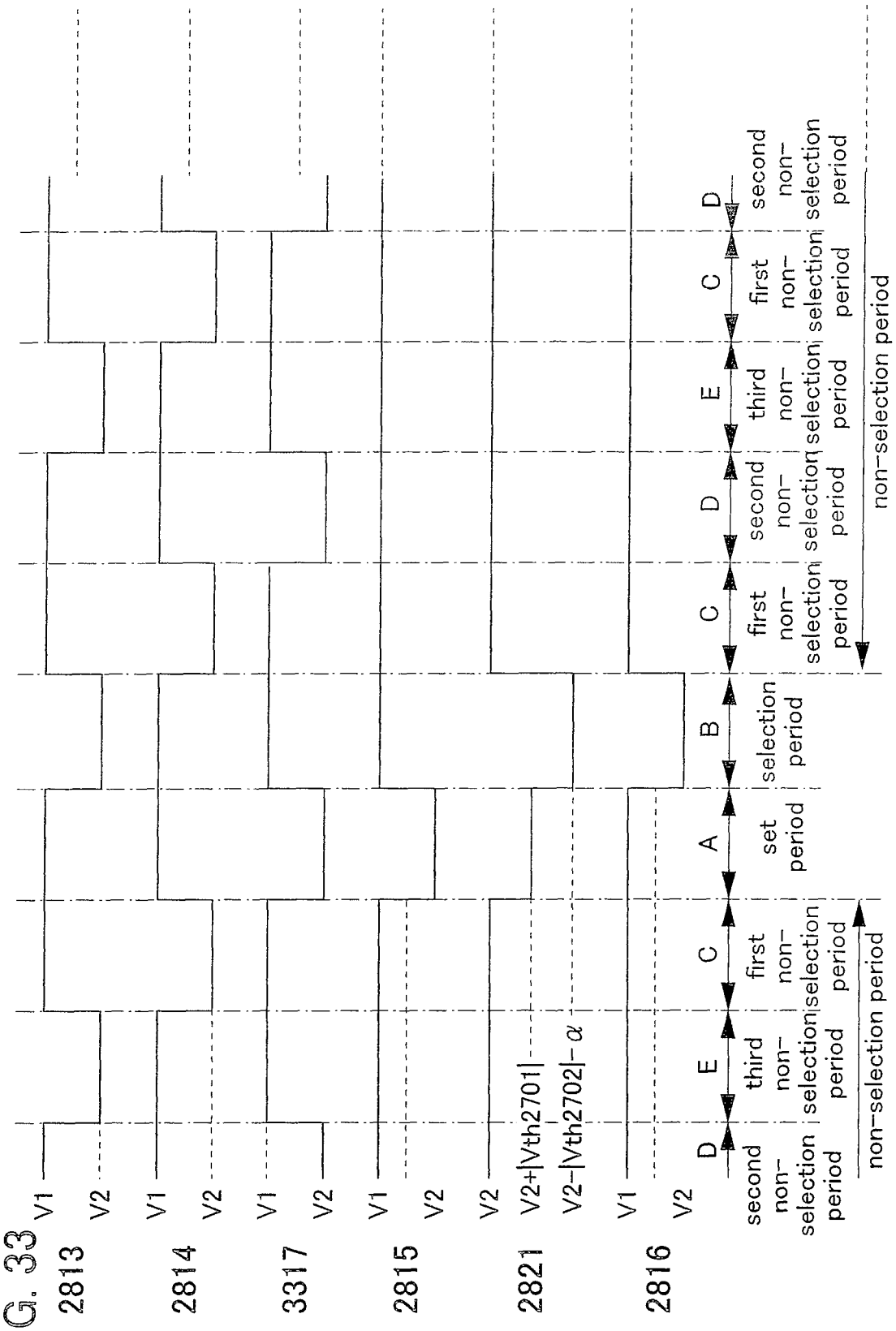
FIG. 33 illustrates Embodiment Mode 6.

Next operations of the flip-flop shown in FIG. 32 are described with reference to a timing chart shown in FIG. 33. Note that FIG. 33 is a timing chart in the case where the flip-flop in FIG. 32 is operated similarly to the flip-flop shown in FIG. 27. Note that portions which are common to those in the timing chart in FIG. 28 are denoted by common reference numerals and description thereof is omitted.

Note that a signal is input to the seventh wiring 3217. The signal input to the seventh wiring 3217 is a third clock signal In addition, the signal input to the seventh wiring 3217 is a digital signal to which a potential of an H-level signal is at V1 (hereinafter also referred to as an H level) and a potential of an L-level signal is at V2 (hereinafter also referred to as an L level).

Note also that the third clock signal is not necessarily input to the seventh wiring 3217. Another signal may be input to the seventh wiring 3217, or a constant potential or current may be input to the seventh wiring 3217.

In FIG. 33, a signal 3317 is a signal input to the seventh wiring 3217.

In the flip-flop in FIG. 32, the fifth transistor 3205 is turned on in a set period and a second non-selection period. In addition, the sixth wiring 2716 remains an H level because a potential of the second wiring 2712 is supplied to the sixth wiring 2716 through the fifth transistor 3205.

As described above, in the flip-flop in FIG. 32, V1 is supplied to the sixth wiring 2716 in a first non-selection period and the second non-selection period from the first non-selection period, the second non-selection period, and a third non-selection period. Therefore, a malfunction of the flip-flop can be further suppressed. This is because V1 is supplied to the sixth wiring 2716 at regular intervals (in the first non-selection period and the second non-selection period) in the non-selection period, and thus a potential of the sixth wiring 2716 can be stabilized at V1.

Further, since the fifth transistor 3205 of the flip-flop in FIG. 32 is turned on only in the set period and the second non-selection period, deterioration in characteristics of the fifth transistor 3205 can be suppressed.

Note that in the flip-flop in FIG. 32, the first transistor 2701, the second transistor 2702, the third transistor 2703, the fourth transistor 2704, and the fifth transistor 3205 are all P-channel transistors. Therefore, a manufacturing process cart be simplified, and thus manufacturing cost can be reduced and a yield can be improved in the flip-flop in FIG. 32. In addition, even when polysilicon or single crystal silicon is used for a semiconductor layer of each transistor, the manufacturing process can be simplified.

Here, a function of the fifth transistor 3205 is described. The fifth transistor 3205 has a function of selecting timing for supplying the potential of the second wiring 2712 to the sixth wiring 2726 and functions as a switching transistor.

Note that arrangement, the number, and the like of the transistors are not limited to those of FIG. 32 as long as operations which are similar to those of FIG. 32 are performed. Thus, a transistor, another element (e.g., a resistor or a capacitor), a diode, a switch, any logic circuit, or the like may be additionally provided.

Figure 34:
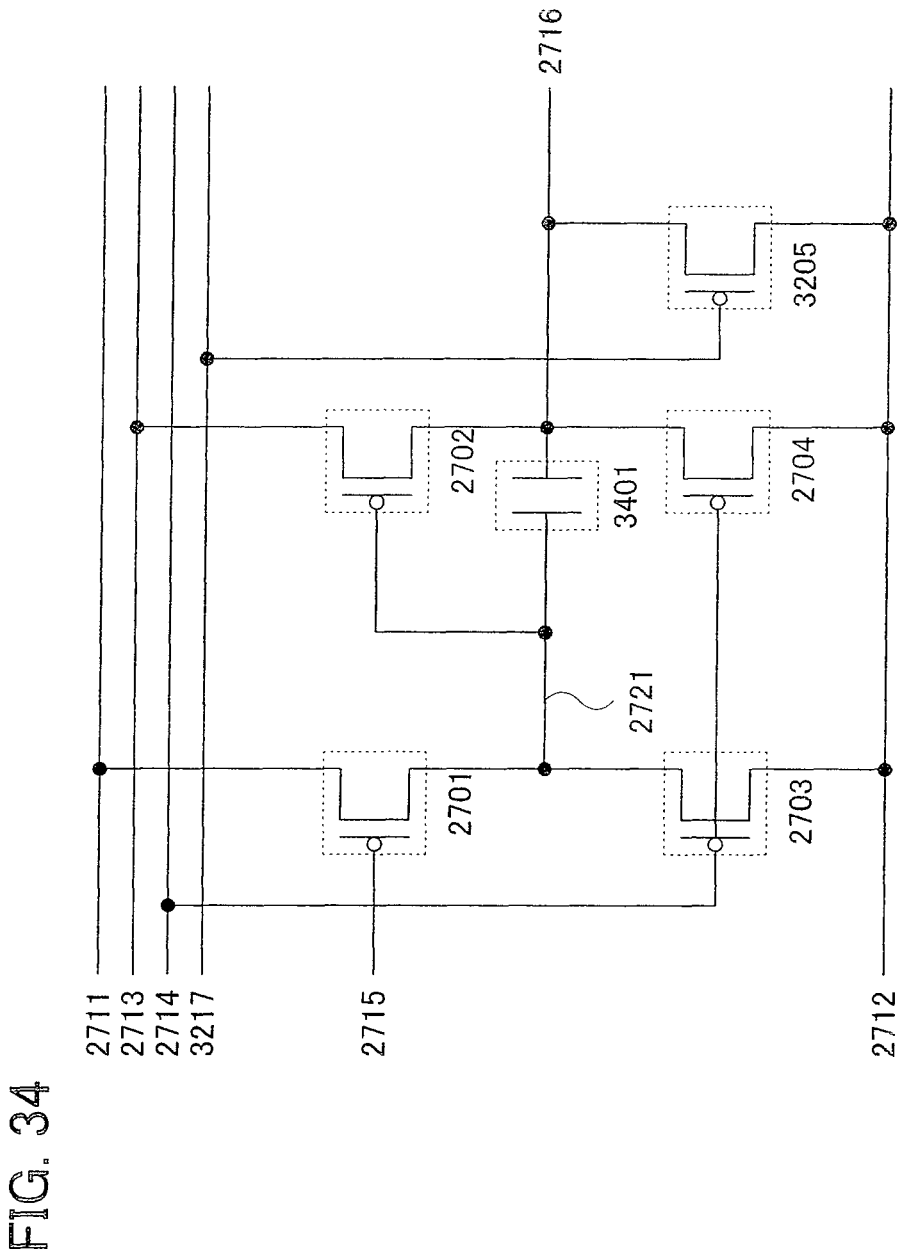
FIG. 34 illustrates Embodiment Mode 6.

For example, as shown in FIG. 34, a capacitor 3401 may be provided between the gate terminal and the second terminal of the second transistor 2702 shown in FIG. 32. By proving the capacitor 3401, the bootstrap operation in the selection period can be performed more stably. In addition, since the parasitic, capacitance between the gate terminal and the second terminal of the second transistor 2702 can be reduced, each transistor can be switched at high speed. Note that in the capacitor 3401, a gate insulating film may be used as an insulating layer and a gate electrode layer and a wiring layer may be used as conductive layers; a gate insulating film may be used as the insulating layer and a gate electrode layer and a semiconductor layer to which air impurity is added may be used as the conductive layers; or an interlayer film (an insulating film) may be used as the insulating layer and a wiring layer and a transparent electrode layer may be used as the conductive layers. Note that portions which are common to those in FIG. 32 are denoted by common reference numerals and description thereof is omitted.

Note that the capacitor 3401 corresponds to the capacitor 1501 in FIG. 15.

Figure 35:
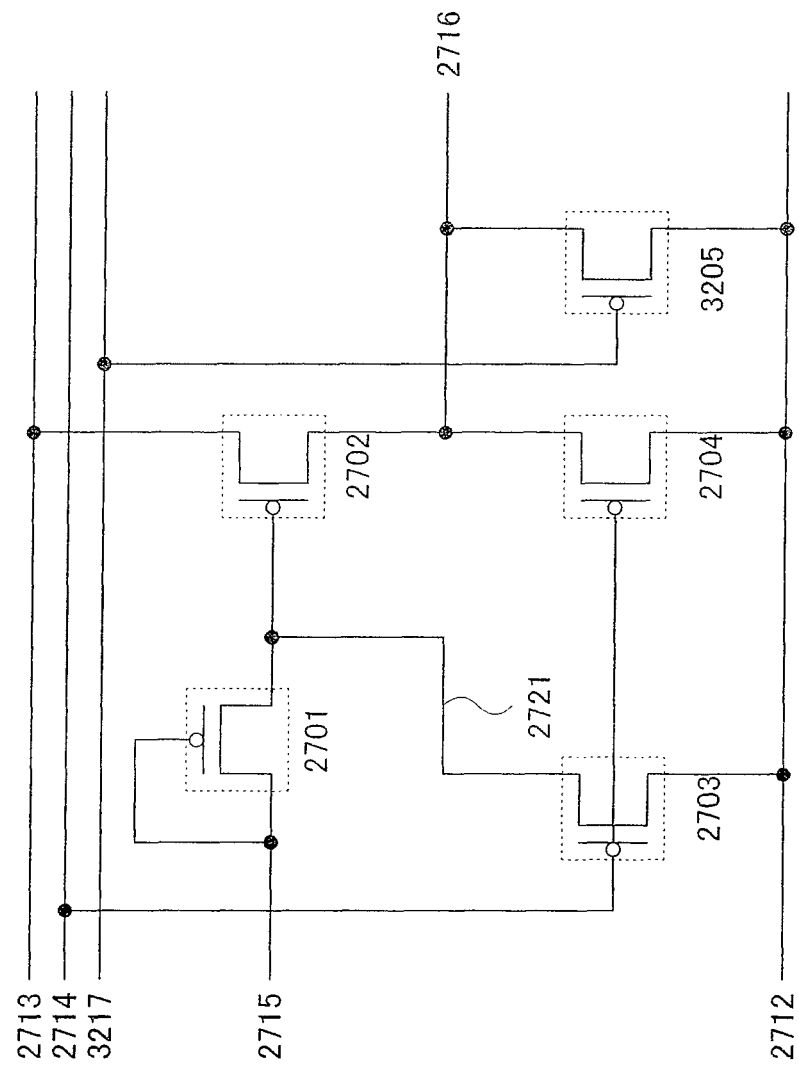
FIG. 35 illustrates Embodiment Mode 6.

Operations which are similar to those of FIG. 32 can also be performed in a flip-flop in FIG. 35. As shown in FIG. 35, the first transistor 2701 shown in FIG. 32 may be diode-connected. The first transistor 2701 is diode-connected, so that the first wiring 2711 is not necessary. Thus, one wiring and one power source potential (V2) can be eliminated from the structure. Note that portions which are common to those in FIG. 32 are denoted by common reference numerals and description thereof is omitted.

In addition, each of the flip-flops shown in this embodiment mode can be applied to each of the shift registers in FIGS. 17 and 18. Since three-phase clock signals can be used similarly to Embodiment Modes 1 to 5, power can be saved. Further, since the number of stages of the flip-flop 1701 connected to each clock signal line (each of the third wiring 613, the fourth wiring 614, and the fifth wiring 615) is reduced to two-third that of the case of using single-phase clock signals in each of the shift registers of this embodiment mode, a load of each clock signal line can be reduced. Note that in each of a potential supplied to each of the first wiring 611 and the second wiring 612, a signal input to each of the third wiring 613, the fourth wiring 614, the fifth wiring 615, and the sixth wiring 616, and a signal output to the wiring 622, an H level and an L level are inverted compared with the case where the flip-flop formed by using the N-channel transistor is applied to each of the shift registers in FIGS. 17 and 18.

Further, each of the shift registers shown in this embodiment mode can be applied to each of the display devices in FIGS. 9, 11, 12, and 44. The life of each of the display devices can be extended by applying this embodiment mode to a scan line driver circuit formed over the same substrate as a pixel portion, similarly to Embodiment Modes 1 to 5.

Note that each of the shift registers and the flip-flops shown in this embodiment inode can be freely combined with structures of display devices shown in other embodiment modes in this specification. In addition, the structures of each of the shift registers and the flip-flops shown in this embodiment mode can be freely combined.

Embodiment Mode 7

Figure 36:
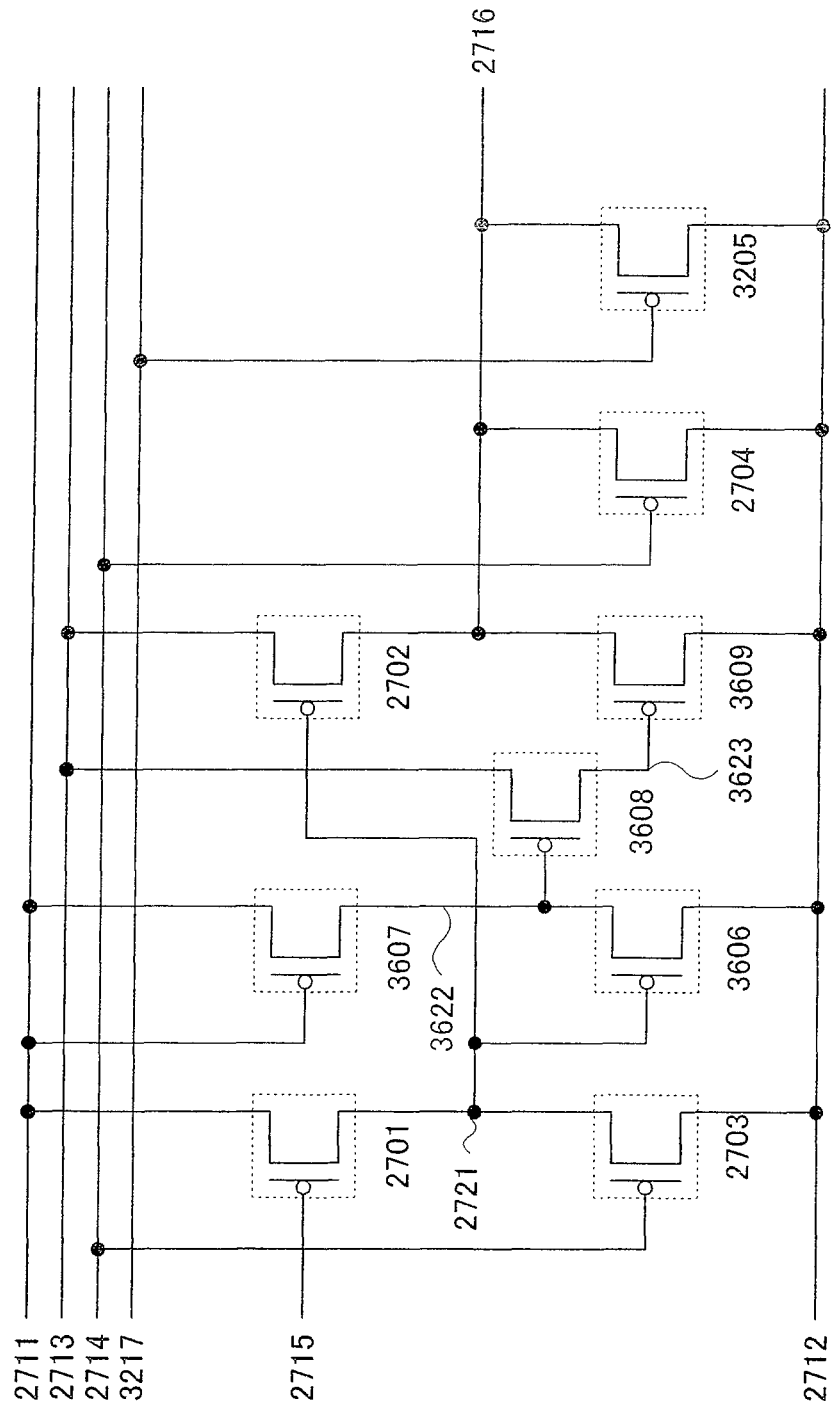
FIG. 36 illustrates Embodiment Mode 7.

In this embodiment mode, a flip-flop having a structure which is different from those of Embodiment Modes 5 and 6 is shown in FIG. 36. Note that portions which are similar to Embodiment Modes 5 and 6 are denoted by common reference numerals and detailed description of the portions which are the same and portions which have similar functions is omitted.

The flip-flop shown in FIG. 36 includes the first transistor 2701, the second transistor 2702, the third transistor 2703, the fourth transistor 2704, the fifth transistor 3205, a sixth transistor 3606, a seventh transistor 3607, an eighth transistor 3608, and a ninth transistor 3609. Note that the flip-flop is connected to the first wiring 2711, the second wiring 2712, the third wiring 2713, the fourth wiring 2714, the fifth wiring 2715, the sixth wiring 2716, and the seventh wiring 3217. In this embodiment mode, each of the sixth transistor 3606, the seventh transistor 3607, the eighth transistor 3608, and the ninth transistor 3609 is a P-channel transistor and is turned on when the absolute value of gate-source voltage (|Vgs|) exceeds the threshold voltage (|Vth|) (when Vgs becomes lower than Vth).

The first terminal (one of the source terminal and the drain terminal) of the first transistor 2701 is connected to the first wiring 2711; the second terminal (the other thereof) of the first transistor 2701 is connected to the gate terminal of the second transistor 2702; and the gate terminal of the first transistor 2701 is connected to the fifth wiring 2715. The first terminal of the third transistor 2703 is connected to the second wiring 2712; the second terminal of the third transistor 2703 is connected to the gate terminal of the second transistor 2702; and the gate terminal of the third transistor 2703 is connected to the fourth wiring 2714. The first terminal of the second transistor 2702 is connected to the third wiring 2713 and the second terminal of the second transistor 2702 is connected to the sixth wiring 2716. The first terminal of the fourth transistor 2704 is connected to the second wiring 2712; the second terminal of the fourth transistor 2704 is connected to the sixth wiring 2716; and the gate terminal of the fourth transistor 2704 is connected to the fourth wiring 2714. The first terminal of the fifth transistor 3205 is connected to the second wiring 2712; the second terminal of the fifth transistor 3205 is connected to the sixth wiring 2716; and the gate terminal of the fifth transistor 3205 is connected to the seventh wiring 3217. A first terminal of the sixth transistor 3606 is connected to the second wiring 2712; a second terminal of the sixth transistor 3606 is connected to a gate terminal of the eighth transistor 3608; and a gate terminal of the sixth transistor 3606 is connected to the gate terminal of the second transistor 2702. A first terminal of the seventh transistor 3607 is connected to the first wiring 2711; a second terminal of the seventh transistor 3607 is connected to the gate terminal of the eighth transistor 3608; and a gate terminal of the seventh transistor 3607 is connected to the first wiring 2711. A first terminal of the eighth transistor 3608 is connected to the third wiring 2713 and a second terminal of the eighth transistor 3608 is connected to a gate terminal of the ninth transistor 3609. A first terminal of the ninth transistor 3609 is connected to the second wiring 2712 and a second terminal of the ninth transistor 3609 is connected to the sixth wiring 2716. Note that a connection point of the second terminal of the sixth transistor 3606, the second terminal of the seventh transistor 3607, and the gate terminal of the eighth transistor 3608 is denoted by a node 3622. In addition, a connection point of the second terminal of the eighth transistor 3608 and the gate terminal of the ninth transistor 3609 is denoted by a node 3623.

Note that the first terminal of the third transistor 2703, the first terminal of the fourth transistor 2704, the first terminal of the fifth transistor 3205, the first terminal of the sixth transistor 3606, and the first terminal of the ninth transistor 3609 are not necessarily connected to the second wiring 2712 and may be connected to different wirings. In addition, the gate terminal of the third transistor 2703 and the gate terminal of the fourth transistor 2704 are not necessarily connected to the fourth wiring 2714 and may be connected to different wirings. Further the first terminal of the first transistor 2701, the first terminal of the seventh transistor 3607, and the gate terminal of the seventh transistor 3607 are not necessarily connected to the first wiring 2711 and may be connected to different wirings. Furthermore, the first terminal of the second transistor 2702 and the first terminal of the eighth transistor 3608 are not necessarily connected to the third wiring 2713 and may be connected to different wirings.

Figure 37:
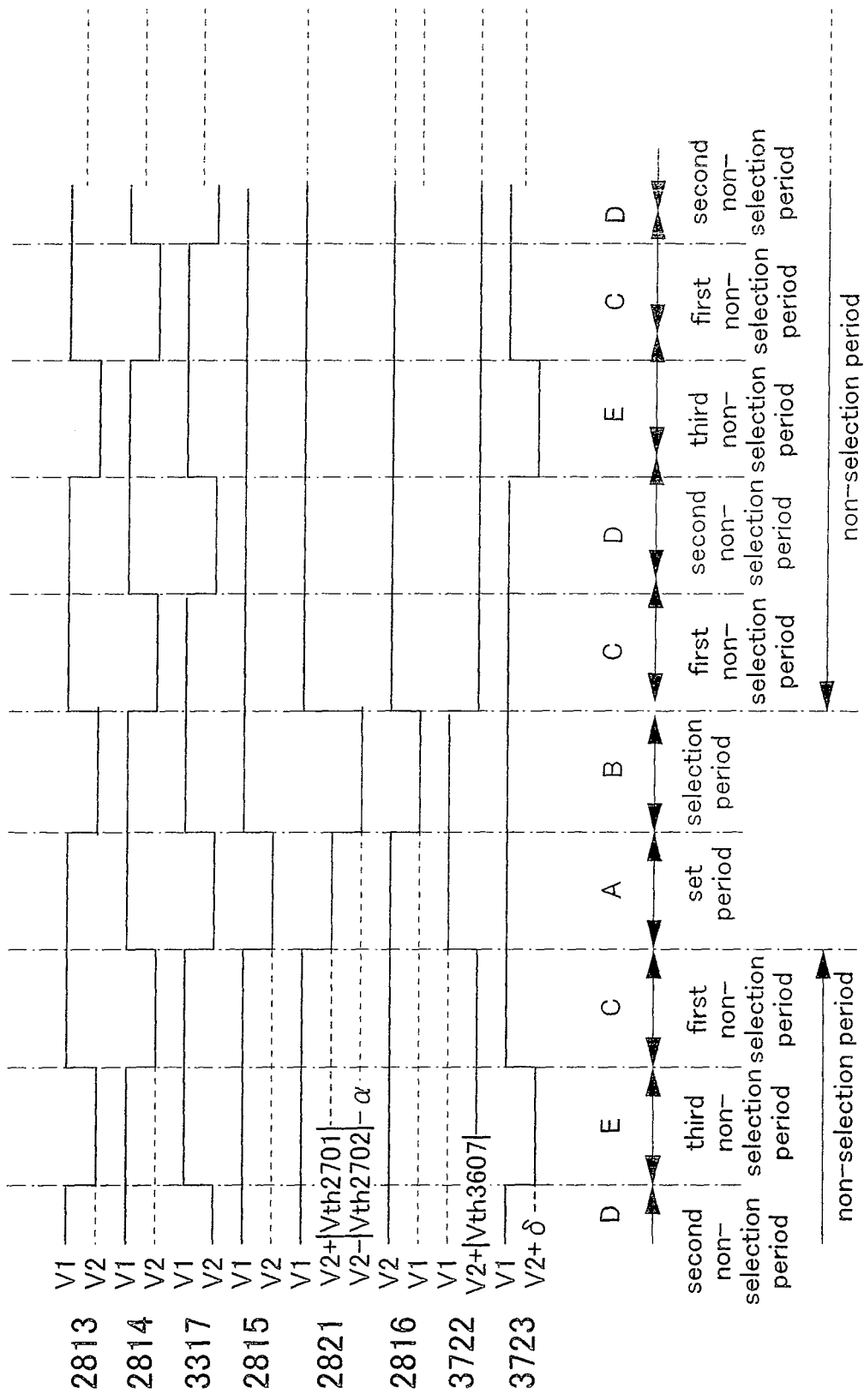
FIG. 37 illustrates Embodiment Mode 7.

Next, operations of the flip-flop shown In FIG. 36 are described with reference to a timing chart shown in FIG. 37. Note that FIG. 37 is a timing chart in the case where the flip-flop in FIG. 36 is operated similarly to the flip-flops shown in FIGS. 27 and 32. Note that portions which are common to those in the timing charts in FIGS. 28 and 33 are denoted by common reference numerals and description thereof is omitted.

In FIG. 37, a potential 3722 is a potential of the node 3622 in FIG. 36 and a potential 3723 is a potential of the node 3623 in FIG. 36.

In the flip-flop in FIG. 36, the ninth transistor 3609 is turned on in a third non-selection period. In addition, the sixth wiring 2716 remains an H level because a potential of the second wiring 2712 is supplied to the sixth wiring 2716 through the ninth transistor 3609.

Control of on/off of the ninth transistor 3609 is specifically described. First, each of the sixth transistor 3606 and the seventh transistor 3607 forms an inverter, and the potential of the node 3622 (the potential 3722) becomes approximately V1 when an L-level signal is input to the gate terminal of the sixth transistor 3606. Note that since the potential 3722 at this time is determined by a resistance ratio of the sixth transistor 3606 to the seventh transistor 3607, the potential 3722 becomes a value which is slightly lower than V1. In addition, since the potential of the node 3622 becomes the sum of a potential of the first wiring 2711 and the absolute value of the threshold voltage of the seventh transistor 3607 when an H-level signal is input to the gate terminal of the sixth transistor 3606, the potential of the node 3622 becomes V2+|Vth3607|. Therefore, since the node 2721 is at an H level and the node 3622 becomes an L level in the first non-selection period, the second non-selection period, and the third non-selection period, the eighth transistor 3608 is turned on. Thus, since the ninth transistor 3609 is controlled by a signal which is input to the third wiring 3713, the ninth transistor 3609 is turned on in the third non-selection period and is turned off in the first non-selection period and the second non-selection period. On the other hand, since the node 2721 is at an L level and the node 3622 becomes an H level in the set period and the selection period, the eighth transistor 3608 is turned off. Thus, since a potential of the gate terminal of the ninth transistor 3609 remains a potential of the first non-selection period which is a previous period of the set period, namely, an H level, the ninth transistor 3609 is turned off.

As described above, in the flip-flop in FIG. 36, V1 is supplied to the sixth wiring 2716 in the first non-selection period, the second non-selection period, and the third non-selection period. Therefore, a malfunction of the flip-flop can be further suppressed. This is because V1 can be supplied to the sixth wiring 2716 in the non-selection period. In addition, since V1 is supplied to the sixth wiring 2716 in the non-selection period in the flip-flop in FIG. 36, noise of the sixth wiring 2716 can be reduced.

In addition, deterioration in characteristics of the sixth transistor 3606, the seventh transistor 3607, the eighth transistor 3608, and the ninth transistor 3609 can be suppressed in the flip-flop in FIG. 36. This is because the sixth transistor 3606 is turned on only in the set period and the selection period; the seventh transistor 3607 is turned on only in a period in which the potential of the node 3622 decreases to V2+|Vth3607| in the first non-selection period which is after the selection period; the eighth transistor 3608 is turned on duly in a period in which the potential of the node 3623 decreases to V2+δ (δ corresponds to |Vth3607|+|Vth3608|) in the first non-selection period, the second non-selection period, and the third non-selection period; and the ninth transistor 3609 is tamed on only in the third non-selection period.

Note that in the flip-flop in FIG. 36, the first transistor 2701, the second transistor 2702, the third transistor 2703, the fourth transistor 2704, the fifth transistor 3205, the sixth transistor 3606, the seventh transistor 3607, the eighth transistor 3608, and the ninth transistor 3609 are all P-channel transistors. Therefore, even when polysilicon or single crystal silicon is used for a semiconductor layer of each transistor in the flip-flop in FIG. 36, a manufacturing process can be simplified.

Here, functions of the sixth transistor 3606, the seventh transistor 3607, the eighth transistor 3608, and the ninth transistor 3609 are described. The sixth transistor 3606 has a function of selecting timing for supplying the potential of the second wiring 2712 to the node 3622 and functions as a switching transistor. The seventh transistor 3607 has a function of selecting timing for supplying the potential of the first wiring 2711 to the node 3622 and functions as a diode. The eighth transistor 3608 has a function of selecting timing for supplying the potential of the third wiring 2713 to the node 3623 and functions as a switching transistor. The ninth transistor 3609 has a function of selecting timing for supplying the potential of the second wiring 2712 to the sixth wiring 2716 and functions as a switching transistor.

Note that arrangement, the number, and the like of the transistors are not limited to those of FIG. 36 as long as operations which are similar to those of FIG. 36 are performed. Thus, a transistor, another element (e.g., a resistor or a capacitor), a diode, a switch, any logic circuit, or the like may be additionally provided.

Figure 38:
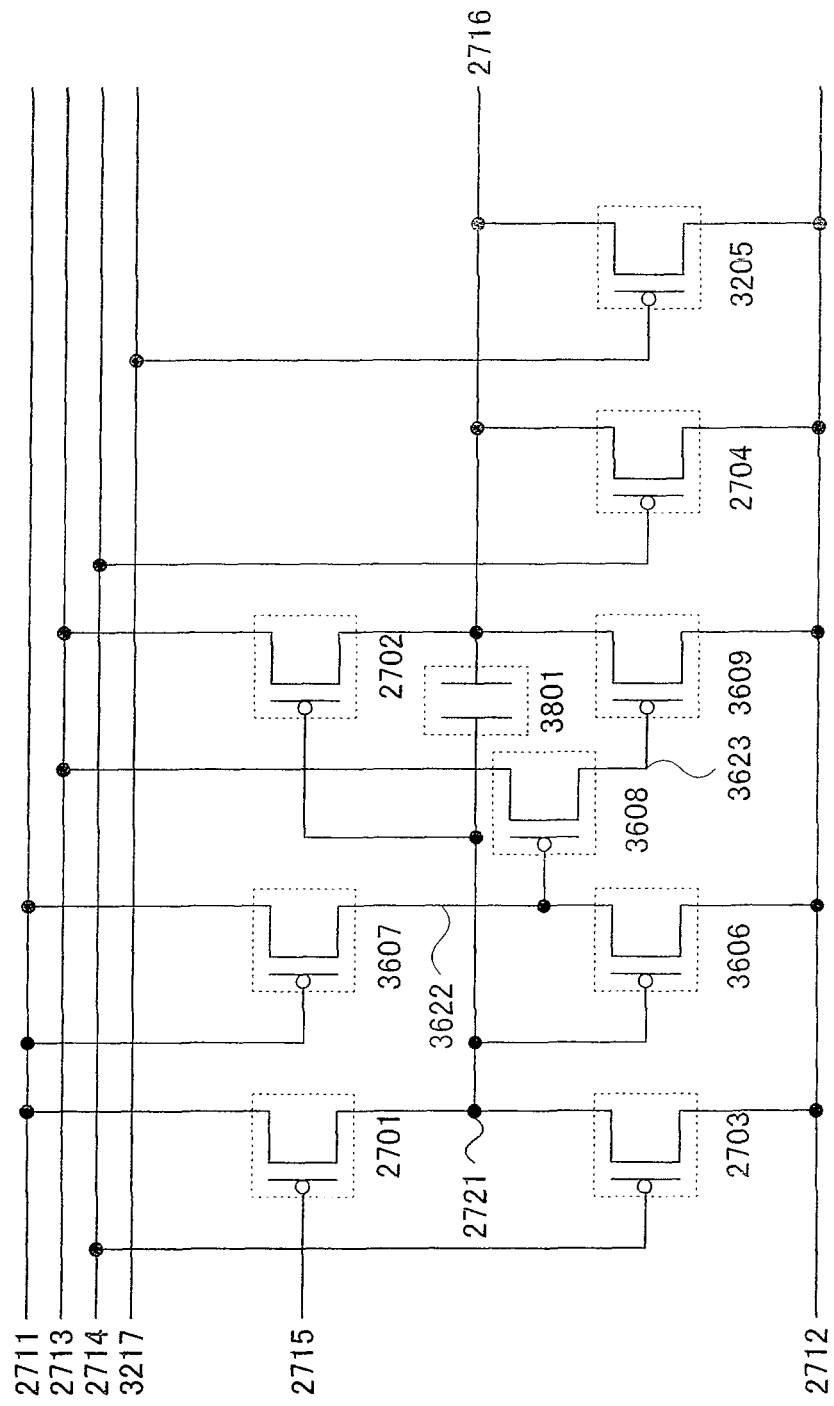
FIG. 38 illustrates Embodiment Mode 7.

For example, as shown in FIG. 38, a capacitor 3801 may be provided between the gate terminal and the second terminal of the second transistor 2702 shown in FIG. 36. By proving the capacitor 3801, the bootstrap operation in the selection period can be performed more stably. In addition, since the parasitic capacitance between the gate terminal and the second terminal of the second transistor 2702 can be reduced, each transistor can be switched at high speed. Note that in the capacitor 3801, a gate insulating film may be used as an insulating layer and a gale electrode layer and a wiring layer may be used as conductive layers; a gate, insulating film may be used as the insulating layer and a gate electrode layer and a semiconductor layer to which an impurity is added may be used as the conductive layers; or an interlayer film (an insulating film) may be used as the insulating layer and a wiring layer and a transparent electrode layer may be used as the conductive layers. Note that portions which are common to those in FIG. 36 are denoted by common reference numerals and description thereof is omitted.

Figure 39:
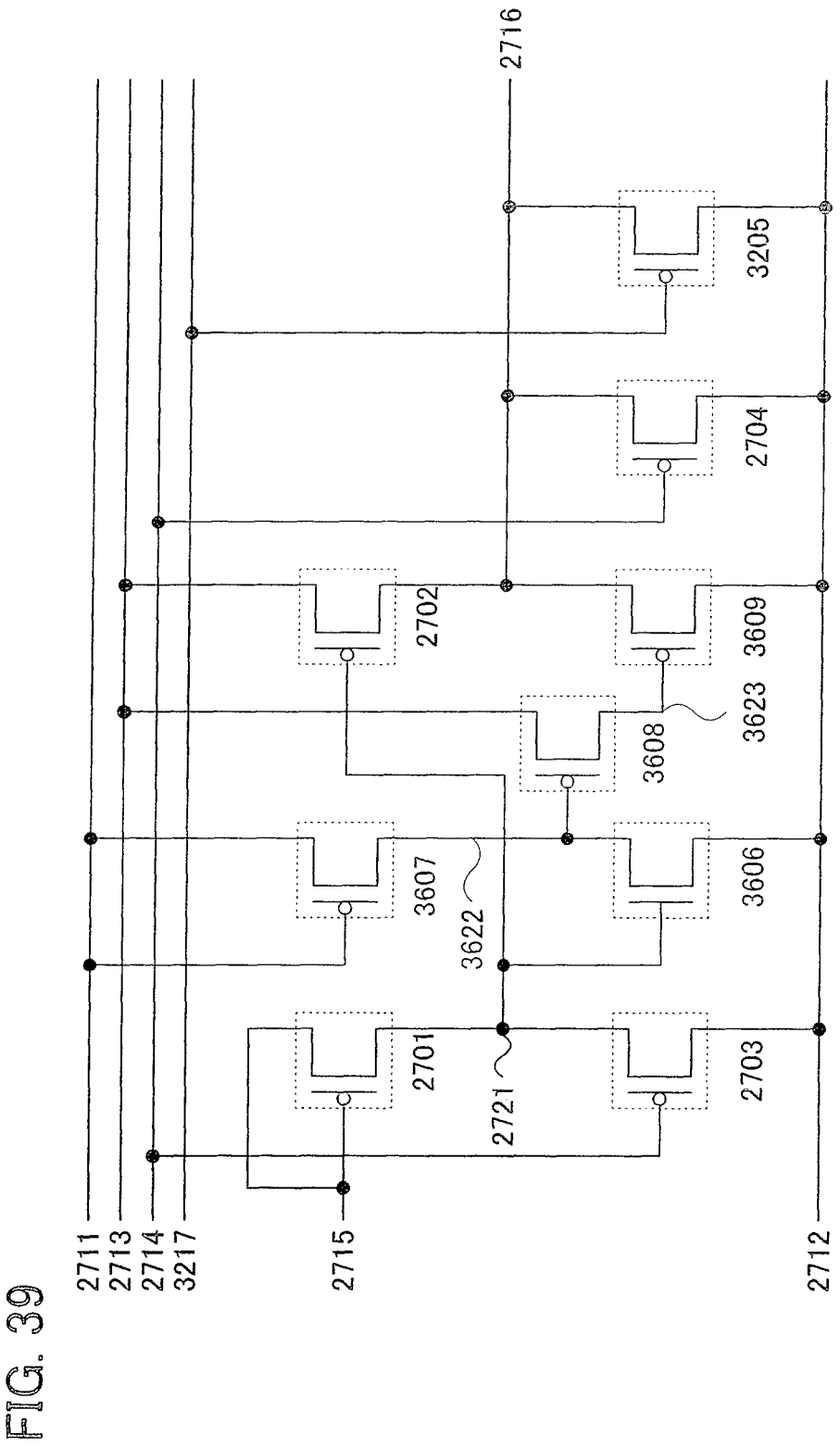
FIG. 39 illustrates Embodiment Mode 7.

Operations which are similar to those of FIG. 36 can also be performed in a flip-flop in FIG. 39. As shown in FIG. 39, the first transistor 2703 shown in FIG. 36 may be diode-connected. The first transistor 2701 is diode-connected, so that current flowing through the first wiring 27U is made small. Thus, wiring width of the first wiring 2711 can be made small. Note that portions which are common to those in FIG. 36 are denoted by common reference numerals and description thereof is omitted.

In addition, each of the flip-flops shown in this embodiment mode can be applied to each of the shift registers in FIGS. 17 and 18. Since three-phase clock signals can be used similarly to Embodiment Modes 1 to 6, power can be saved. Further, since the number of stages of the flip-flop 1701 connected to each clock signal line (each of the third wiring 613, the fourth wiring 614, and the fifth wiring 615) is reduced to two third that of the case of using single-phase dock signals in each of the shift registers of this embodiment mode, a load of each clock signal line can be reduced. Note that in each of a potential supplied to each of the first wiring 611 and the second wiring 612, a signal input to each of the fluid wiring 613, the fourth wiring 614, the fifth wiring 615, and the sixth wiring 616, and a signal output to the wiring 622, an H level and an L level are inverted compared with the case where the flip-flop formed by using the N-channel transistor is applied to each of the shift registers in FIGS. 17 and 18.

Further, each of the shift registers shown in this embodiment mode can be applied to each of the display devices in FIGS. 9, 11, 12, and 44. The life of each of the display devices can be extended by applying this embodiment mode to a scan line driver circuit formed over the same substrate, as a pixel portion, similarly to Embodiment Modes 1 and 6.

Note that each of the shift registers and the flip-flops shown in this embodiment mode can be freely combined with structures of display devices shown in other embodiment modes in this specification. In addition, the structures of each of the shift registers and the flip-flops shown in this embodiment mode can be freely combined.

Embodiment Mode 8

Figure 40:
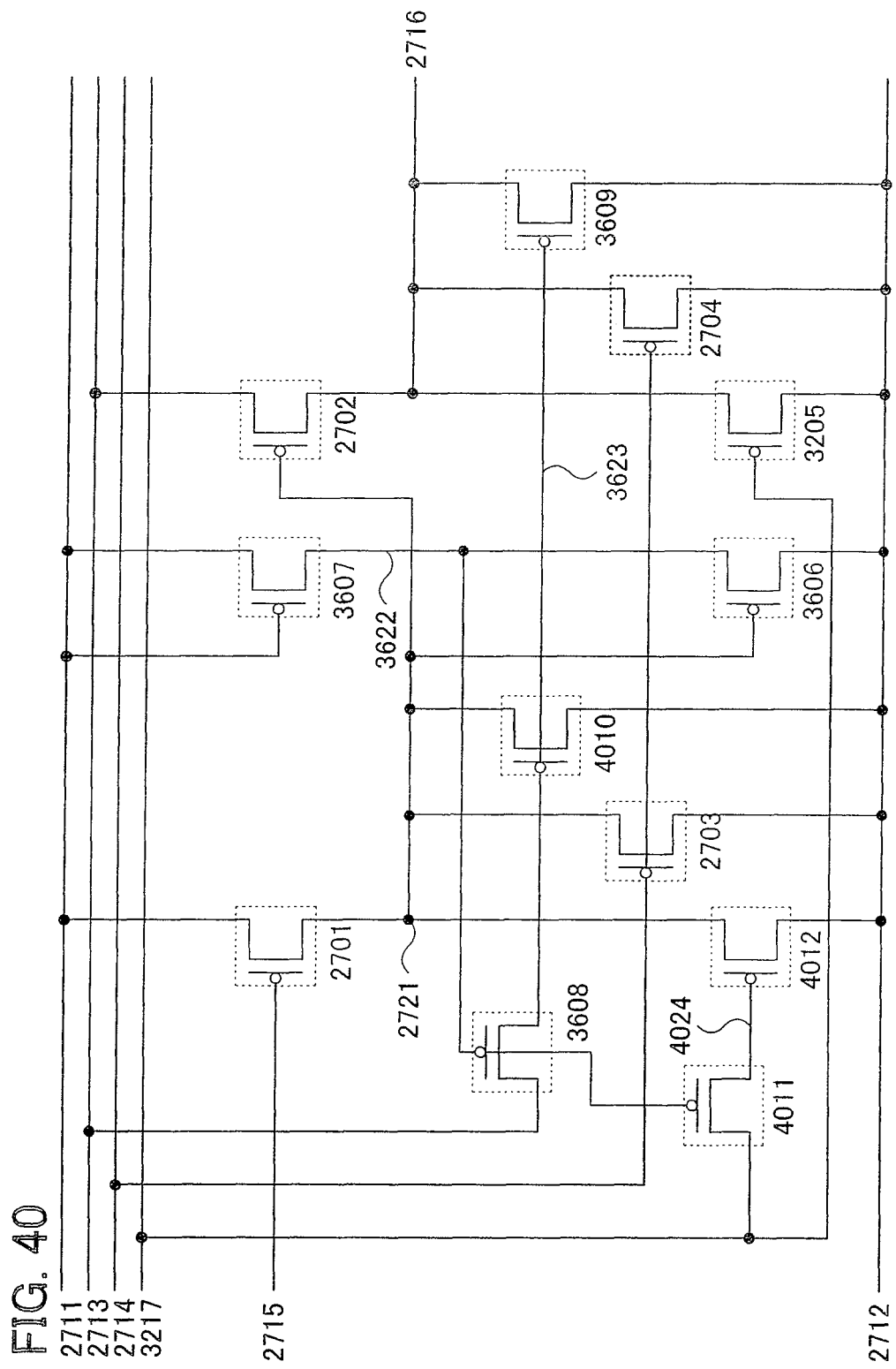
FIG. 40 illustrates Embodiment Mode 8.

In this embodiment mode, a flip-flop having a structure which is different from those of Embodiment Modes 5 to 7 is shown in FIG. 40. Note that portions which are similar to Embodiment Modes 5 to 1 are denoted by common reference numerals and detailed description of the portions which are the same and portions which have similar functions is omitted.

The flip-flop shown in FIG. 40 includes the first transistor 2701, the second transistor 2702, the third transistor 2703, the fourth transistor 2704, the fifth transistor 3205, the sixth transistor 3606, the seventh transistor 3607, the eighth transistor 3608, the ninth transistor 3609, a tenth transistor 4010, an eleventh transistor 4011, and a twelfth transistor 4012. Note that the flip-flop is connected to the first wiring 2711, the second wiring 2712, the third wiring 2713, the fourth wiring 2714, the fifth wiring 2715, the sixth wiring 2716, and the seventh wiring 3217. In this embodiment mode, each of the tenth transistor 4010, the eleventh transistor 4011, and the twelfth transistor 4032 is a P-channel transistor and is turned on when the absolute value of gate-source voltage (|Vgs|) exceeds the threshold voltage (|Vth|) (when Vgs becomes lower than Vth).

The first terminal (one of the source terminal and the drain terminal) of the first transistor 2701 is connected to the first wiring 2711; the second terminal (the other thereof) of the first transistor 2701 is connected to the gate terminal of the second transistor 2702; and the gate terminal of the first transistor 2701 is connected to the fifth wiring 2715. The first terminal of the third transistor 2703 is connected to the second wiring 2712; the second terminal of the third transistor 2703 is connected to the gate terminal of the second transistor 2702; and the gate terminal of the third transistor 2703 is connected to the fourth wiring 2714. The first terminal of the second transistor 2702 is connected to the third wiring 2713 and the second terminal of the second transistor 2702 is connected to the sixth wiring 2716, the first terminal of the fourth transistor 2704 is connected to the second wiring 2712; the second terminal of the fourth transistor 2704 is connected to the sixth wiring 2716; and the gate terminal of the fourth transistor 2704 is connected to the fourth wiring 2714. The first terminal of the fifth transistor 3205 is connected to the second wiring 2712; the second terminal of the fifth transistor 3205 is connected to the sixth wiring 2716; and the gate terminal of the fifth transistor 3205 is connected to the seventh wiring 3217. The first terminal of the sixth transistor 3606 is connected to the second wiring 2712; the second terminal of the sixth transistor 3606 is connected to the gate terminal of the eighth transistor 3608 and a gate terminal of the eleventh transistor 4011; and the gate terminal of the sixth transistor 3606 is connected to the gate terminal of the second transistor 2702. The first terminal of the seventh transistor 3607 is connected to the first wiring 2711; the second terminal of the seventh transistor 3607 is connected to the gate terminal of the eighth transistor 3608 and the gate terminal of the eleventh transistor 4011; and the gate, terminal of the seventh transistor 3607 is connected to the first wiring 2711. The first terminal of the eighth transistor 3608 is connected to the third wiring 2713 and the second terminal of the eighth transistor 3608 is connected to the gate terminal of the ninth transistor 3609 and a gate terminal of the tenth transistor 4010. The first terminal of the ninth transistor 3609 is connected to the second wiring 2712 and the second terminal of the ninth transistor 3609 is connected to the sixth wiring 2716. A first terminal of the tenth transistor 4010 is connected to the second wiring 2712 and a second terminal of the tenth transistor 4010 is connected to the gate terminal of the second transistor 2702. A first terminal of the eleventh transistor 4011 is connected to the seventh wiring 3217 and a second terminal of the eleventh transistor 4011 is connected to a gate terminal of the twelfth transistor 4012. A first terminal of the twelfth transistor 4012 is connected to the second wiring 2712 and a second terminal of the twelfth transistor 4012 is connected to the gate terminal of the second transistor 2702. Note that a connection point of the second terminal of the eleventh transistor 4011 and the gate terminal of the twelfth transistor 4012 is denoted by a node 4024.

Note that the second terminal of she third transistor 2703, the second terminal of the fourth transistor 2704, the second terminal of the fifth transistor 3205, the second terminal of the sixth transistor 3606, the second terminal of the ninth transistor 3609, the second terminal of the tenth transistor 4010, and the second terminal of the twelfth transistor 4012 are not necessarily connected to the second wiring 2712 and may be connected to diffident wirings. In addition, the gate terminal of the third transistor 2703 and the gate terminal of the fourth transistor 2704 are not necessarily connected to the fourth wiring 2714 and may be connected to different wirings. Further, the first terminal of the first transistor 2701, the first terminal of the seventh transistor 3607, and the gate terminal of the seventh transistor 3607 are not necessarily connected to the first wiring 2711 and may be connected to different wirings. Furthermore, the first terminal of the second transistor 2702 and the first terminal of the eighth transistor 3608 are not necessarily connected to the third wiring 2713 and may be connected to different wirings. Moreover, the gate terminal of the fifth transistor 3205 and the first terminal of the eleventh transistor 4011 are not necessarily connected to the seventh wiring 3217 and may be connected to different wirings.

Figure 41:
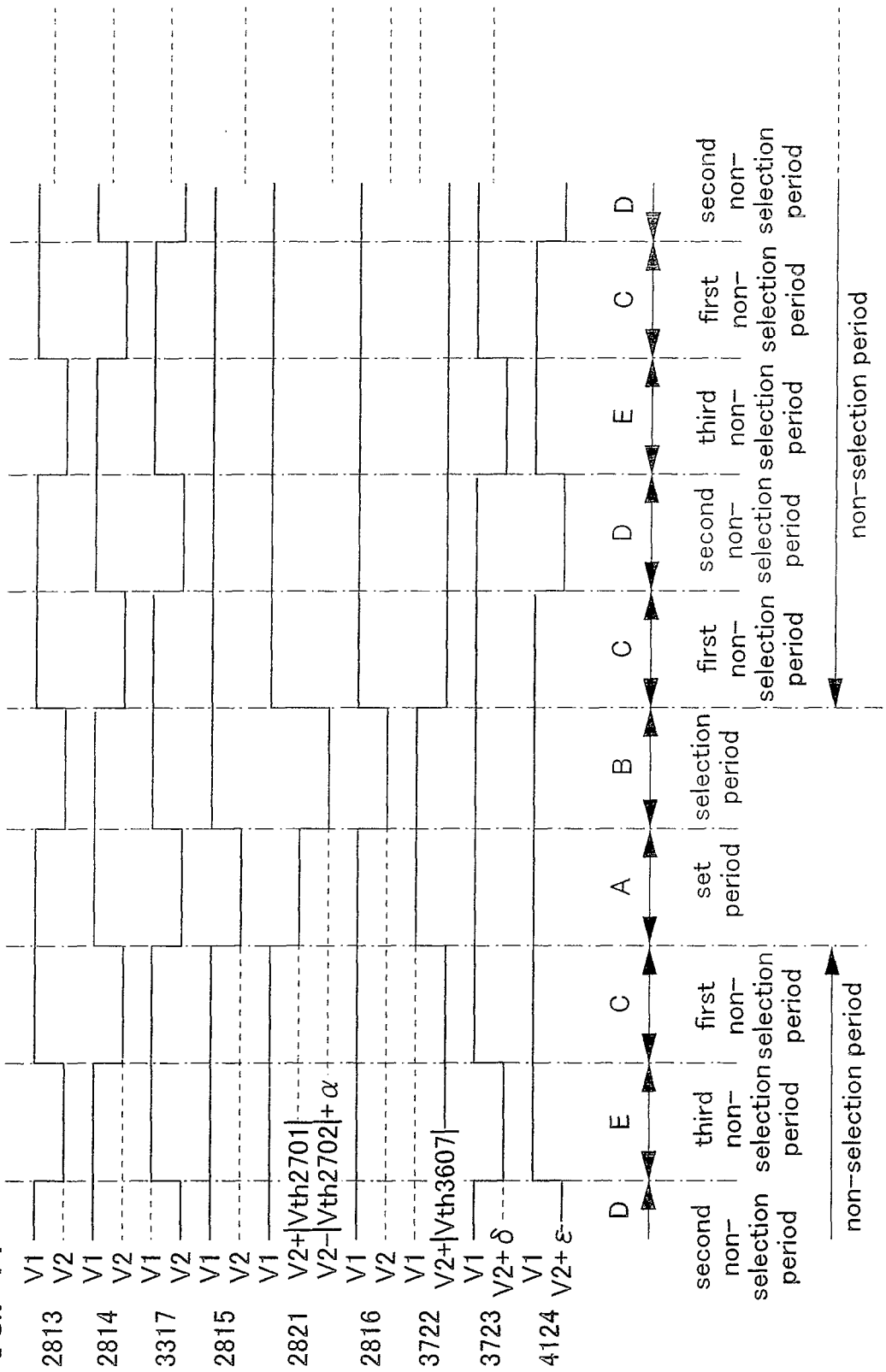
FIG. 41 illustrates Embodiment Mode 8.

Next, operations of the flip-flop shown in FIG. 40 are described with reference to a timing chart shown its FIG. 41. Note that FIG. 41 is a timing chart in the case where the flip-flop in FIG. 40 is operated similarly to the flip-flops shown in FIGS. 27, 32, and 36. Note that portions which are common to those in the timing charts in FIGS. 28, 33, and 37 are denoted by common reference numerals and description thereof is omitted.

In FIG. 41, a potential 4124 is a potential of the node 4024 in FIG. 40.

In the flip-flop in FIG. 4G; the tenth transistor 4010 is turned on in a third non-selection period. In addition, the node 2721 can be more stably kept at an H level because a potential of the second wiring 2712 is supplied to the node 2721 through the tenth transistor 4010. Further, in the flip-flop in FIG. 40, the twelfth transistor 4012 is turned on in a first non-selection period. Furthermore, the node 2721 can be more stably kept at an H level because the potential of the second wiring 2712 is supplied in the node 2721 through the twelfth transistor 4012.

Control of on/off of the twelfth transistor 4012 is specifically described. Note that control of on/off of the tenth transistor 4010 is similar to control of on/off of the ninth transistor 3609, which is described in Embodiment Mode 7. First, each of the sixth transistor 3606 and the seventh transistor 3607 forms an inverter, similarly to the flip-flop in FIG. 36. Therefore, since the node 2721 is at an H level and the node 3622 becomes an L level in the first non-selection period, the second non-selection period, and the third non-selection period, the eleventh transistor 4011 is turned on. Thus, since the twelfth transistor 4012 is controlled by a signal which is input to the seventh wiring 3217, the twelfth transistor 4012 is turned on in the second non-selection period and is turned off in the first non-selection period and the third non-selection period. On the other hand, since the node 2721 is at an L level and the node 3622 becomes an H level in the set period and the selection period, the eleventh transistor 4011 is turned off. Thus, since a potential of the gate terminal of the twelfth transistor 4012 remains a potential of the first non-selection period which is a period previous to the set period, namely, an H level, the twelfth transistor 4012 is turned off.

As described above, in the flip-flop in FIG. 40, V1 is supplied to each of the sixth wiring 2716 and the node 2721 in the first non-selection period, the second non-selection period, and the third non-selection period. Therefore, a malfunction of the flip-flop can be further suppressed. This is because V1 can be supplied to each of the sixth wiring 2716 and the node 2721 in the non-selection period. In addition, since V1 is supplied to each of the sixth wiring 2716 and the node 2721 in the non-selection period in the flip-flop in FIG. 40, noise of the sixth wiring 2716 and the node 2721 can be reduced.

In addition, deterioration in characteristics of the tenth transistor 4010, the eleventh transistor 4011, and the twelfth transistor 4012 can be suppressed in the flip-flop in FIG. 40. This is because the tenth transistor 4010 is turned on only in the third non-selection period; the eleventh transistor 4011 is turned on only in a period in which the potential of the node 4024 decreases to $V12+\varepsilon$ ($\varepsilon$ corresponds to $|Vth3607|+|Vth4011|$) in the first non-selection period, the second non-selection period, and the third non-selection period; and the twelfth transistor 4012 is turned on only in the second non-selection period.

Note that in the flip-flop in FIG. 40, the first transistor 2701, the second transistor 2702, the third transistor 2703, the fourth transistor 2704, the fifth transistor 3205, the sixth transistor 3606, the seventh transistor 3607, the eighth transistor 3608, the ninth transistor 3609, the tenth transistor 4010, the eleventh transistor 4011, and the twelfth transistor 4012 are all P-channel transistors. Therefore, even when polysilicon or single crystal silicon is used for a semiconductor layer of each transistor in the flip-flop in FIG. 40, a manufacturing process can be simplified.

Here, functions of the tenth transistor 4010, the eleventh transistor 4011, and the twelfth transistor 4012 are described. The tenth transistor 4010 has a function of supplying the potential of the second wiring 2712 to the node 2721 and functions as a switching transistor. The eleventh transistor 4011 has a function of supplying a potential of the seventh wiring 3217 to the node 4024 and functions as a switching transistor. The twelfth transistor 4012 has a function of supplying the potential of the second wiring 2712 to the node 2721 and functions as a switching transistor.

Note that arrangement, the number, and the like of the transistors are not limited to those of FIG. 40 as long as operations which are similar to those of FIG. 40 are performed. Thus, a transistor, another element (e.g., a resistor or a capacitor), a diode, a switch, any logic circuit, or the like may be additionally provided.

Figure 42:
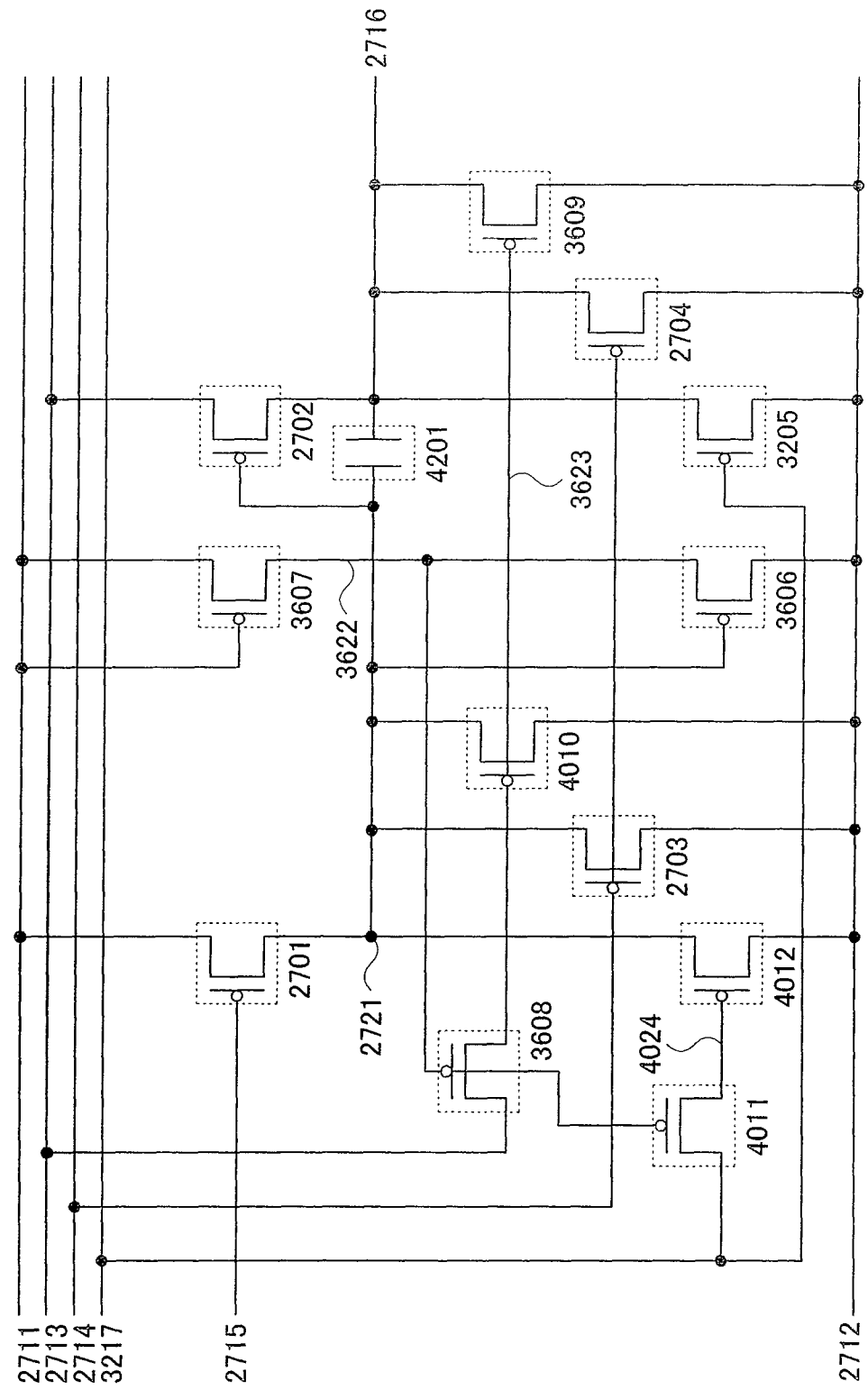
FIG. 42 illustrates Embodiment Mode 8.

For example, as shown in FIG. 42, a capacitor 4201 may be provided between the gate terminal and the second terminal of the second transistor 2792 shown in FIG. 40. By proving the capacitor 4201, the bootstrap operation in the selection period can be performed more stably. In addition, since the parasitic capacitance between the gate terminal and the second terminal of the second transistor 2702 can be reduced, each transistor can be switched at high speed. Note that in the capacitor 4201, a gate insulating film may be used as an insulating layer and a gate electrode layer and a wiring layer may be used as conductive layers; a gate insulating film may be used as the insulating layer and a gate electrode layer and a semiconductor layer to which an impurity is added may be used as the conductive layers; or an interlayer film (an insulating film) may be used as the insulating layer and a wiring layer and a transparent electrode layer may be used as the conductive layers. Note that portions which are common to those in FIG. 40 are denoted by common reference numerals and description thereof is omitted.

Figure 43:
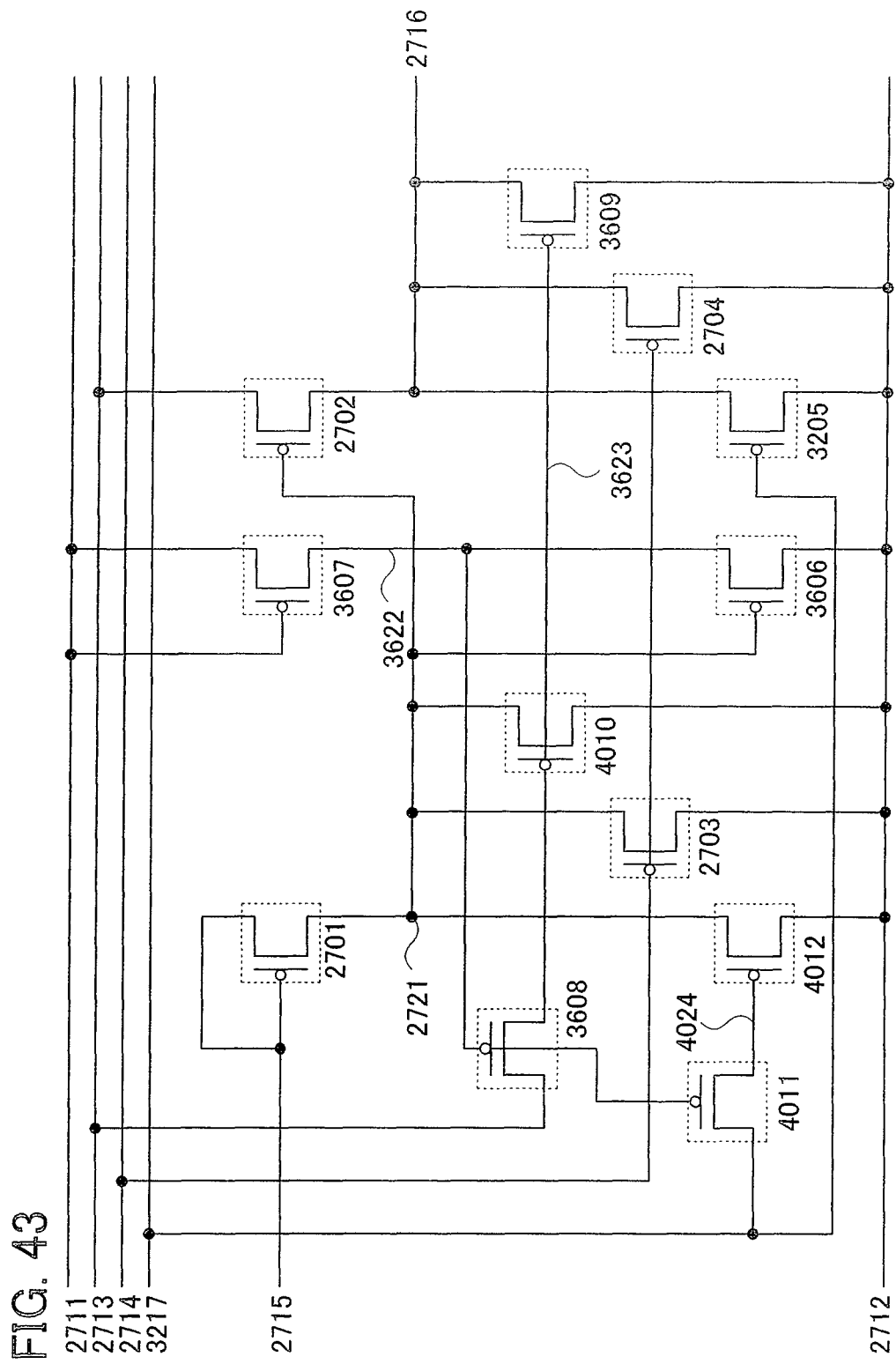
FIG. 43 illustrates Embodiment Mode 8.

Operations which are similar to those of FIG. 40 can also be performed in a flip-flop in FIG. 43. As shown in FIG. 43, the first transistor 2701 shown in FIG. 40 may be diode-connected. The first transistor 2701 is diode-connected, so that current flowing through the first wiring 2711 is made small. Thus, the wiring width of the first wiring 2711 can be made small.

In addition, each of the flip-flops shown in this embodiment mode can be applied to each of the shift registers in FIGS. 17 and 18. Since three-phase clock signals can be used similarly to Embodiment Modes 1 to 7, power can be saved. Further, since the number of stages of the flip-flop 1701 connected to each clock signal line (each of the third wiring 613, the fourth wiring 614, and the fifth wiring 615) is reduced to two-third that of the case of using single-phase dock signals in each of the shift registers of this embodiment mode, a load of each clock signal line can be reduced. Note that in each of a potential supplied to each of the first wiring 611 and the second wiring 612, a signal input to each of the third wiring 613, the fourth wiring 614, the fifth wiring 615, and the sixth wiring 616, and a signal output to the wiring 622, an H level and an L level are inverted compared with the case where the flip-flop formed by using the N-channel transistor is applied to each of the shift registers in FIGS. 17 and 18.

Further, each of the shift registers shown in this embodiment mode can be applied to each of the display devices in FIGS. 9, 11, 12, and 44. The life of each of be display devices can be extended by applying this embodiment mode to a scan line driver circuit formed civet the same substrate as a pixel portion, similarly to Embodiment Modes 1 to 7.

Note that each of the shift registers and the flip-flops shown in this embodiment mode can be freely combined with structures of display devices shown in other embodiment modes in this specification. In addition, the structures of each of the shift registers and the flip-flops shown in this embodiment mode can be freely combined.

Embodiment Mode 9

In this embodiment mode, an example of a pixel included in each of the display devices shown in Embodiment Modes 1 to 8 is described with reference to FIGS. 46A and 46B.

Figure 46B:
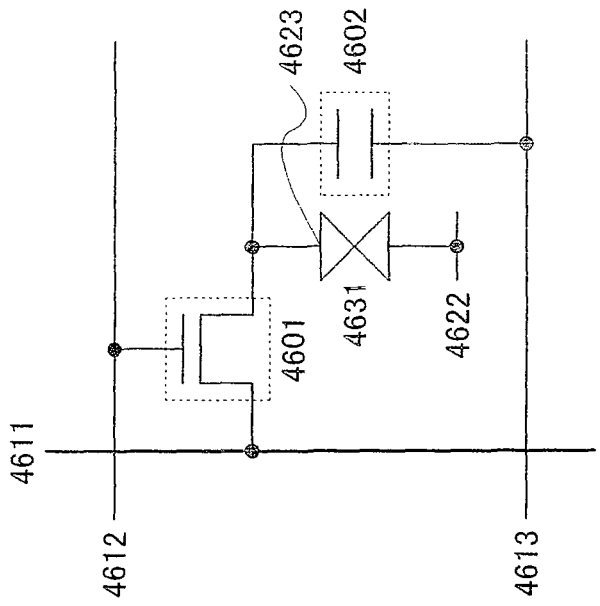
FIGS. 46A and 46B illustrate Embodiment Mode 9.
Figure 46A:
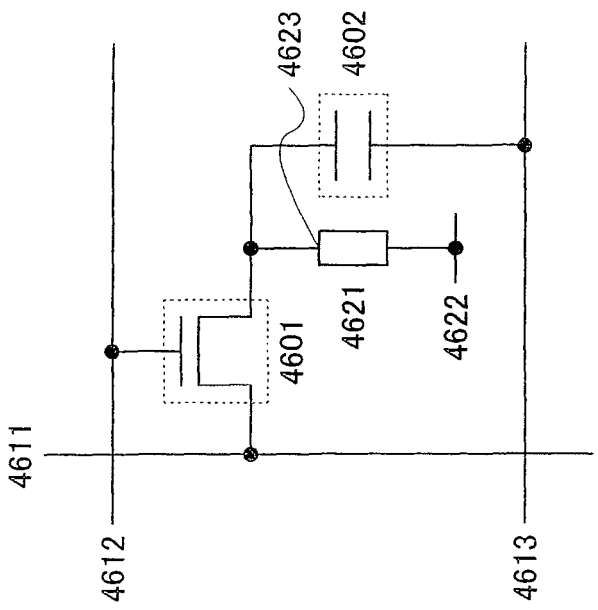

A pixel structure in each of FIGS. 46A and 46B is described. A pixel shown in FIG. 46A includes a transistor 4601, a capacitor 4602, and a display element 4624. Note that the pixel is connected to a first wiring 4611, a second wiring 4612, and a third wiring 4613. In addition, the case is described in which a liquid crystal element 4631, right transmittivity of which is changed by an electric field between a pixel electrode 4623 and an opposite electrode 4622 is used for the display element 4621 as shown in FIG. 46B. Note that the first wiring 4611 may be called a signal line, in addition, the second wiring 4612 may be called a scan line. Further, the third wiring 4613 may be called a storage capacitor line.

Note that although the transistor 4601 is an N-channel transistor, it may be a P-channel transistor. In Embodiment Modes 1 to 4, it is preferable that an N-channel transistor be used as the transistor 4601. This is because since amorphous silicon can be used for a semiconductor layer of the transistor, a manufacturing process can be simplified, and thus manufacturing cost can be reduced and a yield can be improved, and a semiconductor device such as a large display panel can also be manufactured. Further, even when polysilicon or single crystal silicon is used for the semiconductor layer of the transistor, the manufacturing process can be simplified. In Embodiment Modes 5 to 8, it is preferable that a P-channel transistor be used as the transistor 4601. This is because a manufacturing process can be simplified, so that manufacturing cost can be reduced and the yield cart be improved.

Note that the first wiring 4611 corresponds to any one of the signal lines S1 to Sm shown in the display devices in FIGS. 9, 11, 12, and 44. Note that the second wiring 4612 corresponds to any one of the scan lines G1 to Gn shown in the display devices in FIGS. 9, 11, 12, and 44.

Note that although the third wiring 4613 is not shown in FIGS. 9, 11, 12, and 44, ii is preferable that the third wiring 4613 be added to FIGS. 9, 11, 12, and 44 if necessary as described above.

Note that the capacitor 4602 has a Junction of holding a potential of the pixel electrode 4623 of the display element 4621. Thus, the capacitor 4602 is connected between the pixel electrode 4623 and the third wiring 4633; however, the present invention is not limited to this. It is only necessary that the capacitor 4602 be provided so that it can hold the potential of the pixel electrode 4623. The capacitor 4602 may be connected to the second wiring 4612 of another pixel (e.g., a pixel of a previous row) or may be connected to the opposite electrode 4622 or an electrode corresponding to the opposite electrode 4622. In addition, when the display element 4621 has capacitive properties, the capacitor 4602 and the third wiring 4613 are not necessarily provided.

As for an operating method, the first wiring 4611 is selected to him on the transistor 4601 and a video signal is input to each of the pixel electrode 4623 and the capacitor 4602 from the first wiring 4611. Then, the display element 4621 has transmittivity in accordance with the video signal.

Here, a driving method which enables a display device to have high image quality is described. Note that as the driving method which enables the display device to have high image quality, an overdriving method, a driving method which controls a common line (a storage capacitor line), backlight scanning, a high frequency driving method, and the like are described. In addition, these driving methods can be freely combined.

Figure 47:
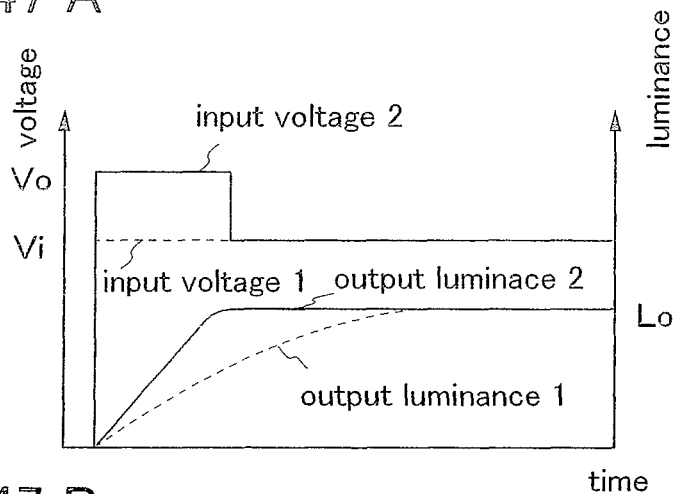
FIGS. 47A to 47C illustrate Embodiment Mode 9.
Figure 47:
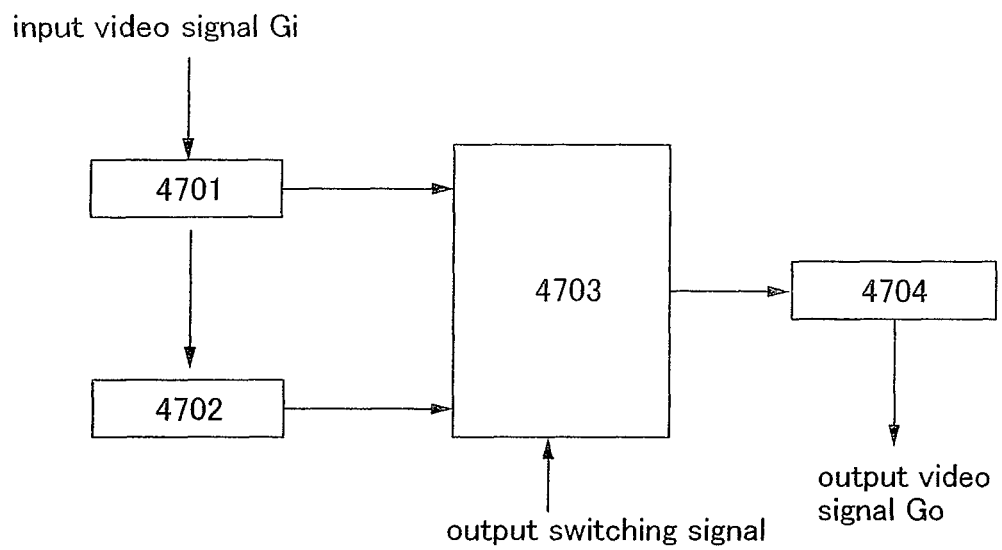
Figure 47:
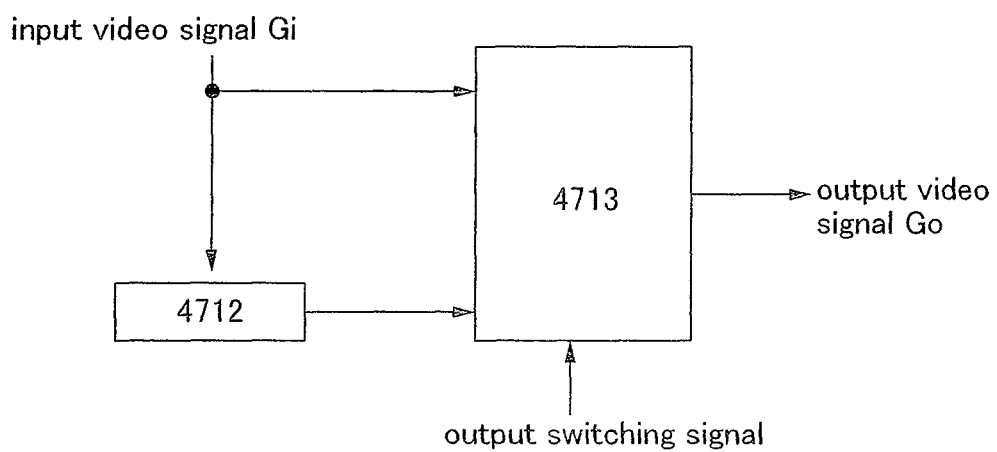

First, an overdriving method is described with reference to FIGS. 47A to 47C. FIG. 47A shows time change of output luminance with respect to input voltage of a display element. Time change of output luminance of the display element with respect to input voltage 1 shown by a broken line is like output luminance 1 also shown by a broken line. That is, although voltage for obtaining intended output luminance Low is Vi, time corresponding to response speed of the element is necessary to achieve the intended output luminance Low when Vi is directly input as the input voltage.

Overdriving is a technique to increase the response speed. Specifically, overdriving is a method in which the input voltage is brought back to Vi after response speed of the element is increased by applying Vo which is voltage higher than Vi to the element for a certain period so that the element has output luminance, which is close to the intended output luminance Low. At this time, the input voltage is represented by input voltage 2 and the output luminance is represented by output luminance 2. Time to the intended luminance low represented by a graph of the output luminance 2 is shorter than that represented by a graph of the output luminance 1.

Note that although the ease is described in FIG. 47A in which the output luminance is changed positively with respect to the input voltage, the present invention also includes the case in which the output luminance is changed negatively with respect to the input voltage.

A circuit for achieving such driving is described with reference to FIGS. 47B and 47C. First, the case is described with reference to FIG. 47B in which an input video signal Gi is a signal having an analog value (may be a discrete value) and an output video signal Go is also a signal having an analog value. An overdriving circuit shown in FIG. 47B includes an encoding circuit 4701, s frame memory 4702, a correction circuit 4703, and a DA converter circuit 4704.

First, the input video signal Gi is input to the encoding circuit 4701 and is encoded. That is, the input video signal Gi is converted from an analog signal to a digital signal having the appropriate number of bits. After that, the converted digital signal is input to each of the frame memory 4702 and the correction circuit 4703. A video signal of a previous frame held in the frame memory 4702 is also input to the correction circuit 4703 at the same time. Then, the correction circuit 4703 outputs a corrected video signal in accordance with a numerical value table which is prepared in advance from the video signal of the frame and the video signal of the previous frame. At this time, an output switching signal may be input to the correction circuit 4703 so that the corrected video signal and the video signal of the frame are switched and output. Next, the corrected video signal or (lie video signal of the frame is input to the DA converter circuit 4704. Then, the output video signal Go which is an analog signal in accordance with the corrected video signal or the video signal of the frame is output In this manner, overdriving can be achieved.

Subsequently, the case is described with reference to FIG. 47C in which the input video signal Gi is a signal having a digital value and the output video signal Go is also a signal having a digital value. An overdriving circuit shown in FIG. 47C includes a frame memory 4712 and a correction circuit 4713.

The input video signal Gi is a digital signal and is input to the frame memory 4712 and the correction circuit 4713. A video signal of a previous frame held in the frame memory 4712 is also input to the correction circuit 4713 at the same time. Then, the correction, circuit 4713 outputs a collected video signal in accordance with a numerical value table which is prepared in advance from the video signal of the frame and the video signal of the previous frame. At this time, an output switching signal may be input to the correction circuit 4713 so that the corrected video signal and the video signal of the frame are switched and output, in this manner, overdriving can be achieved.

Note that a combination of the numeric value table for obtaining the corrected video signal is a product of the number of gray scales which 1SF can have and the number of gray scales which 2SF can have. The smaller the number of this combination becomes, the mote preferable, because data amount which is stored in the correction circuit 4713 becomes small. In this embodiment mode, luminance of a dark image is 0 in a halftone until a subframe which displays a bright image reaches the highest luminance, and luminance of the bright image is constant after the subframe which displays the bright image reaches the highest luminance and until a maximum gray scale is displayed, so that the number of this combination can be made extremely small.

Note also that the overdriving circuit in the present invention also includes the case in which the input video signal Gi is an analog signal and the output video signal Go is a digital signal. At this time, it is only necessary that the DA converter circuit 4704 be removed from the circuit shown in FIG. 47B. In addition, the overdriving circuit in the present invention also includes the ease in which the input video signal Gi is a digital signal and the output video signal Go is an analog signal. At this time, it is only necessary that the encoding circuit 4701 be removed from the circuit shown in FIG. 47B.

Figure 48:
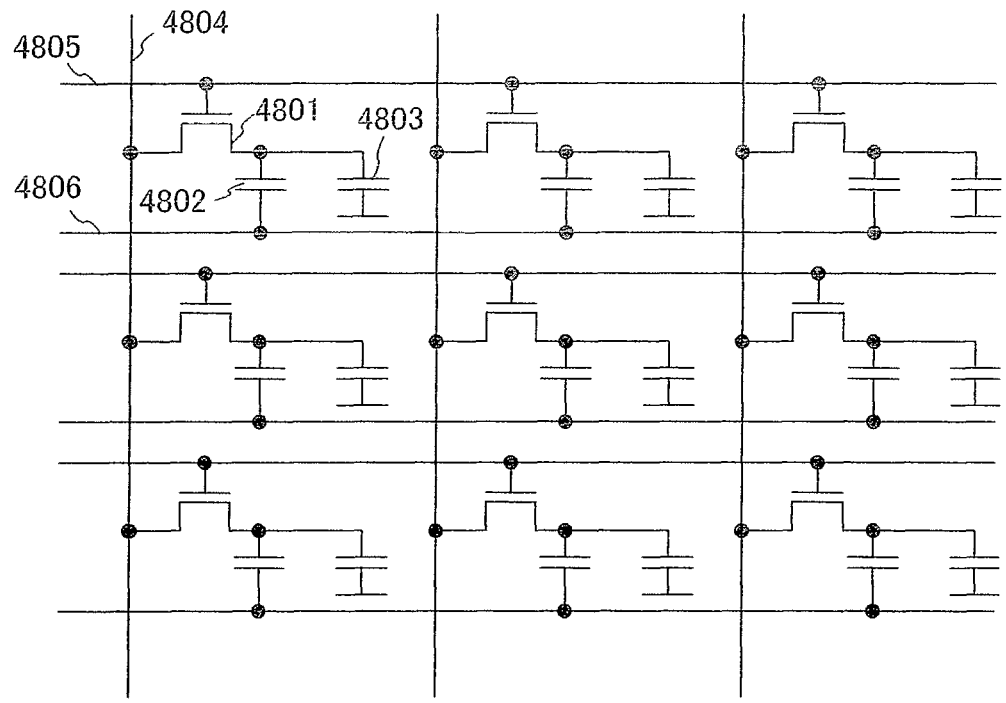
FIGS. 48A and 48B illustrate Embodiment Mode 9.
Figure 48:
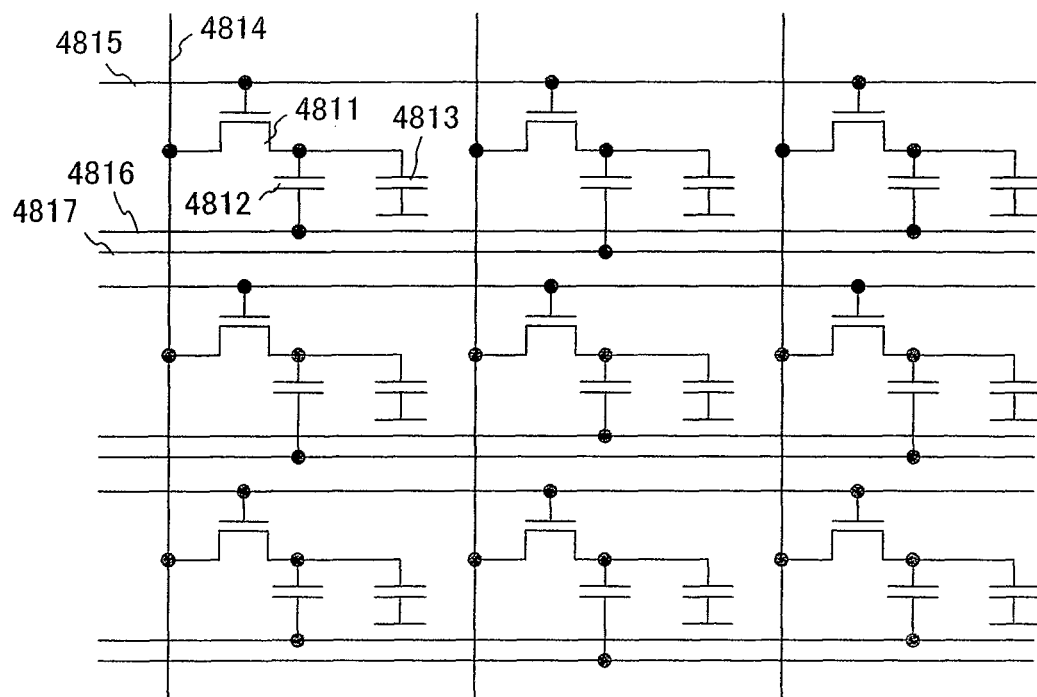

Driving which controls a potential of a common line is described with reference to FIGS. 48A and 48B. FIG. 48A is a diagram showing a plurality of pixel circuits in which one common line is provided with respect to one scan line in a display device using a display element which has capacitive properties like a liquid crystal element. Each of the pixel circuits shown in FIG. 48A includes a transistor 4801, an auxiliary capacitor 4802, a display element 4803, a video signal line 4804, a scan line 4805, and a common line 4806.

Note that the transistor 4801, the auxiliary capacitor 4802, the display element 4803, the video signal line 4804, the scan line 4805, and the common line 4806 correspond to the transistor 4601, the capacitor 4602, the display element 4621, the tins wiring 4611, the second wiring 4612, and the third wiring 4613 shown in FIG. 46A, respectively.

A gate terminal of the transistor 4801 is electrically connected to the scan line 4805; one of a source terminal and a drain terminal of the transistor 4801 is electrically connected to the video signal line 4804; and the other of the source terminal and the drain terminal of the transistor 4801 is electrically connected to one of terminals of the auxiliary capacitor 4802 and one of terminals of the display element 4803. In addition, the other of the terminals of the auxiliary capacitor 4802 is electrically connected to the common line 4806.

First, in each of pixels selected by the scan line 4805, voltage corresponding to a video signal is applied to the display element 4803 and the auxiliary capacitor 4802 through the video signal line 4804 because the transistor 4801 is turned on. At this time, when the video signal is a signal which makes all of pixels connected to the common line 4806 display a minimum gray scale or when the video signal is a signal which makes ail of the pixels connected to the common line 4806 display a maximum gray scale, it is not necessary that the video signal be written to each of the pixels through the video signal line 4804. Instead of writing the video signal through the video signal line 4804, voltage applied to the display element 4803 can be changed by changing a potential of the common line 4805.

Subsequently, FIG. 48B is a diagram showing a plurality of pixel circuits in which two common lines are provided with respect to one scan line in a display device using a display element which has capacitive properties like a liquid crystal element. Each of the pixel circuits shown in FIG. 48B includes a transistor 4811, an auxiliary capacitor 4812, a display element 4813, a video signal line 4814, a scan line 4815, a first common line 4816, and a second common line 4817.

A gate terminal of the transistor 4811 is electrically connected to the scan line 4815; one of a source terminal and a drain terminal of the transistor 4811 is electrically connected to the video signal line 4814; and the other of the source terminal and the drain terminal of the transistor 4811 is electrically connected to one of terminals of the auxiliary capacitor 4812 and one of terminals of the display element 4813. In addition, the other of the terminals of the auxiliary capacitor 4812 is electrically connected to the first common line 4816. Further, in a pixel which is adjacent to the pixel, the other of the terminals of the auxiliary capacitor 4812 is electrically connected to the second common line 4817.

In the pixel circuits shown in FIG. 488, the number of pixels which are electrically connected to one common line is small. Therefore, by changing a potential of the first common line 4816 or the second common line 4817 instead of writing a video signal through the video signal line 4814, frequency of changing voltage applied to the display element 4813 is significantly increased. In addition, source inversion driving or dot inversion driving can be performed. By performing source inversion driving or do inversion driving, reliability of the element can be improved and a flicker can be suppressed.

Figure 49:
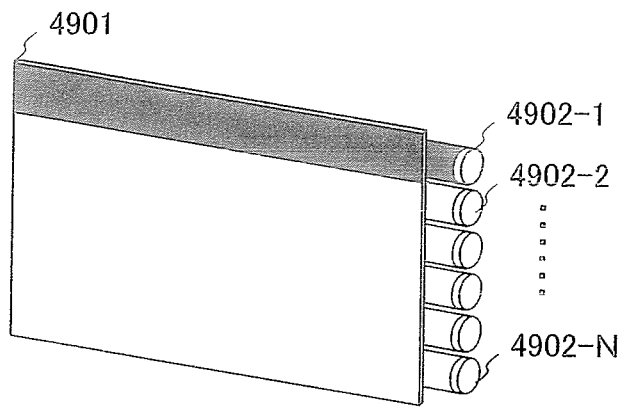
FIGS. 49A to 49C illustrate Embodiment Mode 9.
Figure 49:
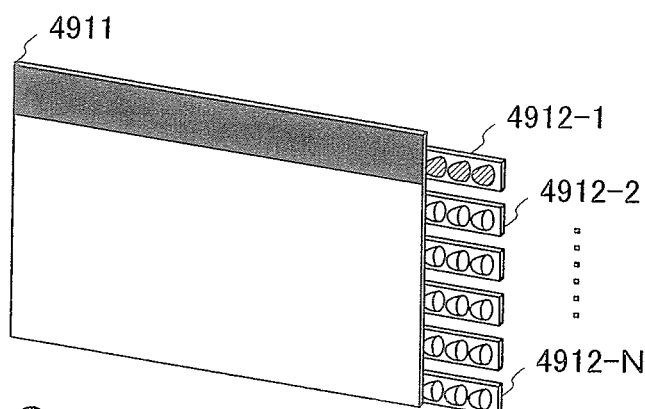
Figure 49:
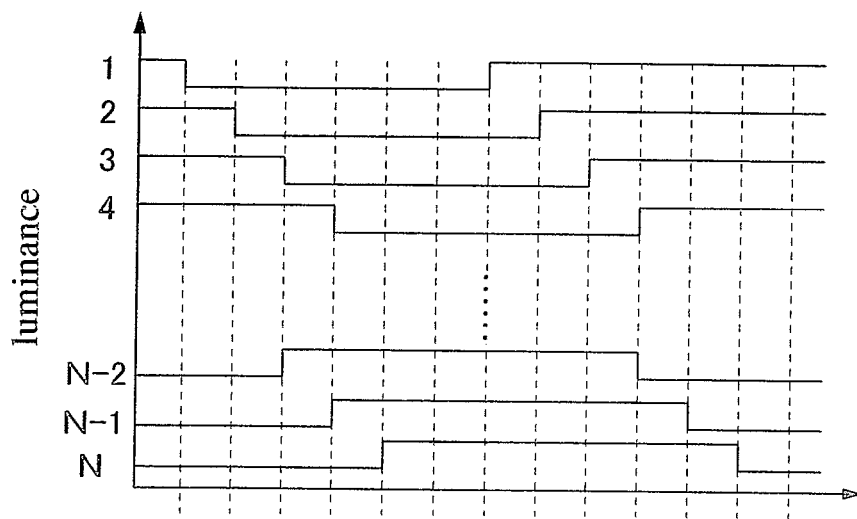

A scanning backlight is described with reference to FIGS. 49A to 49C FIG. 49A is a view showing a scanning backlight in which cold cathode fluorescent lamps are arranged. The scanning backlight shown in FIG. 49A includes a diffusing plate 4901 and N pieces of cold cathode fluorescent lamps 4902-1 to 4902-N. The N pieces of the cold cathode fluorescent lamps 4902-1 to 4902-N are arranged on the back side of the diffusing plate 4901, so that the N pieces of the cold cathode fluorescent lamps 4902-1 to 4902-N can be scanned while luminance thereof is changed.

Change in luminance of each of the cold cathode fluorescent lamps in scanning is described with reference to FIG. 49C. First, luminance of the cold cathode fluorescent lamp 4902-1 is changed for a certain period. After that, luminance of the cold cathode fluorescent lamp 4902-2 which is provided adjacent to the cold cathode fluorescent lamp 4902-1 is changed for the same period. In this manner, luminance is changed sequentially from the cold cathode fluorescent lamp 4902-1 to the cold cathode fluorescent lamp 4902-N. Although luminance which is changed for a certain period is set to be lower than original luminance in FIG. 49C, it may also be higher than original luminance. In addition, although scanning is performed from the cold cathode fluorescent lamps 4902-1 to 4902-N, scanning may also be performed from the cold cathode fluorescent lamps 4902-N to 4902-1, which is in a reversed order.

It is preferable that backlight luminance in a period with low luminance be approximately the same as the highest luminance of a subframe in which a dark image is inserted. Specifically, the backlight luminance is preferably the highest luminance Lmax 1 of 1SF when a dark image is inserted In 1SF, and the backlight luminance is preferably the highest luminance Lmax 2 of 2SF when a dark image is inserted in 2SF.

Note that an LED may be used as a light source of the scanning backlight. The scanning backlight in that case is as shown in FIG. 49B. The scanning backlight shown in FIG. 49B includes a diffusing plate 4911 and light sources 4912-1 to 4912-N, in each of which LEDs are arranged. When the LED is used as the light source of the scanning backlight, there is an advantage in that the backlight can be thin and lightweight. In addition, there is also an advantage that a color reproduction area can be widened. Further, since the LEDs which are arranged in each of the light sources 4912-1 to 4912-N can be similarly scanned, a dot scanning backlight can also be obtained. By using the dot scanning backlight, image quality of a moving image can be further improved.

Figure 50:
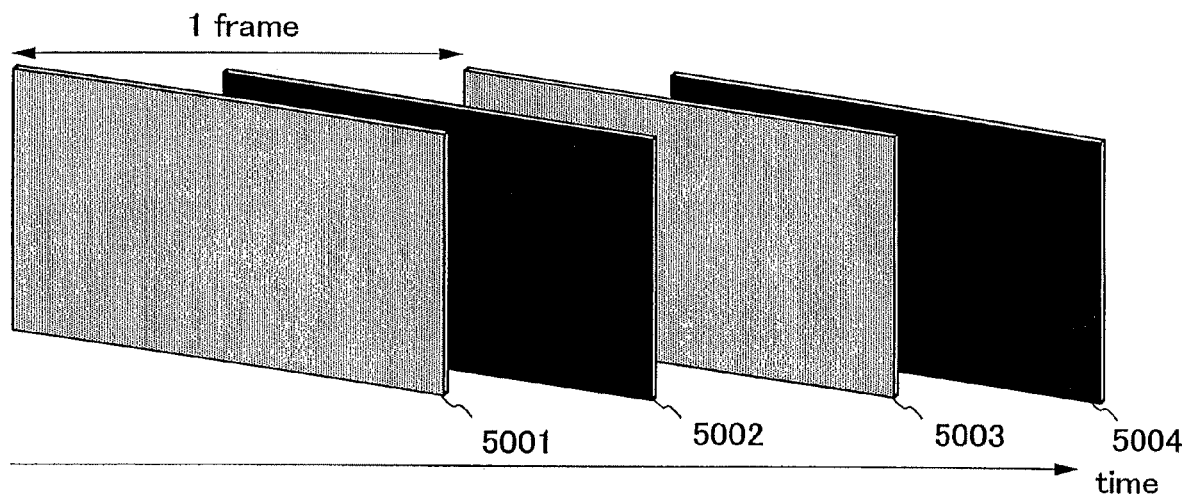
FIGS. 50A to 50C illustrate Embodiment Mode 9.
Figure 50:
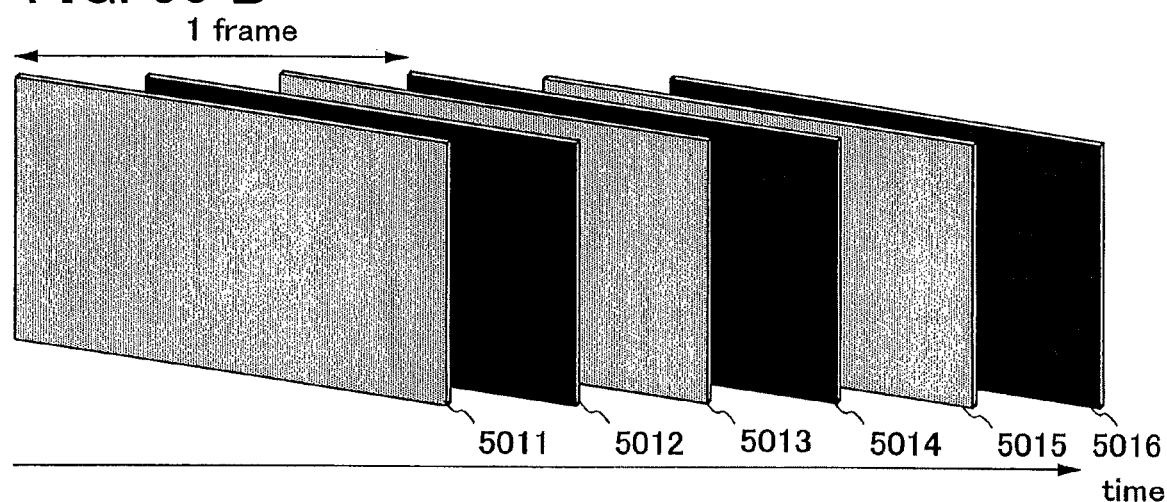
Figure 50:
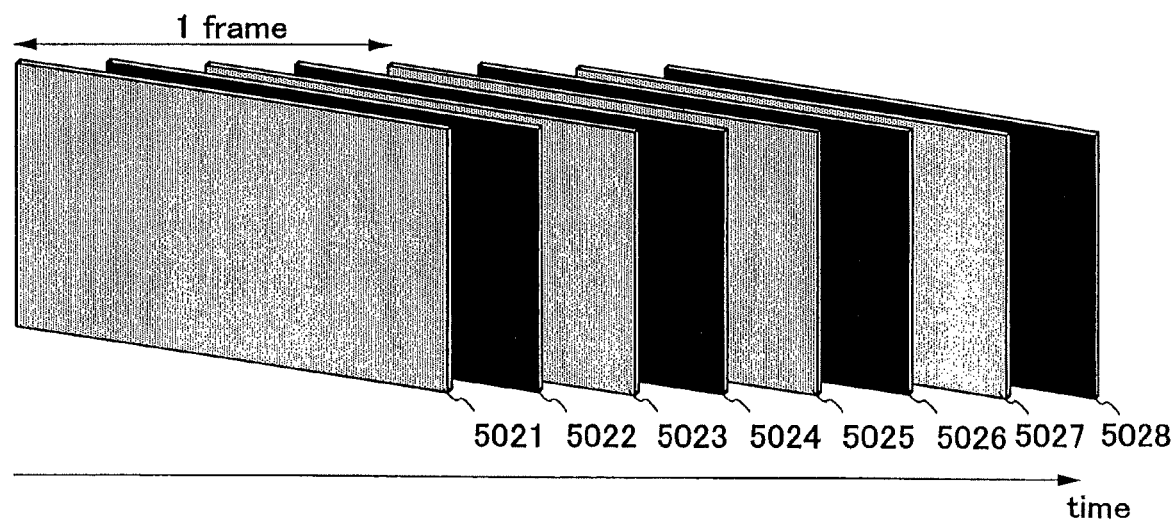

A high frequency driving method is described with reference to FIGS. 50A to 50C. FIG. 50A is a view in which driving is performed by inserting a dark image at a frame frequency of 60 Hz. A reference numeral 5001 denotes a bright image of the frame; a reference numeral 5002 denotes a dark image of the frame; a reference numeral 5003 denotes a bright image of the next frame; and a reference numeral 5004 denotes a dark image of the next frame. In the case of performing driving at 60 Hz, there is an advantage in that consistency with a frame rate of a video signal can be easily obtained and an image processing circuit does not become complicated.

FIG. 50B is a view in which driving is performed by inserting a dark, image at a frame frequency of 90 Hz. A reference numeral 5011 denotes a bright image of the frame; a reference numeral 5012 denotes a dark image of the frame; a reference numeral 5013 denotes a bright image of a first image which is formed from the frame, the next frame, and a frame after next; a reference numeral 5014 denotes a dark image of the first image which is formed from the frame, the next frame, and the frame after next; a reference numeral 2015 denotes a bright image of a second image which is formed from the frame, the next frame, and the frame after next; and a reference numeral 5016 denotes a dark image of the second image which is formed from the frame, the next frame, and the frame after next In the case of performing driving at 90 Hz, there is an advantage in that operating frequency of a peripheral driver circuit is made not so high and image quality of a moving image can be effectively improved.

FIG. 50C is a view in which driving is performed by inserting a dark image at a frame frequency of 120 Hz. A reference numeral 5021 denotes a bright image of the frame; a reference numeral 5022 denotes a dark image of the frame; reference numeral 5023 denotes a bright image of an image which is formed from the frame and the next frame; a reference numeral 5024 denotes a dark image of the image which is formed from the frame and the next frame; a reference numeral 5025 denotes a bright image of the next frame; a reference numeral 5026 denotes a dark image of the next frame; a reference numeral 5027 denotes a bright image of an image which is formed from the next frame and a frame after next; and a reference numeral 5028 denotes a dark image of the image which is formed form the next frame and the fame after next. In the case of performing driving at 120 Hz, there is an advantage in that, an advantageous effect of improving image quality of a moving image is remarkable and an after image is hardly perceived.

FIGS. 51A to 55B show top plan views and cross-sectional views of each of the pixels shown in FIGS. 46A and 46B. FIGS. 51A to 55B have different operation modes of a liquid crystal.

Figure 51A:
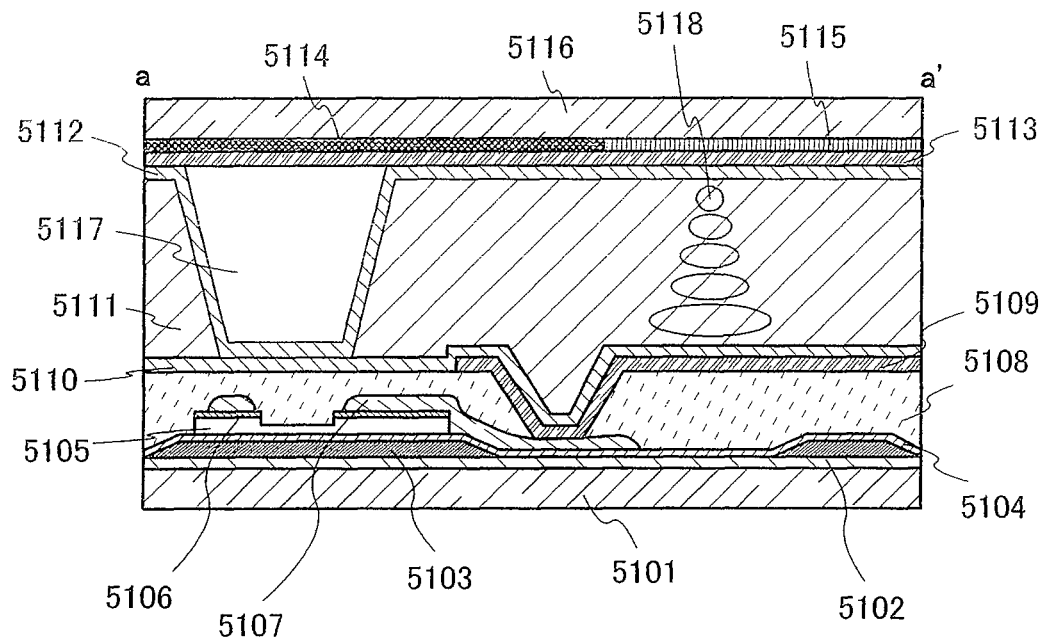
FIGS. 51A and 51B illustrate Embodiment Mode 9.
Figure 51B:
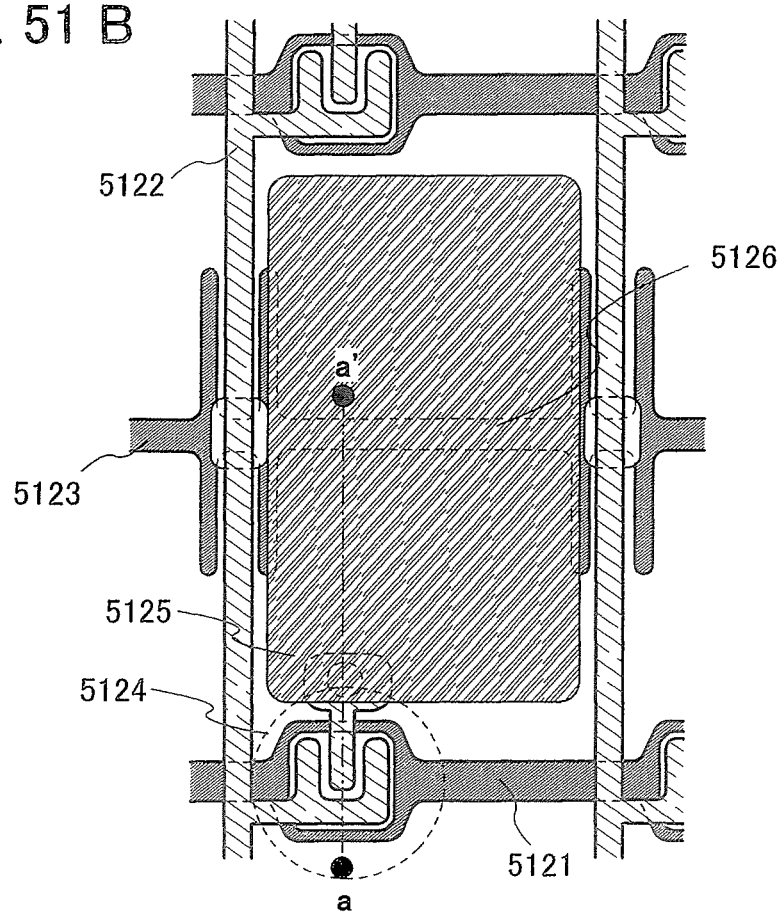
Figure 52:
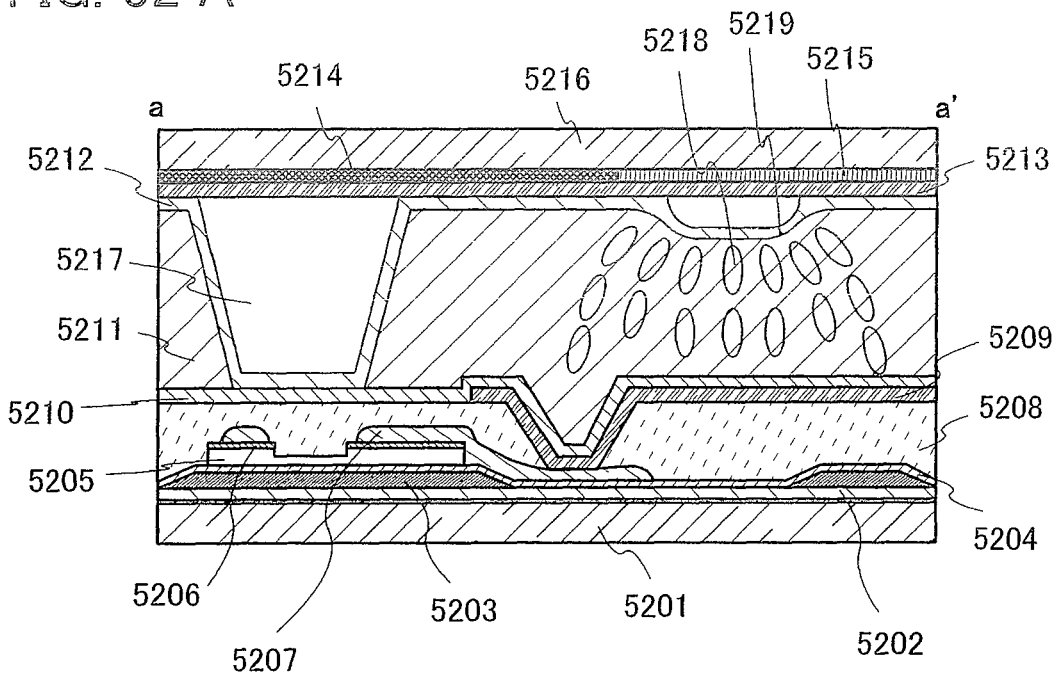
FIGS. 52A and 52B illustrate Embodiment Mode 9.
Figure 52:
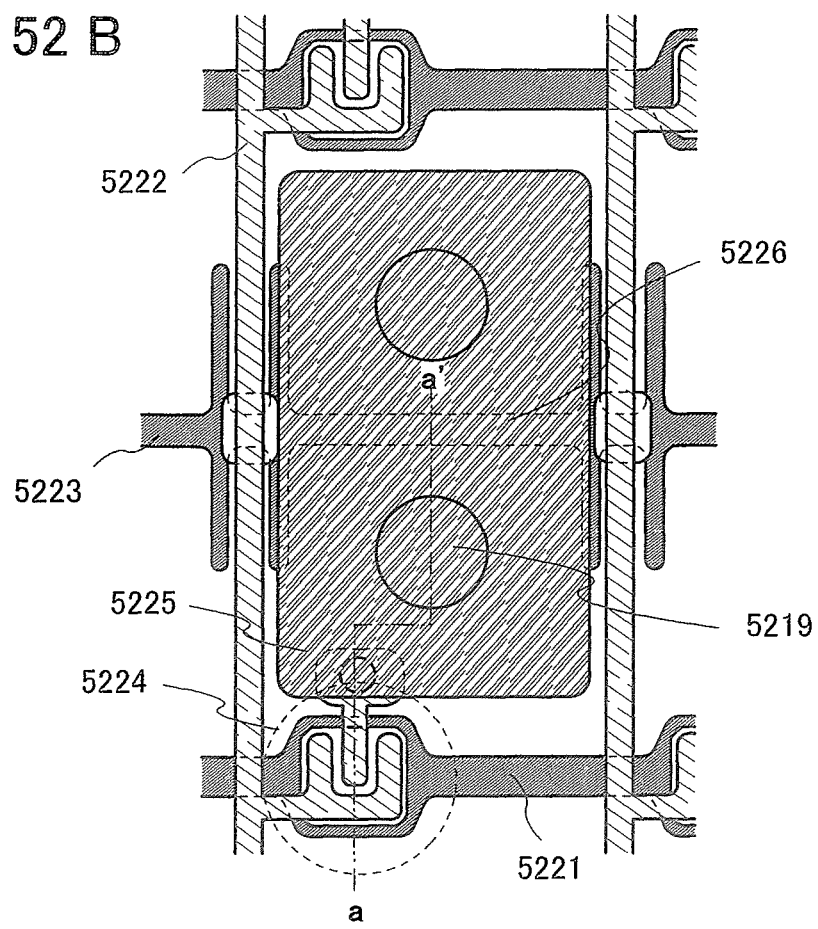
Figure 53:
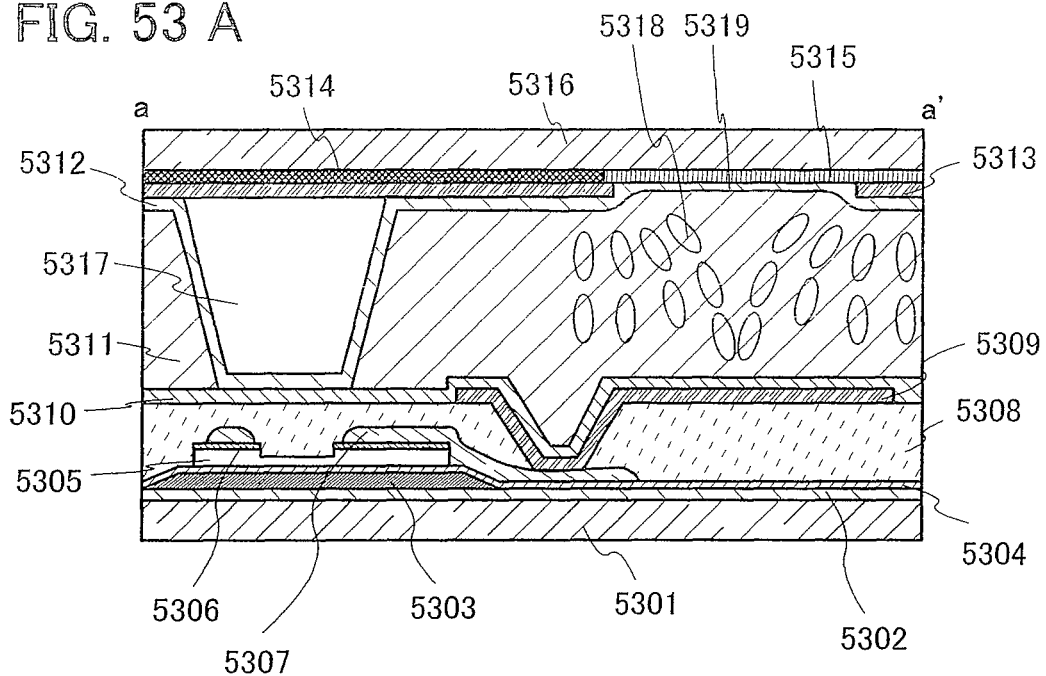
FIGS. 53A and 53B illustrate Embodiment Mode 9.
Figure 53:
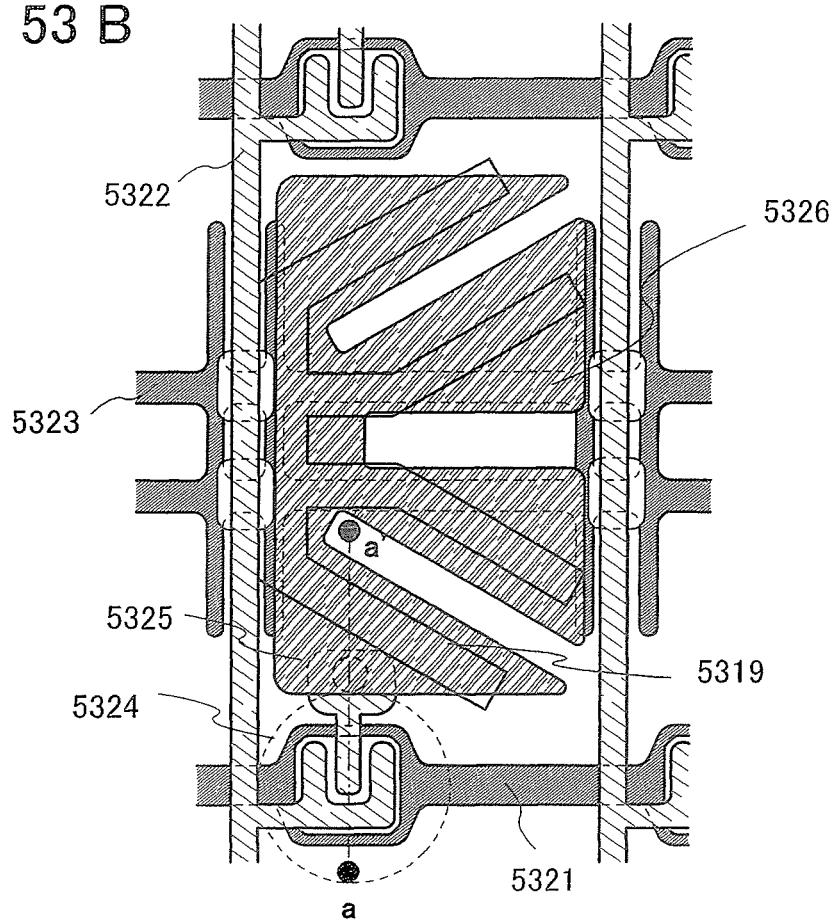
Figure 54:
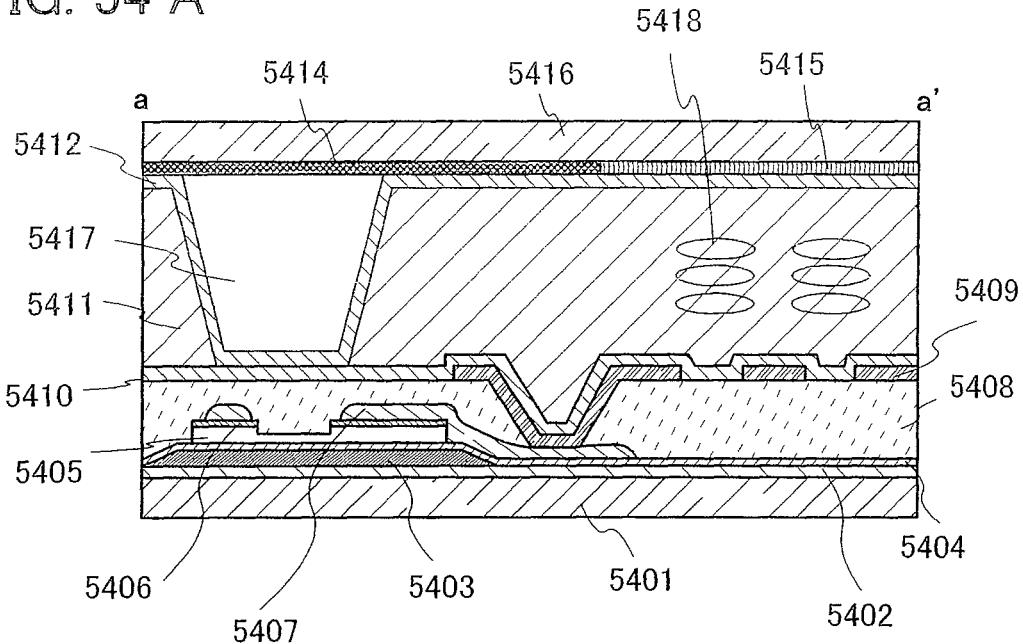
FIGS. 54A and 54B illustrate Embodiment Mode 9.
Figure 54:
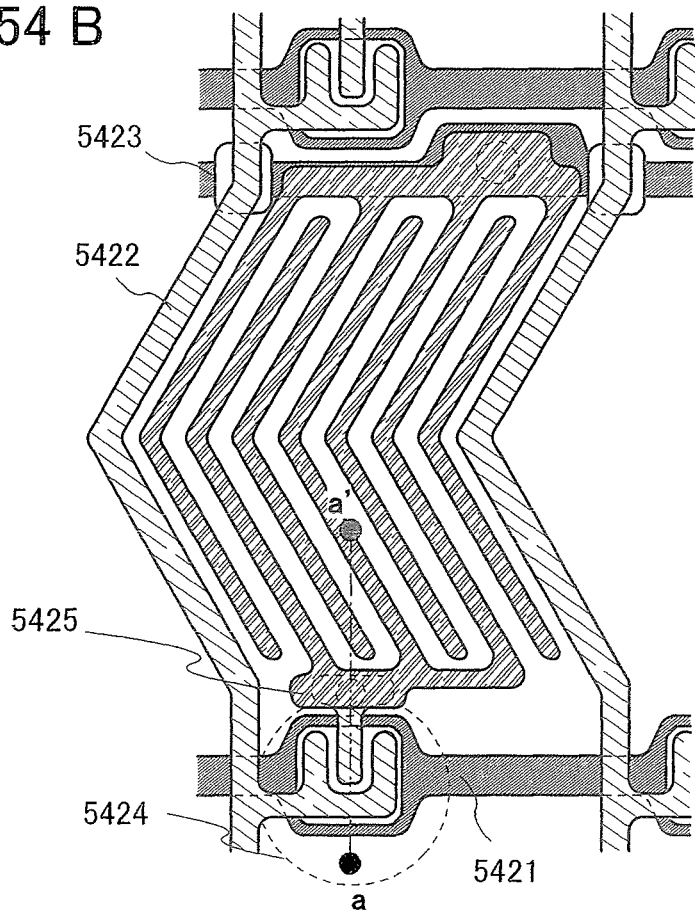

First, FIGS. 51A and 51B are a cross-sectional view and a top plan view of a pixel in which a so-called TN mode which is one of pixel structures of a liquid crystal display device is combined with a thin film transistor (a TFT), FIG. 51A is a cross-sectional view of the pixel and FIG. 51B is a top plan view of the pixel. Further, the cross-sectional view of the pixel shown in FIG. 51A corresponds to a line a-a' in the top plan view of the pixel shown in FIG. 51B. By applying the present invention, to a liquid crystal display device having the pixel structure shown in FIGS. 51A and 51B, the liquid crystal display device can be manufactured at low cost.

A pixel structure of a TN-mode liquid crystal display device is described with reference to FIG. 51A. The liquid crystal display device includes a basic portion which displays an image, which is called a liquid crystal panel. The liquid crystal panel is manufactured as follows: two processed substrates are attached to each other with a gap of several μm therebetween and a liquid crystal material is injected between the two substrates. In FIG. 51A, the two substrates correspond to a first substrate 5101 and a second substrate 5116. A TFT and a pixel electrode may be formed over the first substrate, and a light shielding film 5114, a color filter 5115, a fourth conductive layer 5113, a spacer 5117, and a second alignment film 5112 may be formed on the second substrate.

Note that the present invention can also be implemented without forming the TFT over the first substrate 5101. When the present invention is implemented without forming the TFT, the number of steps is reduced, so that manufacturing cost can be reduced, in addition, since the structure is simple, a yield can be improved. On the other hand, when the present invention is implemented by forming the TFT, a larger display device can be obtained.

The TFT shown in FIGS. 51A and 51B is a bottom-gate TFT using an amorphous semiconductor, which has an advantage that it can be manufactured at low cost by using a large substrate. However, the present invention is not limited to this. As a structure of a TFT which can be used, there are a channel-etched type, a channel-protective type, and the like as for a bottom-gate TFT. Alternatively, a top-gate type may be used. Further, not only an amorphous semiconductor but also a polycrystalline semiconductor may be used.

Note that, the present invention can also be implemented without forming the light shielding film 5114 on the second substrate 5116. When the present invention is implemented without forming the light shielding film 5114, the number of steps is reduced, so that manufacturing cost can be reduced. In addition, since the structure is simple, the yield can be improved. On the other hand, when the present invention is implemented by forming the light shielding film 5114, a display device with little light leakage at the time of black display can be obtained.

Note that the present invention can also be implemented without forming the color filter 5115 on the second substrate 5316. When the present invention is implemented without forming the color filter 5115, the number of steps is reduced, so that manufacturing cost can be reduced. In addition, since the structure is simple, the yield can be improved. On the other hand, when the present invention is implemented by forming the color filter 5115, a display device which can perform color display can be obtained.

Note that the present invention can also be implemented by dispersing spherical spacers instead of providing the spacer 5117 on the second substrate 5116. When the present invention is implemented by dispersing the spherical spacers, the number of steps is reduced, so that manufacturing cost can be reduced. In addition, since the structure is simple, the yield can be improved. On the other hand, when the present invention is implemented by forming the spacer 5117, a position of the spacer is not varied, so that a distance between the two substrates can be uniformed and a display device with little display unevenness can be obtained.

Next, a process to be performed to the first substrate 5101 is described. A substrate having light-transmitting properties is preferably used for the first substrate 5101. For example, a quartz, substrate, a glass substrate, or a plastic substrate may be used. Alternatively, the first substrate 5101 may be a light shielding substrate, a semiconductor substrate, or an SOI (Silicon On Insulator) substrate.

First, a first insulating film 5102 may be formed over the first substrate 5301. The first insulating film 5102 may be an insulating film such as a silicon oxide film, a silicon nitride film, or a silicon oxynitride film ($SiO_xN_y$) film. Alternatively, an insulating film having a slacked-layer structure in which at least two of these films are combined may be used. When the present invention is implemented by forming the first insulating film 5102, change in characteristics of the TFT due to an impurity from the substrate which adversely affects a semiconductor layer can be prevented, so that a display device having high reliability can be obtained. On the other hand, when the present invention is implemented without forming the first insulating film 5102, the number of steps is reduced, so that manufacturing cost can be reduced. In addition, since the structure is simple, the yield can be improved.

Next, a first conductive layer 5103 is formed over the first substrate 3101 or the first insulating Him 5102. A shape of the first conductive layer 5103 may be processed. A step of processing the shape is preferably as follows. First, the first conductive layer 5103 is formed over the entire surface. At Otis time, a film formation apparatus such as a sputtering apparatus or a CVD apparatus may be used. Next, a photosensitive resist material is formed over the entire surface of the first conductive layer 5103 formed over the entire surface. Then, the resist material is exposed to light in accordance with an intended shape by photolithography, a laser direct drawing method, or the like. Next, either the resist material which is exposed to light or the resist material which is not exposed to light is removed by etching, so that a mask for processing the shape of the first conductive layer 5103 can be obtained. After that, the first conductive layer 5103 is removed by etching in accordance with a formed mask pattern, so that the shape of the first conductive layer 5103 can be processed into a desired pattern. Note that there are a chemical method (e.g., wet etching) and a physical method (e.g., dry etching) as a method for etching the first conductive layer 5103, and the method is appropriately selected considering properties or the like of a material of the first conductive layer 5103 and a material used for a portion below the first conductive layer 5103. As a material used for the first conductive layer 5103, Mo, Ti, Al, Nd, Cr, or the like is preferable. Alternatively, a stacked-layer structure of these materials may be used. Further alternatively, the first conductive layer 5103 may be formed as a single layer or a stacked-layer structure of an alloy of these materials.

Next, a second insulating film 5104 is formed. At this time, a film formation apparatus such as a sputtering apparatus or a CVD apparatus may be used. As a material used for the second insulating film 5104, a thermal oxide film, a silicon oxide film, a silicon nitride film, a silicon oxynitride film, or the like is preferable. Alternatively, a stacked-layer structure of these films may be used. It is particularly preferable that part of the second insulating film 5104 which is in contact with a first semiconductor layer 5105 be a silicon oxide film. This is because a trap level at m interface between the semiconductor film 5105 and the second insulating film 5104 is decreased when a silicon oxide film is used. When the first conductive layer 5103 is formed of Mo, it is preferable that part of the second insulating film 5104 which is in contact with the first conductive layer 5103 be a silicon nitride film. This is because a silicon nitride film does not oxidize Mo.

Next, the first semiconductor layer 5105 is formed. After that, it is preferable that a second semiconductor layer 5106 be formed sequentially. Shapes of the first semiconductor layer 5105 and the second semiconductor layer 5106 may be processed. A method for processing the shapes is preferably a method such as photolithography as described above. As a material used for the first semiconductor layer 5105, silicon, silicon germanium (SiGe), or the like is preferable. Further, as a material used for the second semiconductor layer 5106, silicon or the like including phosphorus or the like is preferable.

Next, a second conductive layer 5107 is formed. At this time, it is preferable to use sputtering or a printing method. A material used for the second conductive layer 5107 may have light-transmitting properties or reflectiveness. In the case where the material used for the second conductive layer has light-transmuting properties, for example, an indium tin oxide (ITO) film formed by mixing tin oxide into indium oxide, an indium tin silicon oxide (ITSO) film formed by mixing silicon oxide into indium tin oxide (ITO), an indium zinc oxide (IZO) film formed by mixing zinc oxide into indium oxide, a zinc oxide film, or a tin oxide film can be used. Note that IZO is a transparent conductive material formed by sputtering using a target in which 2 to 20 wt % of zinc oxide (ZnO) is mixed into ITO. On the other hand, in the case of having reflectiveness, Ti, Mo, Ta, Cr, W, Al, or the like can be used. In addition, a two-layer structure in which Al and Ti, Mo, Ta, Cr, or W are stacked, or a three-layer structure in which Al is interposed between metals such as Ti, Mo, Ta, Cr, and W may be employed Note that a shape of the second conductive layer 5107 may be processed. A method for processing the shape is preferably a method such as photolithography as described above. Note also that it is preferable that etching be performed by dry etching. Dry etching may be performed by a dry etching apparatus using a high-density plasma source such as ECR (Electron Cycrotron Resonance) or ICP (Inductive Coupled Plasma).

Next, a channel region of the TFT is formed. At this time, etching of the second semiconductor layer 5106 may be performed by using the second conductive layer 5107 as a mask. Thus, the number of masks can be reduced, so that manufacturing cost can be reduced. By performing etching of the second semiconductor layer 5106 having conductivity, a portion which is removed serves as the channel region of the TFT. Note that without sequentially forming the first semiconductor layer 5105 and the second semiconductor layer 5106, a film serving as a stopper may be formed and patterned in a portion serving as the channel region of the TFT after formation of the first semiconductor layer 5105, and then, the second semiconductor layer 5106 may be formed. Thus, since the channel region of the TFT can be formed without using the second conductive layer 5107 as a mask, a degree of freedom of a layout pattern is increased, which is an advantage. In addition, since the first semiconductor layer 5105 is not etched when the second semiconductor layer 5106 is etched, the channel region of the TFT can be surely formed without causing an etching defect, which is also an advantage.

Next, a third insulating film 5108 is formed. It is preferable that the third insulating Film 5108 have light-transmitting properties. Note that as a material used for the third insulating film 5108, an inorganic material (e.g., silicon oxide, silicon nitride, or silicon oxynitride), an organic compound material having a low dielectric constant (e.g., a photosensitive or nonphotosensitive organic resin material), or the like is preferable. Alternatively, a material including siloxane may be used. Siloxane is a material in which a skeleton structure is formed by a bond of silicon (Si) and oxygen (O). As a substituent, an organic group including at least hydrogen (e.g., an alkyl group or aromatic hydrocarbon) is used. As the substituent, a fluoro group can also be used. Alternatively, the organic group including at least hydrogen and the fluoro group may be used as the substituent. The third insulating film 5108 may have a stacked-layer structure. Note that a shape of the third insulating film 5108 may be processed. A method for processing the shape is preferably a method such as photolithography as described above. At this time, by etching the second insulating film 5104 at the same time, a contact hole teaching not only the third insulating film 5108 but also the first conductive layer 5103 can be formed. It is preferable that a surface of the third insulating film 5108 be as flat as possible. This is because alignment of liquid crystal molecules is adversely affected by unevenness of a surface which is in contact with a liquid crystal.

Next, a third conductive layer 5109 is formed. At this lime, it is preferable to use sputtering or a printing method. Note that a material used for the third conductive layer 5109 may have light-transmitting properties or reflectiveness, similarly to the second conductive layer 5107. Note also that a material which can be used for the third conductive layer 5109 may be similar to that of the second conductive layer 5107. In addition, a shape of the third conductive layer 5109 may be processed. A method for processing the shape may be similar to that of the second conductive layer 5107.

Next, a first alignment film 5110 is formed. As the first alignment film 5110, a film of a polymer such as polyamide can be used. After forming the first alignment film 5110, rubbing may be performed in order to control alignment of the liquid crystal molecules. Rubbing is a step for forming lines in an alignment film by rubbing the alignment film with a cloth. By performing rubbing, the alignment film can have alignment properties.

The first substrate 5101 formed as described above is attached to the second substrate 5116 provided with the light shielding film 5114, the color filter 5115, the fourth conductive layer 5113, the spacer 5117, and the second alignment film 5112 with a sealant with a gap of several urn therebetween, and then, a liquid crystal material is injected between the two substrates, so that the liquid crystal panel can be manufactured. Note that in the TN-mode liquid crystal panel as shown in FIGS. 51A and 51B, the fourth conductive layer 5113 may be formed on the entire surface of the second substrate 5116.

Next, a feature of a pixel structure of the TN-mode liquid crystal panel shown in FIGS. 51A and 51B is described. Liquid crystal molecules 5118 shown in FIG. 51A are long and thin molecules each having a major axis and a minor axis. In FIG. 51A, each of the liquid crystal molecules 5118 is expressed by its length to show a direction of each of the liquid crystal molecules. That is, the direction of the major axis of the liquid crystal molecule 5118 which is expressed to be long is parallel to the paper, and the direction of the major axis becomes closer to a normal direction of the paper as the liquid crystal molecule 5118 is expressed to be shorter. That is, among the liquid crystal molecules 5118 shown in FIG. 51A, the direction of the major axis of the liquid crystal molecule which is close to the first substrate 5101 and the direction of the major axis of the liquid crystal molecule which is close, to the second substrate 5116 are different from each other by 90 degrees, and the directions of the major axes of the liquid crystal molecules 5118 located therebetween are arranged so as to smoothly connect the two directions. That is, the liquid crystal molecules 5118 shown in FIG. 51A are aligned to be twisted by 90 degrees between the first substrate 5101 and the second substrate 5116.

Next, an example of pixel layout of a TN-mode liquid crystal display device to which the present invention is applied is described with reference to FIG. 51B. A pixel of the TN-mode liquid crystal display device to which the present invention is applied may include a scan line 5121, a video signal line 5122, a capacitor line 5123, a TFT 5124, a pixel electrode 5125, and a pixel capacitor 5126.

Since the scan line 5121 is electrically connected to a gate terminal of the TFT 5124, it is preferable that the scan line 5121 be formed of the first conductive layer 5103.

Since the video signal line 5122 is electrically connected to a source terminal or a drain terminal of the TFT 5124, it is preferable that the video signal line 5122 be formed of the second conductive layer 5107. Further, since the scan line 5121 and the video signal line 5122 are arranged in matrix, it is preferable that the scan line 512) and the video signal line 5122 beat least formed of conductive layers in different layers.

The capacitor line 5123 is a wiring for forming the pixel capacitor 5126 by being provided to be parallel to the pixel electrode 5125X and it is preferable that the capacitor line 5123 be formed of the first conductive layer 5103. Note that the capacitor line 5123 may be extended along the video signal line 5122 so as to surround the video signal line 5122 as shown in FIG. 51B. Thus, a phenomenon in which a potential of an electrode, which is supposed to be held, is changed in accordance with potential change in the video signal line 5122, namely, a so called cross talk can be reduced. Note also that in order to reduce cross capacitance with the video signal line 5122, the first semiconductor layer 5105 may be provided in a cross region of the capacitor line 5123 and the video signal line. S122 as shown in FIG. 51B.

The TFT 5124 operates as a switch which electrically connects the video signal line 5122 and the pixel electrode 5125. Note that as shown in FIG. 518, one of a source region and a drain region of the TFT 5124 may be provided so as to surround the other of the source region and the drain region. Thus, wide channel width can be obtained in a small area and switching capability can be increased. Note also that as shown in FIG. 51B, the gate terminal of the TFT 5124 may be provided so as to surround the first semiconductor layer 5105.

The pixel electrode 5125 is electrically connected to one of the source terminal and the drain terminal of the TFT 5124. The pixel electrode 5125 is an electrode for applying signal voltage which is transmitted through the video signal line 5122 to the liquid crystal element. In addition, the pixel electrode 5125 and the capacitor line 5123 may form the pixel capacitor 5126. Thus, the pixel electrode 5125 can also have a function of holding the signal voltage which is transmitted through the video signal line 5122. Note that the pixel electrode 5125 may be rectangular as shown in FIG. 51B. Thus, an aperture ratio of the pixel can be increased, so that efficiency of the liquid crystal display device can be improved. In addition, in the case where the pixel electrode 5125 is formed using a material having light-transmitting properties, a transmissive liquid crystal display device can be obtained. A transmissive liquid crystal display device has high color reproductive and can display an image with high image quality. Alternatively, in the case where the pixel electrode 5125 is formed using a material having reflectiveness, a reflective liquid crystal display device can be obtained. A reflective liquid crystal display device has high visibility in a bright environment such as outside, and can extremely reduce power consumption because a backlight is not necessary. Note that in the case where the pixel electrode 5125 is formed using both a material having light-transmitting properties and a material having reflectiveness, a semi-transmissive liquid crystal display device which has advantages of both of the above can be obtained. Note also that in the case where the pixel electrode 5125 is formed using a material having reflectiveness, a surface of the pixel electrode 5125 may have unevenness. Thus, since reflected light is reflected diffusely, an advantage that angular dependency of intensity distribution of reflected light is decreased can be obtained. That is, a reflective liquid crystal display device, brightness of which is uniform at any angle, am be obtained.

Next, a VA (Vertical Alignment)-mode liquid crystal display device to which the present invention is applied is described with reference to FIGS. 52A and 52B. FIGS. 52A and 52B are a cross-sectional view and a top plan view of a pixel in which the present invention is applied to one of pixel structures of a VA-mode liquid crystal display device in which an alignment control projection is used so that liquid crystal molecules are controlled to have various directions and a viewing angle is widened, namely, a so-called MVA (Multi-domain Vertical Alignment) mode. FIG. 52A is a cross-sectional view of a pixel and FIG. 52B is a top plan view of the pixel In addition, the cross-sectional view of the pixel shown in FIG. 52A corresponds to a line a-a' in the top plan view of the pixel shown in FIG. 52B. By applying the present invention to a liquid crystal display device having the pixel structure shown in FIGS. 52A and 528, a liquid crystal display device having a wide viewing angle, high response speed, and high contrast am be obtained.

A pixel structure of an MVA-mode liquid crystal display device is described with reference to FIG. 52A. The liquid crystal display device includes a basic portion which displays an image, which is called a liquid crystal panel. The liquid crystal panel is manufactured as follows: two processed substrates are attached to each other with a gap of several pin therebetween, and a liquid crystal material is injected between the two substrates. In FIG. 52A, the two substrates correspond to a first substrate 5201 and a second substrate 5216. A TFT and a pixel electrode may be formed over the first substrate, and a light shielding film 5214, a color filter 5215, a fourth conductive layer 5213, a spacer 5217, a second alignment film 5212, and an alignment control projection 5219 may be formed on the second substrate.

Note that the present invention can also be implemented without forming the TFT over the first substrate 5201. When the present invention is implemented without forming the TFT, the number of steps is reduced, so that manufacturing cost can be reduced. In addition, since the structure is simple, a yield can be improved. On the other hand, when the present invention is implemented by forming the TFT, a larger display device can be obtained.

The TFT shown in FIGS. 52A and 52B is a bottom-gate TFT using an amorphous semiconductor, which has an advantage that it can be manufactured at low cast by using a large substrate. However, the present invention is not limited to this. As a structure of a TFT which can be used, there are a channel-etched type, a channel-protective type, and the like as for a bottom-gate TFT. Alternatively, a top-gate type may be used. Further, not only an amorphous semiconductor but also a polycrystalline semiconductor may be used.

Note that the present invention can also be implemented without forming the light shielding film 5214 on the second substrate 5216. When the present invention is implemented without forming the light shielding film 5214, the number of steps is reduced, so that manufacturing cost can be reduced. In addition, since the structure is simple, the yield can be improved. On the other hand, when the present invention is implemented by forming the light shielding film 5214, a display device with little, light leakage at the time of black display can be obtained.

Note that the present invention can also be implemented without forming the color filter 5215 on the second substrate 5216. When the present invention is implemented without forming the color fitter 5215, the number of steps is reduced, so that manufacturing cost can be reduced. In addition, since the structure is simple, the yield can be improved. On the other fraud, when the present invention is implemented by forming the color filter 5215, a display device which can perform color display can be obtained.

Note that the present invention can also be implemented by dispersing spherical spacers instead of providing the spacer 5217 on the second substrate 5216. When the present invention is implemented by dispersing the spherical spacers, the number of steps is reduced, so that manufacturing cost can be reduced. In addition, since the structure is simple, the yield can be improved. On the other hand, when the present invention is implemented by forming the spacer 5217, a position of the spacer is not varied, so that a distance between the two substrates can be uniformed and a display device with little display unevenness can be obtained.

Next, as for a process to be performed to the first substrate 5201, the method described in FIGS. 51A and 51B may be used; therefore, description is omitted. Here, the first substrate 5201, a first insulating film 5202, a first conductive layer 5203, a second insulating film 5204, a first semiconductor layer 5205, a second semiconductor layer 5206, a second conductive layer 5207, a third insulating film 5208, a third conductive layer 5209, and a first alignment layer 5210 correspond to the first substrate 5101, the first insulating film 5102, the first conductive layer 5103, the second insulating film 5104, the first semiconductor layer 5105, the second semiconductor layer 5106, the second conductive layer 5107, the third insulating film 5108, the third conductive layer 5109, and the first alignment film 5110 in FIG. 51A, respectively. Note that although not shown in the drawings, an alignment control projection may also be provided on the first substrate side. Thus, alignment of liquid crystal molecules can be controlled more surely. In addition, the first alignment film 5210 and the second alignment film 5212 may be vertical alignment films. Therefore, liquid crystal molecules 5218 can be aligned vertically.

The first substrate 5201 formed as described above is attached to the second substrate 5216 provided with the light shielding film 5214, the color filter 5215, the fourth conductive layer 5213, the spacer 5217, and the second alignment film 5212 with a sealant with a gap of several pan therebetween, and then, a liquid crystal material is injected between the two substrates, so that the liquid crystal panel can be manufactured. Note that in the MVA-mode liquid crystal panel as shown in FIGS. 52A and 52B, the fourth conductive layer 5213 may be formed on the entire surface of the second substrate 5216. Further, the alignment control projection 5219 may be formed so as to be in contact with the fourth conductive layer 5213. Although a shape of the alignment control projection 5219 is not limited, a shape with a smooth curve is preferable. Thus, since alignment of adjacent liquid crystal molecules 5218 becomes extremely similar, an alignment defect can be reduced. Furthermore, a defect of the alignment film in which the second alignment film 5212 is disconnected by the alignment control projection 5219 can be reduced.

Next, a feature of the pixel structure of the MVA-mode liquid crystal panel shown in FIGS. 52A and 52B is described. The liquid crystal molecules 5218 shown in FIG. 52A are long and thin molecules each having a major axis and a minor axis, in FIG. 52A, each; of the liquid crystal molecules 5218 is expressed by its length to show a direction of each of the liquid crystal molecules. That is, a direction of the major axis of the liquid crystal molecule 5218 which is expressed to be long is parallel to the paper, and the direction of the major axis becomes closer to a normal direction of the paper as the liquid crystal molecule 5218 is expressed to be shorter. That is, each of the liquid crystal molecules 5218 shown in FIG. 52A is aligned so that the direction of the major axis is normal to the alignment film. Thus, the liquid crystal molecules 5218 in a portion where the alignment control projection 5219 is provided are aligned radially with the alignment control projection 5219 as a center. With this state, a liquid crystal display device having a wide viewing angle can be obtained.

Next, an example of pixel layout of the MVA-mode liquid crystal display device to which the present invention is applied is described with reference to FIG. 52B. The pixel of the MVA-mode liquid crystal display device to which the present invention is applied may include a scan line 5221, a video signal line 5222, a capacitor line 5223, a TFT 5224, a pixel electrode 5225, a pixel capacitor 5226, and an alignment control projection 5219.

Since the scan line 5222 is electrically connected to a gate terminal of the TFT 5224, is preferable that the scan line 5221 be formed of the first conductive layer 5203.

Since the video signal line 5222 is electrically connected to a source terminal or a drain terminal of the TFT 5224, it is preferable that the video signal line 5222 be formed of the second conductive layer 5207. Further, since the scan line 5221 and the video signal line 5222 are arranged in matrix, it is preferable that the scan line 5221 and the video signal line 5222 be at least formed of conductive layers in different layers.

The capacitor line 5223 is a wiring for forming the pixel capacitor 5226 by being provided to be parallel to the pixel electrode 5225, and it is preferable that the capacitor line 5223 be formed of the first conductive layer 5203. Note that the capacitor line 5223 may be extended along the video signal line 5222 so as to surround the video signal line 5222 as shown in FIG. 52B. Thus, a phenomenon in which a potential of an electrode, which is supposed to be held, is changed in accordance with potential change in the video signal line 5222, namely, a so-called cross talk can be reduced. Note also that in order to reduce cross capacitance with the video signal line 5222, the first semiconductor layer 5205 may be provided in a cross region of the capacitor line 5223 and the video signal line 5222 as shown in FIG. 52B.

The TFT 5224 operates as a switch which electrically connects the video signal line 5222 and the pixel electrode 5225. Note that as shown in FIG. 52B, one of a source region and a drain region of the TFT 5224 may be provided so as to surround the other of the source region and the drain region. Thus, wide channel width can be obtained in a small area and switching capability can be increased. Note also that as shown in FIG. 52B, the gate terminal of the TFT 5224 may be provided so as to surround the first semiconductor layer 5205.

The pixel electrode 5225 is electrically connected to one of the source terminal and the drain terminal of the TFT 5224. The pixel electrode 5225 is an electrode for applying signal voltage which is transmitted through the video signal line 5222 to be liquid crystal element. In addition, the pixel electrode 5225 and the capacitor line 5223 may form the pixel capacitor 5226. Thus, the pixel electrode 5225 can also have a function of holding the signal voltage which is transmitted through the video signal line 5222. Note that the pixel electrode 5225 may be rectangular as drown in FIG. 52B. Thus, an aperture ratio of the pixel out be increased, so that efficiency of the liquid crystal display device can be improved. In addition, in the case where the pixel electrode 5225 is formed using a material having light-transmitting properties, a transmissive liquid crystal display device can be obtained. A transmissive liquid crystal display device has high color reproductivity and can display an image with high image quality. Alternatively, in the case where the pixel electrode 5225 is formed using a material having reflectiveness, a reflective liquid crystal display device can be obtained. A reflective liquid crystal display device has high visibility in a bright environment such as outside, and can extremely reduce power consumption because a backlight is not necessary. Note that in the case where the pixel electrode 5225 is formed using both a material having light-transmitting properties and a material having reflectiveness, a semi-transmissive liquid crystal display device which has advantages of both of the above can be obtained. Note also that in the case where the pixel electrode 5225 is formed using a material having reflectiveness, a surface of the pixel electrode 5225 may have unevenness. Thus, since reflected light is reflected diffusely, an advantage that angular dependency of intensity distribution of reflected light is decreased can be obtained. That is, a reflective liquid crystal display device, brightness of which is uniform at any angle, can be obtained.

Next, another example of a VA (vertical alignment)-mode liquid crystal display device to which the present invention is applied is described with reference to FIGS. 53A and 53B. FIGS. 53A and 53B are a cross-sectional view and a top plan view of a pixel in which the present invention is applied to one of pixel structures of a VA-mode liquid crystal display device in which a fourth conductive layer 5313 is patterned so that liquid crystal molecules are controlled to have various directions and a viewing angle is widened, namely, a so-called PVA (Patterned Vertical Alignment) mode. FIG. 53A is a cross-sectional view of a pixel and FIG. 53B is a top plan view of the pixel. Further, the cross-sectional view of the pixel shown in FIG. 53A corresponds to a line a-a' in the top plan view of the pixel shown in FIG. 53B. By applying the present invention to a liquid crystal display device having the pixel structure shown in FIGS. 53A and 53B, a liquid crystal display device having a wide viewing angle, high response speed, and high contrast can be obtained.

A pixel structure of a PVA-mode liquid crystal display device is described with reference to FIG. 53A. The liquid crystal display device includes a basic portion which displays an image, which is called a liquid crystal panel. The liquid crystal panel is manufactured as follows: two processed substrates are attached to each other with a gap of several μm therebetween and a liquid crystal material is injected between the two substrates. In FIG. 53A, the two substrates correspond to a first substrate 5301 and a second substrate 5316. A TFT and a pixel electrode may be formed over the first substrate, and a light shielding film 5314, a color filter 5315, a fourth conductive layer 5313, a spacer 5317, and a second alignment film 5312 may be formed on the second substrate.

Note that the present invention can also be implemented without forming the TFT over the first substrate 5301. When the present invention is implemented without forming the TFT, the number of steps is reduced, so that manufacturing cost can be reduced. In addition, since the structure is simple, the yield can be improved. On the other hand, when the present invention is implemented by forming the TFT, a larger display device can be obtained.

The TFT shown in FIGS. 53A and 53B is a bottom-gate TFT using an amorphous semiconductor, which has an advantage that it can be manufactured at low cost by using large substrate. However, the present invention is not limited to this. As a structure of a TFT which can be used, there are a channel-etched type, a channel-protective type, anti the like as for a bottom-gate TFT. Alternatively, a top-gate type may be used. Further, not only an amorphous semiconductor but also a polycrystalline semiconductor may be used.

Note that the present invention can also be implemented without forming the light shielding film 5314 on the second substrate 5316. When the present invention is implemented without forming the light shielding film 5314, the number of steps is reduced, so that manufacturing cast can be reduced. In addition, since the structure is simple, the yield can be improved. On the other hand, when the present invention is implemented by forming the light shielding film 5314, a display device with little light leakage at the time of black display can be obtained.

Note that the present invention can also be implemented without forming the color filter 5315 on the second substrate 5316. When the present invention is implemented without forming the color filter 5315, the number of steps is reduced, so that manufacturing cost can be reduced. In addition, since the structure is simple, the yield can be improved. On the other hand, when the present invention is implemented by forming the color filter 5315, a display device which can perform color display can be obtained.

Note that the present invention can also be implemented by dispersing spherical spacers instead of providing the spacer 5317 on the second substrate 5316. When the present invention is implemented by dispersing the spherical spacers, the number of steps is reduced, so that manufacturing cost can be reduced. In addition, since the structure is simple, the yield can be improved. On the other hand, when the present invention is implemented by forming the spacer 5317, a position of the spacer is not varied, so that a distance between the two substrates can be uniformed and a display device with little display unevenness can be obtained.

Next, as for a process to be performed to the first substrate 5301, the method described in FIGS. 51A and 51B may be used; therefore, description is omitted. Here, the first substrate 5301, a first insulating film 5302, a first conductive layer 5303, a second insulating film 5304, a first semiconductor layer 5305, a second semiconductor layer 5306, a second conductive layer 5307, a third insulating film 5308, a third conductive layer 5309, and a first alignment film 5310 correspond to the first substrate 5101, the first insulating film 5102, the first conductive layer 5103, the second insulating film 5104, the first semiconductor layer 5105, the second semiconductor layer 5106, the second conductive layer 5107, the third insulating film 5108, the third conductive layer 5109, and the first alignment film 5110 in FIG. 51A, respectively Note that an electrode notch portion may be provided to the third conductive layer 5309 on the first substrate 5301 side. Thus, alignment of liquid crystal molecules can be controlled more surely. In addition, the first alignment film 5310 and the second alignment film 5312 may be vertical alignment films. Therefore, liquid crystal molecules 5318 can be aligned vertically.

The first substrate 5301 formed as described above is attached to the second substrate 5316 provided with the light shielding film 5314, the color filter 5315, the fourth conductive layer 5313, the spacer 5317, and the second alignment film 5312 with a sealant with a gap of several μm therebetween, and then, a liquid crystal material is injected between the two substrates, so that the liquid crystal panel can be manufactured. Note that in the PVA mode liquid crystal panel as shown in FIGS. 53A and 53B, the fourth conductive layer 5313 may be patterned to form an electrode notch portion 5319. Note also that although a shape of the electrode notch portion 5319 is not limited, a shape in which a plurality of rectangles having different directions are combined is preferable. Thus, since a plurality of regions having different alignment can be formed, a liquid crystal display device having a wide viewing angle can be obtained. Further, it is preferable that a shape of the fourth conductive layer 5313 at a boundary between the electrode notch portion 5319 and the fourth conductive layer 5313 be a smooth curve. Thus, since alignment of the adjacent liquid crystal molecules 5318 is extremely similar, an alignment defect can be reduced. Furthermore, a defect of the alignment film in which the second alignment film 5312 is disconnected by the electrode notch portion 5319 can be reduced.

Next, a feature, of the pixel structure of the PVA-mode liquid crystal panel shown in FIGS. 53A and 53B is described. The liquid crystal molecules 5318 shown in FIG. 53A are long and thin molecules each having a major axis and a minor axis. In FIG. 53A, each of the liquid crystal molecules 5318 is expressed by its length to show a direction of each of the liquid crystal molecules. That is, a direction of the major axis of the liquid crystal molecule 5318 which is expressed to be long is parallel to the paper, and the direction of the major axis becomes closer to a normal direction of the paper as the liquid crystal molecule 5318 is expressed to be shorter That is, each of the liquid crystal molecules 5318 shown in FIG. 53A is aligned so that the direction of the major axis is normal to the alignment film. Thus, the liquid crystal molecules 5318 in a portion where the electrode notch portion is provided are aligned radially with the boundary between the electrode notch portion 5319 and the fourth conductive layer 5313 as a center. With this state, a liquid crystal display device having a wide viewing angle can be obtained.

Next, an example of pixel layout of the PVA-mode liquid crystal display device to which the present invention is applied is described with reference to FIG. 53B. The pixel of the PVA-mode liquid crystal display device to which the present invention is applied may include a scan line 5321, a video signal line 5322, a capacitor line 5323, a TFT 5324, a pixel electrode 5325, a pixel capacitor 5326, and an electrode notch portion 5319.

Since the scan line 5321 is electrically connected to a gate terminal of the TFT 5324, it is preferable that the scan line 5321 be formed of the first conductive layer 5303.

Since the video signal line 5322 is electrically connected to a source terminal or a drain terminal of the TFT 5324, it is preferable that the video signal line 5322 be formed of the second conductive layer 5307. Further, since the scan line 5321 and the video signal line 5322 are arranged in matrix, it is preferable that the scan line 5321 and the video signal line 5322 be at least formed of conductive layers in different layers.

The capacitor line 5323 is a wiring for forming the pixel capacitor 5326 by being provided to be parallel to the pixel electrode 5325, and it is preferable that the capacitor line 5323 be formed of the first conductive layer 5303. Note that the capacitor line 5323 may be extended along the video signal line 5322 so as to surround the video signal line 5322 as shown in FIG. 53B. Thus, a phenomenon in which a potential of an electrode, which is supposed to be held, is changed in accordance with potential change in the video signal line 5322, namely, a so-called cross talk can be reduced. Note also that in order to reduce cross capacitance with the video signal line 5322, the first semiconductor layer 5305 may be provided in a cross region of the capacitor line 5323 and the video signal line 5322 as shown in FIG. 53B.

The TFT 5324 operates as a switch which electrically connects the video signal line 5322 and the pixel electrode 5325. Note that as shown in FIG. 53B, one of a source region and a drain region of the TFT 5324 may be provided so as to surround the other of the source region and the drain region. Thus, wide channel width can be obtained in a small area and switching capability can be increased. Note also that as shown in FIG. 53B, the gate terminal of the TFT 5324 may be provided so as to surround the first semiconductor layer 5305.

The pixel electrode 5325 is electrically connected to one of the source terminal and the drain terminal of the TFT 5324. The pixel electrode 5325 is an electrode for applying signal voltage, which is transmitted through the video signal line 5322 to the liquid crystal element. In addition, the pixel electrode 5325 and the capacitor line 5323 may form the pixel capacitor 5326. Thus, the pixel electrode 5325 can also have a function of holding the signal voltage which is transmitted through the video signal line 5322. It is preferable that the pixel electrode 532S have a notched portion in a portion where the electrode notch portion 5319 does not exist in accordance with the shape of the electrode notch portion 5319 provided to the fourth conductive layer 5313 as shown in FIG. 53B. Thus, since a plurality of regions having different alignment of the liquid crystal molecules 5318 can be formed, a liquid crystal display device having a wide viewing angle can be obtained. Further, in the case where the pixel electrode 5325 is formed using a material having light-transmitting properties, a transmissive liquid crystal display device can be obtained. A transmissive liquid crystal display device has high color reproducibility and can display an image with high image quality. Alternatively, in the case where the pixel electrode 5325 is formed using a material having reflectiveness, a reflective liquid crystal display device can be obtained. A reflective liquid crystal display device has high visibility in a bright environment such as outside, and can extremely reduce power consumption because a backlight is not necessary. Note that in the case where the pixel electrode 5325 is formed using both a material having light-transmitting properties and a material having reflectiveness, a semi-transmissive liquid crystal display device which has advantages of both of the above can be obtained. Note, also that in the case where the pixel electrode 5325 is formed using a material having reflectiveness, a surface of the pixel electrode 5325 may have unevenness. Thus, reflected light is reflected diffusely and an advantage that angular dependency of intensity distribution of reflected light is decreased can be obtained. That is, a reflective liquid crystal display device, brightness of which is uniform at any angle, can be obtained.

Next, a lateral electric field-mode liquid crystal display device to which the present invention is applied is described with reference to FIGS. 54A and 54B. FIGS. 54A and 54B are a cross-sectional view and a top plan view of a pixel in which the present invention is applied to one of pixel structures of a lateral electric field-mode liquid crystal display device which performs switching so that alignment of liquid crystal molecules is always horizontal to a substrate, in which an electric field is applied laterally by patterning a pixel electrode 5425 and a common electrode 5423 into comb shapes, namely, a so-called IPS (In-Plane-Switching) mode. FIG. 54A is a cross-sectional view of a pixel and FIG. 54B is a top plan view of the pixel. Further, the cross-sectional view of the pixel shown in FIG. 54A corresponds to a line a-a' in the top plan view of the pixel shown in FIG. 54B. By applying the present invention to a liquid crystal display device having the pixel structure shown in FIGS. 54A and 54B, a liquid crystal display device having a theoretically wide viewing angle and response speed which has small dependency on a gray scale can be obtained.

A pixel structure of an IPS-mode liquid crystal display device is described with reference to FIG. 54A. The liquid crystal display device includes a basic portion which displays an image, which is called a liquid crystal panel. The liquid crystal panel is manufactured as follows: two processed substrates are attached to each other with a gap of several urn therebetween and a liquid crystal material is injected between the two substrates. In FIG. 54A, the two substrates correspond to a first substrate 5401 and a second substrate 5416. A TFT and a pixel electrode may be formed over the first substrate; and a light shielding film 5414, a color filter 5415, a spacer 5417, and a second alignment film 5412 may be formed on the second substrate.

Note that the present invention can also be implemented without forming the TFT over the first substrate 5401. When the present invention is implemented without forming the TFT, the number of steps is reduced and manufacturing cost can be reduced. In addition, since the structure is simple, the yield can be improved. On the other hand, when the present invention is implemented by forming the TFT, a larger display device can be obtained.

The TFT shown in FIGS. 54A and 54B is a bottom-gate TFT using art amorphous semiconductor, which has an advantage that it can be manufactured at low cost by using a large substrate. However, the present invention is not limited to this. As a structure of a TFT which can be used, there are a channel-etched type, a channel-protective type, and the like as for a bottom-gate TFT Alternatively, a top-gate type may be used. Further, not only an amorphous semiconductor but also a polycrystalline semiconductor may be used.

Note that the present invention can also be implemented without forming the light shielding film 5414 on the second substrate 5416. When the present invention is implemented without forming the light shielding film 5414, the number of steps is reduced, so that manufacturing cost can be reduced. In addition, since the structure is simple, the yield can be improved. On the other hand, when the present invention is implemented by forming the light shielding film 5414, a display device with little light leakage at the time of black display can be obtained.

Note that the present invention can also be implemented without forming the color filter 5415 on the second substrate 5416. When the present invention is implemented without forming the color filter 5415, the number of steps is reduced, so that manufacturing cost cm be reduced. In addition, since the structure is simple, the yield can be improved. On the other hand, when the present invention is implemented by forming the color filter 5415, a display device which can perform color display can be obtained.

Note that the present invention can also be implemented by dispersing spherical spacers instead of providing the spacer 5417 on the second substrate 5416. When the present invention is implemented by dispersing the spherical spacers, the number of steps is reduced, so that manufacturing cost can be reduced. In addition, since the structure is simple, the yield can be improved. On the other hand, when the present invention is implemented by forming the spacer 5417, a position of the spacer is not varied, so that a distance between the two substrates can be uniformed and a display device with little display unevenness can be obtained.

Next, as for a process to be performed to the first substrate 5401, the method described in FIGS. 51A and 51B may be used; therefore, description is omitted. Here, the first substrate 5401, a first insulating film 5402, a first conductive layer 5403, a second insulating film 5404, a first semiconductor layer 5405, a second semiconductor layer 5406, a second conductive layer 5407, a third insulating film 5408, a third conductive layer 5409, and a first alignment film 5410 correspond to the first substrate 5101, the first insulating film 5102, the first conductive layer 5103, the second insulating film 5104, the first semiconductor layer 5105, the second semiconductor layer 5106, the second conductive layer 5107, the third insulating film 5108, the third conductive layer 5109, and the first alignment film 5110 in FIG. 51A, respectively. Note that the third conductive layer 5409 on the first substrate 5401 side may be patterned into two comb-shapes which engage with each other. In addition, one of the comb-shaped electrodes may be electrically connected to one of a source terminal and a drain terminal of the TFT 5424, and the other of the comb-shaped electrodes may be electrically connected to the common electrode 5423. Thus, a lateral electric field can be effectively applied to liquid crystal molecules 5418.

The first substrate 5401 formed as described above is attached to the second substrate 5416 provided with the light shielding film 5414, the color filter 5415, the spacer 5417, and the second alignment film 5412 with a sealant with a gap of several μm therebetween, and then, a liquid crystal material is injected between the two substrates, so that the liquid crystal panel can be manufactured. Note that although not shown in the drawings, a conductive layer may be formed on the second substrate 5416 side. By forming the conductive layer on the second substrate 5416 side, an adverse effect of electromagnetic wave noise, from outside can be reduced.

Next, a feature of the pixel structure of the IPS-mode liquid crystal panel shown in FIGS. 54A and 54B is described. The liquid crystal molecules 5418 shown in FIG. 54A are long and thin molecules each having a major axis and a minor axis. In FIG. 54A, each of the liquid crystal molecules 5418 is expressed by its length to show a direction of each of the liquid crystal molecules. That is, a direction of the major axis of the liquid crystal molecule 5418 which is expressed to be long is parallel to the paper, and the direction of the major axis becomes closer to a normal direction of the paper as the liquid crystal molecule 5418 is expressed to be shorter. That is, each of the liquid crystal molecules 5418 shown in FIG. 54A is aligned so that the direction of the major axis is always horizontal to the substrate. Although FIG. 54A shows alignment in a condition where an electric field is not applied, when an electric field is applied to each of the liquid crystal molecules 5418, each of the liquid crystal molecules rotates in a horizontal plane while the direction of the major axis is kept always horizontal to the substrate. With this state, a liquid crystal display device having a wide viewing angle can be obtained.

Next, an example of pixel layout of an IPS-mode liquid crystal display device to which the present invention is applied is described with reference to FIG. 54B. The pixel of the IPS-mode liquid crystal display device to which the present invention is applied may include, a scan line 5421, a video signal line 5422, the common electrode 5423, the TFT 5424, and the pixel electrode 5425.

Since the scan line 5421 is electrically connected to a gate terminal of the TFT 5424, it is preferable that the scan line 5423 be formed of the first conductive layer 5403.

Since the video signal line 5422 is electrically connected to the source terminal or the drain terminal of the TFT 5424, it is preferable that the video signal line 5422 be formed of the second conductive layer 5407. Further, since the scan line 5421 and the video signal line 5422 are arranged in matrix, it is preferable that the scan line 5421 and the video signal line 5422 be at least formed of conductive layers in different layers. Note that as shown in FIG. 54B, the video signal line 5422 may be formed so as to be bent along with the shapes of the pixel electrode 5425 and the common electrode 5423 in the pixel. Thus, an aperture ratio of the pixel can be increased, so that efficiency of the liquid crystal display device can be improved.

The common electrode 5423 is an electrode for generating a lateral electric field by being provided to be parallel to the pixel electrode 5425, and it is preferable that the common electrode 5423 be formed of the first conductive layer 5403 and the third conductive layer 5409. Note that the common electrode 5423 may be extended along the video signal line 5422 so as to surround the video signal line 5422 as shown in FIG. 54B. Thus, a phenomenon in which a potential of an electrode, which is supposed to be held, is changed in accordance with potential change in the video signal line 5422, namely, a so-called cross talk can be reduced. Note also that in order to reduce cross capacitance with the video signal line 5422, the first semiconductor layer 5405 may be provided in a cross region of the common electrode 5423 and the video signal line 5422 as shown in FIG. 54B.

The TFT 5424 operates as a switch which electrically connects the video signal line 5422 and the pixel electrode 5425. Note that as shown in FIG. 54B, one of a source region and a drain region of the TFT 5424 may be provided so as to surround the other of the source region and the drain region. Thus, wide channel width can be obtained in a small area and switching capability can be increased. Note also that as shown in FIG. 54B, the gate terminal of the TFT 5424 may be provided so as to surround the first semiconductor layer 5405.

The pixel electrode 5425 is electrically connected to one of the source terminal and the drain terminal of the TFT 5424. The pixel electrode 5425 is an electrode for applying signal voltage which is transmitted through the video signal line 5422 to the liquid crystal element. In addition, the pixel electrode 5425 and the common electrode 5423 may form a pixel capacitor. Thus, the pixel electrode 5425 can also have a function of holding the signal voltage which is transmitted through the video signal line 5422. Note that each of the pixel electrode 5425 and the comb-shaped common electrode 5423 may have a bent comb-shape as shown in FIG. 54B. Thus, since a plurality of regions having different alignment of the liquid crystal molecules 5418 can be formed, a liquid crystal display device having a wide viewing angle can be obtained. In addition, in the case where each of the pixel electrode 5425 and the comb-shaped common electrode 5423 is formed using a material having light-transmitting properties, a transmissive liquid crystal display device can be obtained. A transmissive liquid crystal display device has high color reproducibility and can display an image with high image quality. Alternatively, in the case where each of the pixel electrode 5425 and the comb-shaped common electrode 5423 is formed using a material having reflectiveness, a reflective liquid crystal display device can be obtained. A reflective liquid crystal display device has high visibility in a bright environment such as outside, and can extremely reduce power consumption because a backlight is not necessary. Note that in the case where each of the pixel electrode 5425 and the comb-shaped common electrode 5423 is formed using both a material having light-transmitting properties and a material having reflectiveness, a semi-transmissive liquid crystal display device which has advantages of both of the above can be obtained. Note also that in the case where each of the pixel electrode 5425 and the comb-shaped common electrode 5423 is formed using a material having reflectiveness, a surface of each of the pixel electrode 5425 and the comb-shaped electrode 5423 may have unevenness. Thus, since reflected light is reflected diffusely, an advantage that angular dependency of intensity distribution of reflected light is decreased can be obtained. That is, a reflective liquid crystal display device, brightness of which is uniform at any angle, can be obtained.

Although the comb-shaped pixel electrode 5425 and the comb-shaped common electrode 5423 are both formed of the third conductive layer 5409, a pixel structure to which the present invention can apply is not limited to this and can be selected appropriately. For example, the comb-shaped pixel electrode 5425 and the comb-shaped common electrode 5423 may be both formed of the second conductive layer 5407; the comb-shaped pixel electrode 5425 and the comb-shaped common electrode 5423 may be both formed of the first conductive layer 5403; one of them may be formed of the third conductive layer 5409 and the other thereof may be formed of the second conductive layer 5407; one of them may be formed of the third conductive layer 5409 and the other thereof may be formed of the first conductive layer 5403; or one of them may be formed of the second conductive layer 5407 and the other thereof may be formed of the first conductive layer 5403.

Figure 55A:
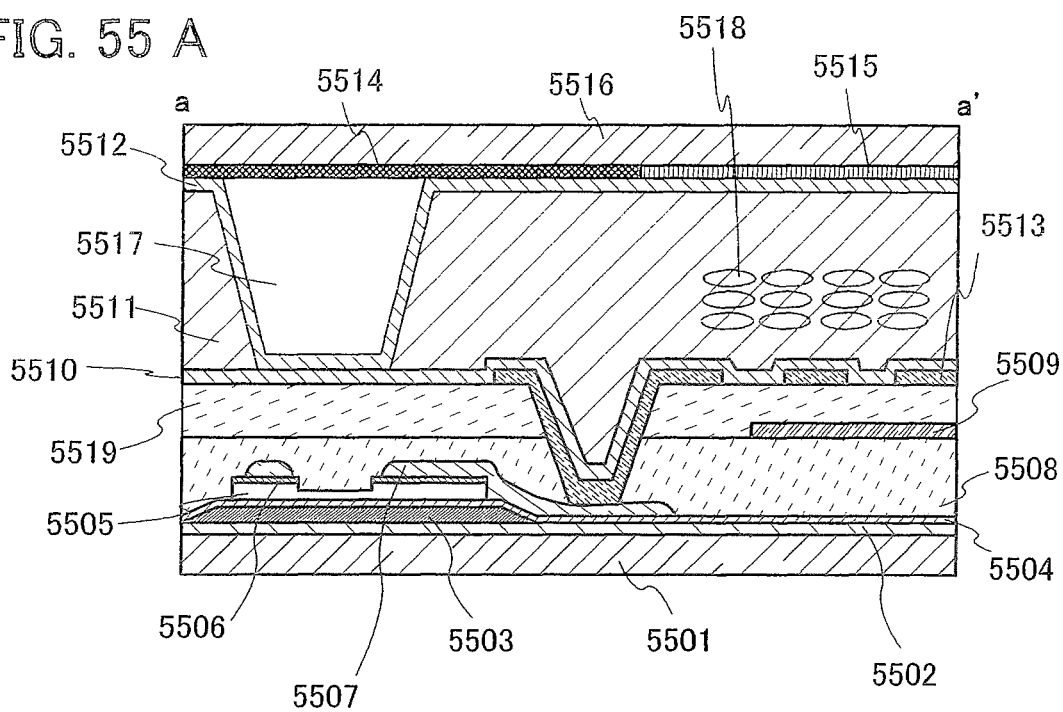
FIGS. 55A and 55B illustrate Embodiment Mode 9.
Figure 55B:
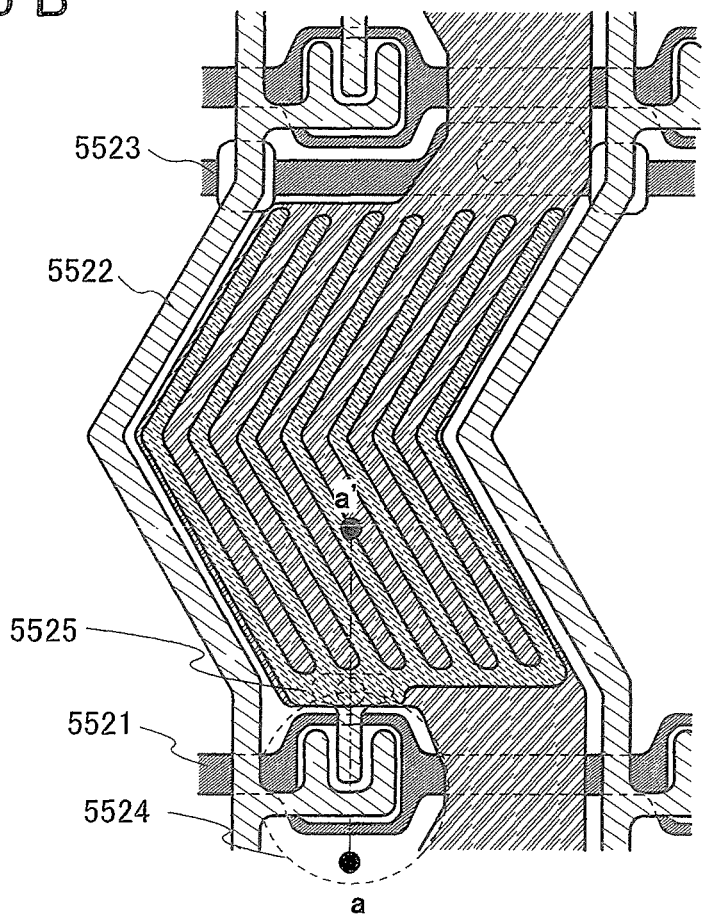

Next, another lateral electric field-mode liquid crystal display device to which the present invention is applied is described with reference to FIGS. 55A and 55B. FIGS. 55A and 55B are views of another pixel structure of a lateral electric field-mode liquid crystal display device which performs switching so that alignment of liquid crystal molecules is always horizontal to a substrate. More specifically, FIGS. 55A and 55B are a cross-sectional view and a top plan view of a pixel of a mode in which one of a pixel electrode 5525 and a common electrode 5523 is patterned into a comb-shape and the other thereof is formed into a planar-shape in a region overlapping with the comp shape, so that an electric field is applied laterally, a so-called FFS (Fringe Field Switching) mode to which the present invention is applied. FIG. 55A is a cross-sectional view of a pixel and FIG. 55B is a top plan view of the pixel. Further, the cross-sectional view of the pixel shown in FIG. 55A corresponds to a line a-a' in the top plan view of the pixel shown in FIG. 55B. By applying the present invention to a liquid crystal display device having the pixel structure shown in FIGS. 55A and 55B, a liquid crystal display device having a theoretically wide viewing angle and response speed which has small dependency on a gray scale can be obtained, A pixel structure of an FFS-mode liquid crystal display device is described with reference to FIG. 55A. The liquid crystal display device includes a basic portion which displays an image, which is called a liquid crystal panel. The liquid crystal panel is manufactured as follows: two processed substrates are attached to each other with a gap of several pro therebetween and a liquid crystal material is injected between the two substrates. In FIG. 55A, the two substrates correspond to a first substrate 5501 and a second substrate 5516. A TFT and a pixel electrode may be formed over the first substrate, and a light shielding film 5514, a color filter 5515, a spacer 5517, and a second alignment film 5512 may be formed on the second substrate.

Note that the present invention can also be implemented without forming the TFT over the first substrate 5501. When the present invention is implemented without forming the TFT, the number of steps is reduced, so that manufacturing cost can be reduced. In addition, since the structure is simple, a yield can be improved. On the other hand, when the present invention is implemented by forming the TFT, a larger display device can be obtained.

The TFT shown in FIGS. 55A and 55B is a bottom-gate TFT using an amorphous semiconductor, which has an advantage that it can be manufactured at low cost by using a large substrate. However, the present invention is not limited to this. As a structure of a TFT which can be used, there are a channel-etched type, a channel-protective type, and the like as far a bottom-gate TFT. Alternatively, s top-gate type may be used. Further, not only an amorphous semiconductor bat also a polycrystalline semiconductor may be used.

Note that the present invention can also be implemented without forming the light shielding film 5514 on the second substrate 5516. When the present invention is implemented without forming the light shielding film 5514, the number of steps is reduced, so that manufacturing cost can be reduced, in addition, since the structure is simple, the yield can be improved. On the other hand, when the present invention is implemented by forming the light shielding film 5514, a display device with little fight leakage at the rime of black display can be obtained.

Note that the present invention can also be implemented without forming the color filter 5515 on the second substrate 5516. When the present invention is implemented without forming the color filter 5515, the number of steps is reduced, so that manufacturing cost can be reduced. In addition, since the structure is simple, the yield can be improved. On the other hand, when the present invention is implemented by forming the color filter 5515, a display device which can perform color display can be obtained.

Note that the present invention can also be implemented by dispersing spherical spacers instead of providing the spacer 5517 on the second substrate 5516. When the present invention is implemented by dispersing the spherical spacers, the number of steps is reduced, so that manufacturing cost can be reduced. In addition, since the structure is simple, the yield can be improved. On the other hand, when the present invention is implemented by forming the spacer 5517, a position of the spacer is not varied, so that a distance between the two substrates can be uniformed and a display device with little display unevenness can be obtained.

Next, as for a process to be performed to the first substrate 5501, the method described in FIGS. 55A and 55B may be used; therefore, description is omitted. Here, the first substrate 5501, a first insulating film 5502, a first conductive layer 5503, a second insulating film 5504, a first semiconductor layer 5505, a second semiconductor layer 5506, a second conductive layer 5507, a third insulating film 5508, a third conductive layer 5509, and a first alignment film 5510 correspond to the first substrate 5101, the first insulating film 5102, the first conductive layer 5103, the second insulating film 5104, the first semiconductor layer 5105, the second semiconductor layer 5106, the second conductive layer 5107, the third insulating film 5108, the third conductive layer 5109, and the first alignment film 5110 in FIG. 51A, respectively.

However, a fourth insulating film 5519 and a fourth conductive layer 5513 may be formed on the first substrate 5501 side, which is different from FIGS. 51A and 51B. More specifically, the fourth insulating film 5519 may be formed after the third conductive layer 5509 is patterned; the fourth conductive layer 5513 may be formed after the fourth insulating film 5519 is patterned so as to form a contact hole; and the first alignment film 5510 may be formed after the fourth conductive layer 5513 is similarly patterned. As materials and processing methods of the fourth insulating film 5519 and the fourth conductive layer 5513, materials and processing methods which are similar to those of the third insulating film 5508 and the third conductive layer 5509 can be used. Further, the comb-shaped electrode may be electrically connected to one of a source terminal and a drain terminal of the TFT 5524 and the planar electrode may be electrically connected to the common electrode 5523. Thus, a lateral electric field can be effectively applied to the liquid crystal molecules 5518.

The first substrate 5501 formed as described above is attached to the second substrate 5516 provided with the light shielding film 5514, the color filter 5515, the spacer 5517, and the second alignment film 5512 with a sealant with a gap of several run therebetween, and then, a liquid crystal material is injected between the two substrates, so that the liquid crystal panel can be manufactured. Note that although not shown in the drawings, a conductive layer may be formed on the second substrate 5516 side. By forming the conductive layer on the second substrate 5516 side, an adverse effect of electromagnetic wave noise from outside can be reduced.

Next, a feature of the pixel structure of the FPS-mode liquid crystal panel shown in FIGS. 55A and 55B is described. The liquid crystal molecules 5518 shown in FIG. 55A are long and thin molecules each having a major axis and a minor axis. In FIG. 55A, each of the liquid crystal molecules 5518 is expressed by its length to show a direction of each of the liquid crystal molecules. That is, a direction of the major axis of the liquid crystal molecule 5518 which is expressed to be long is parallel to the paper and the direction of the major axis becomes closer to a normal direction of the paper as the liquid crystal molecule 5518 is expressed to be shorter. That is, each of the liquid crystal molecules 5518 shown in FIG. 55A is aligned so that the direction of the major axis is always horizontal to the substrate. Although FIG. 55A shows alignment in a condition where an electric field is not applied, when an electric field is applied to each at the liquid crystal molecules 5518, each of the liquid crystal molecules rotates in a horizontal plane while the direction of the major axis is kept always horizontal to the substrate. With this state, a liquid crystal display device having a wide viewing angle can be obtained.

Next, an example of pixel layout of an FFS-mode liquid crystal display device to which the present invention is applied is described with reference to FIG. 55B. The pixel of the FFS-mode liquid crystal display device to which the present invention is applied may include a scan line 5521, a video signal line 5522, the common electrode 5523, the TFT 5524, and the pixel electrode 5525.

Since the scan line 5521 is electrically connected to a gate terminal of the TFT 5524, it is preferable that the scan line 5521 be formed of the first conductive layer 5503.

Since the video signal line 5522 is electrically connected to the source terminal or the drain terminal of the TFT 5524, it is preferable that the video signal line 5522 be formed of the second conductive layer 5507. Further, since the scan line 5521 and the video signal line 5522 are arranged in matrix, it is preferable that the scan line 5521 and the video signal line 5522 be at least formed of conductive layers in different layers. Note that as shown in FIG. 55B, the video signal line 5522 may be formed so as to be bent along with the shape of the pixel electrode 5525 in the pixel. Thus, an aperture ratio of the pixel can be increased, so that efficiency of the liquid crystal display device can be improved.

The common electrode 5523 is an electrode for generating a lateral electric field by being provided to be parallel to the pixel electrode 5525, and it is preferable that the common electrode 5523 be formed of the first conductive layer 5503 and the third conductive layer 5509. Note that the common electrode 5523 may be formed along the video signal line 5522 as shown in FIG. 55B. Thus, a phenomenon in which a potential of an electrode, which is supposed to be held, is changed in accordance with potential change in the video signal line 5522, namely, a so-called cross talk can be reduced. Note also that in order to reduce cross capacitance with the video signal line 5522, the first semiconductor layer 5505 may be provided in a cross region of the common electrode 5523 and the video signal line 5522 as shown in FIG. 55B.

The TFT 5524 operates as a switch which electrically connects the video signal line 5522 and the pixel electrode 5525. Note that as shown in FIG. 55B, one of a source region and a drain region of the TFT 5524 may be provided so as to surround the other of the source region and the drain region. Thus, wide channel width can be obtained in a small area and switching capability can be increased. Note also that as shown to FIG. 55B, the gate terminal of the TFT 5524 may be provided so as to surround the first semiconductor layer 5505.

The pixel electrode 5525 is electrically connected to one of the source terminal and the drain terminal of the TFT 5524. The pixel electrode 5525 is an electrode for applying signal voltage which is transmitted through the video signal line 5522 to the liquid crystal element in addition, the pixel electrode 5525 and the common electrode 5523 may form a pixel capacitor. Thus, the pixel electrode 5525 can also have a function of holding the signal voltage which is transmitted through the video signal line 5522. Note that it is preferable that the pixel electrode 5525 be formed with a bent comb-shape as shown in FIG. 55B. Thus, since a plurality of regions having different alignment of the liquid crystal molecules 5518 can be formed, a liquid crystal display device having a wide viewing angle can be obtained. In addition, in the case where each of the pixel electrode 5525 and the comb-shaped common electrode 5523 is formed using a material having light-transmitting properties, a transmissive liquid crystal display device can be obtained. A transmissive liquid crystal display device has high color reproductivity and can display an image with high image quality. Alternatively, in the case where each of the pixel electrode 5525 and the comb-shaped common electrode 5523 is formed using a material having reflectiveness, a reflective liquid crystal display device can be obtained. A reflective liquid crystal display device has high visibility in a bright environment such as outside, and can extremely reduce power consumption because, a backlight is not necessary. Note that in the case where each of the pixel electrode 5525 and the comb-shaped common electrode 5523 is formed using both a material having light-transmitting properties and a material having reflectiveness, a semi-transmissive liquid crystal display device which has advantages of both of the above can be obtained. Note also that in the case where each of the pixel electrode 5525 and the comb-shaped common electrode 5523 is formed using a material having reflectiveness, a surface of each of the pixel electrode 5525 and the comb-shaped electrode 5523 may have unevenness. Thus, since reflected light is reflected diffusely, an advantage that angular dependency of intensity distribution of reflected light is decreased can be obtained. That is, a reflective liquid crystal display device, brightness of which is uniform at any angle, can be obtained.

Although the comb-shaped pixel electrode 5525 is formed of the fourth conductive layer 5513 and the planar common electrode 5523 is formed of the third conductive layer 5509, a pixel structure to which the present invention can apply is not limited to this and can be appropriately selected as long as the structure satisfies a certain condition. More specifically, the comb-shaped electrode may be located closer to the liquid crystal than the planar electrode seeing from the first substrate 5501. This is because a lateral electric-field is always generated on the side opposite to the planar electrode seeing from the comb-shaped electrode. That is, this is because the comb-shaped electrode is necessary to be located closer to the liquid crystal than the planar electrode in order to apply the lateral electric field to the liquid crystal.

In order to satisfy this condition, for example, the comb-shaped electrode may be formed of the fourth conductive layer 5513 and the planar electrode may be formed of the third conductive layer 5509; the comb-shaped electrode may be formed of the fourth conductive layer 5513 and the planar electrode may be formed of the second conductive layer 5507; the comb-shaped electrode may be formed of the fourth conductive layer 5513 and the planar electrode may be formed of the first conductive layer 5503; the comb-shaped electrode may be formed of the third conductive layer 5509 and the planar electrode may be formed of the second conductive layer 5507; the comb-shaped electrode may be formed of the third conductive layer 5509 and the planar electrode may be formed of the first conductive layer 5503; or the comb-shaped electrode may be formed of the second conductive layer 5507 and the planar electrode may be formed of the first conductive layer 5503. Although the comb-shaped electrode is electrically connected to one of the source region and the drain region of the TFT 5524 and the planar electrode is electrically connected to the common electrode 5523, the connections may be reversed, lit that case, the planar electrode may be formed individually for each pixel.

Note that as an operation mode of a liquid crystal element included in a liquid crystal display device of the present invention, a TN (Twisted Nematic) mode, an IPS (In-Plane-Switching) mode, art FFS (fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Bend) mode, an FLC (Ferroelectric Liquid Crystal) mode, an AFLC (AntiFerroelectrie Liquid Crystal) mode, a PDLC (Polymer Dispersed Liquid Crystal) mode, or the like can be freely used.

By applying the structure of the display device shown in the aforementioned embodiment mode to a liquid crystal display device, deterioration in characteristics of a transistor can be suppressed. Therefore, a malfunction of a shift register caused by deterioration in characteristics of the transistor can be prevented. In addition, a display defect of the liquid crystal display device caused by the malfunction of the shift register can be suppressed.

Note that the pixel structure shown in this embodiment mode can be freely combined with the structures of the display devices shown in other embodiment modes in this specification. In addition, the pixel structure shown in this embodiment mode cart be freely combined.

Embodiment Mode 10

In this embodiment mode, an example of a pixel included In the display device shown in Embodiment Modes 1 to 8 is described, which is different front Embodiment Mode 9.

Figure 65B:
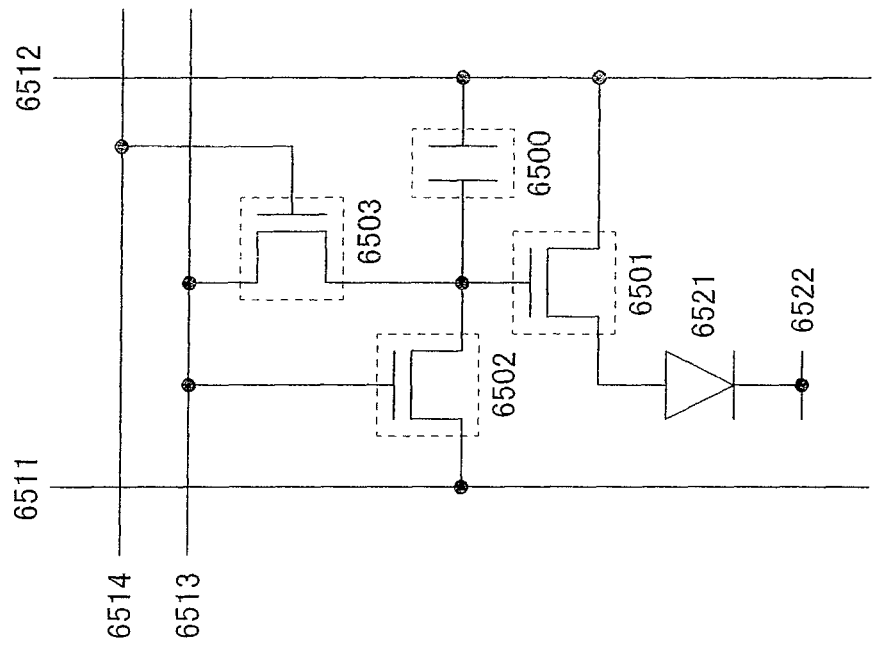
FIGS. 65A and 65B illustrate Embodiment Mode 10.
Figure 65A:
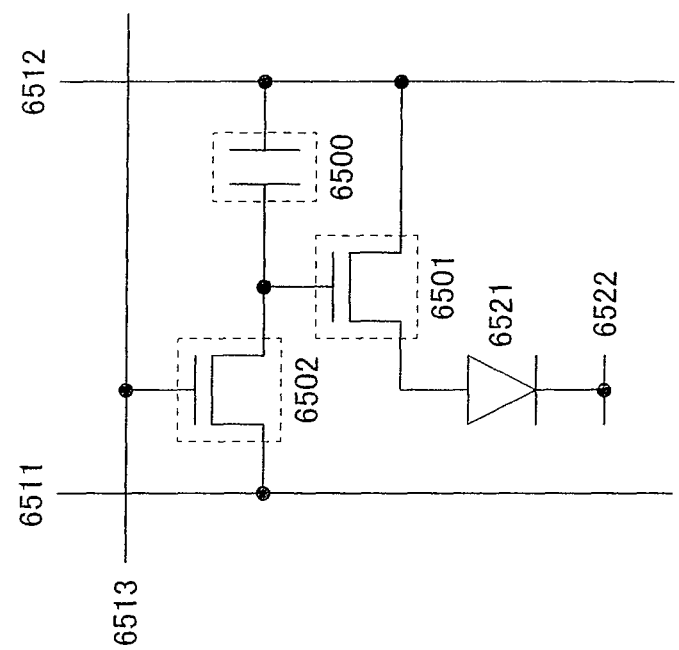

A pixel structure of FIG. 65A is described. A pixel circuit shown in FIG. 65A includes a capacitor 6500, a first transistor 6501, a second transistor 6502, and a display element 6521. A pixel is connected to a first wiring 6511, a second wiring 6512, and a third wiring 6513. In the display element 6521, a light-emitting layer is interposed between a pixel electrode and an opposite electrode 6522. For the display element 6521, an EL element in which a current flows from the pixel electrode to the opposite electrode 6522 can be used. Note that the first wiring 6511 may be called a signal line; the second wiring 6512 may be called a power supply line; and the third wiring 6513 may be called a scan line. The first transistor 6501 may be called a driving transistor; and the second transistor 6502 may be called a selection transistor.

The case where a light-emitting element such as an Ft element is used as the display element 6521 is described.

Note that the transistors 6501 and 6502 are N-channel transistors in the drawing; however, they may be P-channel transistors. In Embodiment Modes 1 to 4, N-channel transistors are preferably used as the transistors 6501 and 6502. It is because simplification of a manufacturing process, reduction in manufacturing cost, and improvement in yield can be realized since amorphous silicon can be used as a semiconductor layer of a transistor. Further, it is because a semiconductor device such as a huge display panel can be formed. Even when polysilicon or single crystalline silicon is used as a semiconductor layer of a transistor, simplification of a manufacturing process can be realized. In addition, in Embodiment Modes 5 to 8. P-channel transistors are preferably used as the transistors 6501 and 6502. It is because simplification of a manufacturing process, reduction in manufacturing cost, and improvement in yield can be realized.

Note, that the first wiring 6511 corresponds to any one of the signal lines S1 to Sm shown in each display device in FIGS. 9, 11, 12, and 44. The third wiring 6513 corresponds to any one of the scan lines G1 to Gn shown in each display device in FIGS. 9, 11, 12, and 44.

Note also that the second wiring 6512 is not shown in FIGS. 9, 11, 12, and 44; however, as described above, it may be added to FIGS. 9, 11, 12, and 44 if needed.

A first terminal of the first transistor 6501 is connected to the second wiring 6512, and a second terminal of the first transistor 6501 is connected to the pixel electrode of the display element 6521. A first terminal of the second transistor 6502 is connected to the first wiring 6511, a second terminal of the second transistor 6502 is connected to a gate terminal of the first transistor 6501, and a gate terminal of the second transistor 6502 is connected to the thud wiring 6513. A first electrode of the capacitor 6500 is connected to the second wiring 6512, and a second electrode of the capacitor 6500 is connected to the gate terminal of the first transistor 6501.

The capacitor 6500 has a function to hold a gate terminal voltage of the first transistor 6501. Accordingly, although the capacitor 6500 is connected between the first transistor 6501 and the second wiring 6512, the invention is not limited thereto. It is acceptable as long as the capacitor 6500 is provided to hold the gate terminal voltage of the first transistor 6501, and it may be connected to the third wiring 6513 of another pixel (e.g., a pixel of a previous row). Further, the capacitor 6500 may be omitted when gate capacitance of the first transistor 6501 is used.

As an operation method, the third wiring 6513 is selected, the second transistor 6502 is turned on, and video signals are input from the first wiring 6511 to the capacitor 6500 and the gate terminal of the first transistor 6501. Thus, the first transistor 6501 supplies a current in accordance with a gate-source voltage thereof to the display element 6521, so that the display element 6521 emits light.

As a driving method of the display device for expressing a gray scale, there are an analog gray scale method and a digital gray scale method. The analog gray scale method includes a method which controls emission intensity of a display element in an analog manner and a method which controls a light-emitting period of a display element in an analog manner. In the analog gray scale method, the method which controls emission intensity of a display element in an analog manner is often used. On the other hand, in the digital gray scale method, a gray scale is expressed by controlling on/off of a display element in a digital manner. In the case of the digital gray scale method, there is an advantage of high noise resistance since data can be processed with a digital signal; however, since the digital driving method has only two states of a light-emitting state and a non-light-emitting state, the digital driving method can display only two gray scales alone. Accordingly, multi-gray scale display has been realized by combining with another method. As a technique for multi-gray scale display, there are an area gray scale method in which a light-emitting area of a pixel is weighted and selected to perform gray scale display and a time gray scale method in which a light-emitting period is weighted and selected to perform gray scale display.

Figure 68:
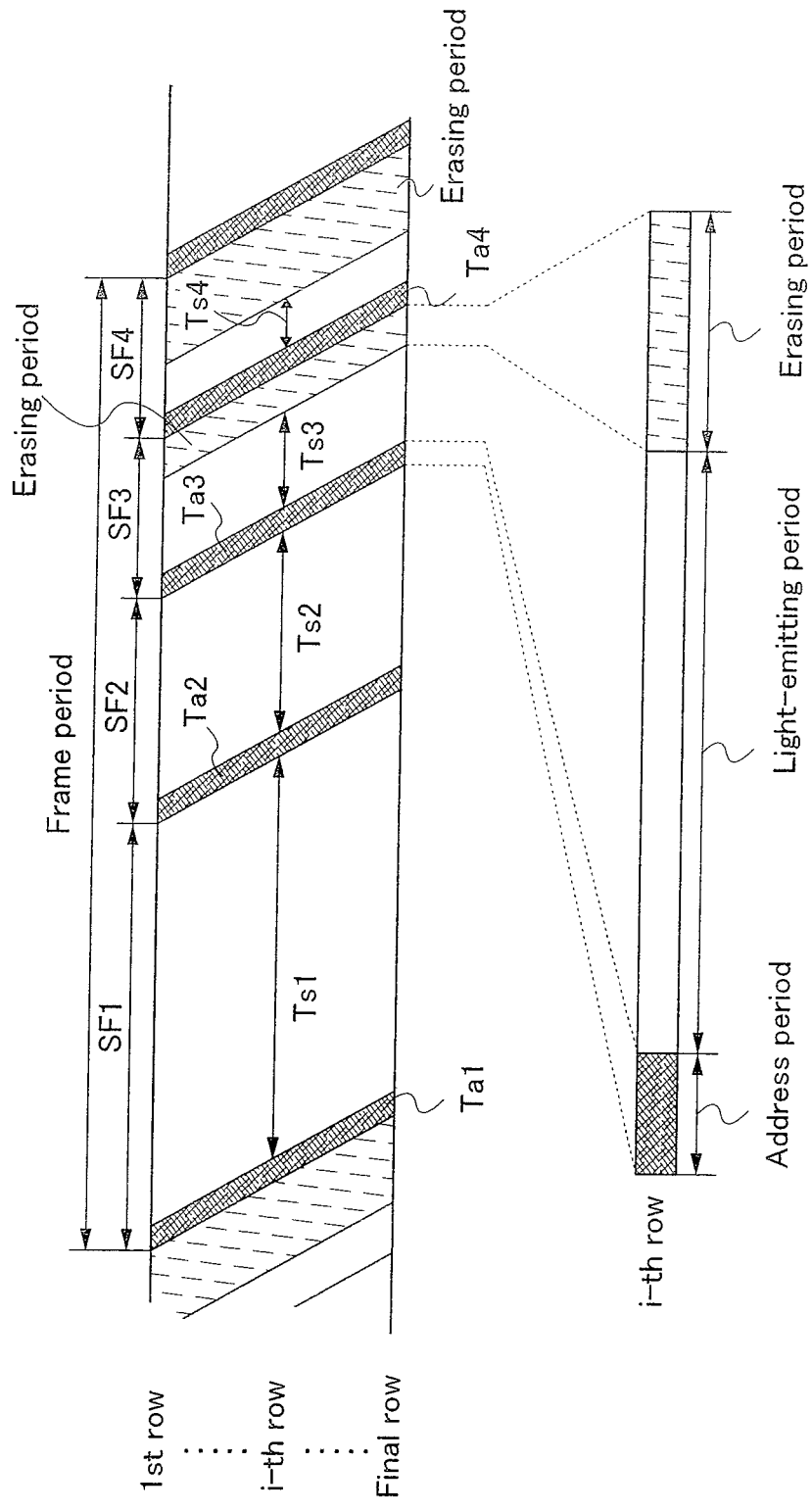
FIG. 68 illustrates Embodiment Mode 10.

When the digital gray scale method and the time gray scale method are combined, one frame period is divided into a plurality of subframe periods (SFn) as shown in FIG. 68. Each subframe period includes an address period (Ta) having an initialization period, a threshold voltage writing period, and a data writing period, and a light-emitting period (Ts). Note that the number of the subframe periods provided in one frame period corresponds to the number of display bits n. In addition, in one frame period, a ratio of length of light-emitting periods in respective subframe period is set to $2(n-1):2(n-2): \ldots :2:1$. Light emission or non-light emission of a display element is selected in each light-emitting period, and a gray scale is expressed by utilizing difference in total time in one frame period in which the display element emits light In one frame period, luminance is high when the total light-emitting time is long, and luminance is low when the total light-emitting time is short. FIG. 68 shows an example of a 4-bit gray scale, in which one frame period is divided into four subframe periods and $2^4=16$ gray scale levels can be expressed by combining light-emitting periods. Note that a gray scale can be expressed even when the ratio of length of the light-emitting periods is not a power-of-two ratio. Further, a subframe period may be further divided.

Note that when multi-gray scale display is realized by using the time gray scale method as described above, length of the light-emitting period of a lower-order bit is short; therefore, when dam writing operation of the next subframe period is started immediately after termination of the light-emitting period, it overlaps with data writing operation of a previous subframe period, so that normal operation cannot be performed. Accordingly, a third transistor 6503 is provided between the gate terminal of fire first transistor 6501 and the third wiring 6513 as shown in FIG. 65B; and the third transistor 6503 is tuned on in part of the light-emitting period and the first transistor 6501 is forced to turn off, so that an erasing period that forcibly makes a non-light-emitting state is provided, and thus, light emission having shorter length than data writing periods necessary for all rows can be expressed. Note that on/off of the third transistor 6503 is controlled by a fourth wiring 6514. Accordingly, it is needless to say that the structure shown in FIG. 65B is particularly effective in the analog gray scale method, but is also effective in the method combining the digital gray scale method and the time gray scale method. Note that since it is only necessary that a current do not flow to the display element in order to obtain the non-light-emitting state, the non-light-emitting state can be obtained by, for example, lowering a potential of the second wiring 6512 as well as by taming off the first transistor 6501 as described above. Alternatively, a switch may further be provided between the first transistor 6501 and the second wiring 6512, and the fits transistor 6501 and the second wiring 6512 may be made not to be electrically connected by using the switch, so that a non-light-emitting state can be obtained. Further, a switch may further be provided between the first transistor 6501 and the pixel electrode of the display element 6521 and a current stops flowing to the display element 6521 by using the switch, so that a non-light-emitting state can be obtained.

Next, a structure of a pixel, which is different from FIGS. 65A and 65B is described with reference to FIG. 66.

Figure 66:
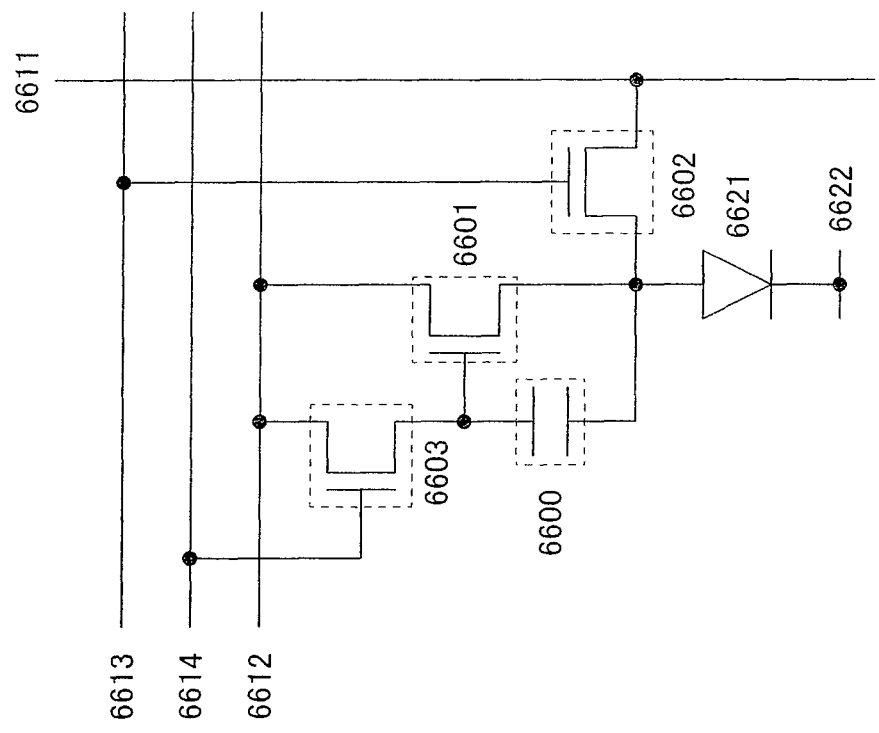
FIG. 66 illustrates Embodiment Mode 10.

The pixel structure of FIG. 66 is described. A pixel circuit shown in FIG. 66 includes a capacitor 6600, a first transistor 6601, a second transistor 6602, a third transistor 6603, and a display element 6621. A pixel is connected to a first wiring 6611, a second wiring 6612, a third wiring 6613, and a fourth wiring 6614. The display element 662 is interposed between a pixel electrode and an opposite electrode 6622. For the display element 6621, an EL element in which a current flows from the pixel electrode to the opposite electrode 6622 can be used. Note that the first wiring 6611 may be called a signal line; the second wiring 6612 may be called a power supply lint; and the third wiring 6613 and the fourth wiring 6614 may be called first and second scan lines. The first transistor 6601 may be called a driving transistor; and the second transistor 6602 and the third transistor 6603 may be called first and second switching transistors.

The case where a light-emitting element such as an EL element is used as the display element 6621 is described.

Note that the first, second, and third transistors 6601, 6602, and 6603 are N-channel transistors in the drawing; however, they may be P-channel transistors. In Embodiment Modes 1 to 4, N-channel transistors are; preferably used as the first, second, and third transistors 6601, 6602, and 6603. It is because simplification of a manufacturing process, reduction in manufacturing cost, and improvement in yield can be realized since amorphous silicon can be used as a semiconductor layer of a transistor. Further, ii is because a semiconductor device such as a large display panel can be formed. Even when polysilicon or single crystalline silicon is used as a semiconductor layer of a transistor, simplification of a manufacturing process can be realized. In addition, in Embodiment Modes 5 to 8, P-channel transistors are preferably used as the first, second, and third transistors 6601, 6602, and 6603. It is because simplification of a manufacturing process, reduction in manufacturing cost, and improvement in yield can be realized.

Note that the first wiring 6611 corresponds to any one of the signal lines S1 to Sm shown in each display device in FIGS. 9, 11, 12, and 44. The third wiring 6613 corresponds to any one of the scan lines G1 to Gn shown in each display device in FIGS. 9, 11, 12, and 44.

Note that the second and fourth wirings 6612 and 6614 are not shown in FIGS. 9, 11, 12, and 44; however, as described above, they may be added to FIGS. 9, 11, 12, and 44 if needed.

A first terminal of the first transistor 6601 is connected to the second wiring 6612, and a second terminal of the first transistor 6601 is connected to the pixel electrode of the display element 6621. A first terminal of the second transistor 6602 is connected to the first wiring 6611, a second terminal of the second transistor 6602 is connected to the pixel electrode of the display element 6621, and a gate terminal of the second transistor 6602 is connected to the third wiring 6613. A first terminal of the third transistor 6603 is connected to the second wiring 6612, a second terminal of the third transistor 6603 is connected to the gate terminal of the first transistor 6601, and a gate terminal of the third transistor 6603 is connected to the fourth wiring 6614. A first electrode of the capacitor 6600 is connected to the gate terminal of the first transistor 6601, and a second electrode of the capacitor 6600 is connected to the pixel electrode of the display element 6621.

As a driving method, the third wiring 6613 and the fourth wiring 6614 are selected, the second transistor 6602 and the third transistor 6603 are turned on, and a potential of the second wiring 6612 is lowered to approximately the same potential as the opposite electrode 6622. Thereafter, a current corresponding to a video signal is supplied (the video signal is input) from the second wiring 6612 to the first wiring 661L Thus, a gate terminal voltage of the first transistor 6601 becomes a value corresponding to the video signal, and at this time, a gate-source voltage (potential difference between the gate terminal and the second terminal) of the first transistor 6601 is held in the capacitor 6600. Thereafter, the second transistor 6602 and the third transistor 6603 are turned off, and the potential of the second wiring 6612 is increased, so that a current starts flowing to the display element 6621. At this time, the gate-source voltage of the first transistor 6601 is held at the potential corresponding to the video signal by the capacitor 6600; therefore, a current of the video signal and the current flowing to the display element 6621 become the same value. Thus, the display element 6621 emits light with a luminance corresponding to the video signal.

Next, a structure of a pixel, which is different from FIG. 66 is described with reference to FIG. 67.

Figure 67:
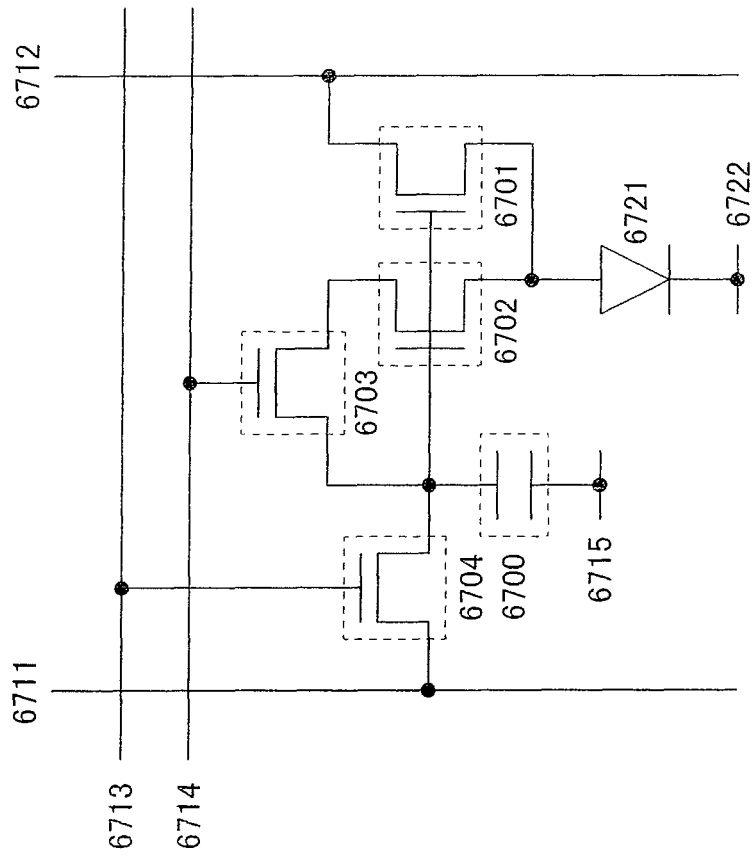
FIG. 67 illustrates Embodiment Mode 10.

The pixel structure of FIG. 67 is described. A pixel circuit shown in FIG. 67 includes a capacitor 6700, a first transistor 6701, a second transistor 6702, a third transistor 6703, a fourth transistor 6704, and a display element 6721. A pixel is connected to a first wiring 6711, a second wiring 6712, a third wiring 6713, a fourth wiring 6714, and a fifth wiring 6715. In the display element 6721, a light-emitting layer is interposed between a pixel electrode and an opposite electrode 6722. For the display element 6621, an EL element in which a current flows from the pixel electrode to the opposite electrode 6722 can be used. Note that the first wiring 6711 may be called a signal line; the second wiring 6712 may be called a power supply line; the third wiring 6713 and the fourth wiring 6714 may be called first and second scan lines; and the fifth wiring 6715 may be called a storage capacitor line. The first transistor 6701 and the second transistor 6702 may be called first and second driving transistors; and the third transistor 6703 and the fourth transistor 6704 may be called first and second switching transistors. Note that the first transistor 6701 and the second transistor 6702 are coupled to each other, so that a so-called current mirror structure is provided.

The case where a light-emitting element such as an EL element is used as the display element 6621 is described.

Note that the first, second, third, and fourth transistors 6701, 6702, 6703, and 6704 are N-channel transistors in the drawing; however, they may be P-channel transistors. In Embodiment Modes 1 to 4, N-channel transistors are preferably used as the first, second, third, and fourth transistors 6701, 6702, 6703, and 6704. It is because simplification of a manufacturing process, reduction in manufacturing cost, and improvement in yield can be realized since amorphous silicon can be used as a semiconductor layer of a transistor. Further, it is because a semiconductor device such as a large display panel can be formed. Even when polysilicon or single crystalline silicon is used as a semiconductor layer of a transistor, simplification of a manufacturing process can be realized. In addition, in Embodiment Modes 5 to 8, P-channel transistors are preferably used as the first, second, third, and fourth transistors 6701, 6702, 6703, and 6704. It is because simplification of a manufacturing process, reduction in manufacturing cost, and improvement in yield can be realized.

Note that the first wiring 6711 corresponds to any one of the signal lines S1 to Sm shown in each display device in FIGS. 9, 11, 12, and 44. The third wiring 6713 corresponds to any one of the scan lines G1 to Gn shown in each display device in FIGS. 9, 11, 12, and 44.

Note that the second, fourth, and fifth wirings 6712, 6714, and 6715 are not shown in FIGS. 9, 11, 12, and 44; however, as described above, they may be added to FIGS. 9, 11, 12, and 44 if needed.

A first terminal of the first transistor 6701 is connected to the second wiring 6712, and a second terminal of the first transistor 6701 is connected to the pixel electrode of the display element 6721. A first terminal of the second transistor 6702 is connected to a second terminal of the third transistor 6703, and a second terminal of the second transistor 6702 is connected to the pixel electrode of the display element 6721. A first terminal of the third transistor 6703 is connected to a gate terminal of the first transistor 6701 and a gate terminal of the second transistor 6702, and a gate terminal of the third transistor 6703 is connected to the fourth wiring 6714. A first terminal of the fourth transistor 6704 is connected to the first wiring 6711, a second terminal of the fourth transistor 6704 is connected to the gate terminal of the first transistor 6701 and the gate terminal of the second transistor 6702, and a gate terminal of the fourth transistor 6704 is connected to the third wiring 6713. A first electrode of the capacitor 6700 is connected to the fifth wiring 6715, and a second electrode of the capacitor 6700 is connected to the gate terminal of the first transistor 6701 and the gate terminal of the second transistor 6702.

Note that the capacitor 6700 has a Junction to hold gate terminal voltages of the first transistor 6701 and the second transistor 6702. Accordingly, although the capacitor 6700 is connected between the fifth wiring 6715 and the gate terminals of the first transistor 6701 and the second transistor 6702; the invention is not limited thereto. It is acceptable as long as the capacitor 6700 is provided to hold the gate terminal voltages of the first transistor 6701 and the second transistor 6702, and it may be connected to the third wiring 6713 of another pixel (e.g., a pixel of a previous row), further, the capacitor 6700 may be omitted when gate capacitance of the first transistor 6701 and the second transistor 6702 is used.

As a driving method, the third wiring 6713 and the fourth wiring 6714 are selected, and the third transistor 6703 and the fourth transistor 6704 are turned on. Thereafter, a current corresponding to a video signal is supplied (the video signal is input) from the first wiring 6711 to the display element 6721. Thus, the gate terminal voltages of the first transistor 6701 and the second transistor 6702 become a value corresponding to the video signal and are held in the capacitor 6700. Thereafter the third transistor 6703 and the fourth transistor 6704 are turned off. Then, the first transistor 6701 supplies the current corresponding to the video signal to the display element 6721, and the display element 6721 emits light with a luminance corresponding to the video signal.

Next, a cross-sectional view of each pixel shown in FIGS. 65A and 65B is described.

Figure 69A:
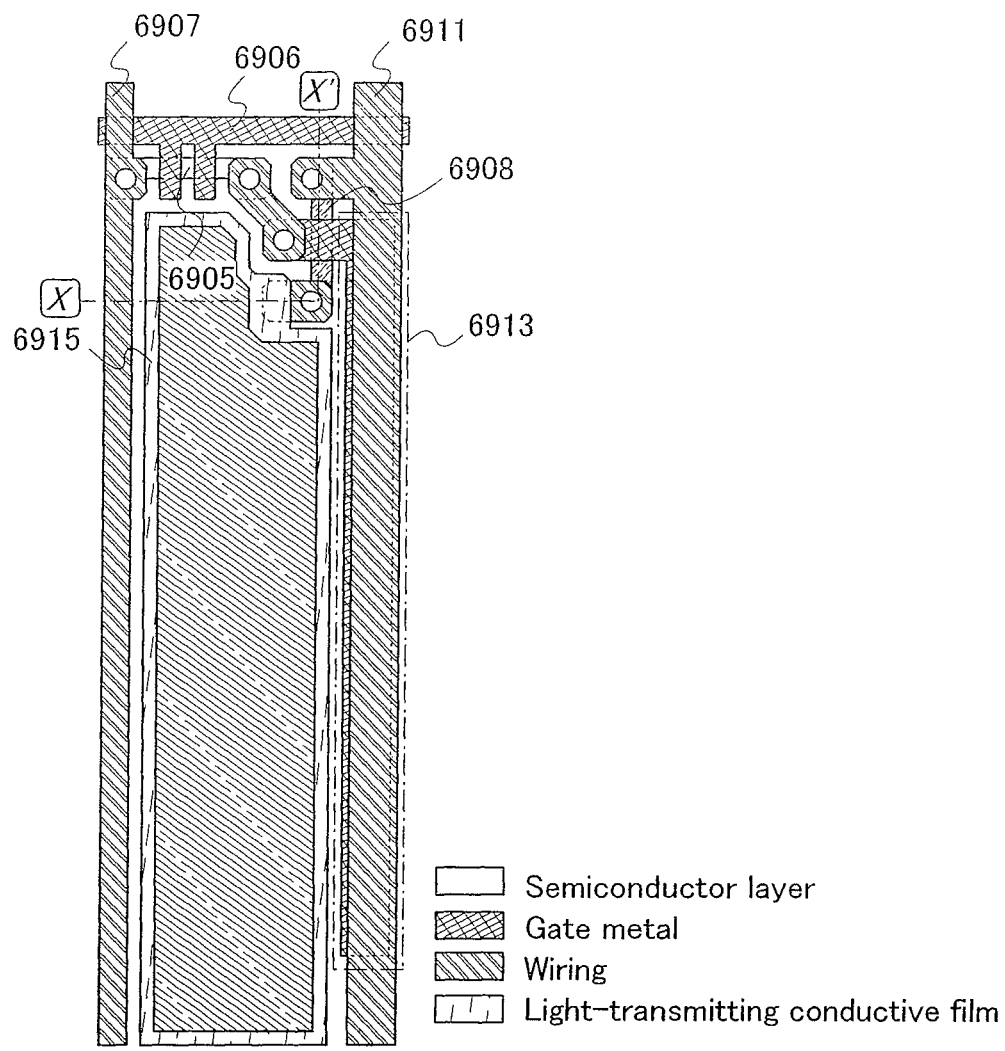
FIGS. 69A and 69B illustrate Embodiment Mode 10.
Figure 69B:
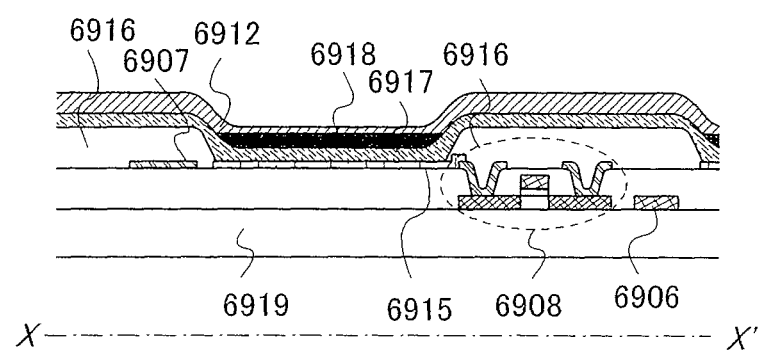

FIG. 69A shows a layout example of elements in a pixel including two TFTs. FIG. 69B is a cross-sectional view along X-X' in FIG. 69A. Note that the layout example in FIG. 69A can be applied to the pixel shown in FIG. 65A.

As shown in FIG. 69A, the pixel in the invention may include a first TFT 6905, a first wiring 6906, a second wiring 6907, a second TFT 6908, a third wiring 6911, an opposite electrode 6912, a capacitor 6913, a pixel electrode 6915, a partition wall 6916, an organic conductive film 6917, an organic thin film 6918, and a substrate 6919. Note that it is preferable that the first TFT 6905 be used as a switching TFT, the first wiring 6906 as a gate signal line, the second wiring 6907 as a source signal line, the second TFT 6908 as a driving TFT, and the third wiring 6911 as a current supply line.

As shown in FIG. 69A, it is preferable that a gate electrode of the first TFT 6905 be electrically connected to the first wiring 6906, one of a source terminal or a drain terminal of the first TFT 6905 be electrically connected to the second wiring 6907, and the other of the source terminal or the drain terminal of the first TFT 6905 be electrically connected to a gate electrode of the second TFT 6908 and one electrode of the capacitor 6913. Note that the gate electrode of the first TFT 6905 may include a plurality of gate electrodes as shown in FIG. 69A. Accordingly, a leakage current in the off state of the first TFT 6905 can be reduced.

It is preferable that one of a source terminal or a drain terminal of the second TFT 6908 be electrically connected to the third wiring 6911, and the other of the source terminal or the drain terminal of the second TFT 6908 be electrically connected to the pixel electrode 6915. Accordingly, a current flowing to the pixel electrode 6915 can be controlled by the second TFT 6908.

The organic conductive film 6917 may be provided over the pixel electrode 6915, and the organic thin film (organic compound layer) 6918 may fee further provided thereover. The opposite electrode 6912 may be provided over the organic thin film (organic compound layer) 6918. Note that the opposite electrode 6912 may be formed over an entire surface of all pixels to be commonly connected to all the pixels, or may be patterned using a shadow mask or the like.

Light emitted from the organic thin film (organic compound layer) 6918 is transmitted through either the pixel electrode 6915 or the opposite electrode 6912. In this case, in FIG. 69B, the case where light is emitted to the pixel electrode side, that is, a side on which the TFT and the like are formed is referred to as bottom emission; and the case where light is emitted to the opposite electrode side is referred to as top emission.

In the case of bottom emission, it is preferable that the pixel electrode 6915 be formed of a light-transmitting conductive film. In the case of top emission, it is preferable that the opposite electrode 6912 be formed of a light-transmitting conductive film.

In a light-emitting device for color display; EL elements having respective light emission colors of RGB may be separately formed, or an EL element with a single color may be formed over an entire surface and light emission of RGB can be obtained by using a color filter.

Note that the structure shown in FIGS. 69A and 69B are examples, and various structures can be employed for a pixel layout, a cross-sectional structure, a stacking order of electrodes of an EL element, and the like, as well as the structures shown in FIGS. 69A and 69B. Further, as a light-emitting layer, various elements such as a crystalline element such as an LED, and an element formed of an inorganic thin film can be used as well as the element formed of the organic thin film shown in the drawing.

Next, a layout example of elements in a pixel including three TFTs is described with reference to FIG. 70A. FIG. 70B is a cross-sectional view along X-X' in FIG. 70A. Note that the layout example in FIG. 70A can be applied to the pixel shown in FIG. 65B.

Figure 70A:
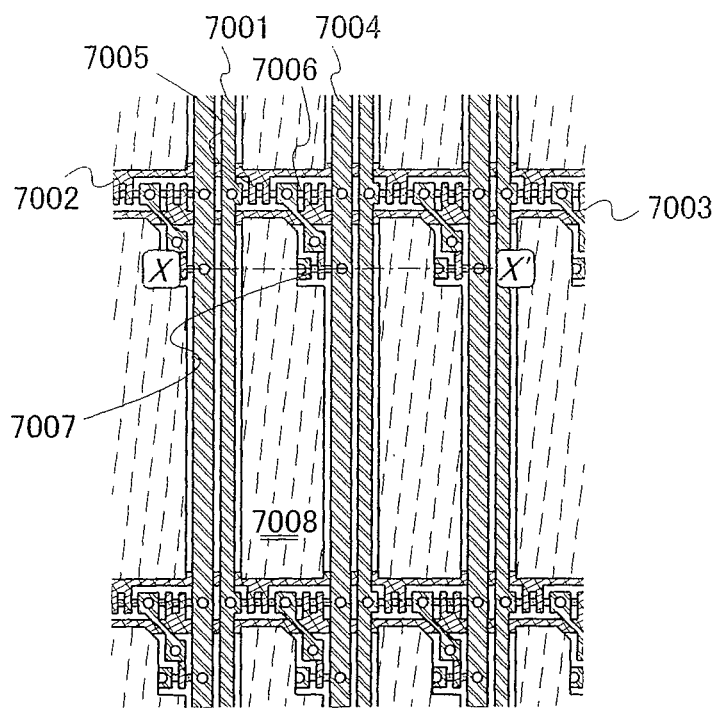
FIGS. 70A and 70B illustrate Embodiment Mode 10.
Figure 70B:
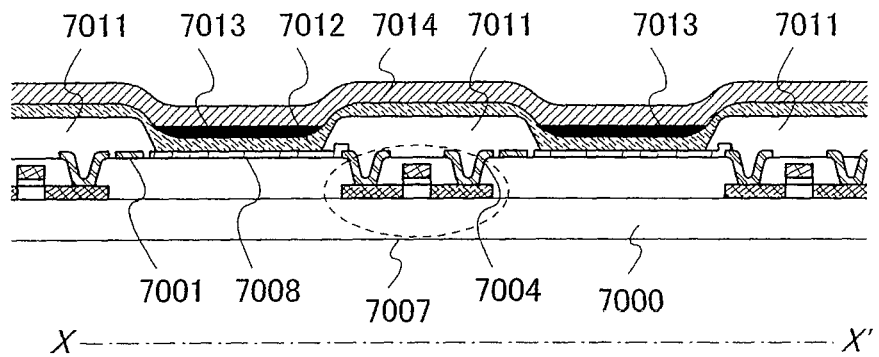

As shown in FIG. 70A, the pixel in the invention may include a substrate 7000, a first wiring 7001, a second wiring 7002, a third wiring 7003, a fourth wiring 7004, a first TFT 7005, a second TFT 7006, a third TFT 7007, a pixel electrode 7008, a partition wall 7011, an organic conductive film 7012, an organic thin film 7013, and an opposite electrode 7014. Note that it is preferable that the first wiring 7001 be used as a source signal line, the second wiring 7002 as a gate signal line for writing, the third wiring 7003 as a gate signal Hue for erasing, the fourth wiring 7004 as a current supply line, the first TFT 7005 as a switching TFT, the second TFT 7006 as an erasing TFT, and the third TFT 7007 as a driving TFT.

As shown in FIG. 70A, it is preferable that a gate electrode of the first TFT 7005 be electrically connected to the second wiring 7002, one of a source terminal or a drain terminal of the first TFT 7005 be electrically connected, to the first wiring 7001, and the other of the source terminal ox the drain terminal of the first TFT 7005 be electrically connected to a gate electrode of the third TFT 7007. Note that the gate electrode of the first TFT 7005 may include a plurality of gate electrodes as shown in FIG. 70A. Accordingly, a leakage current in the off state of the first TFT 7005 can be reduced.

It is preferable that a gate electrode of the second TFT 7006 be electrically connected to the third wiring 7003, one of a source terminal or a drain terminal of the second TFT 7006 be electrically connected to the fourth wiring 7004, and the other of the source terminal or the drain terminal of the second TFT 7006 be electrically connected to the gate electrode of the third TFT 7007. Note that the gate electrode of the second TFT 7006 may include a plurality of gate electrodes as shown in FIG. 70A. Accordingly, a leakage current in the off state of the second TFT 7006 can be reduced.

It is preferable that one of a source terminal or a drain terminal of the third TFT 7007 be electrically connected to the fourth wiring 7004, and the other of the source terminal or the drain terminal of the third TFT 7007 be electrically connected to the pixel electrode 7008. Accordingly, a current flowing to the pixel electrode 7008 can be controlled by the third TFT 7007.

The organic conductive film 7012 may be provided over the pixel electrode 7008, and the organic thin film (organic compound layer) 7013 may be further provided thereover. The opposite electrode 7014 may be provided over the organic thin film (organic compound layer) 7013. Note that the opposite electrode 7014 may be formed over an entire surface of all pixels to be commonly connected to al) the pixels, or may be patterned using a shadow mask or the like.

Light emitted from the organic thin film (organic compound layer) 7013 is transmitted through either the pixel electrode 7008 or the opposite electrode 7014. In this case, in FIG. 70B, the case where light is emitted to the pixel electrode side, that is, a side on which the TFT and the like are formed is referred to as bottom emission; and the case where light is emitted to the opposite electrode side is referred to as top emission.

In the case of bottom emission, it is preferable that the pixel electrode 7008 be formed of a light-transmitting conductive film. In the case of top emission, it is preferable that the opposite electrode 7014 be formed of a light-transmitting conductive film.

In a light-emitting device for color display, EL elements having respective light emission colors of RGB may be separately formed, or an EL element with a single color may be formed over an entire surface and light emission of RGB can be obtained by using a color filter.

Note that the structure shown in FIGS. 70A and 70B are examples, and various structures can be employed for a pixel layout, a cross-sectional structure, a stacking order of electrodes of an EL element, and the like, as well as the structure shown in FIGS. 70A and 70B. Further, as a light emitting layer, various elements such as a crystalline element such as an LED, and an element formed of an inorganic thin film can be used as well as the element formed of the organic thin film shown in the drawing.

Next, a layout example of elements in a pixel including four TFTs is described with reference to FIG. 71A. FIG. 71B is a cross-sectional view along X-X' in FIG. 71A.

Figure 71A:
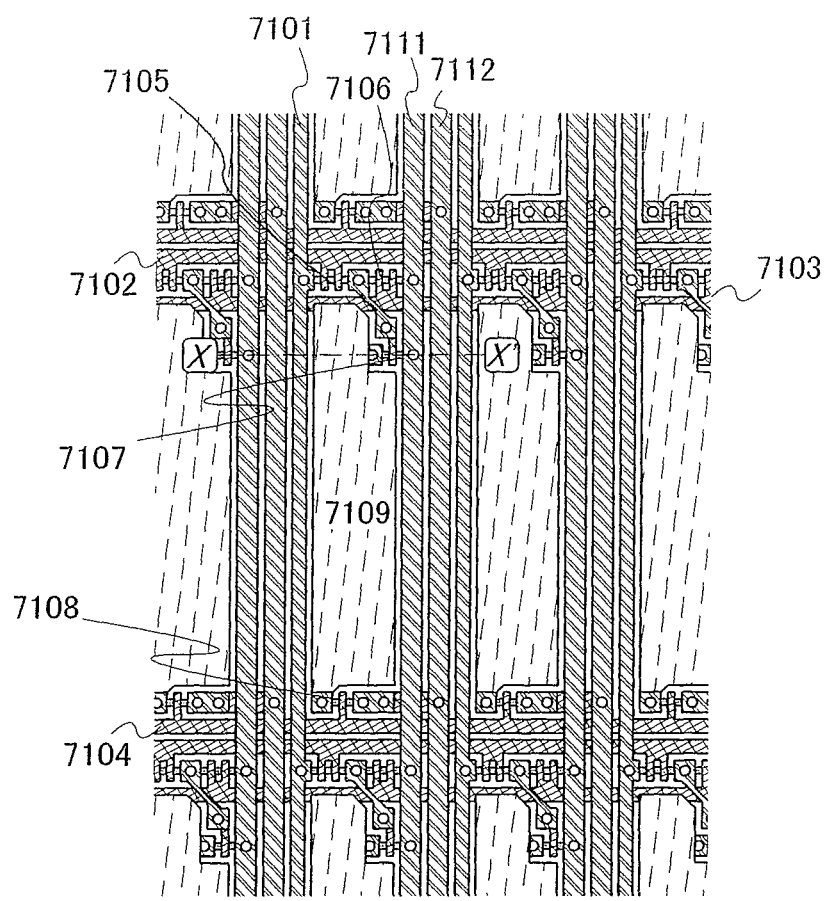
FIGS. 71A and 71B illustrate Embodiment Mode 10.
Figure 71B:
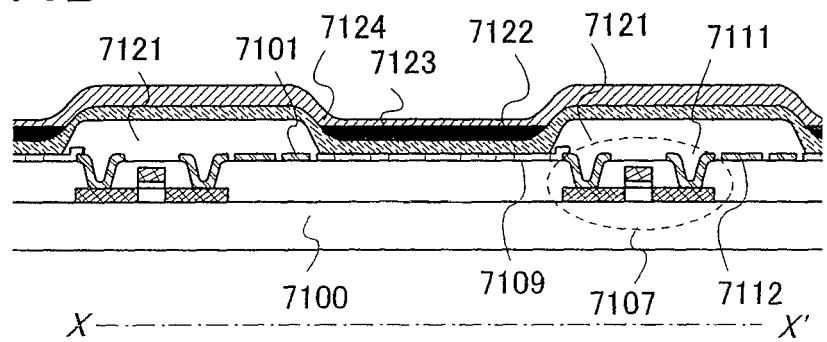

As shown in FIG. 71A, the pixel in the invention may include a substrate 7100, a first wiring 7101, a second wiring 7102, a third wiring 7103, a fourth wiring 7104, a first TFT 7105, a second TFT 7106, a third TFT 7107, a fourth TFT 7108, a pixel electrode 7109, a fifth wiring 7111, a sixth wiring 7112, a partition wall 7121, an organic conductive film 7122, an organic thin film 7123, and an opposite electrode 7124. Note that it is preferable that the first wiring 7101 be used as a source signal line, the second wiring 7102 as a gate signal line for writing, the third wiring 7103 as a gate signal line for erasing, the fourth wiring 7104 as a signal line for reverse biasing, the first TFT 7105 as a switching TFT, the second TFT 7106 as art erasing TFT, the third TFT 7107 as a driving TFT, the fourth TFT 7108 as a TFT for reverse bias, the fifth wiring 7111 as a current supply line, and the sixth wiring 7112 as a power supply line for reverse biasing.

As shown in FIG. 71A, it is preferable that a gate electrode of the first TFT 7105 be electrically connected to the second wiring 7102, one of a source terminal or a dram terminal of the first TFT 7105 be electrically connected to the first wiring 7101, and the other of the source terminal or the drain terminal of the first TFT 7105 be electrically connected to a gate electrode of the third TFT 7107. Note that the gate electrode of the first TFT 7105 may include a plurality of gate electrodes as shown in FIG. 71A. Accordingly, a leakage current in the off state of the first TFT 7105 can be reduced.

It is preferable that a gate electrode of the second TFT 7106 be electrically connected to the third wiring 7103, one of a source terminal or a drain terminal of the second TFT 7106 be electrically connected to the fifth wiring 7111, and the other of the source terminal or the drain terminal of the second TFT 7106 be electrically connected to the gate electrode of the third TFT 7107. Note that the gate electrode of the second TFT 7106 may include a plurality of gate electrodes as shown in FIG. 71A. Accordingly, a leakage current in the off state of the second TFT 7106 can be reduced.

It is preferable that one of a source terminal or a drain terminal of the third TFT 7107 be electrically connected to the fifth wiring 7111, and the other of the source terminal or the drain terminal of the third TFT 7107 be electrically connected to the pixel electrode 7109. Accordingly, a current flowing to the pixel electrode 7109 can be controlled by the third TFT 7107.

It is preferable that a gate electrode of the fourth TFT 7108 be electrically connected to the fourth wiring 7104, one of a source terminal or a drain terminal of the fourth TFT 7108 be electrically connected to the sixth wiring 7112, and the other of the source terminal or the drain terminal of the fourth TFT 7108 be electrically connected to the pixel electrode 7109. Accordingly, a potential of the pixel electrode 7109 can be controlled by the fourth TFT 7108, so that a reverse bias can be applied to a light-emitting element including the organic conductive film 7122, the organic thin film 7123 and the like. When a reverse bias is applied to a light-emitting element including the organic conductive film 7122, the organic thin film 7123, and the like, reliability of the light-emitting element can be significantly improved.

For example, it is known that when a light-emitting element of which luminance half-decay time is approximately 400 hours in the case, of driving with a direct-current voltage (3.65 V) is driven with an alternating current voltage (forward bias: 3.7 V, reverse bias: 1.7 V, a duty ratio of 50%, and an alternating current frequency of 60 Hz), luminance half-decay time becomes 700 hours or more.

The organic conductive film 7122 may be provided over the pixel electrode 7109, and the organic thin film (organic compound layer) 7123 may be further provided thereover. The opposite electrode 7124 may be provided over the organic thin film (organic compound layer) 7123. Note that the opposite electrode 7124 may be formed over an entire surface of all pixels to be commonly connected to all the pixels, or may be patterned using a shadow mask or the like.

Light emitted from the organic thin film (organic compound layer) 7123 is transmitted through either the pixel electrode 7109 or the opposite electrode 7124. In this case, in FIG. 71B, the case where light is emitted to the pixel electrode side, that is, a side on which the TFT and the like are formed is referred to as bottom emission; and the case where light is emitted to the opposite electrode side is referred to as top emission.

In the case of bottom emission, it is preferable that the pixel electrode 7109 be formed of a light-transmitting conductive film. In the case of top emission, it is preferable that the opposite electrode 7124 be formed of a light-transmitting conductive film.

In a light-emitting device for color display, EL elements having respective light emission colors of RGB may be separately formed, or an EL element with a single color may be formed over an entire surface and light emission of RGB can be obtained by using a color filter.

Note that the structure shown in FIGS. 71A and 71B are examples, and various structures can be employed for a pixel layout, a cross-sectional structure, a stacking order of electrodes of an EL element, and the like, as well as the structure shown in FIGS. 71A and 71B. Further, as a light-emitting layer, various elements such as a crystalline element such as an LED, and an element formed of an inorganic thin film can be used as well as the element formed of the organic thin film shown in the drawing.

Next a structure of an EL element which can be applied to the invention is described.

An EL element which can be applied to the invention may have a structure including a layer (mixed layer) in which a plurality of materials among a hole injecting material, a hole transporting material, a light-emitting material, an electron transporting material, an electron injecting material, and the like are mixed (hereinafter referred to as a mixed junction type EL element) as well as a stacked-layer structure where a hole injecting layer formed of a hole injecting material, a hole transporting layer formed of a hole transporting material a light-emitting layer formed of a light-emitting material an electron transporting layer formed of an electron transporting material an electron injecting layer formed of an electron injecting material, and the like are clearly distinguished.

FIGS. 72A to 72E are schematic views each showing a structure of a mixed junction type EL element. In FIGS. 72A to 72E, reference numeral 7201 indicates an anode of the EL element. 7202 indicates a cathode of the EL element; and a layer interposed between the anode 7201 and the cathode 7202 corresponds to an EL layer.

Figure 72A:
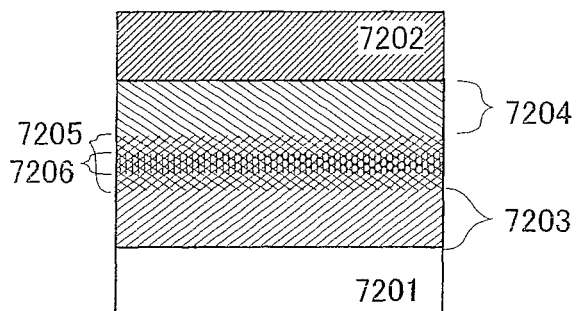
FIGS. 72A to 72E illustrate Embodiment Mode 10.

In FIG. 72A, the EL layer can have a structure where the EL layer includes a hole transporting region 7203 formed of a hole transporting material and an electron transporting region 7204 formed of an electron transporting material, the hole transporting region 7203 is closer to the anode than the electron transporting region 7204, and a mixed region 7205 including both the hole transporting material and the electron transporting material is provided between the hole transporting region 7203 and the electron transporting region 7204.

In this case, in the direction front the anode 7201 to the cathode 7202, a concentration of the hole transporting material in the mixed region 7205 may be decreased and a concentration of the electron transporting material in the mixed region 7205 may be increased.

Note that in the aforementioned structure, a ratio of concentrations of each functional material may be changed (a concentration gradient may be formed) in the mixed region 7205 including both the hole it unsporting material and the electron transporting material, without including the hole transporting layer 7203 formed of only the hole transporting material. Alternatively, a ratio of concentrations of each functional material may be changed (a concentration gradient may be formed) in the mixed region 7205 including both the hole transporting material and the electron transporting material, without including the hole transporting layer 7203 formed of only the hole transporting material and the electron transporting layer 7204 formed of only the electron transporting material. A ratio of concentrations may be changed depending on a distance from the anode or the cathode. Further, the ratio of concentrations may be changed continuously. The concentration gradient can be freely set.

A region 7206 to which a light-emitting material is added is included in the mixed region 7205. A light emission color of the EL element can be controlled by the light-emitting material. Further carriers can be trapped by the light-emitting material. As the light-emitting material, various fluorescent dyes as well as a metal complex having a quinoline skeleton, a benzooxazole skeleton, or a benzothiazole skeleton can be used. The light emission color of the EL element can be controlled by adding the light-emitting material.

As the anode 7201, an electrode material having a high work function is preferably used in order to inject holes efficiently. For example, a transparent electrode formed of indium tin oxide (ITO), indium zinc oxide (IZO), ZnO, $SnO_2$, $In_2O_3$, or the like can be used. When a light-emitting property is not needed, the anode 7201 may be formed of an opaque metal material.

As the hole transporting material, an aromatic amine compound or the like can be used.

As the electron transporting material, a metal complex having a quinoline derivative, 8-quinolinol, or a derivative thereof as a ligand (especially tris(8-quinolinolato)aluminum ($Alq_3$)), or the like can be used.

As the cathode 7202, an electrode material having a low work function is preferably used in order to inject electrons efficiently. A metal such as aluminum, indium, magnesium, silver, calcium, barium, or lithium can be used by itself. Alternatively, an alloy of the aforementioned metal or an alloy of the aforementioned metal and another metal may be used.

Figure 72B:
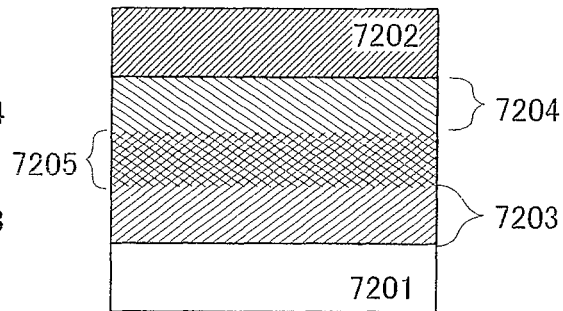

FIG. 72B is a schematic view of a structure of an EL element, which is different from that of FIG. 72A. Note that the same portions as those in FIG. 72A are denoted by the same reference numerals, and description thereof is omitted.

In FIG. 72B, a region to which a light-emitting material is added is not included. However, as a material added to the electron transporting region 7204, a material (electron-transporting and light-emitting material) having both an electron transporting property and a light-emitting property, for example, tris(8-quinolinolato)aluminum ($Alq_3$) is used; thus, light emission can be performed.

Alternatively, as a material added to the hole transporting region 7203, a material (hole-transporting and light-emitting material) having both a hole transporting property and a light-emitting property may be used.

Figure 72C:
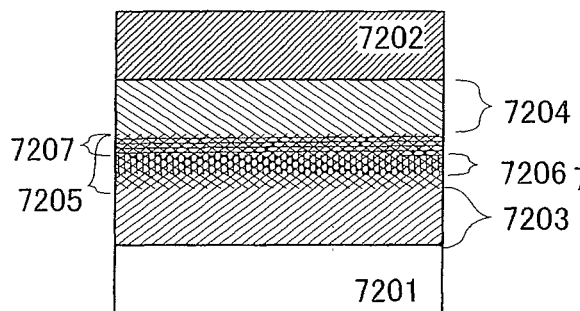

FIG. 72C is a schematic view of a structure of an EL element, which is different from those of FIGS. 72A and 72B. Note that the same portions as those in FIGS. 72A and 72B are described by the same reference numerals, and description thereof is omitted.

In FIG. 72C, a region 7207 including the mixed region 7205 is provided, to which a hole blocking material having a larger energy difference between the highest occupied molecular orbital and the lowest unoccupied molecular orbital than the hole transporting material is added. The region 7207 to which the hole blocking material is added is provided close, to the cathode 7202 than the region 7206 to which the light-emitting material is added in the mixed region 7205; thus, a recombination rate of carriers and light emission efficiency can be increased. The aforementioned structure provided with the region 7207 to which the hole blocking material is added is especially effective in an EL element which utilizes light emission (phosphorescence) by a triplet exciton.

Figure 72D:
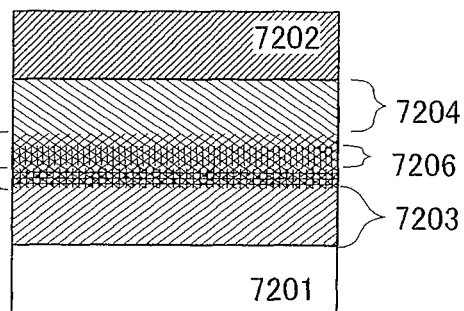

FIG. 72D is a schematic view of a structure of an EL element, which is different from those of FIGS. 72A to 72C. Note that the same portions as those in FIGS. 72A to 72C are described by the same reference numerals, and description thereof is omitted.

In FIG. 72D, a region 7208 including the mixed region 7205 is provided, to which an electron blocking material having a larger energy difference between the highest occupied molecular orbital and the lowest unoccupied molecular orbital than the electron transporting material is added. The region 7208 to which the electron blocking material is added is provided closer to the anode 7201 than the region 7206 to which the light-emitting material is added in the mixed region 7205; thus, a recombination rate of carriers and light emission efficiency can be increased. The aforementioned structure provided with the region 7208 to which the electron blocking material is added is especially effective in an EL element which utilises light emission (phosphorescence) by a triplet exciton.

Figure 72E:
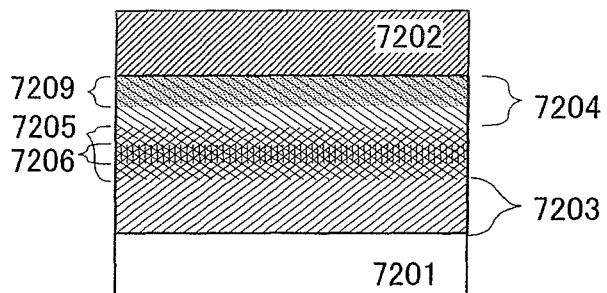

FIG. 72E is a schematic view of a structure of a mixed junction type EL element, which is different from those of FIGS. 72A to 72B. FIG. 72E shows an example of a structure where a region 7209 to which a metal material is added is included in part of an EL layer in contact with an electrode of the EL element. In FIG. 72E, the same portions as those in FIGS. 72A to 72D are described by the same reference numerals, and description thereof is omitted. In FIG. 72E, MgAg (Mg—Ag alloy) may be used as the cathode 7202, and the region 7209 to which Al (aluminum) alloy is added may be included in a legion which is in contact with the cathode 7202 of the region 7204 to which the electron transporting material is added, for example. By the aforementioned structure, oxidation of the cathode can be prevented, and electron injection efficiency from the cathode can be increased. Therefore, the lifetime of the mixed junction type EL element can be extended, and a driving voltage can be lowered.

As a method of forming the aforementioned mixed junction type EL element a co-evaporation method or the tike can be used.

In the mixed junction type EL elements as shown in FIGS. 72A to 72E, a clear interface between the layers does not exist, and charge accumulation can be reduced. Thus, the lifetime of the EL element can be extended, and a driving voltage can be lowered.

Note that the structures shown in FIGS. 72A to 72E can be implemented in tree combination with each other.

Note that a structure of the mixed junction type EL element is not limited to those described above. A known structure, may be freely used.

Note that an organic material which forms an EL layer of an EL element may be a low molecular material or a high molecular material, and both of the materials may be used. When a low molecular material is used as an organic compound material, a film can be formed by an evaporation method. On the other hand, when a high molecular material is used as the EL layer, the high molecular material is dissolved in a solvent and a film can be formed by a spin coating method or an ink-jet method.

In addition, the EL layer may be formed of a middle molecular material. In this specification, a middle molecule organic light-emitting material denotes an organic light-emitting material without a sublimation property and with a polymerization degree of approximately 20 or less. When a middle molecular material is used as the EL layer, a film can be formed by an ink-jet method or the like.

Note that a low molecular material, a high molecular material, and a middle molecular material may be used in combination.

In addition, an EL element may utilize either light emission (fluorescence) by a singlet exciton or light emission (phosphorescence) by a triplet exciton.

Next, an evaporation device for forming a display device to which the invention can be applied is described with reference to the drawing.

A display device to which the invention can be applied may be manufactured by forming an EL layer. The EL layer is formed so that a material which exhibits electroluminescence is included in at least part thereof. The EL layer may be formed of a plurality of layers having different functions. In this case, the EL layer may be formed of a combination of layers having different functions, which are also called a hole injecting and transporting layer, a light-emitting layer, an electron injecting and transporting layer, and the like.

Figure 73:
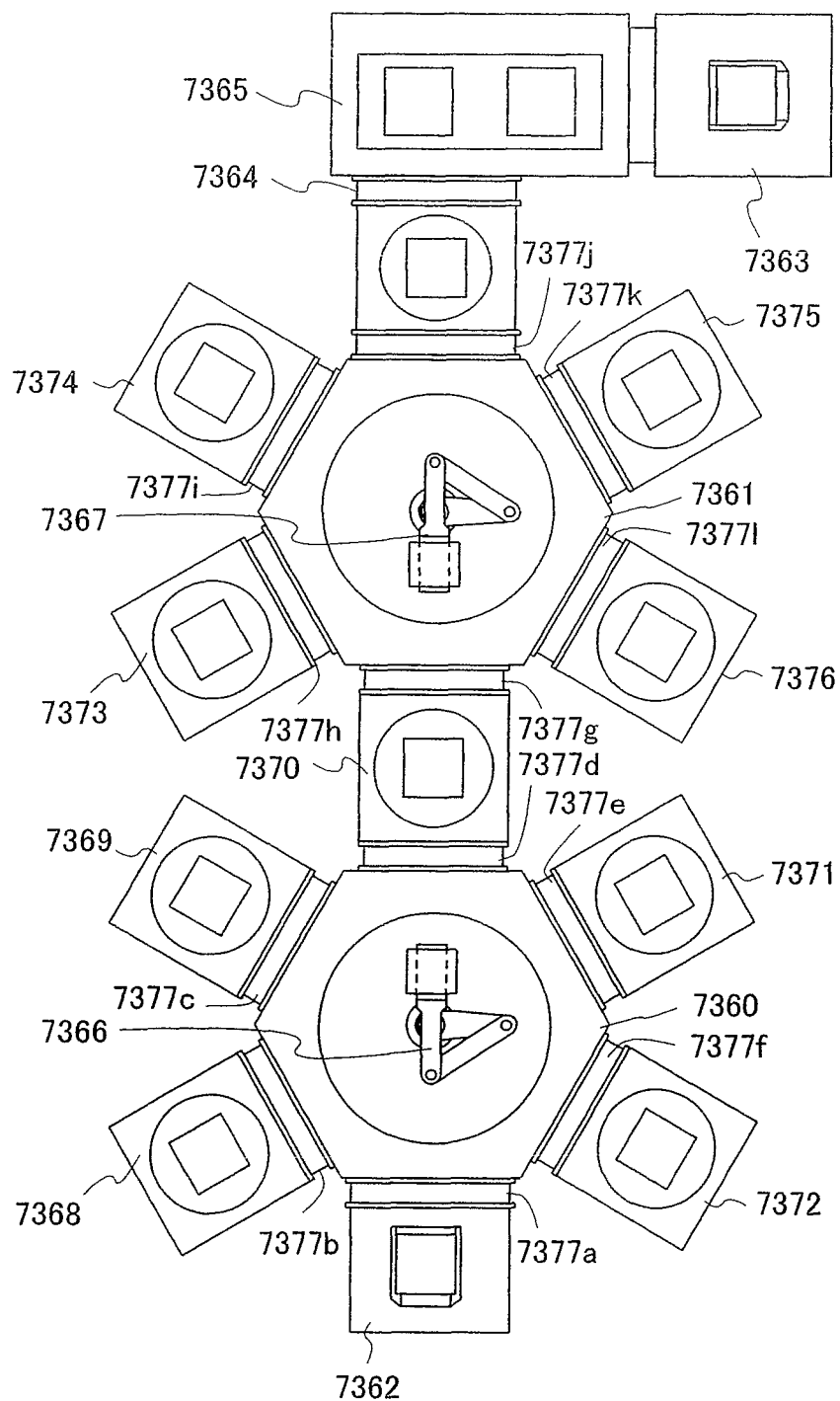
FIG. 73 illustrates Embodiment Mode 10.

FIG. 73 shows a structure of an evaporation device for forming an EL layer over an element substrate provided with a transistor. In the evaporation device, s plurality of treatment chambers are connected to transfer chambers 7360 and 7361. Each treatment chamber includes a loading chamber 7362 for supplying a substrate, an unloading chamber 7363 for collecting the substrate, a heat treatment chamber 7368, a plasma treatment chamber 7372, deposition treatment chambers 7369, 7370, 7371, 7373, 7374, and 7373 for depositing an EL material, and a deposition treatment chamber 7376 for forming a conductive film formed of aluminum or formed using aluminum as its main component as one electrode of an EL element. Further; gate valves 7377*a* to 73771 are provided between the transfer chambers and the treatment chambers, so that the pressure in each treatment chamber can be controlled independently, and cross contamination between the treatment chambers is prevented.

A substrate introduced into the transfer chamber 7360 from the loading chamber 7362 is transferred to a predetermined treatment chamber by an arm type transfer means 7366 capable of rotating. Further, the substrate is transferred from a certain treatment chamber to another treatment chamber by the transfer means 7366. The transfer chambers 7360 and 7361 are connected by the deposition treatment chamber 7370 at which the substrate is delivered by the transfer means 7366 and a transfer means 7367.

Each treatment chamber connected to the transfer chambers 7360 and 7361 is maintained in a reduced pressure state. Therefore, in the evaporation device, deposition treatment of an EL layer is continuously performed without exposing the substrate to the room air. A display pane in which the formation of the EL layer is completed might be deteriorated due to moisture or the like; therefore, in the evaporation device, a sealing treatment chamber 7365 for performing a sealing treatment before exposure to the room air in order to maintain quality is connected to the transfer chamber 7361. Since the sealing treatment chamber 7365 is under atmospheric pressure or reduced pressure similar thereto, an intermediate treatment chamber 7364 is also provided between the transfer chamber 7361 and the sealing treatment chamber 7365. The intermediate treatment chamber 7364 is provided for delivering the substrate and buffering the pressure between the chambers.

An exhaust means is provided in the loading chamber, the unloading chamber, the transfer chamber, and the deposition treatment chamber in order to maintain reduced pressure in the chamber. As the exhaust means, various vacuum pumps such as a dry pump, a turbo-molecular pump, and a diffusion pump can be used.

In the evaporation device of FIG. 73, the number of treatment chambers connected to the transfer chambers 7360 and 7361 and a structure thereof can be combined in accordance with a stacked-layer structure of the EL element as appropriate. An example of the combination is described below.

The heat treatment chamber 7368 performs a degasification treatment by heating a substrate over which a lower electrode, an insulating partition wall, and the like are formed first In the plasma treatment chamber 7372, a surface of the lower electrode is treated with a rare, gas or oxygen plasma. The plasma treatment is performed for cleaning the surface, stabilizing a surface state, and stabilizing a physical or chemical state (e.g., a work function) of the surface.

The deposition treatment chamber 7369 is for forming an electrode buffer layer which is in contact with one electrode of the EL element. The electrode buffet layer has a carrier injection property (hole injection or electron injection) and suppresses generation of a short-circuit and a black spot defect of the EL element. Typically, the electrode buffer layer is formed of an organic-inorganic hybrid material, has a resistivity of $0.5 \times 10^4$ to $1 \times 10^6$ Ωcm, and is formed having a thickness of 30 to 300 nm. The deposition treatment chamber 7371 is for forming a hole transporting layer.

A light-emitting layer in an EL element has a different structure between the case of emitting single color light and the case of emitting white light. A deposition treatment chamber in the evaporation device is preferably provided in accordance with the structure. For example, when three kinds of EL elements each having a different light emission color are formed in a display panel, it is necessary to form a light-emitting layer corresponding to each light emission color. In this case, the deposition treatment chamber 7370 can be used for forming a first light-emitting layer, a deposition treatment chamber 7373 can be used for forming a second light-emitting layer, and a deposition treatment chamber 7374 can be used for forming a third light-emitting layer. By using a different deposition treatment chamber for each light emitting layer, cross contamination due to different light-emitting materials can be prevented, and throughput of the deposition treatment can be improved.

Alternatively, three kinds of EL elements each having a different light emission color may be sequentially deposited in each of the deposition treatment chambers 7370, 7373 and 7374. In this case, evaporation is performed by moving a shadow mask in accordance with a region to be deposited.

When an EL element which emits white light is formed, the EL element is formed by vertically stacking light-emitting layers of different light emission colors. Also in this case, the element substrate can be transferred through the deposition treatment chambers sequentially to form each light-emitting layer. Alternatively, different light-emitting layers can be formed continuously in the same deposition treatment chamber.

In the deposition treatment chamber 7376, an electrode is formed over the EL layer. The electrode can be formed by an electron beam evaporation method or a sputtering method, and preferably by a resistance heating evaporation method.

The element substrate in which the formation of the electrode is finished is transferred to the sealing treatment chamber 7365 through the intermediate treatment chamber 7364. The sealing treatment chamber 7365 is filled with an inert gas such as helium, argon, neon, or nitrogen, and a sealing substrate is attached and sealed to a side of the element substrate where the EL layer is formed under the atmosphere. In a sealed state, a space between the element substrate and the sealing substrate may be filled with the inert gas or a resin material. The scaling treatment chamber 7365 is provided with a dispenser which provides a sealing material, a mechanical element such as an arm and a fining stage which fixes the sealing substrate to face the element substrate, a dispenser or a spin coater which fills the chamber with a resin material, and the like.

Figure 74:
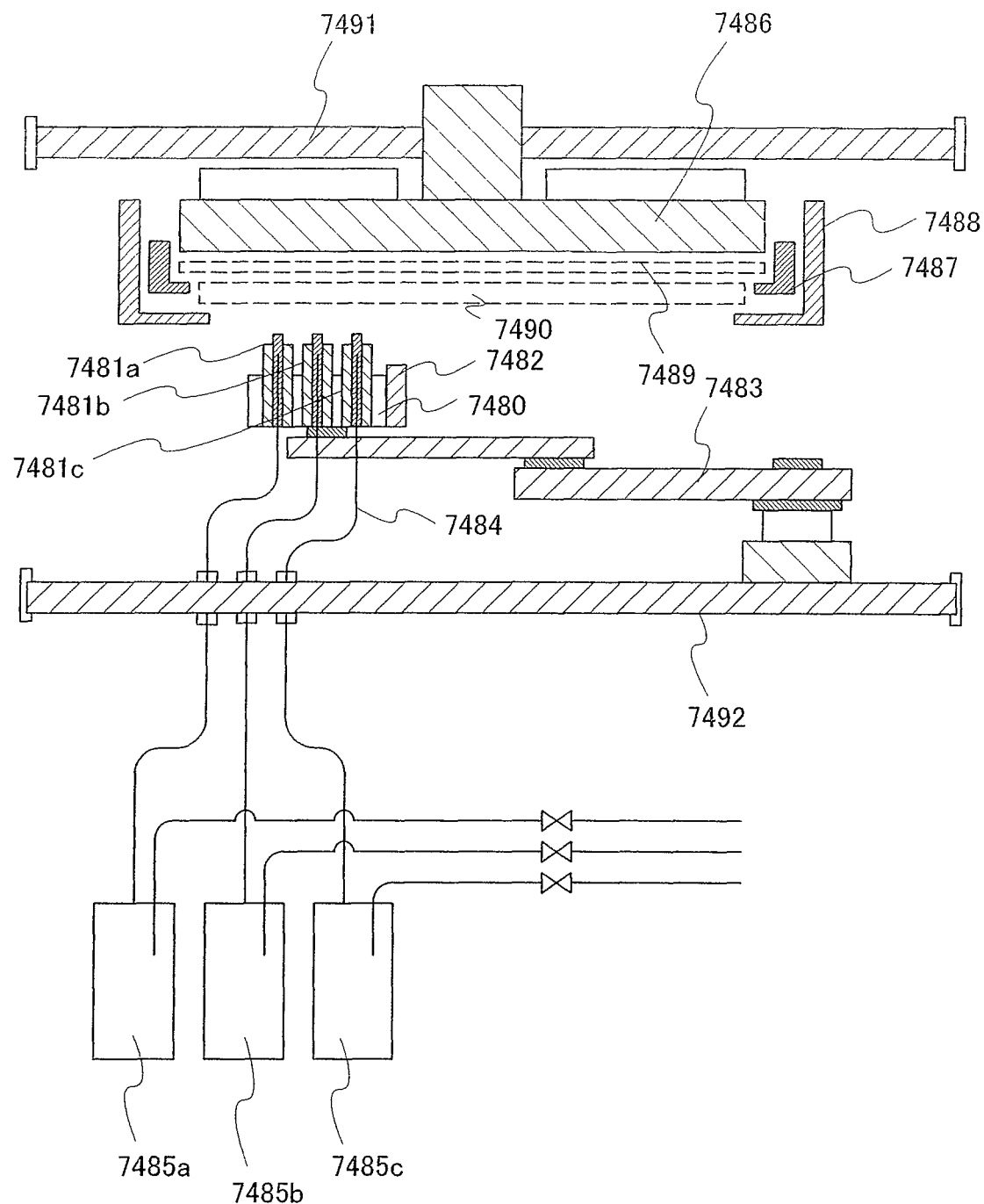
FIG. 74 illustrates Embodiment Mode 10.

FIG. 74 shows an internal structure of a deposition treatment chamber. The deposition treatment chamber is maintained in a reduced pressure state. In FIG. 74, a space interposed between a top plate 7491 and a bottom plate 7492 is an inner chamber, which is maintained In a reduced pressure state.

One or a plurality of evaporation sources are provided in the treatment chamber. This is because a plurality of evaporation sources are preferably provided when a plurality of layers having different compositions are formed or when different materials are co-evaporated. In FIG. 74, evaporation sources 7481a, 7481b, and 7481c are attached to an evaporation source holder 7480. The evaporation source holder 7480 is held by a multi-joint arm 7483. The multi-joint arm 7483 allows the evaporation source holder 7480 to move within its movable range by stretching the joint. In addition, the evaporation source holder 7480 may be provided with a distance sensor 7482 to monitor a distance between the evaporation sources 7481a to 7481c and a substrate 7489, so that an optimum distance for evaporation may be controlled. In this case, the multi-joint arm may be capable of moving toward upper and lower directions (Z direction) as well.

The substrate 7489 is fixed by using a substrate stage 7486 and a substrate chuck 7487 together. The substrate stage 7486 may have a structure where a heater is incorporated so that the substrate 7489 can be heated. The substrate 7489 is fixed to the substrate stage 7486 and transferred by the substrate chuck 7487. At the time of evaporation, a shadow mask 7490 provided with an opening corresponding to a deposition pattern can be used if needed. In this case, the shadow mask 7490 is provided between the substrate 7489 and the evaporation sources 7481a to 7481c. The shadow mask 7490 is fixed to toe substrate 7489 in close contact with each other or with a certain interval therebetween by a mask chuck 7488. When an alignment of the shadow mask 7490 is needed, the alignment is performed by arranging a camera in the treatment chamber and providing the mask chuck 7488 with a positioning means which slightly moves in X-Y-θ directions.

The evaporation sources 7481a to 7483c include an evaporation material supply means which continuously supplies an evaporation material to the evaporation source, the evaporation material supply means includes material supply sources 7485a, 7485b, and 7485c, which are provided apart from the evaporation sources 7481a to 7481c, and a material supply pipe 7484 which connects therebetween. Typically, the material supply sources 7485a to 7485c are provided corresponding to the evaporation sources 7483a to 7481c. In FIG. 74, the material supply source 7485a corresponds to the evaporation source 7481a; the material supply source 7485b corresponds to the evaporation source 7481b; and the material supply source 7485c corresponds to the evaporation source 7481c.

As a method for supplying an evaporation material, an airflow transfer method, an aerosol method, or the like can be used. In an airflow transfer method, impalpable powder of an evaporation material is transferred in airflow to the evaporation sources 7481a to 7483c, by using an inert gas or the like, in an aerosol method, evaporation is performed while material liquid in which an evaporation material is dissolved or dispersed in a solvent is transferred and aerosolized by an atomizer, and the solvent in the aerosol is vaporized. In each case, the evaporation sources 7481a to 7481c are provided with a heating means, and a film is formed over the substrate 7489 by vaporizing the evaporation material transferred thereto, in FIG. 74, the material supply pipe 7484 can be bent flexibly and is formed of a thin pipe which has enough rigidity not to be transformed even under reduced pressure.

When an airflow transfer method or an aerosol method is used, deposition may be performed under atmospheric pressure or lower pressure in the deposition treatment chamber, and preferably performed under a reduced pressure of 133 to 13300 Pa. An inert gas such as helium, argon, neon, krypton, xenon, or nitrogen fills the deposition treatment chamber or is supplied (and exhausted at the same time) to the deposition treatment chamber, so that the pressure can be adjusted. In addition, an oxidizing atmosphere may be employed by introducing a gas such as oxygen or nitrous oxide in the deposition treatment chamber where an oxide film is termed. Further, a reducing atmosphere may be employed by introducing a gas such as hydrogen in the deposition treatment chamber where an organic material is deposited.

As another method for supplying an evaporation material, a screw may be provided in the material supply pipe 7484 to continuously push the evaporation material toward the evaporation source.

With this evaporation device, a film can be formed continuously with high uniformity even in the case of a large display panel. Further, since it is not necessary to supply an evaporation material to the evaporation source every time the evaporation material is run out in the evaporation source, throughput can be improved.

When the structure of each display device shown in the aforementioned embodiment modes is used for driving a pixel, deterioration in characteristics of a transistor can be suppressed. Thus, malfunction of a shift register due to deterioration In characteristics of the transistor can be prevented. Further, a display defect of the pixel due to malfunction of the shift register can be suppressed.

Note that each pixel structure shown in this embodiment mode can be implemented in free combination with the structure of each display device shown in other embodiment modes in this specification. Further, the pixel structures shown in this embodiment mode cart be implemented in free combination with each other.

Embodiment Mode 11

In this embodiment mode, a signal line driver circuit included in each display device shown in Embodiment Modes 1 to 8 is described.

Figure 56:
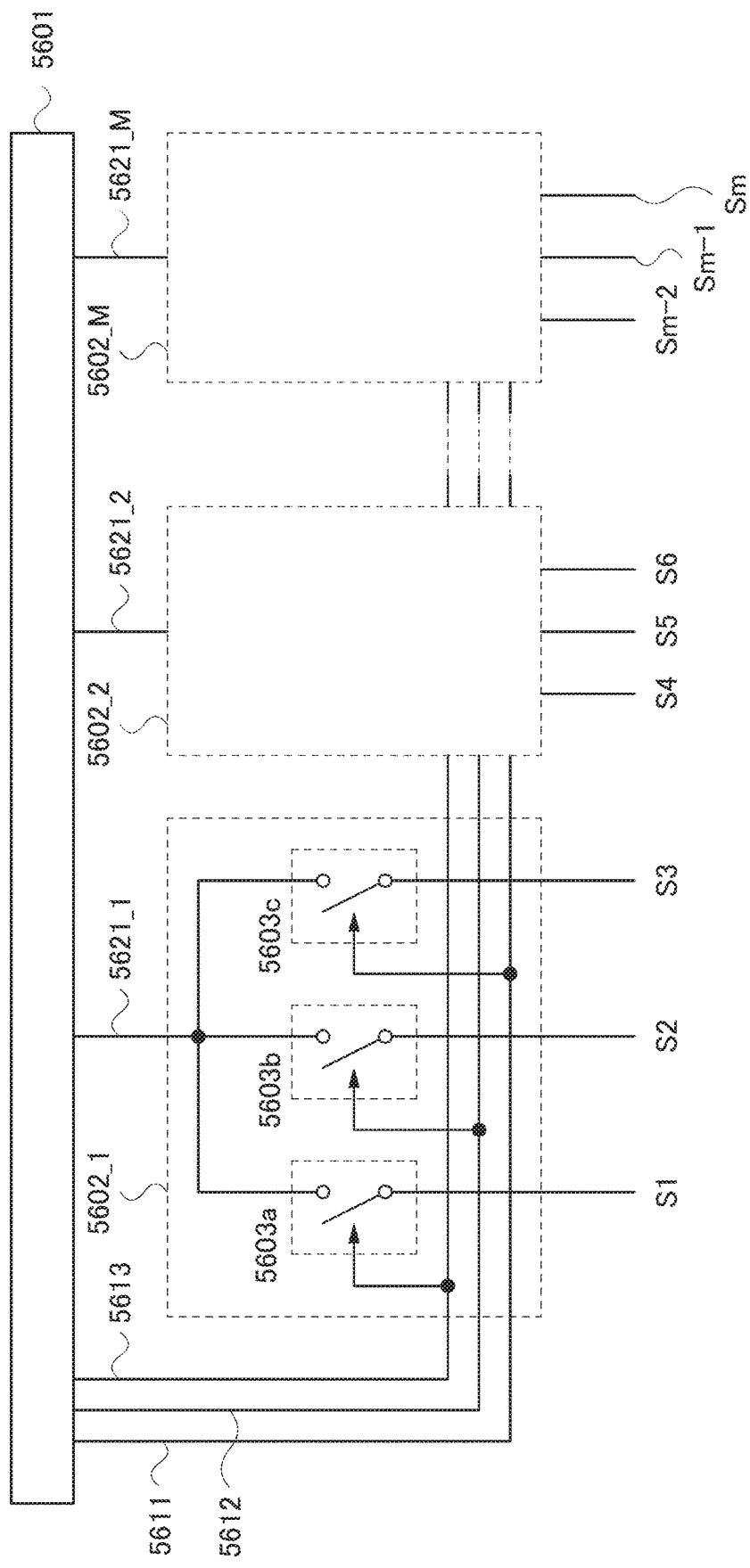
FIG. 56 illustrates Embodiment Mode 11.

A signal line driver circuit in FIG. 56 is described. The signal line driver circuit in FIG. 56 includes a driver IC 5601, switch groups 3602_1 to 5602_M, a first wiring 5611, a second wiring 5612, a third wiring 5613, and wirings 5621_1 to 5621_M. Each of the switch groups 5602_1 to 5602_M includes a first switch 5603a, a second switch 5603b, and a third switch 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, the third wiring 5613, and each one of the wirings 5621_1 to 5621_M corresponding to each of the switch groups 5602_1 to 5602_M. Each of the wirings 5621_1 to 5621_M is connected to three signal lines through the first switch 5603a, the second switch 5603b, and the third switch 5603c. For example, the wiring 5621_J in the J-th column (one of the wirings 5621_1 to 5621_M) is connected to a signal line Sj−1, a signal line Sj, and a signal line Sj+1 through the first switch 5603a, the second switch 5603b, and the third switch 5603c included in the switch group 5602_J.

Note that the driver IC 5601 is preferably formed using a single crystalline substrate or a glass substrate using a polycrystalline semiconductor. The switch groups 5602_1 to 5602_M are preferably formed over the same substrate as each pixel portion shown in Embodiment Modes 1 to 8. Therefore, the driver IC 5601 and the switch groups 5602_1 to 5602_M are preferably connected through an FPC or the like.

Figure 57:
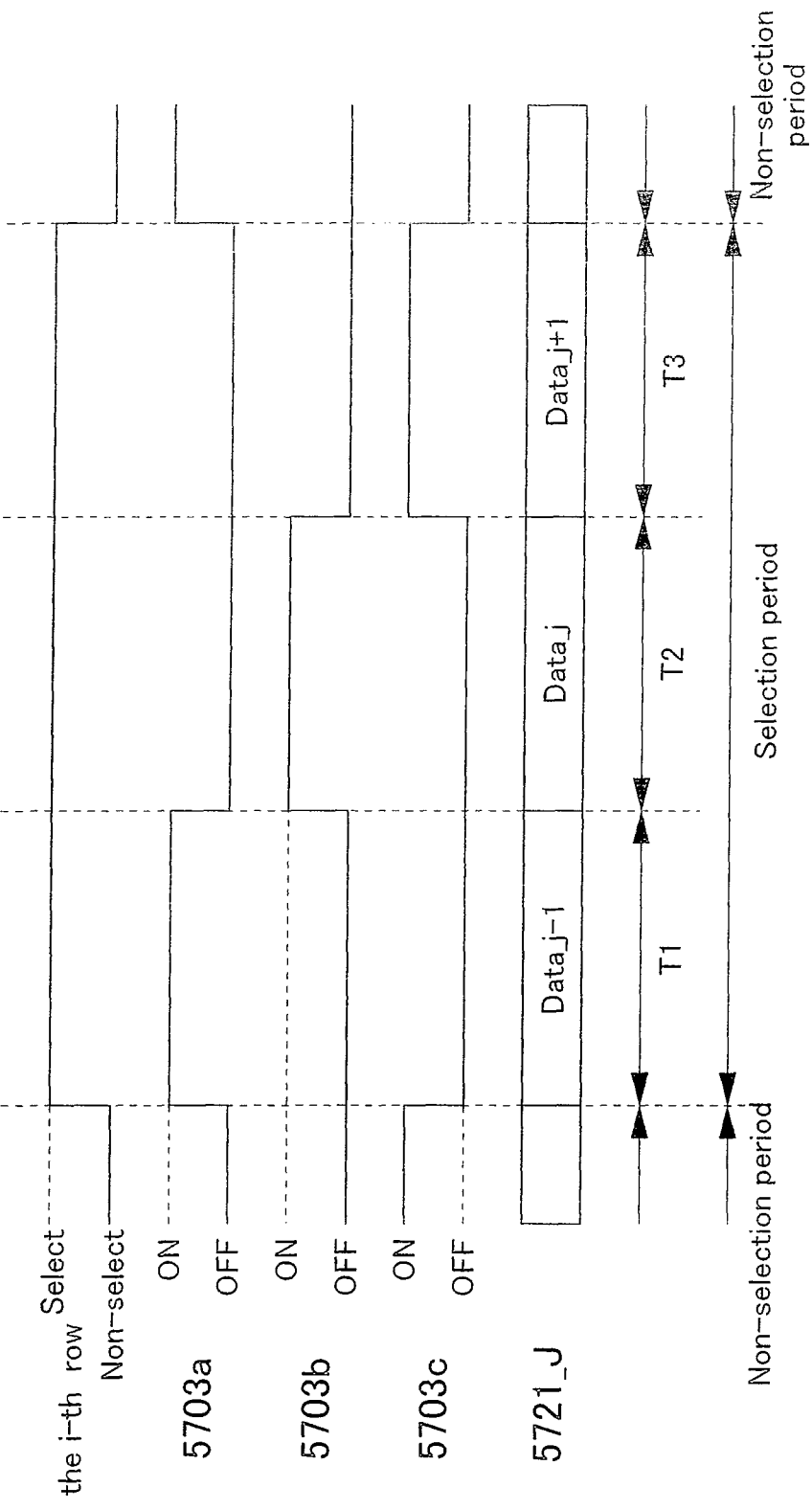
FIG. 57 illustrates Embodiment Mode 11.

Next, operation of the signal line driver circuit in FIG. 56 is described with reference to a timing chart of FIG. 57. The timing chart of FIG. 57 show's the case where a scan line Gi in the i-th row is selected. A selection period of the scan line Gi in the i-th row is divided into a first sub-selection period T1, a second sub-selection period T2, and a third sub-selection period T3. Note that the signal line driver circuit in FIG. 5b operates similarly to FIG. 57 even when a scan line in another row is selected.

Signals are input to the first wiring 5611, the second wiring 5612, and the third wiring 5613. On/off of the first switch 5603a is controlled by the signal input to the first wiring 5611. On/off of the second switch 5603b is controlled by the signal input to the second wiring 5612. On/off of the third switch 5603c is controlled by the signal input to the third wiring 5613.

Note that the timing chart of FIG. 57 shows the case where the wiring 5621_J in the J-th column is connected to the signal line Sj−1 the signal line Sj, and the signal line Sj+1 through the first switch 5603a, the second switch 5603b, and the third switch 5603c.

The timing chart of FIG. 57 shows timing when the scan line Gi in the i-th row is selected, timing 5703a of on/off of the first switch 5603a, riming 5703b of on/off of the second switch 5603b, timing 5703c of on/off of the third switch 5603c, and a signal 5721_J input to the wiring 5621_J in the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 in input to the signal line Sj, and a video signal input to the wiring 5621_J in the third sub-selection period T3 is input to the signal fine Sj+1. In the first sub-selection period T1, the second sub-selection period 12, and the third sub-selection period T3, the video signals input to the wiring 5621_J are denoted by Dataj−1, Dataj, and Dataj+1.

As shown in FIG. 57, in the first sub-selection period T1, the first switch 5603a is turned on, and the second switch 5603b and the third switch 5603c am turned off. At this time, Dataj−1 input to the wiring 5621_J is input to the signal line Sj−1 through the first switch 5603a. In the second sub-selection period T2, the second switch 5603b is turned on, and the first switch 5603a and the third switch 5603c are turned off. At this time, Dataj input to the wiring 5621_J is input to the signal line Sj through the second switch 5603b. In the third sub-selection period T3, the third switch 5603c h fumed on, and the first switch 5603a and the second switch 5603b are turned off. At this time, Dataj+1 input to the wiring 5621_J is input to the signal line Sj+1 through the third switch 5603c.

As described above, in the signal line driver circuit of FIG. 56, one gate selection period is divided into three; thus, video signals can be input to three signal lines from one wiring 5621 in one gate selection period. Therefore, in the signal line driver circuit in FIG. 56, the number of connections in which the substrate provided with the driver IC 5601 and the substrate provided with the pixel portion are connected can be approximately one third of the number of signal lines. The number of connections is reduced to approximately one third of the number of signal lines; therefore, reliability, yield, and the like of the signal line driver circuit in FIG. 56 can be improved.

By applying the signal line driver circuit in this embodiment mode to each display device shown in Embodiment Modes 1 to 8, the number of connections in which the substrate provided with the pixel portion and an external substrate are connected can be further reduced. Therefore, reliability and yield of the display device in the invention can be improved.

Next, the case where N-channel transistors are used for the first switch 5603a, the second switch 5603b, and the third switch 5603c is described with reference to FIG. 59. Note that portions similar to FIG. 56 are denoted by the same reference numerals, and detailed description of the same portions and portions having similar functions is omitted.

A first transistor 5903a corresponds to the first switch 5603a. A second transistor 5903b corresponds to the second switch 5603b. A third transistor 5903c corresponds to the third switch 5603c.

For example, in the case of the switch group 5602_J, a first terminal of the first transistor 5903a is connected to the wiring 5621_J, a second terminal of the first transistor 5903a is connected to the signal line Sj−1, and a gate electrode of the first transistor 5903a is connected to the first wiring

5611. A first terminal of the second transistor 5903*b* is connected to the wiring 5621_J, a second terminal of the second transistor 5903*b* is connected to the signal line Sj, and a gate electrode of the second transistor 5903*b* is connected to the second wiring 5612. A first terminal of the third transistor 5903*c* is connected to the wiring 5621_J, a second terminal of the third transistor 5903*c* is connected to the signal line Sj+1, and a gate electrode of the third transistor 5903*c* is connected to the third wiring 5613.

Note that the first transistor 5903*a*, the second transistor 5903*b*, and the third transistor 5903*c* each function as a switching transistor. Further, each of the first transistor 5903*a*, the second transistor 5903*b*, and the third transistor 5903*c* is turned on when a signal input to each gate electrode is at an H level, and is turned off when a signal input to each gate electrode is at an L level.

When N-channel transistors are used for the first switch 5603*a*, the second switch 5603*b*, and the third switch 5603*c*, amorphous silicon can be used for a semiconductor layer of a transistor; thus, simplification of a manufacturing process, reduction in manufacturing cost, and improvement in yield can be realized. Further, a semiconductor device such as a large display panel can be formed. Even when polysilicon or single crystalline silicon is used for the semiconductor layer of the transistor, simplification of a manufacturing process can also be realized. Therefore, the signal line driver circuit in FIG. 59 is preferably applied to each display device shown in Embodiment Modes 1 to 4.

Figure 59:
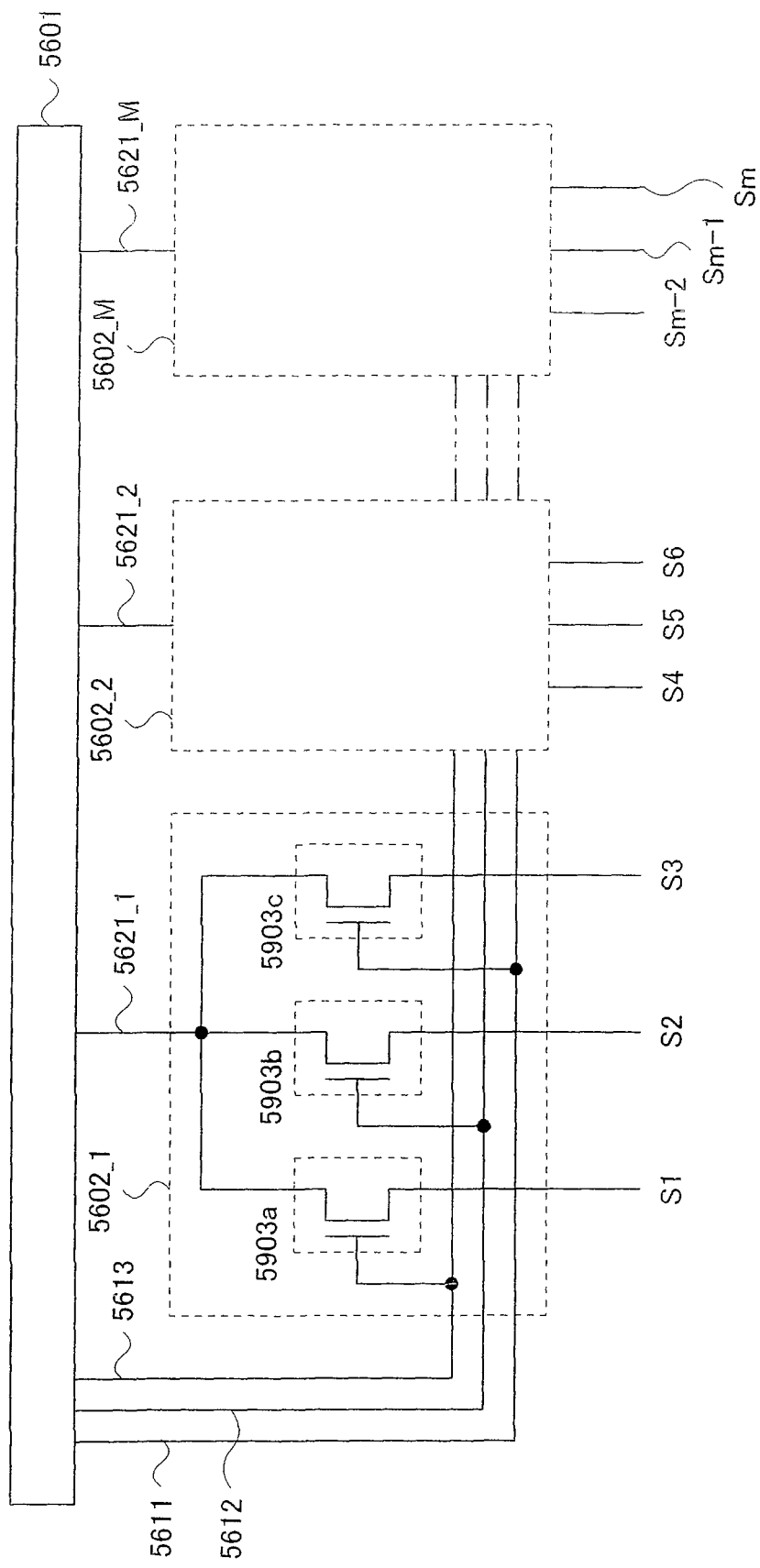
FIG. 59 illustrates Embodiment Mode 11.

In the signal line driver circuit in FIG. 59, N-channel transistors are used for the first transistor 5903*a*, the second transistor 5903*b*, and the third transistor 5903*c*; however, P-channel transistors may be used for the first transistor 5903*a*, the second transistor 5903*b*, and the third transistor 5903*c*. In the latter case, each transistor is turned on when a signal input to the gate electrode is at an L level, and is turned off when a signal input to the gate electrode is at an H level. When P-channel transistors are used for the first transistor 5903*a*, the second transistor 5903*b*, and the third transistor 5903*c*, the signal line driver circuit is preferably applied to each display device shown in Embodiment Modes 5 to 8.

Note that arrangement, the number, a driving method, and the like of a switch are not limited as long as one gate selection period is divided into a plurality of sub-selection periods and video signals are input to a plurality of signal lines from one wiring in each of the plurality of sub-selection periods as shown in FIG. 56. For example, when video signals are input to three or more signal lines from one wiring in each of three or more sub-selection periods, a switch and a wiring for controlling the switch may be added. Note that when one selection period is divided into four or more sub-selection periods, one sub-selection period becomes short. Therefore, one selection period is preferably divided into two or three sub-selection periods.

Figure 58:
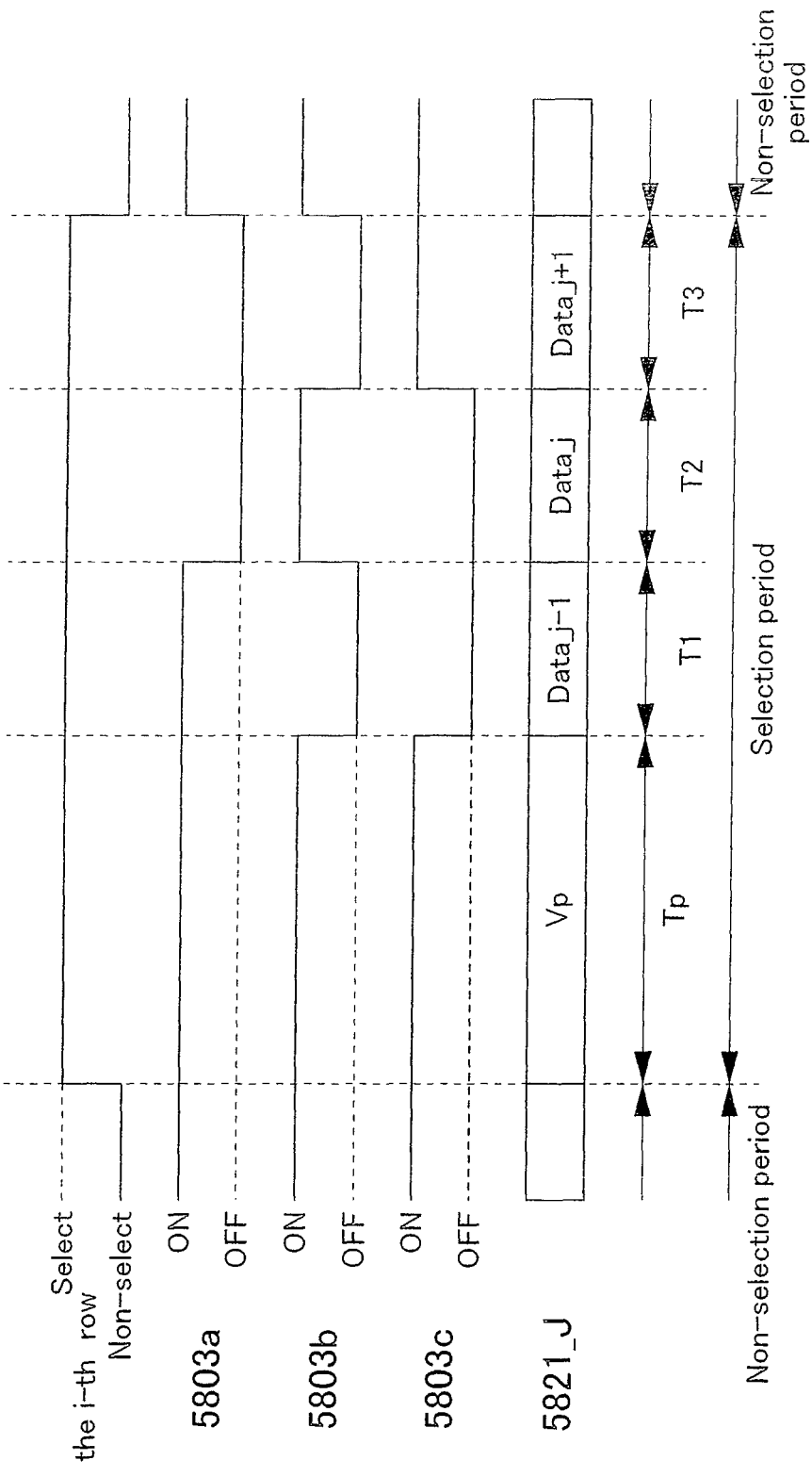
FIG. 58 illustrates Embodiment Mode 11.

For example, as shown in a timing chart of FIG. 58, one selection period may be divided into a precharge period Tp, the first sub-selection period T1, the second sub-selection period T2, and the third sub-selection period T3. The timing chart of FIG. 58 shows timing when the scan line Gi in the i-th row is selected, timing 5803*a* of on/off of the first switch 5603*a*, timing 5803*b* of on/off of the second switch 5603*b*, timing 5803*c* of on/off of the third switch 5603*c*, and a signal 5821_J input to the wiring 5621_J in the J-th column. As shown in FIG. 58, the first switch 5603*a*, the second switch 5603*b*, and the third switch 5603*c* are tuned on in the precharge period Tp. At this time, a precharge voltage Vp input to the wiring 5621_J is input to each of the signal line Sj−1, the signal line Sj, and the signal line Sj+1 through the first switch 5603*a*, the second switch 5603*b*, and the third switch 5603*c*. In the first sub-selection period T1, the first switch 5603*a* is turned on, and the second switch 5603*b* and the third switch 5603*c* are turned off. At this time, Dataj−1 input to the wiring 5621_J is input to the signal line Sj−1 through the first switch 5603*a*. In the second sub-selection period T2, the second switch 5603*b* is turned on, and the first switch 5603*a* and the third switch 5603*c* are turned off. At this time, Dataj input to the wiring 5621_J is input to the signal line Sj through the second switch 5603*b*. In the third sub-selection period T3, the third switch 5603*c* is turned on, and the first switch 5603*a* and the second switch 5603*b* are turned off. At this time, Dataj+1 input to the wiring 5621_J is input to the signal line Sj+1 through the third switch 5603*c*.

As described above, in the signal line driver circuit of FIG. 56, which operates in accordance with the timing chart of FIG. 58, since a precharge select ion period is provided before a sub-selection period, a signal line can be precharged; thus, a video signal can be written to a pixel with high speed. Further, since the signal line is precharged, the pixel can held a correct video signal it is needless to say that in the signal line driver circuit of FIG. 56, which operates in accordance with the timing chart of FIG. 58, the number of connections in which the substrate provided with the driver IC 5601 and the substrate provided with the pixel portion are connected can be approximately one third of the number of signal lines, similarly to the signal line driver circuit in FIG. 56, which operates in accordance with the timing chart of FIG. 57. Accordingly, reliability, yield, and the like can be improved. Note that portions similar to FIG. 57 are denoted by the same reference numerals, and detailed description of the same portions and portions having similar functions is omitted.

Figure 60:
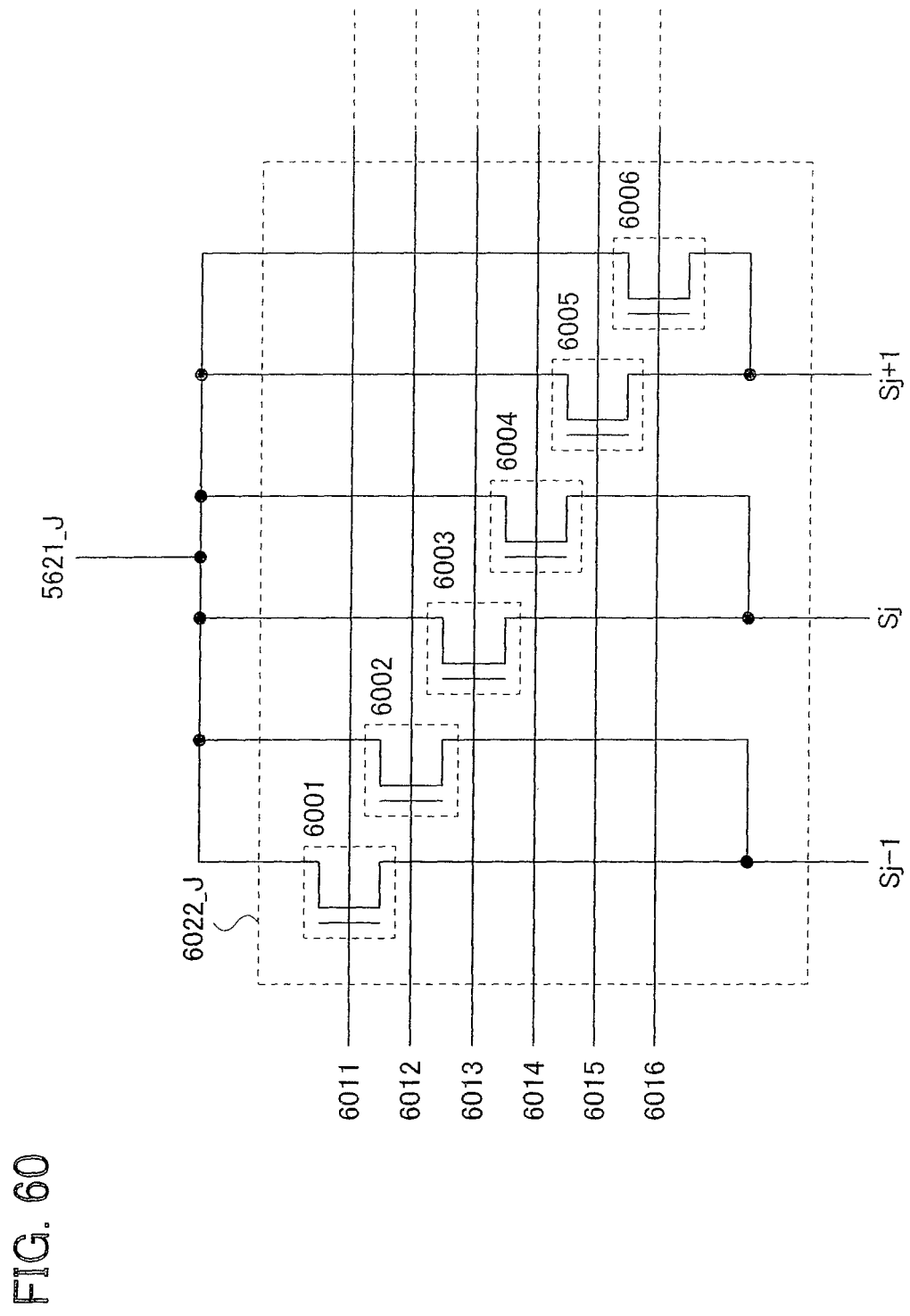
FIG. 60 illustrates Embodiment Mode 11.

Also in FIG. 60, one gate, selection period can be divided into a plurality of sub-selection periods and video signals can be input to a plurality of signal lines from one wiring in each of the plurality of sub-selection periods as shown in FIG. 56. Note that FIG. 60 shows only a switch group 6022_J in the J-th column in a signal line driver circuit. The switch group 6022_J includes a first transistor 6001, a second transistor 6002, a third transistor 6005, a fourth transistor 6004, a fifth transistor 6005, and a sixth transistor 6006. The first transistor 6001, the second transistor 6002, the third transistor 6003, the fourth transistor 6004, the fifth transistor 6005, and the sixth transistor 6006 are N-channel transistors. The switch group 6022_J is connected to a first wiring 6011, a second wiring 6012, a third wiring 6013, a fourth wiring 6014, a fifth wiring 6015, a sixth wiring 6016, the wiring 5621_J, the signal line Sj−1, the signal line Sj, and the signal line Sj+1.

A first terminal of the first transistor 6001 is connected to the wiring 5621_J, a second terminal of the first transistor 6001 is connected to the signal line Sj−1, and a gate terminal of the first transistor 6001 is connected to the first wiring 6011. A first terminal of the second transistor 6002 is connected to the wiring 5621_J, a second terminal of the second transistor 6002 is connected to the signal line Sj−1, and a gate terminal of the second transistor 6002 is connected to the second wiring 6012. A first terminal of the third transistor 6003 is connected to the wiring 5621_J, a second terminal of the third transistor 6003 is connected to the signal line Sj, and a gate terminal of the third transistor 6003 is connected to the third wiring 6013. A first terminal of the fourth transistor 6004 is connected to the wiring 5621_J, a second terminal of the fourth transistor 6004 is connected to the signal line Sj, and a gate terminal of the fourth transistor 6004 is connected to the fourth wiring 6014. A first terminal of the fifth transistor 6005 is connected to the wiring 5621_J, a second terminal of the fifth transistor 6005 is connected to the signal line Sj+1, and a gate terminal of the fifth transistor 6005 is connected to the fifth wiring 6015. A first terminal of the sixth transistor 6006 is connected to the wiring 5621_J, a second terminal of the sixth transistor 6006 is connected to the signal line Sj+1; and a gate terminal of the sixth transistor 6006 is connected to the sixth wiring 6016.

Note that the first transistor 6001, the second transistor 6002, the third transistor 6003, the fourth transistor 6004, the fifth transistor 6005, and the sixth transistor 6006 each function as a switching transistor. Further, each of first transistor 6001, the second transistor 6002, the third transistor 6003, the fourth transistor 6004, the fifth transistor 6005, and the sixth transistor 6006 is turned on when a signal input to each gate electrode is at an H level, and is turned off when a signal input to each gate electrode is at an L level.

Note that the first wiring 6011 and the second wiring 6012 correspond to a first wiring 5911 in FIG. 59. The third wiring 6013 and the fourth wiring 6014 correspond to a second wiring 5912 in FIG. 59. The fifth wiring 6015 and the sixth wiring 6016 correspond to a third wiring 5913 in FIG. 59. The first transistor 6001 and the second transistor 6002 correspond to the first transistor 5903a in FIG. 59. The third transistor 6003 and the fourth transistor 6004 correspond to the second transistor 5903b in FIG. 59. The fifth transistor 6005 and the sixth transistor 6006 correspond to the third transistor 5903c in FIG. 59.

In FIG. 60, in the first sub-selection period T1 shown in FIG. 57, one of the first transistor 6001 or the second transistor 6002 is turned on. In the second sub selection period T2, one of the third transistor 6003 or the fourth transistor 6004 is turned on. In the third sub-selection period T3, one of the fifth transistor 6005 or the sixth transistor 6006 is turned on. Further, in the precharge period Tp shown in FIG. 58, either the first transistor 6001, the third transistor 6003, and the fifth transistor 6005; or the second transistor 6002, the fourth transistor 6004, and the sixth transistor 6006 are turned on.

Thus, in FIG. 60, since the on time of each transistor can be reduced, deterioration in characteristics of the transistor can be suppressed. It is because in the first sub-selection period T1 shown in FIG. 57, for example, the video signal can be input to the signal line Sj−1 when one of the first transistor 6001 or the second transistor 6002 is turned on. Note that in the first sub-selection period T1 shown in FIG. 57, for example, when both the first transistor 6001 and the second transistor 6002 are fumed on at the same time, the video signal can be input to the signal line Sj−1 with high speed;

Note that when N-channel transistors are used for the first transistor 6001, the third transistor 6003, the fifth transistor 6005, the second transistor 6002, the fourth transistor 6004, and the sixth transistor 6006, amorphous silicon can be used for semiconductor layers of the transistors. Therefore, simplification of a manufacturing process, reduction in manufacturing cost, and improvement in yield can be realized. Further, a semiconductor device such as a large display panel can be formed. Even when polysilicon or single crystalline silicon is used for the semiconductor layer of the transistor, simplification of a manufacturing process can also be realized. Therefore, the signal line driver circuit in FIG. 60 is preferably applied to each display device shown in Embodiment Modes 1 to 4.

Note that two transistors are connected in parallel between the wiring 5621 and the signal line in FIG. 60; however, the invention is not limited thereto, and three or more transistors may be connected in parallel between the wiring 5621 and the signal line. Thus, deterioration in characteristics of each transistor ran be further suppressed.

Note that each signal line driver circuit shown in this embodiment mode cat) be implemented in free combination with the structure of each display device shown in other embodiment modes in this specification. Further, the structures of the signal line driver circuit shown in this embodiment mode can be implemented in free combination with each other.

Embodiment Mode 12

In this embodiment mode, a structure for preventing a defect due to electrostatic discharge damage in the display device shown in Embodiment Modes 1 to 8 is described.

Note that electrostatic discharge damage means instant discharge through an input/output terminal of a semiconductor device when positive or negative charges stored in the human body or the object touch the semiconductor device, and damage caused by supplying a large current flowing within the semiconductor device.

FIG. 61A shows a structure for preventing electrostatic discharge damage caused in a scan line by a protective diode. FIG. 61A shows a structure where the protective diode is provided between a wiring 6111 and the scan line. Although not shown, a plurality of pixels are connected to the scan line Gi in the i-th row. Note that a transistor 6101 is used as the protective diode. The transistor 6101 is an N-channel transistor; however, a P-channel transistor may be used, and polarity of the transistor 6101 may be the same as that of a transistor included in a scan line driver circuit or a pixel.

Note that one protective diode is arranged here; however, s plurality of protective diodes may be arranged in series, in parallel, or in series-parallel.

A first terminal of the transistor 6101 is connected to the scan line Gi in the i-th row, a second terminal of the transistor 6101 is connected to the wiring 6111, and a gate terminal of the transistor 6101 is connected to the scan line Gi in the i-th row.

Operation of FIG. 61A is described. A certain potential is input to the wiring 6111, which is lower than an L level of a signal input to the scan line Gi in the i-th row. When positive or negative charges are not discharged to the scan line Gi in the i-th row, a potential of the scan line Gi in the i-th row is at an H level or an L level, so that the transistor 6101 is turned off. On the other hand, when negative charges are discharged to the scan line Gi in the i-th row, the potential of the scan line Gi in the i-th row decreases instantaneously. At this time, the potential of the scan line Gi in the i-th row is lower than a value obtained by subtracting a threshold voltage of the transistor 6101 from a potential of the wiring 6111, so that the transistor 6101 is turned on, and a current flows to the wiring 6111 through the transistor 6101. Therefore, the structure shown in FIG. 61A can prevent a large current from flowing to the pixel, so that electrostatic discharge damage of the pixel can be prevented.

FIG. 61B shows a structure for preventing electrostatic discharge damage when positive charges are discharged to the scan line Gi in the i-th row. A transistor 6102 functioning as a protective diode is provided between a scan line and a wiring 6112. Note that one protective diode is arranged here; however, a plurality of protective diodes may be arranged in series, in parallel, or in series-parallel. The transistor 6102 is an N-channel transistor; however, a P-channel transistor may be used, and polarity of the transistor 6102 may be the same as that of the transistor included in the scan line driver circuit or the pixel. A first terminal of the transistor 6102 is connected to the scan line Gi in the i-th row, a second terminal of the transistor 6502 is connected to the wiring 6112, and a gate terminal of the transistor 6102 is connected to the wiring 6112. Note that a potential higher than an H level of the signal input to the scan line Gi in the i-th row is input to the wiring 6112. Therefore, when charges are not discharged to the scan line Gi in the i-th rows the transistor 6102 is fumed off. On the other hand, when positive charges are discharged to the scan line Gi in the i-th row, the potential of the scan line Gi in the i-th row increases instantaneously. At this time, the potential of the scan line Gi in the i-th row is higher than the sum of a potential of the wiring 6112 and a threshold voltage of the transistor 6102, so that the transistor 6102 is turned on, and a current flows to the wiring 6112 through the transistor 6102. Therefore, the structure shown in FIG. 61B can prevent a large current from flowing to the pixel, so that electrostatic discharge damage of the pixel can be prevented.

As shown in FIG. 61C with a structure which combines FIGS. 61A and 61B, electrostatic discharge damage of the pixel can be prevented when positive or negative charges are discharged to the scan line Gi in the i-th row. Note that portions similar to FIGS. 61A and 61B are denoted by the same reference numerals, and detailed description of the same portions and portions having similar functions is omitted.

Figure 62A:
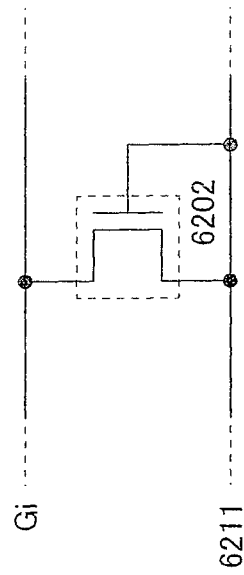
FIGS. 62A and 62B illustrate Embodiment Mode 12.
Figure 62B:
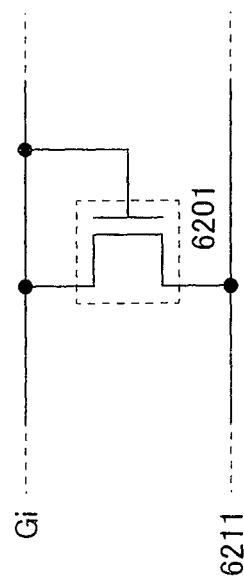

FIG. 62A shows a structure where a transistor 6201 functioning as a protective diode is connected between a scan line and a storage capacitor line. Note that one protective diode is arranged here; however, a plurality of protective diodes may be arranged in series, in parallel, or in series-parallel. The transistor 6201 is an N-channel transistor; however, a P-channel transistor may be used, and polarity of the transistor 6201 may be the same as that of the transistor included in the scan line driver circuit or the pixel. A wiring 6211 functions as a storage capacitor line. A first terminal of the transistor 6201 is connected to the scan line Gi in the i-th row, a second terminal of the transistor 6201 is connected to the wiring 6211, and a gate terminal of the transistor 6201 is connected to the scan line Gi in the i-th row. Note that a potential lower than an L level of the signal input to the scan line Gi in the i-th row is input to the wiring 6211. Therefore, when charges are not discharged to the scan line Gi in the i-th row, the transistor 6210 is turned off. On the other hand, when negative charges are discharged to the scan line Gi in the i-th row, the potential of the scan line Gi in the i-th row decreases instantaneously. At this time, the potential of the scan line Gi in the i-th row is lower than a value obtained by subtracting a threshold voltage of the transistor 6201 from a potential of the wiring 6211, so that the transistor 6201 is turned on, and a current flows to the wiring 6211 through the transistor 6201. Therefore, the structure shown in FIG. 62A can prevent a large current from flowing to the pixel, so that electrostatic discharge damage of the pixel can be prevented. Further, since the storage capacitor line is utilized for discharging charges in the structure shown in FIG. 62A, a wiring is not required to be added, FIG. 62B shows a structure for preventing electrostatic discharge damage when positive charges are discharged to the scan line Gi in the i-th row. Here, a potential higher than an H level of the signal input to the scan line Gi in the i-th row is input to the wiring 6211. Therefore, when charges are not discharged to the scan line Gi in the i-th row, the transistor 6202 is turned off. On the other hand, when positive charges are discharged to the scan line Gi in the i-th row, the potential of the scan line Gi in the j-th row increases instantaneously. At this time, the potential of the scan line Gi in the i-th row is higher than the sum of a potential of the wiring 6211 and a threshold voltage of the transistor 6202, so that the transistor 6202 is turned on, and a current flows to the wiring 6211 through the transistor 6202. Therefore, the structure shown in FIG. 62B can prevent a large current from flowing to the pixel, so that electrostatic discharge damage of the pixel can be prevented. Further, since the storage capacitor line is utilized for discharging charges in the structure shown in FIG. 62B, a wiring is not needed to be added. Note that portions similar to FIG. 62A are denoted by the same reference numerals, and detailed description of the same portions and portions having similar functions is omitted.

Next, FIG. 64A shows a structure for preventing electrostatic discharge damage caused in a signal line by a protective diode. FIG. 64A shows a structure where the protective diode is provided between a wiring 6411 and the signal line. Although not shown, a plurality of pixels are connected to the signal line Sj in the j-th column. A transistor 6401 is used as the protective diode. Note that the transistor 6401 is an N-channel transistor; however, a P channel transistor may be used, and polarity of the transistor 6401 may be the same as that of a transistor included in a signal line driver circuit or the pixel.

Note that one protective diode is arranged here; however, a plurality of protective diodes may be arranged in series, in parallel, or in series-parallel.

A first terminal of the transistor 6401 is connected to the signal line Sj in the j-th column, a second terminal of the transistor 6401 is connected to the wiring 6411, and a gate terminal of the transistor 6401 is connected to the signal line Sj in the j-th column.

Operation of FIG. 64A is described. A certain potential is input to the wiring 6411, which is lower than the smallest value of a video signal input to the signal line Sj in the j-th column. When positive or negative charges are not discharged to the signal line Sj in the j-th column, a potential of the signal line Sj in the j-th column is the same as the video signal, so that the transistor 6401 is turned off. On the other hand, when negative charges are discharged to the signal line Sj in the j-th column, the potential of the signal line Sj in the j-th column decreases instantaneously. At this rime, the potential of the signal line Sj in the j-th column is lower than a value obtained by subtracting a threshold voltage of the transistor 6401 from a potential of the wiring 6411, so that the transistor 6401 in turned on, and a current flows to the wiring 6411 through the transistor 6401. Therefore, the structure shown in FIG. 64A can prevent a large current from flowing to the pixel, so that electrostatic discharge damage of the pixel can be prevented.

FIG. 64B shows a structure for preventing electrostatic discharge damage when positive charges are discharged to the signal line Sj in the j-th column. A transistor 6402 functioning as a protective diode is provided between the signal line and a wiring 6412. Note that one protective diode is arranged here; however, a plurality of protective diodes may be arranged in series, in parallel, or in series-parallel. The transistor 6402 is an N-channel transistor; however, a P-channel transistor may be used, and polarity of the transistor 6402 may be the same as that of the transistor included in the signal line driver circuit or the pixel A first terminal of the transistor 6402 is connected to the signal line Sj in the j-th column, a second terminal of the transistor 6402 is connected to the wiring 6412, and a gate terminal of the transistor 6402 is connected to the wiring 6412. Note that a potential higher than the largest value of a video signal input to the signal line Sj In the j-th column is input to the wiring 6412. Therefore, when charges are not discharged to the signal line Sj in the j-th column, the transistor 6402 is turned off. On the other hand, when positive charges are discharged to the signal line Sj in the j-th column, the potential of the signal line Sj In the j-th column increases instantaneously. At this time, the potential of the signal line Sj in the j-th column is higher than the sum of a potential of the wiring 6412 and a threshold voltage of the transistor 6402, so that the transistor 6402 is turned, on, and a current flows to the wiring 6412 through the transistor 6402. Therefore, the structure shown in FIG. 64B can prevent a large current from flowing to the pixel, so that electrostatic discharge damage of the pixel can be prevented.

As shown in FIG. 64C, with a structure which combines FIGS. 64A and 64B, electrostatic discharge damage of the pixel can be prevented when positive or negative charges are discharged to the signal line Sj in the j-th column. Note that portions similar to FIGS. 64A and 64B are denoted by the same reference numerals, and detailed description of the same portions and portions having similar functions is omitted.

In this embodiment mode, the structures for preventing electrostatic discharge damage of the pixel connected to the scan line and the signal line are described. However, the structure in this embodiment mode is not only used for preventing electrostatic discharge damage of the pixel connected to the scan line and the signal line. For example, when this embodiment mode is used for the wiring to which a signal or a potential is input, connected to the scan line driver circuit and the signal line driver circuit shown in Embodiment Modes 1 to 8, electrostatic discharge damage of the scan line driver circuit and the signal line driver circuit can be prevented.

Note that each display device shown in this embodiment mode can be implemented in free combination with the structure of each display device shown m other embodiment modes in this specification. Further, the structures of the display device shown in this embodiment mode can be implemented in free combination with each other.

Embodiment Mode 13

In this embodiment mode, another structure of a display device which can fee applied to each display device shown in Embodiment Modes 1 to 8 is described.

Figure 63B:
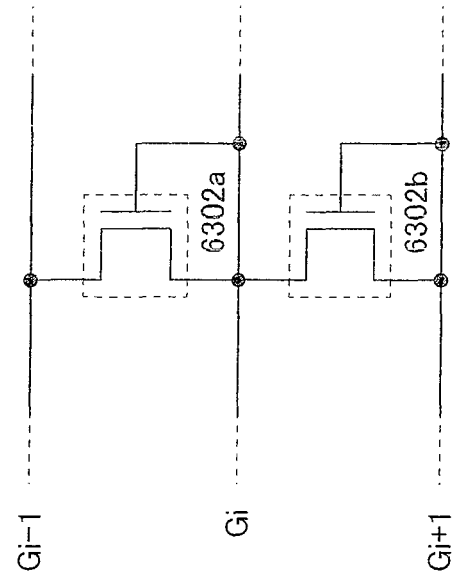
FIGS. 63A to 63C illustrate Embodiment Mode 13.
Figure 63A:
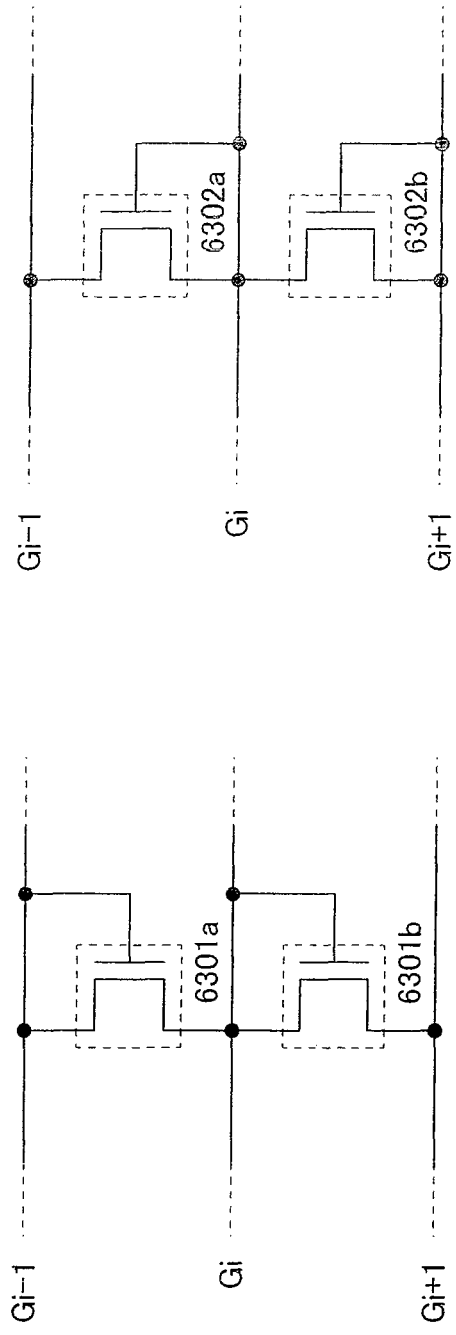

FIG. 63A shows a structure where a diode-connected transistor is provided between a scan Hue and another scan line. FIG. 63A shows a structure where a diode-connected transistor 6301a is provided between the scan line Gi−1 in the (i−1)th row and the scan line Gi in i-th row, and a diode-connected transistor 6301b is provided between the scan line Gi in i-th row, and the scan line Gi+1 in the (i+1)th row. Note that the transistors 6301a and 6301b are N-channel transistors; however, P-channel transistors may be used, and polarity of the transistors 6301a and 6301b may be the same as that of a transistor included in a scan line driver circuit or a pixel.

Note that in FIG. 63A, the scan line Gi−1 in the (i−1)th row, the scan line Gi in i-th row, and the scan line Gi+1 in the (i+1)th row are typically shown, and a diode-connected transistor is similarly provided between other scan lines.

A first terminal of the transistor 6301a is connected to the scan line Gi in i-th row, a second terminal of the transistor 6301a is connected to the scan line Gi−1 in the (i−1)th row, and a gate terminal of the transistor 6301a is connected to the scan line Gi−1 in the (i−1)th row. A first, terminal of the transistor 6301b is connected to the scan line Gi+1 in (i+1)th row, a second terminal of the transistor 6301b is connected to the scan line Gi in the i-th row, and a gate terminal of the transistor 6301b is connected to the scan line Gi in the i-th row.

Operation of FIG. 63A is described. In each scan line driver circuit shown in Embodiment Modes 1 to 4, the scan line Gi−1 in the (i−1)th row, the scan line Gi in i-th row, and the scan line Gi+1 in the (i+1)th row maintain at an L level in the non-selection period. Therefore, the transistors 6301a and 6301b are turned off. However, when the potential of the scan line Gi in i-th row is increased due to noise or the like, for example, a pixel is selected by the scan line Gi in i-th row and a wrong video signal is written to the pixel. Accordingly, by providing the diode-connected transistor between the scan lines as shown in FIG. 63A, writing of a wrong video signal to the pixel can be prevented. It is because when the potential of the scan line Gi in i-th row is increased to more than the sum of a potential of the scan line Gi−1 in the (i−1)th row and a threshold voltage of the transistor 6301a, the transistor 6301a is tinned on and the potential of the scan line Gi in t-th row is decreased; thus, a pixel is not selected by the scan line Gi in i-th row.

The structure of FIG. 63A is particularly advantageous when a scan line driver circuit and a pixel portion are formed over the same substrate, since in the scan line driver circuit including only N channel transistors or only P-channel transistors, a scan line is sometimes in a floating state and noise is easily caused in the scan line.

FIG. 63B shows a structure where a direction of a diode-connected transistor provided between the scan lines is reversed to that in FIG. 63A. Note that transistors 6302a and 6302b are N-channel transistors; however, P-channel transistors may be used, and polarity of the transistors 6302a and 6302b may be the same as that of the transistor included in the scan line driver circuit or the pixel. In FIG. 63B, a first terminal of the transistor 6302a is connected to the scan line Gi in i-th row a second terminal of the transistor 6302a is connected to the scan line Gi−1 in the (i−1)th row, and a gate terminal of the transistor 6302a is connected to the scan line Gi in i-th row. A first terminal of the transistor 6302b is connected to the scan line Gi+1 in (i+1)th row, a second terminal of the transistor 6302b is connected to the scan line Gi in the i-th row, and a gate terminal of the transistor 6302b is connected to the scan line Gi+1 in (i+1)th row. In FIG. 63B, similarly to FIG. 64A, when the potential of the scan line Gi in the i-th row is increased to more than the sum of the potential of the scan line Gi+1 in (i+1)th row and a threshold voltage of the transistor 6302b; the transistor 6302b is turned on and the potential of the scan line Gi in the i-th row is decreased. Thus, a pixel is not selected by the scan line Gi in the i-th row, and writing of a wrong video signal to the pixel can be prevented.

Figure 63C:
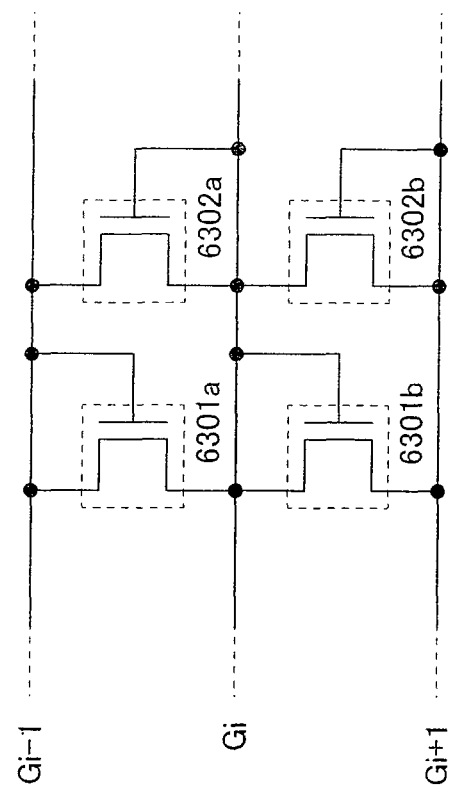

As shown In FIG. 63C, with a structure which combines FIGS. 63A and 63B, even when the potential of the scan line Gi in the i-th row is increased, the transistors 6301a and 6301b are tuned on, so that the potential of the scan line Gi in the i-th row is decreased. Note that in FIG. 63C, since a current flows through two transistors, larger noise can be removed. Note that portions similar to FIGS. 63A and 63B are denoted by the same reference numerals, and detailed description of the same portions and portions having similar functions is omitted.

Note that as shown in FIGS. 62A and 62B, when a diode connected transistor is provided between the scan line and the storage capacitor line, effects similar to FIGS. 63A, 63B, and 63C can be obtained.

Note that each display device shown in this embodiment mode can be implemented in tree combination with the structure of each display device shown in other embodiment modes in this specification. Further, the structures in the display device shown in this embodiment mode can be implemented in free combination with each other.

Embodiment Mode 14

In this embodiment mode, a structure of a display panel including the pixel structure shown in the aforementioned embodiment modes is described with reference to FIGS. 100A and 100B.

FIG. 100A is a top plan view showing a display panel and FIG. 100B is a cross-sectional view along A-A' of FIG. 100A. The display panel includes a signal control circuit 10001, a pixel portion 10002, a first gate driver 10003, and a second gate driver 10006, which are shown by dotted lines. The display panel also includes a sealing substrate 10004 and a sealing material 10005. A portion surrounded by the sealing material 10005 is a space 10007.

Note that a wiring 10008 is for transmitting signals input to the first gate driver 10003, the second gate driver 10006, and the signal control circuit 1000 and receives a video signal, a dock signal, a start signal, and the like from an FPC (Flexible Printed Circuit) 10009 to be au external input terminal. An IC chip (a semiconductor chip including a memory circuit, a buffer circuit, and the like) 10019 is mounted on a connection portion of the FPC 10009 and the display panel by COG (Chip On Glass) or the like. Note that although only the FPC 10009 is shown here, a printed wiring board (PWB) may be attached to the FPC. A display device in this specification includes not only a main body of the display panel but also a display panel with an FPC or a PWB attached thereto and a display panel on which an IC chip or the like is mounted.

Next, a cross-sectional structure is described with reference with FIG. 100B. The pixel portion 10002 and peripheral driver circuits (the first gate driver 10003, the second gate driver 10006, and the signal control circuit 10001) are formed over a substrate 10010. Here, the signal control circuit 10001 and the pixel portion 10002 are shown.

Note that the signal control circuit 10001 is formed using unipolar transistors such as a transistor 10020 and a transistor 10021 which are N-channel transistors. A pixel can be formed using a unipolar transistor by using the pixel structure of any of FIGS. 46A, 46B, 65A, 65B, 66, and 67. Accordingly, when the peripheral driver circuits axe formed using N-channel transistors, a unipolar display panel can be formed. It is needless to say that a CMOS circuit may be formed using a P-channel transistor as well as the unipolar transistor.

Note that in the case where the transistors 10020 and 10021 are P-channel transistors, when the peripheral driver circuits are formed using P-channel transistors, a unipolar display panel can be formed. It is needless to say that a CMOS circuit may be formed using an N-channel transistor as well as the unipolar transistor.

In this embodiment mode, a display panel in which the peripheral driver circuits are formed over the same substrate is shown; however, it is not always necessary, and all or part of the peripheral driver circuits may be formed over an IC chip or the like and the IC chip may be mounted by COG or the like. In this ease, the driver circuit is not needed to be unipolar, and an N-channel transistor and a P-channel transistor can be used in combination.

The pixel portion 10002 includes a transistor 10011 and a transistor 10012. Note that a source terminal of the transistor 19012 is connected to a first electrode (pixel electrode) 10013. An insulator 10014 is formed to cover end portions of the first electrode 10013. Here, a positive photosensitive acrylic resin film is used for the insulator 10014.

For good coverage, the insulator 10014 is formed to have a curved surface having a curvature at an upper end portion or a lower end portion of the insulator 10014. For example, when a positive photosensitive acrylic is used as a material for the insulator 10014, it is preferable that only the upper end portion of the insulator 10014 have a curved surface having a curvature radius (0.2 to 3 μm). Further, as the insulator 10014, either a negative photosensitive acrylic to be insoluble in an etchant by light irradiation or a positive photosensitive acrylic to be soluble in an etchant by light irradiation can be used.

A layer 10016 containing an organic compound and a second electrode (opposite electrode) 10017 are formed over the first electrode 10013. Here, as a material for the first electrode 10013 functioning as an anode, a material having a high work function is preferably used. For example, a single-layer film of an ITO (Indium Tin Oxide) film, an indium zinc oxide (IZO) film, a titanium nitride film, a chromium film, a tungsten film, a Zn film, a Ft film, or the like, a stacked-layer structure of a titanium nitride film and a film containing aluminum as its main component, a three-layer structure of a titanium nitride film, a film containing aluminum as its main component, and a titanium nitride film, or the like can be used. Note that in the case of a stacked-layer structure, resistance as a wiring is low, good ohmic contact can be obtained, and a function as an anode can be obtained.

The layer 10016 containing the organic compound is formed by an evaporation method using an evaporation mask or by an ink-jet method. A metal complex using a metal from group 4 of the periodic table is used for part of the layer 10016 containing the organic compound, and a low molecular material or a high molecular material can be used in combination. Further, for a material used for the layer containing the organic compound, a single layer or a stacked layer of an organic compound is often used; in this embodiment mode, an inorganic compound may be included in part of a film formed of an organic compound. Moreover, a known triplet material can also be used.

Further, as a material used for the second electrode 10017 formed over the layer 10016 containing the organic compound, a material with a low work function (Al, Ag, Li, Ca, or an alloy thereof such as MgAg, MgIn, AlLi, $CaF_2$, or calcium nitride) may be used. Note that when light generated in the layer 10016 containing the organic compound is transmitted through the second electrode 10017, a slacked-layer structure of a metal thin film and a light-emitting conductive film (ITO (indium Tin Oxide), an indium oxide-zinc oxide alloy ($In_2O_3$—ZnO), zinc oxide (ZnO), or the like) is preferably used as the second electrode (cathode) 10017.

In addition, the sealing substrate 10004 is attached to the substrate 10010 by the sealing material 10005 to have a structure where a light-emitting element 10018 is provided in the space 10007 surrounded by the substrate 10010, the sealing substrate 10004, and the scaling material 10005. Note that the space 10007 may be filled with the sealing material 10005 or with an inert gas (such as nitrogen or argon).

Note that an epoxy-based resin is preferably used for the sealing material 10005. Further, it is preferable that these materials transmit as little moisture or oxygen as possible. In addition, as a material used for the sealing substrate 10004, a plastic substrate formed using FRP (Fiberglass-Reinforced Plastics), PVF (polyvinyl fluoride), polyester, acrylic, or the like can be used as well a glass substrate or a quartz substrate.

As described above, a display panel including a pixel structure of the display device in the invention can be obtained. Note that the aforementioned structure is an example, and a structure of a display panel of the display device in the invention is not limited thereto.

As shown in FIGS. 100A and 100B, the signal control circuit 10001, the pixel portion 10002, the first gate driver 10003, and the second gate driver 10006 are formed over the same substrate; thus, cost reduction of the display device can be realized. Further, in this case, when unipolar transistors are used for the signal control circuit 10001, the pixel portion 10002, the first gate driver 10003, and the second gate driver 10006, simplification of si manufacturing process can be realized and thus, further cost reduction can be realized.

Figure 101A:
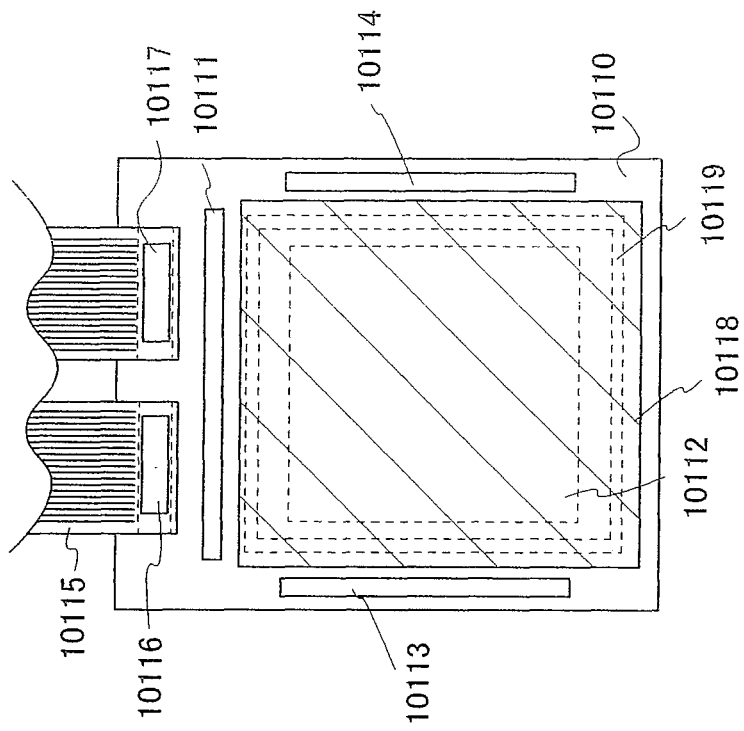
FIGS. 101A and 101B illustrate Embodiment Mode 14.

Note that the structure of the display panel is not limited to the structure shown in FIG. 100A, in which the signal control circuit 10001, the pixel portion 10002, the first gate driver 10003, and the second gate driver 10006 are formed over the same substrate, and a signal control circuit 10101 in FIG. 101A, which corresponds to the signal control circuit 10001, may be formed over an IC chip and mounted on the display panel by COG or the like. Note also that a substrate 10100, a pixel portion 10102, a first gate driver 10103, a second gate driver 10104, an FPC 10105, an IC chip 10106, an IC chip 10107, a sealing substrate 10108, and a sealing material 10109 in FIG. 101A correspond to the substrate 10010, the pixel portion 10002, the first gate driver 10003, the second gate driver 10006, the FPC 10009, the IC chip 10019, the sealing substrate 10004, and the sealing material 10005 in FIG. 100A.

That is, only the signal driver circuit of which high speed operation is required is formed into an IC chip using a CMOS or the like, and thus, lower power consumption is realized. Further, when a semiconductor chip formed using a silicon wafer or the like is used as the IC chip, higher speed operation and lower power consumption can be realized.

Cost reduction can be realized by forming the second driver 10103 and the first gate driver 10104 over the same substrate as the pixel portion 10102. Note that when unipolar transistors are used for the second driver 10103, the first gate driver 10104, and the pixel portion 10102, further cost reduction can be realized. As a structure of a pixel included in the pixel portion 10102, the pixel shown in Embodiment Mode 10 can be employed.

As described above, cost reduction of a high-definition display device can be realized. Further, by mounting an IC chip including a functional circuit (memory or buffer) on a connection portion of the FPC 10105 and the substrate 10100, a substrate area can be effectively utilized.

Figure 101B:
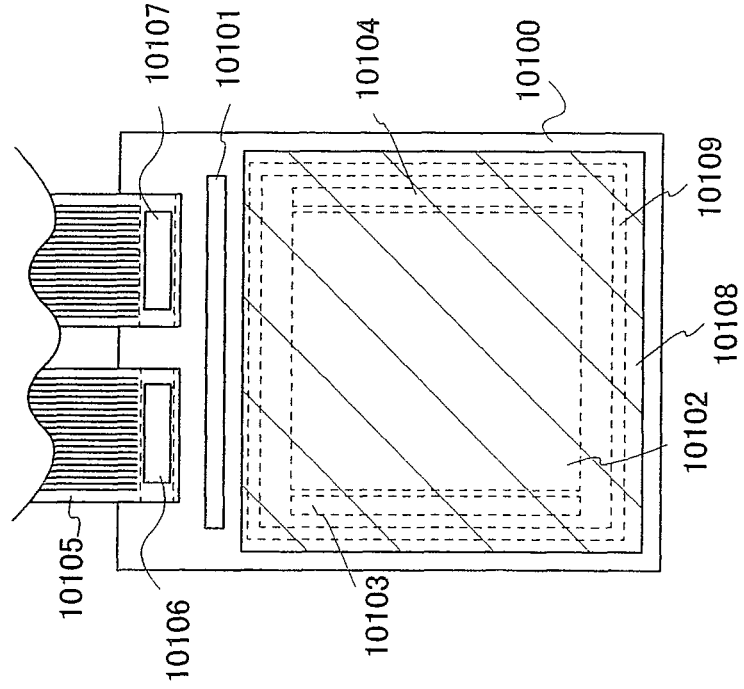

Further, a signal control circuit 10111, a first gate driver 10114, and a second gate driver 10113 in FIG. 101B corresponding to the signal control circuit 10001, the first gate driver 10003, and the second gate driver 10006 in FIG. 100A may be formed over an IC chip and mounted on a display pane by COG or the like. In this case, reduction in power consumption of a high-definition display device can be realized. Accordingly, in order to obtain a display device with lower power consumption, amorphous silicon is preferably used for a semiconductor layer of a transistor used in the pixel portion. Note that a substrate 10110, a pixel portion 10112, an FPC 10115, an IC chip 10116, an IC chip 10117, a sealing substrate 10118, and a sealing material 10119 in FIG. 101B correspond to the substrate 10010, the pixel portion 10002, the FPC 10009, the IC chip 10019, an IC chip 10022, the sealing substrate 10004, and the sealing material 10005 in FIG. 100A.

Further cost reduction cm be realized by using amorphous silicon for a semiconductor layer of a transistor in the pixel portion 10112. Moreover, a large display panel can be manufactured as well.

Figure 75A:
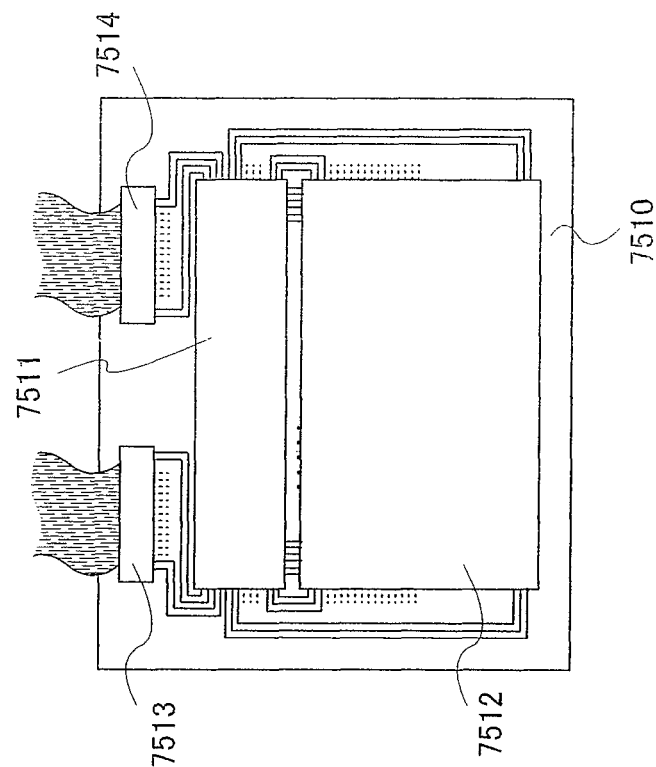
FIGS. 75A and 75B illustrate Embodiment Mode 14.

Further, the second gate driver, the first gate driver, and the signal line control circuit are not always provided in a row direction and a column direction of the pixels. For example, a peripheral driver circuit 7501 formed over an IC chip as shown in FIG. 75A may have functions of the first gate driver 10114, the second gate driver 10113, and the signal control circuit 10111 in FIG. 1018. Note that a substrate 7500, a pixel portion 7502, an FPC 7504, an IC chip 7505, an IC chip 7506, a sealing substrate 7507, and a sealing material 7508 in FIG. 75A correspond to the substrate 10010, the pixel portion 10002, the FPC 10009, the IC chip 10019, the IC chip 10022, the sealing substrate 10004, and the sealing material 10005 in FIG. 100A.

Figure 75B:
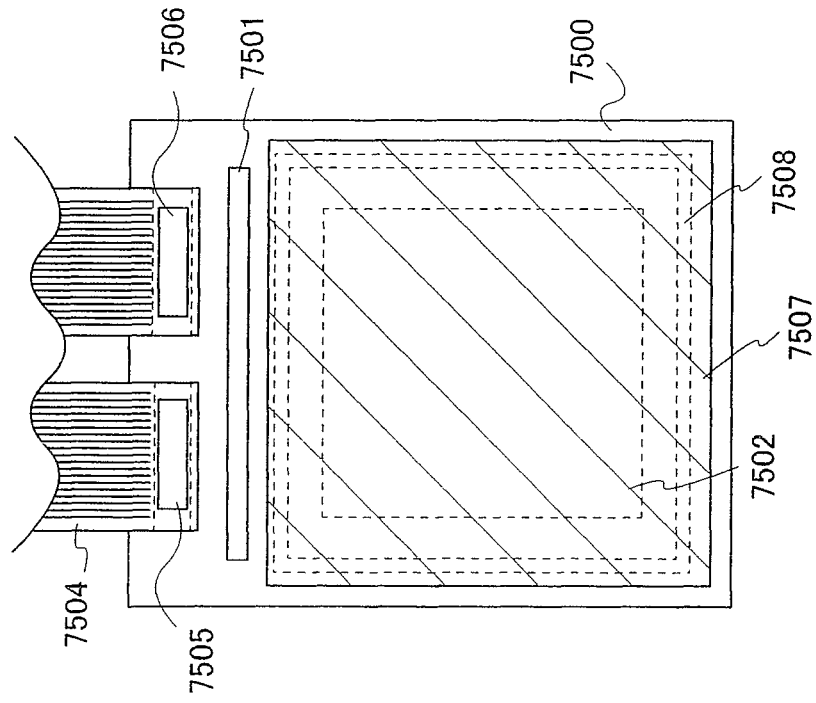

FIG. 75B is a schematic diagram showing connections of wirings of the display device shown in FIG. 75A. The display device includes a substrate 7510, a peripheral driver circuit 7511, a pixel portion 7512, an FPC 7533, and an FPC 7514. A signal and a power supply potential are externally input from the FPC 7513 to the peripheral driver circuit 7511. An output from the peripheral driver circuit 7511 is input to wirings in the row direction and the column direction, which are connected to the pixels included in the pixel portion 7512.

Figures 76A, 76B:
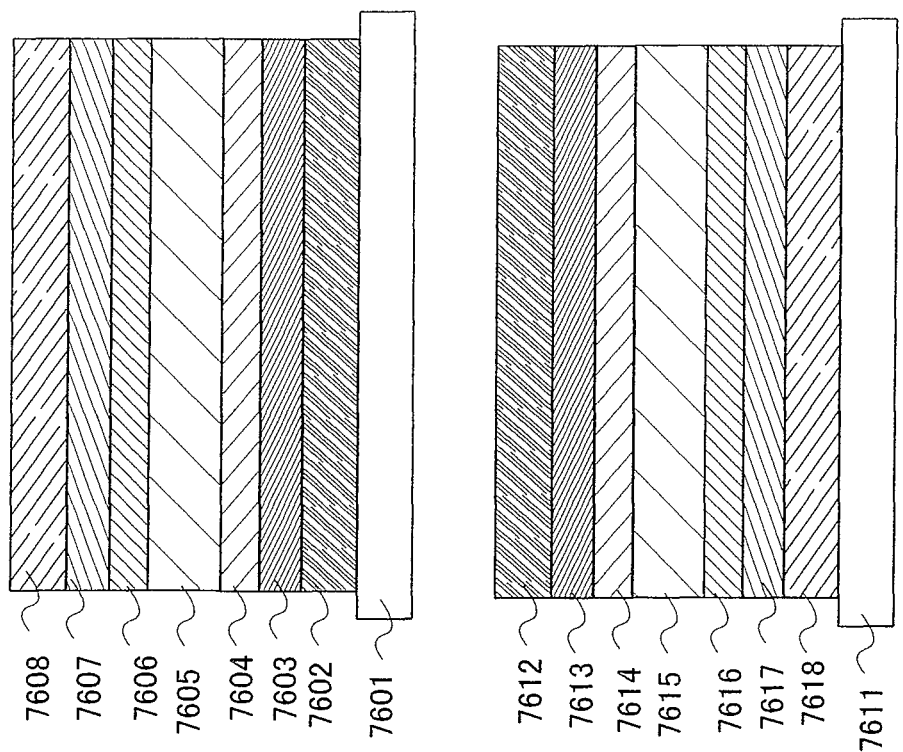
FIGS. 76A and 76B illustrate Embodiment Mode 14.

FIGS. 76A and 76B show examples of light-emitting elements which can be applied to the light-emitting element 10018. That is, a structure of a light-emitting element which can be applied to the pixels shown in the aforementioned embodiment modes is described with reference to FIGS. 76A and 76B.

A light-emitting element in FIG. 76A has an element structure where an anode 7602, a hole injecting layer 7603 formed of a hole injecting material, a hole transporting layer 7604 formed of a hole transporting material, a light-emitting layer 7605, an electron transporting layer 7606 formed of an election transporting material, an electron injecting layer 7607 formed of an electron injecting material, and a cathode 7608 are stacked over a substrate 7601. Here, the light-emitting layer 7605 is formed of only one kind of a light-emitting material in some cases and formed of two or more kinds of materials in other cases. Note that a structure of the element is not limited thereto.

In addition to a stacked-layer structure shown in FIG. 76A, in which functional layers are stacked, there am wide variations such as an element formed using a high molecular compound and a high efficiency element utilizing a triplet light-emitting material which emits light in returning from a triplet excitation state in a light-emitting layer. These variations can also be applied to a white light-emitting element which can be obtained by dividing a light-emitting region into two regions by controlling a recombination region of carriers using a hole blocking layer, and the like.

As an element forming method of this embodiment mode shown in FIG. 76A, a hole injecting material, a hole transporting material, and a light-emitting material are sequentially deposited over the substrate 7601 including the anode 7602 (ITO). Next, an electron transporting material and an electron injecting material are deposited, and finally the cathode 7608 is formed by evaporation.

Next, materials preferable for the hole injecting material, the hole transporting material, the electron transporting material, the electron injecting material, and the light-emitting material are described as follows.

As the hole injecting material, an organic compound such as a porphyrin-based compound, phthalocyanine (hereinafter referred to as $H_2Pc$), copper phthalocyanine (hereinafter referred to as CuPc), or the like is effective. A material which has a lower ionization potential than that of the hole transporting material to be used and has a hole transporting function can also be used as the hole injecting material. Further, a material obtained by chemically doping a conductive high molecular compound, such as polyaniline and polyethylene dioxythiophene (hereinafter referred to as PEDOT) doped with polystyrene sulfonate (hereinafter referred to as PSS), may also employed. Further, an insulating high molecular compound is effective in planarization of the anode, and polyimide (hereinafter referred to as PI) is often used. Farther, an inorganic compound is also used, such as art ultrathin film of aluminum oxide (hereinafter referred to as alumina) as well as a thin film of a metal such as gold or platinum.

As the hole transporting material, an aromatic amine-based compound (that is, a compound having a benzene ring-nitrogen bond) is most widely used. A material widely used as the hole transporting material includes 4,4'-bis (diphenylamino)-biphenyl (hereinafter referred to as TAD), derivatives thereof such as 4,4'-bis[N-(3-methylphenyl)-N-phenyl-amino]-biphenyl (hereinafter referred to as TPD) and 4,4'-bis[N-(1-naphthyl)-N-phenyl-amino]-biphenyl (hereinafter referred to as α-NPD), and starburst aromatic amine compounds such as 4,4',4"-tris(N,N-diphenyl-amino)-triphenylamine (hereinafter referred to as TDATA) and 4,4',4"-tris[N-(3-methylphenyl)-N-phenyl-amino]-triphenylamine (hereinafter referred to as MTDATA).

As the electron transporting material, a metal complex is often used, which includes a metal complex having a quinoline skeleton or a benzoquinoline skeleton, such as Alq, BAlq, tris(4-methyl-8-quinolinolato)aluminum (hereinafter referred to as Almq), and bis(10-hydroxybenzo[h]-quinolinato)beryllium (hereinafter referred to as Bebq). In addition, a metal complex having an oxazole-based or thiazole-based ligand such as bis[2-(2-hydroxyphenyl)-benzoxazolato]zinc (hereinafter referred to as $Zn(BOX)_2$) and bis[2-(2-hydroxyphenyl)-benzothiazolato]zinc (hereinafter referred to as $Zn(BTZ)_2$) may be employed. Further, in addition to the metal complexes, oxadiazole derivatives such as 2-(4-biphenylyl)-5-(4-tert-butylphenyl)-1,3,4-oxadiazole (hereinafter referred to as PBD) and OXD-7, triazole derivatives such as TAZ and 3-(4-tert-butylphenyl)-4-(4-ethylphenyl)-5-(4-biphenylyl)-1,2,4-triazoic (hereinafter referred to as p-EtTAZ), and phenanthroline derivatives such as bathophenanthroline (hereinafter referred to as BPhen) and BCP have electron transporting properties.

As the electron injecting material, the above-mentioned electron transporting materials can be used. In addition, an ultrathin film of an insulator, for example, metal halide such as calcium fluoride, lithium fluoride, or cesium fluoride or alkali metal oxide such as lithium oxide is often used. Further, an alkali metal complex such as lithium acetyl acetonate (hereinafter referred to as Li(acac)) or 8-quinolinolato-lithium (hereinafter referred to as Liq) is also effective.

As the light-emitting material, in addition to the above-mentioned metal complexes such as Alq, Almq, BeBq, BAlq, $Zn(BOX)_2$, and $Zn(BTZ)_2$, various fluorescent pigments are effective. The fluorescent pigments include 4,4'-bis(2,2-diphenyl-vinyl)-biphenyl, which is blue, and 4-(dicyanomethylene)-2-methyl-6-(p-dimethylaminostyryl)-4H-pyran, which is red-orange, and the like. In addition, a triplet light-emitting material, which mainly includes a complex with platinum ox iridium as a central metal, may also be employed. As the triplet light-emitting material, tris(2-phenylpyridine)iridium, bis(2'(4'-tolyl)pyridinato-N,$C^{2'}$)acetylacetonato iridium (hereinafter referred to as $acaclr(tpy)_2$), 2,3,7,8,12,13,17,18-octaethyl-21H,23H porphyrin-platinum, and the like are known.

By using the materials having each function as described above in combination, a light-emitting element with high reliability can be formed.

A light-emitting element in which layers are formed in reverse order of that in FIG. 76A can also be used for the display element 6521 in Embodiment Mode 10. That is, a cathode 7618, an electron injecting layer 7617 formed of an electron injecting material, an electron transporting layer 7616 formed of an electron transporting material, a light-emitting layer 7615, a hole transporting layer 7614 formed of a hole transporting material, a hole, injecting layer 7613 formed of a hole injecting material, and an anode 7612 are sequentially stacked over a substrate 7611.

In addition, at least one of the anode and the cathode of the light-emitting element is needed to be transparent in order to extract light emission. A transistor and a light-emitting element are formed over a substrate. A pixel structure of a display device of the invention can be applied to a light-emitting element having any tight emission structure as follows: a top emission structure where light emission is extracted from a surface on the side opposite to a substrate a bottom emission structure where light emission is extracted from a surface on the substrate side, and a dual emission structure where light emission is extracted from both the surface on the substrate side and the surface on the side opposite to the substrate. A pixel structure of the display device in the invention can be applied to a light-emitting element having any emission structure.

A light-emitting element having a top emission structure is described with reference to FIG. 77A.

A driving transistor 7701 is formed over a substrate 7700. A first electrode 7702 is formed in contact with a source terminal of the driving transistor 7701, and a layer 7703 containing an organic compound and a second electrode 7704 are formed thereover.

The first electrode 7702 is an anode of the light-emitting element. The second electrode 7704 is a cathode of the light-emitting element. That is, a region where the layer 7703 containing the organic compound is interposed between the first electrode 7702 and the second electrode 7704 functions as the light-emitting element.

As a material used for the first electrode 7702 functioning as the anode, a material having a high work function is preferably used. For example, a single-layer film of a titanium nitride film, a chromium film, a tungsten film, a Zn film, a Pt film, or the like, a stacked-layer structure of a titanium nitride film and a film containing aluminum as its main component, a three-layer structure of a titanium nitride film, a film containing aluminum as its main component, and a titanium nitride film, or the like can be used. Note that in the case of a stacked-layer structure, the resistance as a wiring is low, a good ohmic contact can be obtained, and bother, a function as an anode can be obtained. By using a metal film which reflects light, an anode which does not transmit light can be formed.

As a material used for the second electrode 7704 functioning as the cathode, a stacked-layer structure of a thin metal film formed of a material having a low work function (Al, Ag, Li, Ca, or an alloy thereof such as MgAg, MgIn, AlLi, $CaF_2$, or calcium nitride) and a transparent conductive film (ITO (Indium Tin Oxide), indium zinc oxide (IZO), zinc oxide (ZnO); or the like) is preferably used. By using a thin metal film and a transparent conductive film having light-transmitting properties, a cathode which can transmit light can be formed.

As described above, light from the light-emitting element can be extracted from a top surface as shown by an arrow in FIG. 77A. That is, when the display panel shown in FIGS. 100A and 100B is employed, light is emitted toward the sealing substrate 10004 side. Therefore, when a light-emitting element having a top emission structure is employed in a display device, a substrate having light-transmitting properties is used as the sealing substrate 10004.

When an optical film is provided, the sealing substrate 10004 is provided with an optical film.

Note that a metal film formed of a material having a low work function, such as MgAg, MgIn, or AlLi, which functions as a cathode, can be used for the first electrode 7702. In this case, a light-emitting conductive film such as an ITO (Indium Tin Oxide) film or an indium zinc oxide (IZO) film can be used for the second electrode 7704. Therefore, the transmittance of the top light emission can be improved with this structure.

Next, a light-emitting element having a bottom emission structure is described with reference to FIG. 77B. The same reference numerals as those in FIG. 77A are used since the structure of the light-emitting element is the same except for the light emission structure.

Here, as a material used for the first electrode 7702 functioning as the anode, a material having a high work function is preferably used. For example, a transparent conductive film such as an ITO (Indium Tin Oxide) film or an indium zinc oxide (IZO) film can be used. By using a transparent conductive film having light-transmitting properties, an anode which can transmit light can be formed.

As a material used for the second electrode 7704 functioning as the cathode, a metal film formed of a material having a low work function (Al, Ag, Li, Ca, or an alloy thereof such as MgAg, MgIn, AlLi, $CaF_2$, or $Ca_3N_2$) can be used. By using a metal flint which reflects light, a cathode which does not transmit light can be formed.

As described above, light from the light-emitting element can be extracted from a bottom surface as shown by an arrow in FIG. 77B. That is, when the display panel shown in FIGS. 100A and 100B is employed, light is emitted toward the substrate 10010 side. Therefore, when a light-emitting element having a bottom emission structure is employed in a display device, a substrate having light-transmitting properties is used as the substrate 10010.

When art optical film is provided, the substrate 10010 provided with an optical film.

Next, a light-emitting element having a dual emission structure is described with reference to FIG. 77C. The same reference numerals as those in FIG. 77A are used since the structure of the light-emitting element is the same except for the light emission structure.

Here, as a material used for the first electrode 7702 functioning as the anode, a material having a high work function is preferably used. For example, a transparent conductive film such as an ITO (Indium Tin Oxide) film or an indium zinc oxide (IZO) film can be used. By using a transparent conductive film having light-transmitting properties, an anode which can transmit light can be formed.

As a material used for the second electrode 7704 functioning as the cathode, a stacked-layer structure of a thin metal film formed of a material having a low work function (Al Ag, Li, Ca, or an alloy thereof such as MgAg, MgIn, AlLi, $CaF_2$, or calcium nitride) and a transparent conductive film (ITO (indium Tin Oxide), indium oxide, zinc-oxide alloy ($In_2O_3$—ZnO), zinc oxide (ZnO), or the like) can be used. By using a thin metal film and a transparent conductive film having light-transmitting properties, a cathode which can transmit light can be formed.

As described above, light from the light-emitting element can be extracted from both sides as shown by arrows in FIG. 77C That is, when the display panel shown in FIGS. 100A and 100B is employed, light is emitted toward the substrate 10010 side and the sealing substrate 10004 side. Therefore, when a light-emitting element having a dual emission structure is employed in n display device, substrates having light-transmitting properties are used for both the substrate 10010 and the sealing substrate 10004.

When an optical film is provided, both the substrate 10010 and the sealing substrate 10004 are provided with optical films.

In addition, the invention can be applied to a display device in which full color display is realized by using a white light-emitting element and a color filter.

Figure 78:
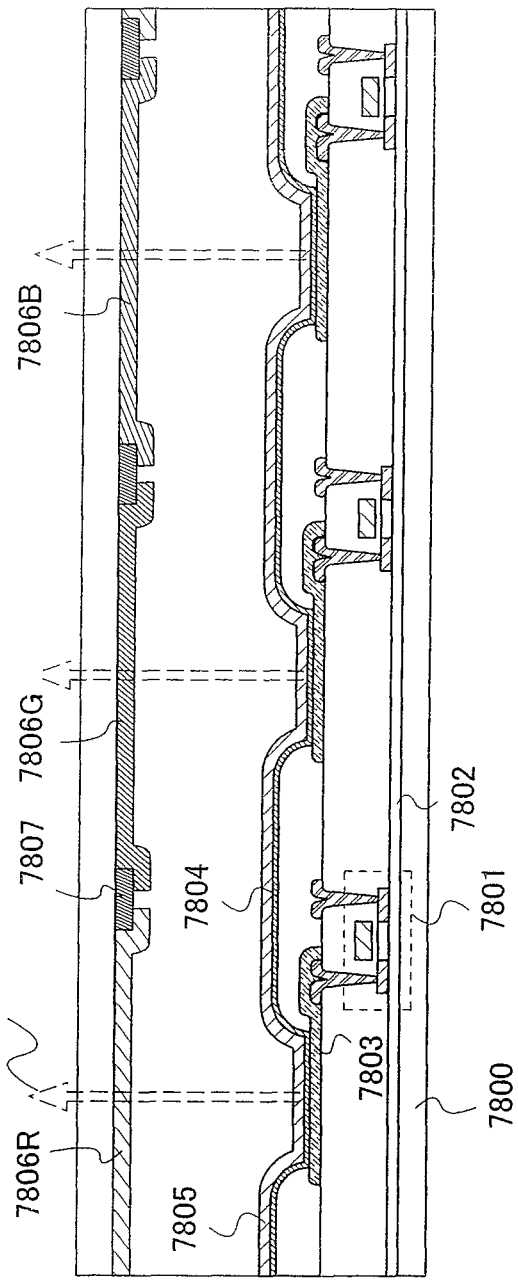
FIG. 78 illustrates Embodiment Mode 14.

As shown in FIG. 78, a base film 7802 is formed over a substrate 7800, and a driving transistor 7801 is formed thereover. A first electrode 7803 is formed in contact with a source terminal of the driving transistor 7801, and a layer 7804 containing an organic compound and a second electrode 7805 are formed thereover.

The first electrode 7803 is an anode of a light-emitting element. The second electrode 7805 is a cathode of the light-emitting element. That is, a region where the layer 7804 containing the organic compound is interposed between the first electrode 7803 and the second electrode 7805 functions as the light-emitting element. In the structure shown in FIG. 78, white light is emitted. A red color filter 7806R, a green color filter 7806G, and a blue color filter 7806B are provided over the light-emitting element; thus, full color display can be performed. Further, a black matrix (also referred to as a BM) 7807 which separates these color filters is provided.

The aforementioned structures of the light-emitting element can be used in combination and can be applied to the display device of the invention as appropriate. The structures of the display panel and the light-emitting element described above are examples, and the pixel structure can also be applied to a display device having another structure.

Next, a partial cross-sectional view of a pixel portion in a display panel is shown.

First, the case where a crystalline semiconductor film (polysilicon (p-Si:H) film) is used as a semiconductor layer of a transistor is described with reference to FIGS. 79A, 79B, 80A, and 80B.

Here, the semiconductor layer is obtained by forming an amorphous silicon (a-Si) film over a substrate by a known film formation method, for example. Note that it is not limited to the amorphous silicon film, and any semiconductor film having an amorphous structure (including a microcrystalline semiconductor film) may be used. Further, a compound semiconductor film having an amorphous structure, such as an amorphous silicon germanium film, may be used.

Then, the amorphous silicon film is crystallized by a laser crystallization method, a thermal crystallization method using RTA or an annealing furnace, a thermal crystallization method using a metal element which promotes crystallization, or the like. It is needless to say that such crystallization methods may be performed in combination.

As a result of the aforementioned crystallization, a crystallized region is formed in part of the amorphous semiconductor film.

Further, the crystalline semiconductor film in which part is made more crystallized is patterned into a desired shape, and an island-shaped semiconductor film is formed of the crystallized region. This semiconductor film is used as the semiconductor layer of the transistor.

As shown in FIG. 79A, a base film 7902 is formed ewer a substrate 7901, and a semiconductor layer is formed thereover. The semiconductor layer includes a channel formation region 7903, an impurity region 7905 to be a source region or a drain region of a driving transistor 7918; and a channel formation region 7906, an LDD region 7907, and an impurity region 7908 to be a lower electrode of a capacitor 7919. Note that channel doping may be performed on the channel formation regions 7903 and 7906.

As the substrate, a glass substrate, a quartz substrate, a ceramic substrate, a plastic substrate, or the like can be used. As the base film 7902, a single layer of aluminum nitride, silicon oxide, silicon oxynitride, or the like, or stacked layers thereof can be used.

A gate electrode 7910 and an upper electrode 7911 of the capacitor art formed over five semiconductor layer with a gate insulating film 7909 interposed therebetween.

An interlayer insulator 7912 is formed to cover the driving transistor 7918 and the capacitor 7919. A wiring 7913 is in contact with the impurity region 7905 ewer the interlayer insulator 7912 through a contact hole. A pixel electrode 7914 is formed in contact with the wiring 7913. A second interlayer insulator 7915 is formed to cover end portions of the pixel electrode 7914 and the wiring 7913. Here, the second interlayer insulator 7915 is formed using a positive photosensitive acrylic resin film. Then, a layer 7916 containing an organic compound and an opposite electrode 7917 are formed over the pixel electrode 7914. A light-emitting element 7920 is formed in a region where the layer 7916 containing the organic compound is interposed between the pixel electrode 7914 and the opposite electrode 7917.

Alternatively, as shown in FIG. 79B, a region 7921 may be provided so that the LDD region which forms part of the lower electrode of the capacitor 7919 overlaps with the upper electrode 7911. Note that portions in common with those in FIG. 79A are denoted by the same reference numerals, and description thereof is omitted.

Alternatively, as shown in FIG. 80A, a second upper electrode 8091 which is formed in the same layer as the wiring 7913 in contact with the impurity region 7905 of the driving transistor 7918 may be included. Note that portions in common with those in FIG. 79A are denoted by the same reference numerals, and description thereof is omitted. The interlayer insulator 7912 is interposed between the second upper electrode 8091 and the upper electrode 7911 to form a second capacitor. Since the second upper electrode 8091 is in contact with the impurity region 7908, a first capacitor having a structure where the base film 7902 is interposed between the upper electrode 7911 and the channel formation region 7906, and the second capacitor having structure where the inter layer insulator 7912 is interposed between the upper electrode 7911 and the second upper electrode 8091 are connected in parallel, so that a capacitor 8092 including the first capacitor and the second capacitor is formed. Since the capacitor 8092 has the total capacitance of the first capacitor and the second capacitor, the capacitor having a large capacitance can be formed in a small area. That is, when it is used for the capacitor in the pixel structure of the display device in the invention, an aperture ratio can be further improved.

Alternatively, a capacitor may have a structure shown in FIG. 80B. A base film 8002 is formed over a substrate 8001, and a semiconductor layer is formed thereover. The semiconductor layer includes a channel formation region 8003 and an impurity region 8005 to be a source region or a drain region of a driving transistor 8018. Note that channel doping may be performed on the channel formation region 8003.

As the substrate, a glass substrate, a quartz substrate, a ceramic substrate, a plastic substrate, or the like can be used. As the base film 8002, a single layer of aluminum nitride, silicon oxide, silicon oxynitride, or the like, or stacked layers thereof can be used.

A gate electrode 8007 and a first electrode 8008 are formed over the semiconductor layer with a gate insulating film 8006 interposed therebetween.

A first interlayer insulator 8009 is formed to cover the driving transistor 8018 and the first electrode 8008. A wiring 8010 is in contact with the impurity region 8005 over the first interlayer insulator 8009 through a contact hole. A second electrode 8011 is formed of the same material and in the same layer as the wiring 8010.

Further, a second interlayer insulator 8012 is formed to cover the wiring 8010 and the second electrode 8011. A pixel electrode 8013 is formed in contact with the wiring 8010 over the second interlayer insulator 8012 through a contact hole. A third electrode 8014 is formed of the same material and in the same layer as the pixel electrode 8013. Here, a capacitor 8019 including the first electrode 8008, the second electrode 8011, and the third electrode 8014 is formed.

A third interlayer insulator 8015 is formed to cover the pixel electrode 8013 and the third electrode 8014. Then, a layer 8016 containing an organic compound and an opposite electrode 8017 are formed over the third interlayer insulator 8015 and the third electrode 8014. A light-emitting element 8020 is formed in a region where the layer 8016 containing the organic compound is interposed between the pixel electrode 8013 and the opposite electrode 8017.

As described above, the structures shown in FIGS. 79A, 79B, 80A, and 80B are examples of a structure of a transistor in which a crystalline semiconductor film is used for its semiconductor layer. Note that the structures of the transistor shown in FIGS. 79A, 79B, 80A, and 80B are examples of a top gate transistor. That is, the transistor may be a P-channel transistor or an N-channel transistor. In the case of an N channel transistor, the LDD region may overlap with the gate electrode or not, or part of the LDD region may overlap with the gate electrode. Further, the gate electrode may have a tapered shape, and the LDD region may be provided below the tapered portion of the gate electrode in a self-aligned manner. In addition, the number of gate electrodes is not limited to two, and a multigate structure with three or more gate electrodes may be employed, or a single gate structure may also be employed.

By using a crystalline semiconductor film for a semiconductor layer (such as a channel formation region, a source region, and a drain region) of a transistor included in the pixel of the display device in the invention, for example, the first gate driver 10003, the second gate driver 10006, and the signal control circuit 10001 are easily formed over the same substrate as the pixel portion 10002 in FIG. 100A.

As a structure of a transistor which uses polysilicon for its semiconductor layer, FIGS. 81A and 81B each show a partial cross section of a display pane using a transistor having a structure where a gate electrode is interposed between a substrate and a semiconductor layer, that is, a bottom gate structure where a gate electrode is located below a semiconductor layer.

A base film 8102 is formed over a substrate 8101. Then, a gate electrode 8103 is formed over the base film 8102. A first electrode 8104 is formed in the same layer and of the same material as the gate, electrode 8103. As a material for the gate electrode 8103, polycrystalline silicon to which phosphorus is added can be used. In addition to polycrystalline silicon, silicide which is a compound of metal and silicon may be used.

Them a gate insulating film 8105 is formed to cover the gate electrode 8103 and the first electrode 8104. As the gate insulating film 8105, a silicon oxide film, a silicon nitride film, or the like is used.

A semiconductor layer is formed over the gate insulating film 8105. The semiconductor layer includes a channel formation region 8106, an LDD region 8107, and art impurity region 8108 to be a source region or a drain region of a driving transistor 8122; and a channel formation region 8109, an LDD region 8110, and an impurity region 8111 which are to be as a second electrode of a capacitor 8123. Note that channel doping may be performed to the channel formation regions 8106 and 8109.

As the substrate, a glass substrate, a quartz substrate, a ceramic substrate, a plastic substrate, or the like can be used. As the base film 8102, a single layer of aluminum nitride, silicon oxide, silicon oxynitride, or the like, or stacked layers thereof can be used.

A first interlayer insulator 8112 is formed to cover the semiconductor layer. A wiring 8113 is in contact with the impurity region 8108 over the first interlayer insulator 8112 through a contact hole. A third electrode 8114 is formed in the same layer and of the same material as the wiring 8113. The capacitor 8123 including the first electrode 8104, the second electrode, and the third electrode 8114 is formed.

In addition, an opening 8115 is formed In the first, interlayer insulator 8112. A second interlayer insulator 8116 is formed to cover the driving transistor 8122, the capacitor 8123, and the opening 8115. A pixel electrode 8117 is formed over the second interlayer insulator 8116 through a contact hole. Then, an insulator 8118 is formed to cover an end portion of the pixel electrode 8117 by using a positive photosensitive acrylic resin film, for example. A layer 8119 containing an organic compound and an opposite electrode 8120 are formed over the pixel electrode 8117. A light-emitting element 8121 is formed in a region where the layer 8119 containing the organic compound is interposed between the pixel electrode 8117 and the opposite electrode 8120. The opening 8115 is located below the light-emitting element 8121. That is, when light emitted from the light-emitting element 8121 is extracted from the substrate side, the transmittance can be improved since the opening 8115 is provided.

Further, a structure as shown in FIG. 81B may be employed, in which a fourth electrode 8124 is formed in the same layer and of the same material as the pixel electrode 8117 in FIG. 81A. Thus, the capacitor 8123 including the first electrode 8104, the second electrode, the third electrode 8114, and the fourth electrode 8124 can be formed.

Figure 82A:
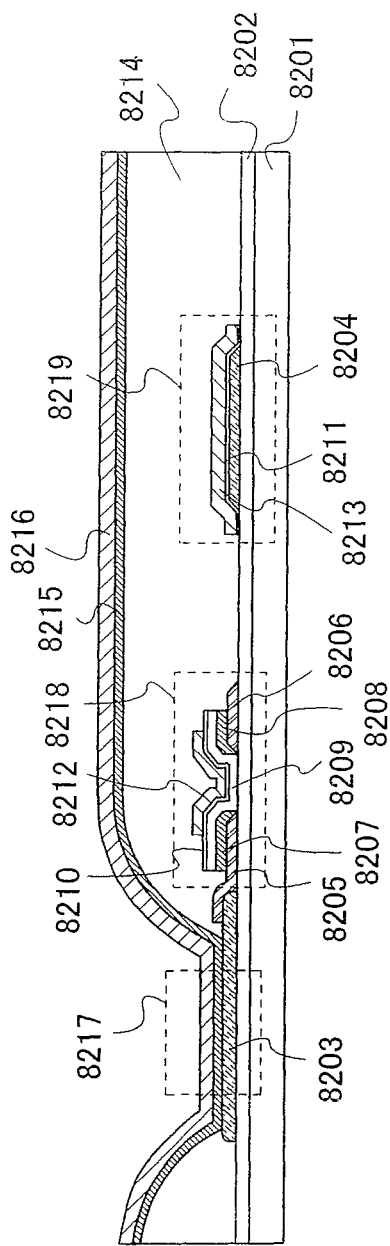
FIGS. 82A and 82B illustrate Embodiment Mode 14.
Figure 82B:
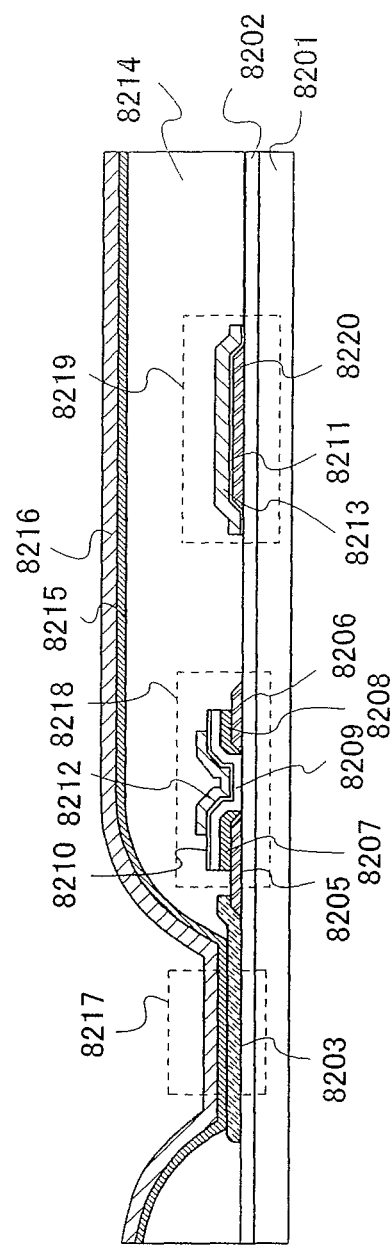

Next, the case where an amorphous silicon (a-Si:H) film is used for the semiconductor layer of the transistor is described. FIGS. 82A and 82B show the case of a top gate transistor. FIGS. 83A, 83B, 84A, and 84B show the case of a bottom gate transistor.

FIG. 82A shows a cross section of a top gate transistor in which amorphous silicon is used for its semiconductor layer. A base film 8202 is formed over a substrate 8201. A pixel electrode 8203 is formed over the base film 8202. A first electrode 8204 is formed in the same layer and of the same material as the pixel electrode 8203.

As the substrate, a glass substrate, a quartz substrate, a ceramic substrate, or the like can be used. As the base film 8202, a single layer of aluminum nitride, silicon oxide, silicon oxynitride, or the like, or stacked layers thereof can be used.

A wiring 8205 and a wiring 8206 are formed over the base film 8202, and an end portion of the pixel electrode 8203 is covered with the wiring 8205. An n-type semiconductor layer 8207 and an n-type semiconductor layer 8208 having n-type conductivity are formed over the wiring 8205 and the wiring 8206. In addition, a semiconductor layer 8209 is formed between the wiring 8205 and the wiring 8206 and over the base film 8202. Part of the semiconductor layer 8209 is extended over the n-type semiconductor layers 8207 and 8208. Note that this semiconductor layer is formed of a non-crystalline semiconductor film such as an amorphous silicon (a-Si:H) film or a microcrystalline semiconductor (µ-Si:H) film. Further, a gate insulating film 8210 is formed over the semiconductor layer 8209. An insulating film 8211 formed in the same layer and of the same material as the gate insulating film 8210 is also formed over the first electrode 8204. Note that as the gate insulating film 8210, a silicon oxide film, a silicon nitride film, or the like is used.

A gate electrode 8212 is formed over the gate insulating film 8210. A second electrode 8213 formed in the same layer and of the same material as the gate electrode is formed over the first electrode 8204 with the insulating film 8211 interposed therebetween. A capacitor 8219 in which the insulating film 8211 is interposed between the first electrode 8204 and the second electrode 8213 is formed. An interlayer insulating film 8234 is formed to cover an end portion of the pixel electrode 8203, a driving transistor 8218, and the capacitor 8219.

A layer 8215 containing an organic compound and an opposite electrode 8216 are formed over the interlayer insulating layer 8214 and the pixel electrode 8203 located in an opening of the interlayer insulating film 8214. A light-emitting element 8217 is formed in a region where the layer 8215 containing the organic compound is interposed between the pixel electrode 8203 and the opposite electrode 8216.

As shown in FIG. 82B, a first electrode 8220 may be formed instead of the first electrode 8204 in FIG. 82A. The first electrode 8220 is formed in the same layer and of the same material as the wirings 8205 and 8206.

FIGS. 83A and 83B each show a partial cross-sectional view of a panel in a display device using a bottom gate transistor in which amorphous silicon is used for its semiconductor layer.

A base film 8302 is formed over a substrate 8301. A gate electrode 8303 is formed over the base film 8302. A first electrode 8304 is formed in the same layer and of the same material as the gate electrode. As a material for the gate electrode 8303, polycrystalline silicon to which phosphorus is added can be used, in addition to polycrystalline silicon, silicide which is a compound of a metal and silicon may be employed.

A gate insulating film 8305 is formed to cover the gate electrode 8303 and the first electrode 8304. As the gate insulating film 8305, a silicon oxide film, a silicon nitride film, or the like is used.

A semiconductor layer 8306 is formed over the gate insulating film 8305. A semiconductor layer 8307 is formed in the same layer and of the same material as the semiconductor layer 8306.

As the substrate, a glass substrate, a quartz substrate, a ceramic substrate, or the like can be used. As the base film 8302, a single layer of aluminum nitride, silicon oxide, silicon oxynitride, or the like, or stacked layers thereof can be used.

N-type semiconductor layers 8308 and 8309 having n-type conductivity am formed over the semiconductor layer 8306. A n-type semiconductor layer 8310 is formed over the semiconductor layer 8307.

Wirings 8311 and 8312 are formed over the n-type semiconductor layers 8308 and 8309 respectively. A conductive layer 8313 formed in the same layer and of the same material as the wirings 8311 and 8312 is formed over the n-type semiconductor layer 8310.

A second electrode including the semiconductor layer 8307, the n-type semiconductor layer 8310, and the conductive layer 8313 is formed. Note that a capacitor 8320 in which the base film 8302 is interposed between the second electrode and the first electrode 8304 is formed.

One end portion of the wiring 8311 is extended, and a pixel electrode 8314 is formed on and in contact with the extended wiring 8331.

An insulator 8315 is formed to cover an end portion of the pixel electrode 8314, a driving transistor 8339, and the capacitor 8320.

A layer 8316 containing an organic compound and an opposite electrode 8317 are formed over the pixel electrode 8314 and the insulator 8315. A light-emitting element 8338 is formed in a region where the layer 8316 containing the organic compound is interposed between the pixel electrode 8334 and the opposite electrode 8317.

Note that the semiconductor layer 8307 and the n-type semiconductor layer 8310 to be part of a second electrode of the capacitor 8320 are not always formed. That is, the second electrode of the capacitor 8320 may be the conductive layer 8333 so that the capacitor 8320 has a structure where the gate insulating film is interposed between the first electrode 8304 and the conductive layer 8313.

Note that in FIG. 83A, when the pixel electrode 8314 is formed before the wiring 8311 is formed, a capacitor 8322 can be formed, as shown in FIG. 83B, in which the gate insulating film 8305 is interposed between a second electrode 8321 formed of the pixel electrode 8314 and the first electrode 8304.

Note that although FIGS. 83A and 83B show examples of an inverted staggered channel-etched transistor, a channel protective transistor may also be used. The case of a channel protective transistor is described with reference to FIGS. 84A and 84B.

A channel protective transistor in FIG. 84A is different from the driving transistor 8319 having a channel-etched structure shown in FIG. 83A in that an insulator 8401 to be an etching mask is provided over a region where a channel of the semiconductor layer 8306 is formed. Common portions except that point are denoted by the same reference numerals.

Similarly, a channel protective transistor shown in FIG. 84B is different tom the driving transistor S319 having a channel-etched structure shown in FIG. 83B in that the insulator 8401 to be an etching mask is provided over the region where a channel of the semiconductor layer 8396 is formed. Common portions except that point are denoted by the same reference numerals.

When an amorphous semiconductor film is used for a semiconductor layer (such as a channel forming region, a source region, and a drain region) of a transistor included in the pixel of the display device in the invention, manufacturing cost can be reduced. For example, when the pixel structure shown in FIGS. 66 and 67 is used, an amorphous semiconductor film can be employed.

Note that the structures of the transistor and the capacitor which can be applied to the pixel structure of the display device in the invention are not limited to the aforementioned structure, and various structures of a transistor and a capacitor can be employed.

When the structure of each display device shown in the aforementioned embodiment modes is used for driving a display panel, deterioration in characteristics of a transistor can be suppressed. Thus, malfunction of a shift register due to deterioration in characteristics of the transistor can be prevented. Further, a display defect of the display panel due to malfunction of the shift register can be suppressed.

Note that each structure of the display panel shown in this embodiment mode can be implemented in free combination with the structure of each display device shown in other embodiment modes in this specification. Further, the structures of the display panel shown in this embodiment mode can be implemented In free combination with each other.

Embodiment Mode 15

In this embodiment mode, a method of forming a semiconductor device to which the invention can be applied and which includes a thin film transistor (TFT) is described with reference to drawings.

Figure 85A:
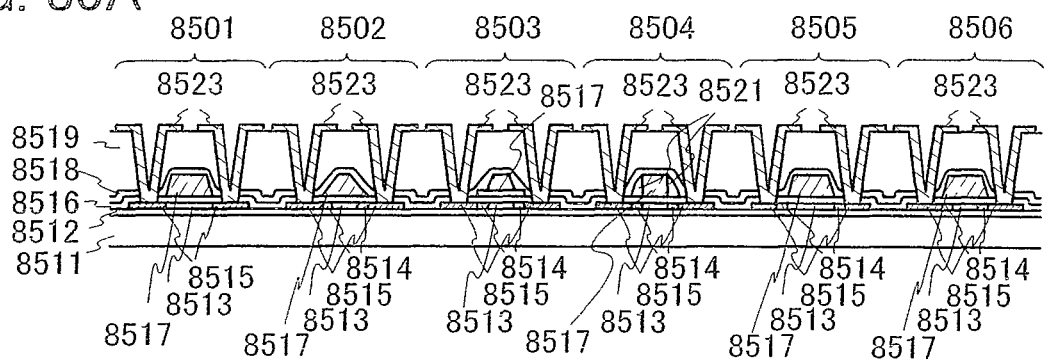
FIGS. 85A to 85G illustrate Embodiment Mode 15.

FIGS. 85A to 85G are diagrams showing examples of a structure and a manufacturing process of a TFT included in the semiconductor device to which the invention can be applied. FIG. 85A is a diagram showing an example of a structure of the TFT included in the semiconductor device to which the invention can be applied FIGS. 85B to 85G are diagrams showing an example of a manufacturing process of the TFT included in the semiconductor device to which the invention can be applied. Note that a structure and a manufacturing process of a TFT included in the semiconductor device to which the invention can be applied are not limited to those in FIGS. 85A to 85G, and various structures and manufacturing processes can be used.

First, an example of a structure of the TFT included in the semiconductor device to which the invention can be applied is described with reference to FIG. 85A. FIG. 85A is a cross-sectional view of a plurality of TFTs each having a different structure. Here, in FIG. 85A, the plurality of TFTs each having a different structure are juxtaposed, which is for describing structures of TFTs included in the semiconductor device to which the invention can be applied. Therefore, the TFTs included in the semiconductor device to which the invention can be applied are not needed to be actually juxtaposed as shown in FIG. 85A and can be separately formed if needed.

Next, characteristics of each layer forming the TFT included in the semiconductor device to which the invention can be applied are described.

A substrate 8511 can be a glass substrate using barium borosilicate glass, alumino borosilicate glass, or the like, a quartz substrate, a ceramic substrate, a metal substrate containing stainless steel, or the like. In addition, a substrate formed of plastics typified by polyethylene terephthalate (PET), polyethylene naphthalate (PEN), or polyethersulfone (PES), or a substrate formed of a flexible synthetic resin such as acrylic can also be used. By using a flexible substrate, a semiconductor device capable of being bent can be formed. In addition, such a substrate has no strict limitations on an area or a shape thereof. Therefore, for example, when a substrate having a rectangular shape, each side of which is 1 meter or more, is used as the substrate 8511, productivity can be significantly improved. Such an advantage is highly favorable as compared with the case where a circular silicon substrate is used.

An insulating film 8512 functions as a base film and is provided to prevent alkali metal such as Na or alkaline earth metal from the substrate 8511 from adversely affecting characteristics of a semiconductor element. The insulating film 8512 can have a single-layer structure or a stacked-layer structure of an insulating film containing oxygen or nitrogen, such as silicon oxide, silicon nitride, silicon oxynitride, or silicon nitride oxide. For example, when the insulating film 8512 is provided to have a two-layer structure, if is preferable that a silicon nitride oxide film be used as a first insulating film and a silicon oxynitride film be used as a second insulating film. When the insulating film 8512 is provided to have a three-layer structure, it is preferable that a silicon oxynitride film be used as a first insulating film, a silicon nitride film be used as a second insulating film, and a silicon oxynitride film be used as a third insulating film.

Semiconductor films 8513, 8514, and 8515 can be formed using an amorphous semiconductor or a semi-amorphous semiconductor (SAS). Alternatively, a polycrystalline semiconductor film may be used. SAS is a semiconductor having an intermediate structure between amorphous and crystalline (including single crystal and polycrystalline) structures and having a third state which is stable in free energy. Moreover, SAS includes a crystalline region with a short range order and lattice distortion. A crystalline region of 0.5 to 20 nm can be observed at least in part of a film. When silicon is contained as a main component, Raman spectrum shifts to a wave number side lower than 520 $cm^{-1}$. The diffraction peaks of (111) and (220) which are thought to be derived from a silicon crystalline lattice are observed by X-ray diffraction, SAS contains hydrogen or halogen of at least 1 atomic % or more of terminate dangling bonds. SAS is formed by glow discharge decomposition (plasma CVD) of a gas containing silicon. As the gas containing silicon, $Si_2H_6$, $SiH_2Cl_2$, $SiHCl_3$, $SiCl_4$, $SiF_4$, or the like can be used in addition to $SiH_4$. Further, $GeF_4$ may be mixed. Alternatively, the gas containing silicon may be diluted with $H_2$, or $H_2$ and one or more kinds of rare gas elements selected from He, Ar, Kr, and Ne. A dilution ratio may be in the range of 2 to 1000 times; pressure may be in the range of approximately 0.1 to 133 Pa, a power supply frequency may be 1 to 120 MHz and preferably 13 to 60 MHz, and a substrate heating temperature may be 300° C. or lower. A concentration of impurities in atmospheric components such as oxygen, nitrogen, and carbon is preferably $1\times10^{20}$ $cm^{-1}$ or less as impurity elements in the film. In particular, an oxygen concentration is $5\times10^{19}/cm^3$ or less, and preferably $1\times10^{19}/cm^3$ or less. Here, an amorphous silicon film is formed using a material containing silicon (Si) as its main component (e.g., $Si_xGe_{1-x}$) by a known method (such as a sputtering method, an LPCVD method, or a plasma CVD method).

Then, the amorphous silicon film is crystallized by a known crystallization method such as a laser crystallization method, a thermal crystallization method using RTA or an annealing furnace, or a thermal crystallization method using a metal element which promotes crystallization.

An insulating film 8516 can have a single-layer structure or a stacked-layer structure of an insulating film containing oxygen or nitrogen, such as silicon oxide, silicon nitride, silicon oxynitride, or silicon nitride oxide.

A gate electrode 8517 can have a single-layer structure of a conductive film or a stacked-layer structure of two or three conductive, films. As a material for the gate electrode 8517, a known conductive film can be used. For example, a single film of an element such as tantalum (Ta), titanium (H), molybdenum (Mo), tungsten (W), chromium (Cr), silicon (Si), or the like; a nitride film containing the element (typically, a tantalum nitride film, a tungsten nitride film, or a titanium nitride film); an alloy film in which the elements are combined (typically, a Mo—W alloy or a Mo—Ta alloy); a silicide film containing the element (typically, a tungsten silicide film or a titanium silicide film); and the like can be used. Note that the aforementioned single film, nitride film, alloy film, silicide film, and the like can have a single-layer structure or a stacked-layer structure.

An insulating film 8518 can have a single-layer structure or a stacked-layer structure of an insulating film containing oxygen or nitrogen, such as silicon oxide, silicon nitride, silicon oxynitride, or silicon nitride oxide; or a film containing carbon, such as a DLC (Diamond-Like Carbon), by a known method (such as a sputtering method or a plasma CVD method).

An insulating film 8519 can have a single layer structure or a stacked-layer structure of an organic material such as epoxy, polyimide, polyamide, polyvinyl phenol, benzocyclobutene, or acrylic; or a siloxane resin, in addition to an insulating film containing oxygen or nitrogen, such as silicon oxide, silicon nitride, silicon oxynitride, or silicon nitride oxide; or a film containing carbon, such as a DLC (Diamond-Like Carbon). Note that a siloxane resin corresponds to a resin having Si—O—Si bonds. Siloxane includes a skeleton structure of a bond of silicon (St) and oxygen (O). As a substituent, an organic group containing at least hydrogen (such as an alkyl group or aromatic hydrocarbon) is used. Alternatively, a fluoro group, or a fluoro group and an organic group containing at least hydrogen can be used as a substituent. Note that in the semiconductor device of the invention, the insulating film 8519 can be provided to cover the gate electrode 8537 directly without provision of the insulating film 8518.

As a conductive film 8523, a single film of an element such as Al, Ni, C, W, Mo, Ti, Pt, Cu, Ta, Au, Mn, or the like, a nitride film containing the element, an alloy film in which the elements are combined, a silicide film containing the element, or the like can be used. For example, as an alloy containing a plurality of elements, an Al alloy containing C and Ti, an Al alloy containing Ni, an Al alloy containing C and Ni, an Al alloy containing C and Mn, or the like can be used. In the case of a stacked-layer structure, a structure can be such that Al is interposed between Mo, Ti, or the like; thus, resistance of Al to heat and chemical reaction can be improved.

Next, characteristics of each structure is described with reference to the cross-sectional view of the plurality of TFTs each having a different structure in FIG. 85A.

Reference numeral 8501 denotes a single drain TFT. Since it can be formed by a simple method, it is advantageous in low manufacturing cost and high yield. Here, the conductive films 8513 and 8515 each have different concentration of impurities, and the semiconductor film 8513 is used as a channel region and the semiconductor films 8515 are used as a source region and a drain region. By controlling the amount of impurities in this manner, resistivity of the semiconductor film can be controlled. Further, an electrical connection state of the semiconductor film and the conductive film 8523 can be closer to ohmic contact. Note that as a method of separately forming the semiconductor films each including different amount of impurities, a method where impurities are doped in the semiconductor film using the gate electrode 8517 as a mask can be used.

Reference numeral 8502 denotes a TFT in which the gate electrode 8517 has a certain tapered angle or more. Since it can be formed by a simple method, it is advantageous in low manufacturing cost and high yield. Here, the conductive films 8513, 8514, and 8515 each have different concentration of impurities. The semiconductor film 8513 is used as a channel region, the semiconductor films 8514 as lightly doped drain (LDD) regions, and the semiconductor films 8515 as a source region and a dram region. By controlling the amount of impurities in this manner, resistivity of the semiconductor film can be controlled. Further, an electrical connection state of the semiconductor film and the conductive film 8523 can be closer to ohmic contact. Moreover, since the TFT includes the LDD region, high electric field is hardly applied to the TFT, so that deterioration of the element due to hot carriers can be suppressed. Note that as a method of separately forming the semiconductor films each including different amount of impurities, a method where impurities are doped in the semiconductor film using the gate electrode 8517 as a mask can be used. In the TFT S502, since the gate electrode 8517 has a certain tapered angle or more, gradient of the concentration of impurities doped in the semiconductor film through the gate electrode 8517 can be provided, and the LDD region can be easily formed.

Reference numeral 8503 denotes a TFT in which the gate electrode 8517 includes at least two layers and a lower gate electrode is longer than an upper gate electrode. When the gate electrode 8517, has such a shape, an LDD region can be formed without addition of a photomask. Note that a structure where the LDD region overlaps with the gate electrode 8517, like the TFT 8503, is particularly culled a GOLD (Gate Overlapped LDD) structure. As a method of forming the gale electrode 8517 with such a shape, the following method may be used. First, when the gate electrode 8517 is patterned, the lower and upper gate electrodes are etched by dry etching so that side surfaces thereof are inclined (tapered). Then, an inclination of the upper gate electrode is processed to be almost perpendicular by anisotropic etching. Thus, the gate electrode in which the lower gate electrode is longer that the upper gate electrode is formed. Thereafter; impurity elements are doped twice, so that the semiconductor film 8513 used as a channel region, the semiconductor films 8514 used as LDD regions, and the semiconductor films 8515 used as a source terminal and a drain terminal are formed.

Note that part of the LDD region, which overlaps with the gate electrode 8517, is referred to as an Lov region, and part of the LDD region, which does not overlap with the gate electrode 8517, is referred to as an Loff region. The Loff region is highly effective in suppressing an off-current value, whereas it is not very effective in preventing deterioration in an on-current value due to hot carriers by relieving an electric field in the vicinity of the drain. On the other hand, the Lov region is highly effective in preventing deterioration in the on-current value by relieving the electric field in the vicinity of the drain, whereas it is not very effective in suppressing the off-current value. Thus, it is preferable to form a TFT having a structure corresponding to TFT characteristics required for each of the various circuits. For example, when the semiconductor device of the invention is used for a display device, a TFT having an Loff region is preferably used as a pixel TFT in order to suppress the off-current value. On the other hand, as a TFT in a peripheral circuit, a TFT having an Lov region is preferably used in order to prevent deterioration in the on-current value by relieving the electric field in the vicinity of the drain.

Reference numeral 6504 denotes a TFT including a sidewall 8521 in contact with a side surface of the gate electrode 8517. When the TFT includes the sidewall 8521, a region overlapping with the sidewall 8521 can be made to be an LDD region.

Reference numeral 8505 denotes a TFT in which an LDD (Loff) region is formed by doping in the semiconductor film with use of a mask. Thus, the LDD region can surety be formed, and an off-current value of the TFT can be reduced.

Reference numeral 8506 denotes a TFT in which an LDD (Lov) region is formed by doping in the semiconductor film with use of a mask. Thus, the LDD region can surely be formed, and deterioration in an on-current value can be prevented by relieving the electric field in the vicinity of the drain of the TFT.

Next, an example of a manufacturing process of a TFT included in the semiconductor device to which the invention can be applied is described with reference to FIGS. 85B to 85G Note that a structure and a manufacturing process of a TFT included in the semiconductor device to which the invention can be applied are not limited to those in FIGS. 85A to 85G, and various structures and manufacturing processes can be used.

In the invention, a surface of the substrate 8511, the insulating film 8512, the semiconductor film 8513, the semiconductor film 8514, the semiconductor film 8515, the insulating film 8516, the insulating film 8518, or the insulating film 8519 is oxidized or nitrided by plasma treatment, so that the semiconductor film or the insulating film can be oxidized or nitrided. By oxidizing or nitriding the semiconductor film or the insulating film by plasma treatment in such a manner, a surface of the semiconductor film or the insulating film is modified, and the insulating film can be formed to be denser than an insulating film formed by a CVD method or a sputtering method; thus, a detect such as a pinhole can be suppressed, and characteristics and the like of the semiconductor device can be improved.

First, the sot face of the substrate 8511 is washed using hydrofluoric add (HF), alkaline, or pure water. The substrate 8511 can be a glass substrate using barium borosilicate glass, alumino borosilicate glass, or the like, a quarts substrate, a ceramic substrate, a metal substrate containing stainless steel or the like. In addition, a substrate formed of plastics typified by polyethylene terephthalate (PET), polyethylene naphthalate (PEN), or polyethersulfone (PES), or a substrate formed of a flexible synthetic resin such as acrylic can also be used. Here, the case where a glass substrate is used as the substrate 8511 is shown.

Figure 85B:
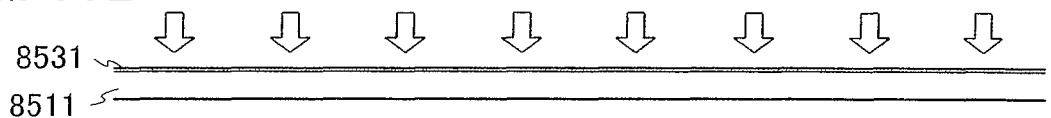

Here, an oxide film or a nitride film may be formed on the surface of the substrate 8511 by oxidising or nitriding the surface of the substrate 8511 by plasma treatment (FIG. 85B). Hereinafter, an insulating film such as an oxide film or a nitride film formed by performing plasma treatment on the surface is also referred to as a plasma-treated insulating film. In FIG. 85B, an insulating film 8531 is a plasma-treated insulating film. In general, when a semiconductor element such as a thin film transistor is provided over a substrate formed of glass, plastic, or the like, an impurity element such as alkali metal (e.g., Na) or alkaline earth metal included in glass, plastic, or the like might be mixed into the semiconductor element so that the semiconductor element is contaminated; thus, characteristics of the semiconductor element might be adversely affected. However, nitridation of a surface of the substrate formed of glass, plastic, or the like can prevent an impurity element such as alkali metal (e.g., Na) or alkaline earth metal included in the substrate form being mixed into the semiconductor element.

Note that when the surface is oxidized by plasma treatment, the plasma treatment is performed in an oxygen atmosphere (e.g., in an atmosphere of oxygen ($O_2$) and a rare gas (containing at least one of Be, He, Ar, Kr, and Xe), in an atmosphere of oxygen, hydrogen ($H_2$), and a rare gas, or in an atmosphere of dinitrogen monoxide and a rare gas) On the other hand, when the surface is nitrided by plasma treatment, the plasma treatment is performed in a nitrogen atmosphere (e.g., in an atmosphere of nitrogen (Nr) and a rare gas (containing at least one of He, Ne, Ax, Kr, and Xe), in an atmosphere of nitrogen, hydrogen, and a rare gas, or in an atmosphere of $NH_3$ and a rare gas). As a tare gas, Ar may be used, for example. Further, a gas in which Ar and Kr are mixed may be used as well. Therefore, the plasma-treated insulating film contains a rare gas (containing at least one of He, Ne, Ar, Kr, and Xe) used for plasma treatment. For example, the plasma-treated insulating film contains Ar when Ar is used.

It is preferable that plasma treatment be performed in the atmosphere containing the aforementioned gas, with conditions of an electron density ranging from $1\times10^{11}$ to $1\times10^{13}$ $cm^{-3}$ and a plasma electron temperature ringing from 0.5 to 1.5 eV. Since the plasma electron density is high and the electron temperature in the vicinity of an object to be treated is low, damage by plasma to the object to be treated can be prevented. Further, since the plasma electron density is as high as $1\times10^{11}$ $cm^{-3}$ or more, an oxide film or a nitride film formed by oxidizing or nitriding the object to be treated by plasma treatment is superior in its uniformity of thickness and the like as well as being dense, as compared with a film formed by a CVD method, a sputtering method, or the like. Further, since the plasma electron temperature is as low as 1 eV or less, oxidation or nitridation can be performed at a lower temperature as compared with a conventional plasma treatment or thermal oxidation. For example, oxidation or nitridation can be performed sufficiently even when plasma treatment is performed at a temperature lower than a strain point of a glass substrate by 100 degrees or more. Note that as frequency for generating plasma, high frequency waves such as microwaves (2.45 GHz) can be used. Note that hereinafter, the plasma treatment is performed using the aforementioned conditions unless otherwise specified.

Note that FIG. 85B shows the case w here the plasma-treated insulating film is formed by plasma treatment to the surface of the substrate 8511; however, the invention includes the case where a plasma-treated insulating film is not formed on the surface of the substrate 8511.

Note that a plasma-treated insulating film formed by plasma treatment to the surface of the object to be treated is not shown in FIGS. 85C to 85G; however, the invention includes the case where a plasma-treated insulating film formed by plasma treatment exists on the surface of the substrate 8511, the insulating film 8512, the semiconductor film 8513, the semiconductor film 8514, the semiconductor film 8515, the insulating film 8516, the insulating film 8518, or the insulating film 8519.

Figure 85C:
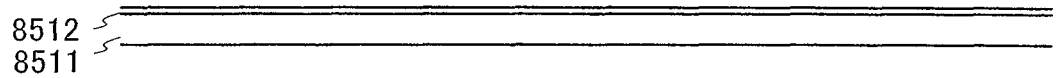

Next, the insulating film 8512 is formed over the substrate 8511 by a known method (such as a sputtering method, an LPCVD method, or a plasma CVD method) (FIG. 85C). As the insulating film 8512, a silicon oxide film or a silicon oxynitride film can be used.

Here, a plasma-treated insulating film may be formed on the surface of the insulating film 8512 by oxidizing or nitriding the surface of the insulating film 8512 by plasma treatment. By oxidizing the surface of the insulating film 8512, the surface of the insulating film 8512 is modified, and the dense film with fewer defects such as a pinhole can be obtained. Further, by oxidizing the surface of the insulating film 8512, the plasma-treated insulating film containing a little amount of N atoms can be formed; thus, interface characteristics between the plasma-treated insulating film and a semiconductor film is improved when the semiconductor film is provided over the plasma-treated insulating film. The plasma-treated insulating film contains a rare gas (containing at least one of He, Ne, Ax, Kr, and Xe) used for plasma treatment. Note that the plasma treatment can be similarly performed under the aforementioned conditions.

Figure 85D:
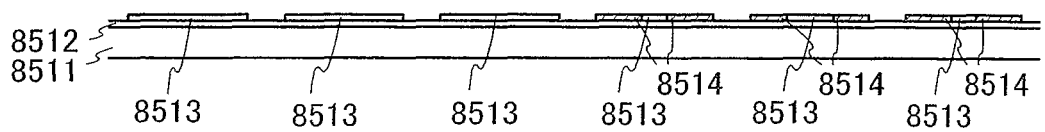
Figure 85E:
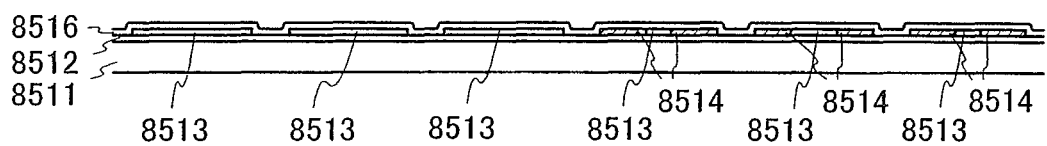

Next, the island-shaped semiconductor films 8513 and 8514 are formed over the insulating film 8512 (FIG. 85D). The island-shaped semiconductor films 8513 and 8514 can be formed in such a manner that an amorphous semiconductor film is formed over the insulating film 8512 by using a material containing silicon (Si) as its main component (e.g., $Si_xGe_{1-x}$) or the like by a known method (such as a sputtering method, an LPCVD method, or a plasma CVD method), the amorphous semiconductor film is crystallized, and the semiconductor film is selectively etched. Note that crystallization of the amorphous semiconductor film can be performed by a known crystallization method such as a laser crystallization method, a thermal crystallization method using RTA or an annealing furnace, a thermal crystallization method using a metal element which promotes crystallization, or a method in which these methods are combined. Here, end portions of the island-shaped semiconductor films are provided to have an angle of about 90 degrees ($\theta=85$ to 100 degrees). Alternatively; the semiconductor film 8514 to be a low concentration drain region may be formed by doping impurities with use of a mask.

Here, a plasma-treated insulating film may be formed on the surfaces of the semiconductor films 8513 and 8514 by oxidizing or minding the surfaces of the semiconductor films 8513 and 8514 by plasma treatment. For example, when Si is used as the semiconductor flints 8513 and 8514, silicon oxide or silicon nitride is formed as the plasma-treated insulating film. Further, after the semiconductor films 8513 and 8514 are oxidized by plasma treatment, the semiconductor films 8513 and 8514 may be nitrided by performing plasma treatment again. In this case, silicon oxide is formed in contact with the semiconductor films 8513 and 8514, and silicon nitride oxide is formed on the surface of the silicon oxide. When the semiconductor film is oxidized by plasma treatment, the plasma treatment is performed in an oxygen atmosphere (e.g., in an atmosphere of oxygen (Or) and a rare gas (containing at least one of He, Ne, Ar, Kr, and Xe), in an atmosphere of oxygen, hydrogen ($H_2$), and a rare gas, or in an atmosphere of dinitrogen monoxide and a rate gas). On the other hand, when the semiconductor film is nitrided by plasma treatment, the plasma treatment is performed in a nitrogen atmosphere (e.g., in an atmosphere of nitrogen (NV) and a rare gas (containing at least one of He, Ne, Ar, Kr, and Xe), in an atmosphere of nitrogen, hydrogen, and a rare gas, or in an atmosphere of $NH_3$ and a rare gas). As a rare gas, Ar may be used, for example. Further, a gas in which Ar and Kr are mixed may be used as well. Therefore, the plasma-treated insulating film contains a rate gas (containing at least one of He, Ne, Ar, Kr, and Xe) used for plasma treatment. For example, the plasma-treated insulating film contains Ar when Ar is used.

Next, the insulating film 8516 is formed (FIG. 85B). The insulating film 8516 can have a single-layer structure or a stacked-layer structure of an insulating film containing oxygen or nitrogen, such as silicon oxide, silicon nitride, silicon oxynitride, or silicon nitride oxide, by a known method (such as a sputtering method, an LPCVD method, or a plasma CVD method). Note that when the plasma-treated insulating film is formed on the surfaces of the semiconductor films 8513 and 8514 by plasma treatment to the surfaces of the semiconductor films 8513 and 8514, the plasma-treated insulating film can be used as the insulating film 8526.

Here, the surface of the insulating film 8516 may be oxidized or nitrided by plasma treatment, so that a plasma-treated insulating film is formed on the surface of the insulating film 8516. Note that the plasma-treated insulating film contains a rare gas (containing at least one of He, Ne, Ar, Kr, and Xe) used for plasma treatment. Note that the plasma treatment can be similarly performed under the aforementioned conditions.

Alternatively, after the insulating film 8516 is oxidized by plasma treatment once in art oxygen atmosphere, the insulating film 8516 may nitrided by performing plasma treatment again in a nitrogen atmosphere, fly oxidizing or nitriding the surface of the insulating film 8516 by plasma treatment in such a manner, the surface of the insulating film 8516 is modified, and the dense film can be formed. The insulating film obtained by plasma treatment is denser and has fewer defects such as a pinhole, as compared with an insulating film formed by a CVD method, a sputtering method, or the like, thus, characteristics of the thin film transistor can be improved.

Figure 85F:
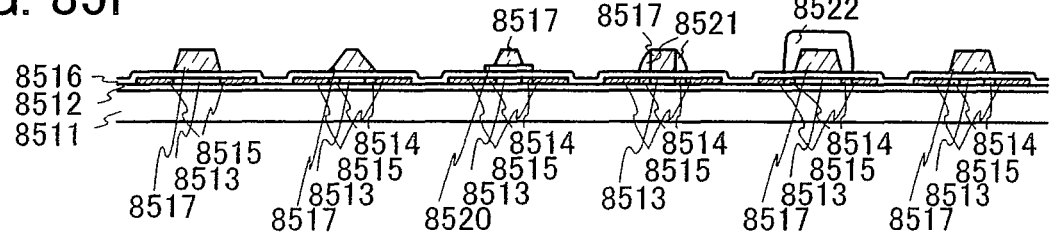

Next, the gate electrode 8517 is formed (FIG. 85F). The gate electrode 8517 can be formed by a known method (such as a sputtering method, an LPCVD method, or a plasma CVD method).

In the TFT 8501, the semiconductor films 8515 used as the source region and the drain region can be formed by doping impurities after the gate electrode 8517 is formed.

In the TFT 8502, the semiconductor films 8514 used as the LDD regions and the semiconductor films 8515 used as the source region and the drain region can be formed by doping impurities after the gate electrode 3517 is formed.

In the TFT 8503, the semiconductor films 8514 used as the LDD regions and the semiconductor films 8515 used as the source region and the drain region can be formed by doping impurities after the gate electrode 8517 is formed.

In the TFT 8504, the semiconductor films 8514 used as the LDD regions and the semiconductor films 8515 used as the source region and the drain region can be formed by doping impurities after the sidewall 8521 is formed on the side surface of the gate electrode 8517. Note that silicon oxide or silicon nitride can be used for the sidewall 8521. As a method of forming the sidewall 8521 on the side surface of the gate electrode 8517, a method where a silicon oxide film or a silicon nitride film is formed by a known method after the gate electrode 8517 is formed, and then, the silicon oxide film or the silicon nitride film is etched by anisotropic etching can be used, for example. Thus, the silicon oxide film or the silicon nitride film remains only on the side surface of the gate electrode 3517, so that the sidewall 8521 can be formed on the side surface of the gate electrode 8517.

In the TFT 8505, the semiconductor films 8514 used as the LDD (Loff) regions and the semiconductor films 8515 used as the source region and the drain region can be formed by doping impurities after a mask 8521 is formed to cover the gate electrode 8517.

In the TFT 8506, the semiconductor films 8514 used as the LDD (Lov) regions and the semiconductor films 8515 used as the source region and the drain region cart be formed by doping impurities after the gate electrode 8517 is formed.

Figure 85G:
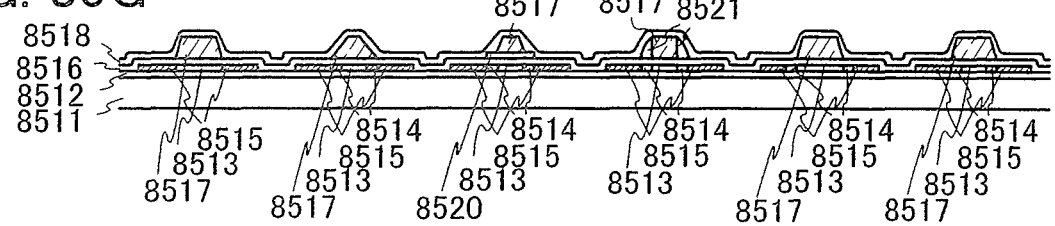

Next, the insulating film 8518 is formed (FIG. 85G). The insulating film 8518 can have a single-layer structure or a slacked-layer structure of an insulating film containing oxygen or nitrogen, such as silicon oxide, silicon nitride, silicon oxynitride, or silicon nitride oxide; or a film containing carbon, such as a DLC (Diamond-Like Carbon), by a known method (such as a sputtering method or a plasma CVD method).

Here, the surface of the insulating film 8518 may be oxidized or nitrided by plasma treatment, so that a plasma-treated insulating film is formed on the surface of the insulating film 8518. Note that the plasma-treated insulating film contains a rare gas (containing at least one of Be, Ne, Ax, Kr, and Xe) used for plasma treatment Note that the plasma treatment can be similarly performed under the aforementioned conditions.

Next, the insulating film 8519 is formed. The insulating film 8519 can have a single-layer structure or a stacked-layer structure of an organic material such as epoxy, polyimide, polyamide, polyvinyl phenol, benzocyclobutene, or acrylic; or a siloxane resin, in addition to an insulating film containing oxygen or nitrogen, such as silicon oxide, silicon nitride, silicon oxynitride, or silicon nitride oxide; or a film containing carbon, such as a DLC (Diamond-Like Carbon), by known method (such as a sputtering method or a plasma CVD method). Note that a siloxane resin corresponds to a resin having Si—O—Si bonds. Siloxane includes a skeleton structure of a bond of silicon (Si) and oxygen (O). As a substituent an organic group containing at least hydrogen (such as an alkyl group or aromatic hydrocarbon) is used. Alternatively, a fluoro group, or a fluoro group and an organic group containing at least hydrogen can be used as a substituent. Further, the plasma-treated insulating film contains a rare gas (containing at least one of He, Ne, Ar, Kr, and Xe) used for plasma treatment. For example, the plasma-treated insulating film contains Ar when Ar is used.

When an organic material such as polyimide, polyamide, polyvinyl phenol, benzocyclobutene, or acrylic, or a siloxane resin is used for the insulating film 8519, the surface of the insulating film 8519 can be modified by oxidizing or nitriding the surface by plasma treatment. Modification of the surface improves intensify of the insulating film 8519, and physical damage such as a crack generated when an opening is formed, for example, or film reduction in etching can be reduced. Further, when the conductive film 8523 is formed over the insulating film 8519, modification of the surface of the insulating film 8519 improves adhesion to the conductive film. For example, when a siloxane resin is used for the insulating film 8519 and nitrided by plasma treatment, a plasma-treated insulating film containing nitrogen or a rare gas is formed by nitriding a surface of the siloxane resin, and physical intensity is improved.

Next, a contact hole is formed in the insulating films 8519, 8518, and 8516 in order to form the conductive film 8523 electrically connected to the semiconductor film 8515. Note that the contact hole may have a tapered shape. Thus, coverage with the conductive film 8523 can be improved.

Note that the method of forming the semiconductor device shown in this embodiment mode can be applied to the method of forming the display device shown in other embodiment modes in this specification. Further, the method of forming the semiconductor device shown in this embodiment mode cat) be implemented in free combination with each other.

Embodiment Mode 16

In this embodiment mode, a halftone method is described as a process of forming a semiconductor device such as a transistor.

Figure 104:
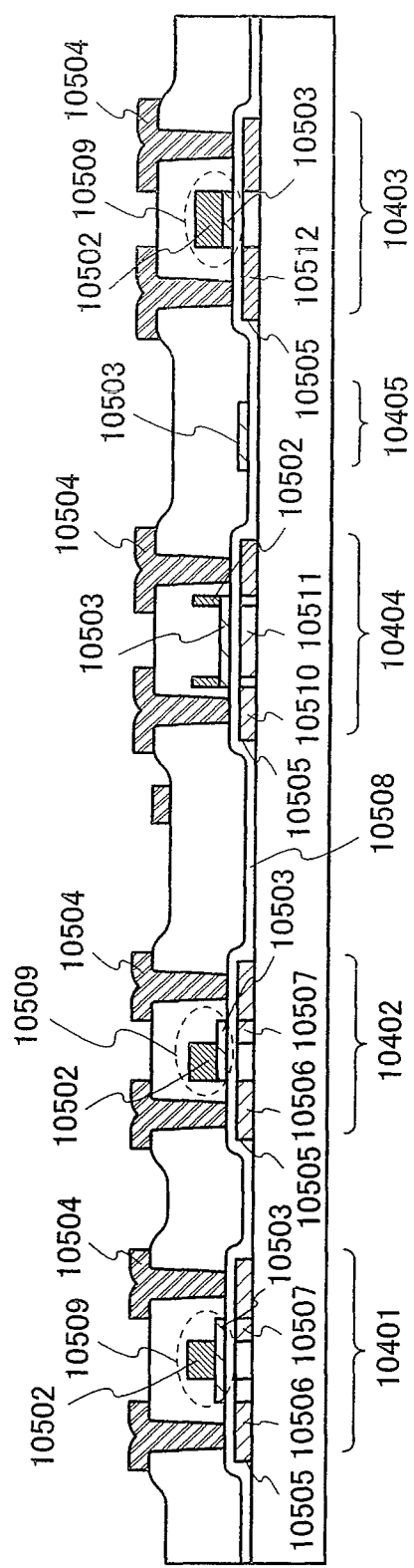
FIG. 104 illustrates Embodiment Mode 16.

FIG. 104 is a cross-sectional view showing a semiconductor device including a transistor, a capacitor, and a resistor. FIG. 104 shows N-channel transistors 10401 and 10402, a capacitor 10404, a resistor 10405, and a P-channel transistor 10403. Each transistor includes a semiconductor layer 10505, an insulating film 10508, and a gate electrode 10509. The gate electrode 10509 has a stacked-layer structure of a first conductive layer 10503 and a second conductive layer 10502. FIGS. 105A to 105E are top plan views corresponding to the transistor, the capacitor, and the resistor in FIG. 104, which can be used as reference.

In FIG. 104, in the channel length direction (a direction in which carriers flow) of the N-channel transistor 10401, impurity regions 10507 (also called lightly doped drain (LDD)) are formed on opposite sides of the gate electrode and in the semiconductor layer 10505, which are doped with impurities at a lower concentration than impurity regions 10506 which form a source region and a drain region electrically connected to wirings 10504. When the N-channel transistor 10401 is formed, phosphorus or the tike is added to the impurity regions 10506 and 10507 as impurities which impart n-type conductivity. The LDD is formed in order to suppress hot-election degradation and a short-channel effect.

As shown in FIG. 105A, in the gate electrode 10509 of the N-channel transistor 10401, the first conductive layer 10503 is formed to extend beyond each side of the second conductive layer 10502. In this ease, the first conductive layer 10503 is formed to be thinner than the second conductive layer 10502. The first conductive layer 10503 is formed to have a thickness enough for ion species which are accelerated with an electric, field of 10 to 100 kV to pass through. The impurity regions 10507 are formed to overlap with the first conductive layer 10503 of the gate electrode 10509. That is, LDD regions which overlap with the gate electrode 10509 are formed. In this structure, in the gate electrode 10509, the impurity regions 10507 are formed in a self-aligned manner by adding impurities having one conductivity type (to the semiconductor layer 10505) through the first conductive layer 10503, using the second conductive layer 10502 as a mask. That is, the LDDs which overlap with the gate electrode are formed in a self-aligned manner.

In FIG. 104, in the N-channel transistor 10402, the impurity region 10507, which is doped with imparities at a lower concentration than the impurity regions 10506, is formed on one side of the gate electrode and in the semiconductor layer 10505. As shown in FIG. 105B, in the gate electrode 10509 of the N-channel transistor 10402, the first conductive layer 10503 is formed to extend beyond one side of the second conductive layer 10502. In this case also, an LDD can be formed in a self-aligned manner by adding impurities having one conductivity type (to the semiconductor layer 10505) through the first conductive layer 10503, using the second conductive layer 10502 as a mask.

A transistor having an LDD on one side may be used as a transistor in which only a positive voltage or a negative voltage is applied between a source terminal and a drain terminal. Specifically, such a transistor may be used as a transistor forming a logic gate, for example, an inverter circuit, a NAND circuit, a NOR circuit, or a latch circuit; or a transistor forming an analog circuit, for example, a sense amplifier, a constant voltage generation circuit, or a VCO.

In FIG. 104, the capacitor 10404 is formed, in which the insulating layer 10508 is interposed between the first conductive, layer 10503 and the semiconductor layer 10505. The semiconductor layer 10505 for forming the capacitor 10404 includes impurity regions 10510 and 10511. The impurity region 10511 is formed in a position of the semiconductor layer 10505, which overlaps with the first conductive layer 10503. The impurity region 10510 is electrically connected to the wiring 10504. Since impurities having one conductivity type can be added to the impurity region 10511 through the first conductive layer 10503, the concentration of impurities contained in the impurity regions 10510 and 10511 can be controlled to be either the same or different. In either case, since the semiconductor layer 10505 in the capacitor 10404 functions as an electrode, the resistance of the semiconductor layer 10505 is preferably lowered by adding impurities having one conductivity type thereto. Further, the first conductive layer 10503 can fully function as an electrode by utilizing the second conductive layer 10502 as an auxiliary electrode as shown in FIG. 105C. In this manner, by forming a composite electrode structure where the first conductive layer 10503 and the second conductive layer 10502 are combined, the capacitor 10404 can be formed in a self-aligned manner.

In FIG. 104, the resistor 10405 is formed of the first conductive layer 10503. The first conductive layer 10503 is formed having a thickness of 30 to 150 nm; therefore, the resistor can be formed by setting the width or the length of the first conductive layer 10503 as appropriate.

The resistor may include a semiconductor layer containing impurity elements at a high concentration or a thin metal layer. A metal layer is preferable since the resistance value thereof is determined by the thickness and quality of the film, and thus has small variations, whereas the resistance value of a semiconductor layer is determined by the thickness and quality of the film, the concentration and activation rate of impurities, and the like. FIG. 105D is a top plan view of the resistor 10405.

In FIG. 104, the semiconductor layer 10505 in the P-channel transistor 10403 is provided with impurity regions 10512. This impurity regions 10512 form a source region and a drain region forming a contact with the wiring 10504. The gate electrode 10509 has a structure where the first conductive layer 10503 and the second conductive layer 10502 overlap with each other. The P-channel transistor 10403 is a transistor having a single-drain structure where no LDD is provided. When the P-channel transistor 10403 is formed, boron or the like as impurities which impart p-type conductivity is added to the impurity regions 10512. On the other hand, an N channel transistor having a single-drain structure can also be formed if phosphorus is added to the impurity regions 10512. FIG. 105B is a top plan view of the F-channel transistor 10403.

One or both of the semiconductor layer 10505 and the insulating layer 10508 may be oxidized or nitrided by high-density plasma treatment in which plasma is excited by microwaves, with an electron temperature of 2 eV or less, an ion energy of 5 eV or less, and an electron density in the range of approximately $10^{11}$ to $10^{13}$/cm$^3$. At this time, by treating the layer in an oxygen atmosphere (e.g., $O_2$ or $N_2O$) or a nitrogen atmosphere (e.g., $N_2$ or $NH_3$) with the substrate temperature being set at 300 to 450° C., a defect level of an interface between the semiconductor layer 10505 and the insulating layer 10508 can be lowered. The insulating layer 10508 can be densified by this treatment. That is, generation of charge defects can be suppressed, and fluctuation of a threshold voltage of the transistor can be suppressed. In addition, in the case of driving the transistor with a voltage of 3 V or less, a layer oxidized or nitrided by the plasma treatment can be used as the insulating layer 10508. In the cast of driving the transistor with a voltage of 3 V or more, the insulating layer 10508 can be formed by combining an insulating layer formed on the surface of the semiconductor layer 10505 by the plasma treatment with an insulating layer deposited by a CVD method (a plasma CVD method or a thermal CVD method). Similarly, such an insulating layer can also be utilized as a dielectric layer of the capacitor 10404. In this case, the insulating layer formed by the plasma treatment is a dense film with a thickness of 1 to 10 nm; thus, a capacitor with high charge capacity can be formed.

As described with reference to FIGS. 104 and 105A to 105B, elements having various structures can be formed of a combination of conductive layers with different thicknesses. A region where only the first conductive layer is formed and a region where both the first conductive layer and the second conductive layer are formed can be formed using a photomask or a reticle having a diffraction grating pattern or an auxiliary pattern which is formed of a semi-transmissive film and has a function to reduce the light intensity. That is, in a photolithography step, the thickness of a resist mask to be developed is varied by controlling the amount of light transmitting through the photomask when a photoresist is exposed to light. In this case, a resist with the aforementioned complex shape may be formed by providing the photomask or the reticle with slits having a resolution limit or less. Further, the mask pattern formed of a photoresist material may be transformed by baking at approximately 200° C. after development.

By using a photomask or a reticle having a diffraction grating pattern or an auxiliary pattern which is formed of a semi-transmissive film and has a function to reduce the light intensity, the region where only the first conductive layer is formed and the region where the first conductive layer and the second conductive layer are stacked can be continuously formed. As shown in FIG. 105A, the region where only the first conductive layer is formed can be selectively formed over the semiconductor layer. Such a region is effective over the semiconductor layer, whereas it is not needed in other regions (wiring regions connected to a gate electrode). With such a photomask or reticle, the region where only the first conductive layer is formed is not necessarily formed in a wiring portion; therefore, the density of the wiring can be substantially increased.

In FIGS. 104 and 105A to 105B, the first conductive layer is formed having a thickness of 30 to 50 nm, using a refractory metal such us tungsten (W), chromium (Cr), tantalum (Ta), tantalum nitride, or molybdenum (Mo), or an alloy or a compound containing such a metal as its main component. The second conductive layer is formed having a thickness of 300 to 600 nm, using a refractory metal such as tungsten (W), chromium (Or), tantalum (Ta), tantalum nitride, or molybdenum (Mo), or an alloy or a compound containing such a metal as its main component. For example, the first conductive layer mid the second conductive layer are formed using different conductive materials, so that the etching rate of each conductive layer can be varied in an etching step to be performed later. For example, a tantalum nitride film can be used for the first conductive layer and a tungsten film can be used for the second conductive layer.

This embodiment mode shows that a transistor, a capacitor, and a resistor each having a different electrode structure can be separately formed through the same patterning step, using a photomask or a reticle having a diffraction grating pattern or an auxiliary pattern which is formed of a semi-transmissive film and has a function to reduce the light intensity. Thus, elements with different modes can be formed and integrated in accordance with characteristics of a circuit without increasing the number of manufacturing steps.

Note that the method or forming the semiconductor device shown in this embodiment mode can be applied to the method of forming the display device shown in other embodiment modes in this specification. Further, the method of forming the semiconductor device shown in this embodiment mode can be implemented in free combination with each other.

Embodiment Mode 17

In this embodiment mode, another structure which can be applied to the case where the display device of the invention is provided with a light-emitting element is described with reference to FIGS. 86A to 86C and 102A to 102C.

Light-emitting elements utilizing electroluminescence are classified according to whether a light-emitting material is an organic compound or an inorganic compound, la general, the former is referred to as an organic EL element, and the latter is referred to as an inorganic EL element.

An inorganic EL element is classified as either a dispersion type inorganic EL element or a thin-film type inorganic EL element, depending on its element structure. These elements differ in that the former includes an electroluminescent layer in which panicles of a light-emitting material are dispersed in a binder, whereas the latter includes an electroluminescent layer formed of a thin film of a light emitting material. However, the former and the latter have in common in that they need electrons accelerated by a high electric field. Mechanisms of obtained light emission are donor-acceptor recombination light emission which utilizes a donor level and an acceptor level; and localized light emission which utilizes inner-shell electron transition of a metal ion. In general, donor-acceptor recombination light emission is employed in dispersion type inorganic EL elements and localized light emission is employed in thin-film type inorganic EL elements in many cases.

A light-emitting material which can be used in the invention includes a base material and an impurity element to be a luminescence center. Light emission of various colors can be obtained by changing the impurity element to be included. The light-emitting material can be formed using various methods, such as a solid phase method or a liquid phase method (coprecipitation method). Further, a liquid phase method such as a spray pyrolysis method, a double decomposition method, a method which employs a pyrolytic reaction of a precursor, a reverse micelle method, a method in which one or more of these methods are combined with high-temperature baking, or a freeze-drying method, or the like can be used.

A solid phase method is a method in which a base material and an impurity element or a compound containing an impurity element are weighed, mixed in a mortar, and heated and baked in an electric furnace so as to be reacted; thus, the impurity element is included in the base material. The baking temperature is preferably 700 to 1500° C. This is because a solid-phase reaction does not proceed when the temperature is too low, and the base material decomposes when the temperature is too high. Note that the materials may be baked in powder form; however, they are preferably baked in pellet form. A solid phase method needs a comparatively high temperature compared with other methods such as a liquid phase method, but is a simple method, and thus has high productivity and is suitable for mass production.

A liquid phase method (coprecipitation method) is a method in which a base material or a compound containing a base material, and an impurity element or a compound containing an impurity element are reacted in a solution, dried, and then baked. The particles of the light-emitting material are uniformly distributed, and the reaction can progress even when the particles are small and the baking temperature is lower than that of a solid phase method.

As the base material to be used for the light-emitting material, sulfide, oxide, or nitride can be used. As sulfide, zinc sulfide, cadmium sulfide, calcium sulfide, yttrium sulfide, gallium sulfide, strontium sulfide, barium sulfide, or the like can be used, for example. As oxide, zinc oxide, yttrium oxide, or the like can be used, for example. As nitride, aluminum nitride, gallium nitride, indium nitride, or the like can be used, for example. Alternatively, zinc selenide, zinc telluride, or the like; or a ternary mixed crystal such as calcium gallium sulfide, strontium gallium sulfide, or barium gallium sulfide may be used.

As a luminescence center for localized light emission, manganese (Mn), copper (Cu), samarium (Sm), terbium (Tb), erbium (Er), thulium (Tm), europium (Hu), cerium (Ce), praseodymium (Pr), or the like can be used. Further, a halogen element such as fluorine (F) or chlorine (Cl) may be added for charge compensation.

On the other hand, as a luminescence center for donor-acceptor recombination light emission, a light-emitting material containing a first impurity element forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

When the light-emitting material for donor-acceptor recombination light emission is synthesized using a solid phase method, a base material, the first impurity element or a compound containing the first impurity element, and the second impurity element or a compound containing the second impurity element are weighed, mixed in a mortar, and heated and baked in an electric furnace. As the base material, the aforementioned base materials can be used. As the first impurity element or the compound containing the first impurity element, fluorine (F), chlorine (Cl), aluminum sulfide, or the like can be used, for example. As the second impurity element or the compound containing the second impurity element, copper (Cu), silver (Ag), copper sulfide, silver sulfide, or the like can be used, for example. The baking temperature is preferably 700 to 1500° C. This is because a solid-phase reaction docs not proceed when the temperature is too low, and the base material decomposes when the temperature is too high. Note that the materials may be baked in powder form; however, they are preferably baked in pellet form.

Alternatively, as the impurity element in the case where the solid phase reaction is used, a compound formed of the first impurity element and the second impurity element may be used in combination. In this case, the impurity elements are easily diffused and the solid phase reaction proceeds readily; therefore, a uniform light-emitting material can be obtained. Further, since an unnecessary impurity element is not included, a high purity light-emitting material can be obtained. As the compound formed of the first impurity element and the second impurity element, copper chloride, silver chloride, or the like can be used, for example.

Note that the concentration of these impurity elements may be in the range of 0.01 to 10 atomic %, and is preferably in the range of 0.05 to 5 atomic % with respect to the base material.

In the ease of a thin-film type inorganic EL element, an electroluminescent layer includes the aforementioned light-emitting material, and can be formed using a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALB) method, or the like can be used.

Figure 86A:
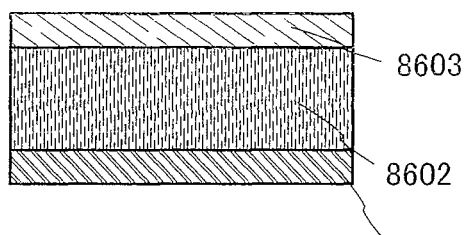
FIGS. 86A to 86C illustrate Embodiment Mode 17.
Figure 86B:
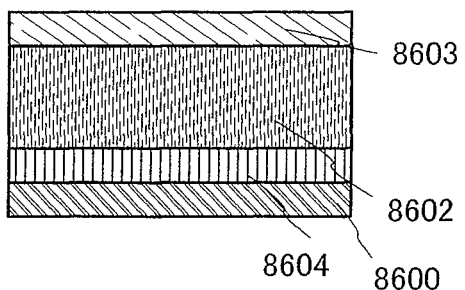
Figure 86C:
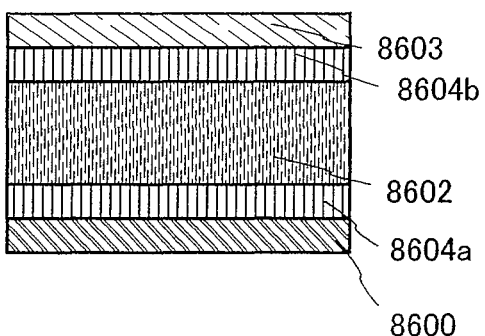

FIGS. 86A to 86C each show an example of a thin-film type inorganic EL element which can be used as the light-emitting element. In FIGS. 86A to 86C, the light-emitting element includes a first electrode layer 8600, an electroluminescent layer 8602, and a second electrode layer 8603.

The light-emitting elements in FIGS. 86B and 86C each have a structure where an insulating layer is provided between the electrode layer and the electroluminescent layer in the light-emitting element in FIG. 86A. The light-emitting element in FIG. 86B includes an insulating layer 8604 between the first electrode layer 8600 and the electroluminescent layer 8602. The light-emitting element in FIG. 86C includes an insulating layer 8604a between the first electrode layer 8600 and the electroluminescent layer 8602, and an insulating layer 8604b between the second electrode layer 8603 and the electroluminescent layer 8602. Thus, the insulating layer may be provided between the electroluminescent layer and one of the electrode layers interposing the electroluminescent layer, or may be provided between the electroluminescent layer and each of the electrode layers interposing the electroluminescent layer. Further, the insulating layer may be a single layer or stacked layers including a plurality of layers.

Note that the insulating layer 8604 is provided in contact with the first electrode layer 8600 in FIG. 86B; however, the insulating layer 8604 may be provided in contact with the second electrode layer 8603 by reversing the positions of the insulating layer and the electroluminescent layer.

In the case of a dispersion type inorganic EL, a film-shaped electroluminescent layer is formed by dispersing particulate light-emitting materials in a binder. When particles with a desired size cannot be sufficiently obtained by a method of forming the light-emitting material, the light-emitting materials may be processed into particles by being crushed in a mortar or the like. The binder is a substance for fixing particulate light-emitting material in a dispersed state and maintaining the shape as the electroluminescent layer. The light-emitting material is uniformly dispersed in the electroluminescent layer and fixed by the binder.

In the case of a dispersion type inorganic EL, as a method of forming the electroluminescent layer, a droplet discharging method by which the electroluminescent layer can be selectively formed, a printing method (such as screen printing or offset printing), a coating method such as a spin coating method, a dipping method, a dispenser method, or the like can be used. The thickness of the electroluminescent layer is not particularly limited, but preferably in the range of 10 to 1000 nm. Further, in the electroluminescent layer including the light-emitting material and the binder, a ratio of the light-emitting material is preferably 50 wt % or more and 80 wt % or less.

Figure 102A:
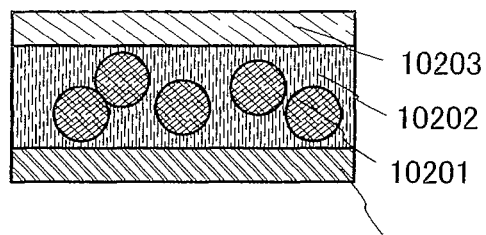
FIGS. 102A to 102C illustrate Embodiment Mode 17.
Figure 102B:
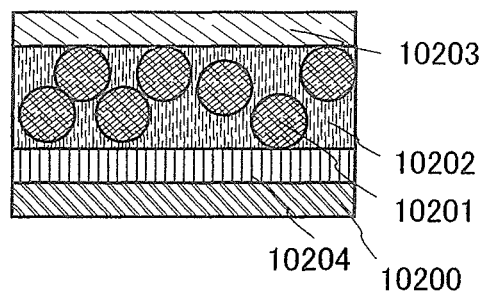
Figure 102C:
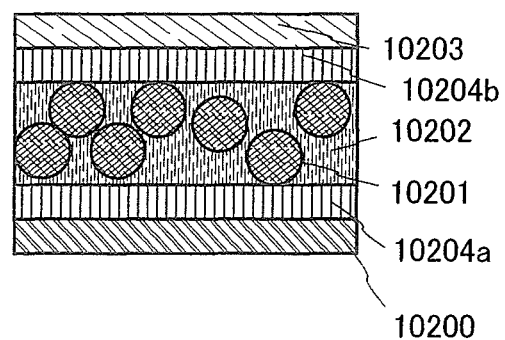

FIGS. 102A to 102C each show an example of n dispersion type inorganic EL element which can be used as the light-emitting element A light-emitting element in FIG. 102A has a stacked-layer structure of a first electrode layer 10200, an electroluminescent layer 10202, and a second electrode layer 10203. The electroluminescent layer 10202 includes a light-emitting material 10201 held by a binder.

As the binder which can be used in this embodiment mode, an organic material or an inorganic material, or a mixed material containing an organic material and an inorganic material can be used. As the organic material, a polymer having comparatively high dielectric constant, such as a cyanoethyl cellulose based resin, or a resin such as polyethylene, polypropylene, a polystyrene based resin, a silicone resin, an epoxy resin, or vinylidene fluoride can be used. Alternatively, a heat-resistant polymer such as aromatic polyamide or polybenzimidazole, or a siloxane resin may be used.

Note that a siloxane resin corresponds to a resin having Si—O—Si bonds. Siloxane includes a skeleton structure of a bond of silicon (Si) and oxygen (O). As a substituent, an organic group containing at least hydrogen (such as an alkyl group or aromatic, hydrocarbon) is used. Alternatively, a fluoro group, or a fluoro group and an organic group containing at least hydrogen may be used as a substituent. Further, a resin material, for example, a vinyl resin such as polyvinyl alcohol or polyvinylbutyral, a phenol resin, a novolac resin, an acrylic resin, a melamine resin, an urethane resin, air oxazole resin (e.g., polybenzoxazole), or the like may be used. In addition, fine panicles having a high dielectric constant, such as particles of barium titanate or strontium titanate, can be adequately mixed with these resins to adjust the dielectric constant.

The inorganic material included in the binder can be formed using silicon oxide, silicon nitride, silicon containing oxygen and nitrogen, aluminum nitride, aluminum containing oxygen and nitrogen, aluminum oxide, titanium oxide, barium titanate, strontium titanate, lead titanate, potassium niobate, lead niobate, tantalum oxide, barium rantalate, lithium tantalate, yttrium oxide, zirconium oxide, zinc sulfide, or a substance containing an inorganic insulating material. When an inorganic material having a high dielectric constant is included in the organic material (by addition or the like), the dielectric constant of the electroluminescent layer formed of the light-emitting material and the binder can be more effectively controlled and can be further improved.

In a manufacturing process, the light-emitting materials axe dispersed in a solution containing the binder. As a solvent for a solution containing the binder which can be used in this embodiment mode, a solvent in which a binder material can be dissolved and which can form a solution having a viscosity suitable for a method (various wet processes) of forming the electroluminescent layer with a desired thickness may be selected as appropriate. An organic solvent or the like can be used. For example, when a siloxane resin is used as the binder, propylene glycol monomethyl ether, propylene glycol monomethyl ether acetate (also referred to as PGMEA), 3-methoxy-3-methyl-1-butanol (also referred to as MMB), or the like can be used.

The light-emitting elements in FIGS. 102B and 102C each have a structure where an insulating layer is provided between the electrode layer and the electroluminescent layer in the light-emitting element in FIG. 102A. The light-emitting element in FIG. 102B includes an insulating layer 10204 between the first electrode layer 10200 and the electroluminescent layer 10202. The light-emitting element in FIG. 102C includes an insulating layer 10204a between the first electrode layer 10200 and the electroluminescent layer 10202, and an insulating layer 10204b between the second electrode layer 30203 and the electroluminescent layer 10202. Thus, the insulating layer may be provided between the electroluminescent layer and one of the electrode layers interposing the electroluminescent layer, or may be provided between the electroluminescent layer and each of the electrode layers interposing the electroluminescent layer. Further, the insulating layer may be a single layer or stacked layers including a plurality of layers.

Note that the insulating layer 10204 is provided in contact with the first electrode layer 10200 in FIG. 102B; however, the insulating layer 10204 may be provided in contact with the second electrode layer 10203 by reversing the positions of the insulating layer and the electroluminescent layer.

The insulating layers such as the insulating layer 8604 in FIGS. 86A and 86B and the insulating layer 10204 in FIGS. 102A and 102B are not particularly limited, but preferably have high withstand voltage and are dense films. Further, the insulating layer preferably has high dielectric constant. For example, silicon oxide, yttrium oxide, titanium oxide, aluminum oxide, hafnium oxide, tantalum oxide, barium titanate, strontium titanate, lead titanate, silicon nitride, zirconium oxide; or a mixed film of those materials or a stacked-layer film including two or more of those materials can be used. The insulating film can be formed by sputtering, evaporation, CVD, or the like. Alternatively, the insulating layer may be formed by dispersing particles of these insulating materials in a binder. A binder material may be formed using a material similar to that of a binder contained in an electroluminescent layer, by using a method similar thereto. The thickness of the insulating layer is not particularly limited, but preferably in the range of 10 to 1000 nm.

The light-emitting element in this embodiment mode can emit light when a voltage is applied between the pair of electrode layers interposing the electroluminescent layer. The light-emitting element can operate with DC drive or AC drive.

Note that each display device shown in this embodiment mode can be implemented in free combination with the structure of each display device shown in other embodiment modes in this specification. Further, the structures of the display device shown in this embodiment mode can be implemented in free combination with each other.

Embodiment Mode 18

Figure 87:
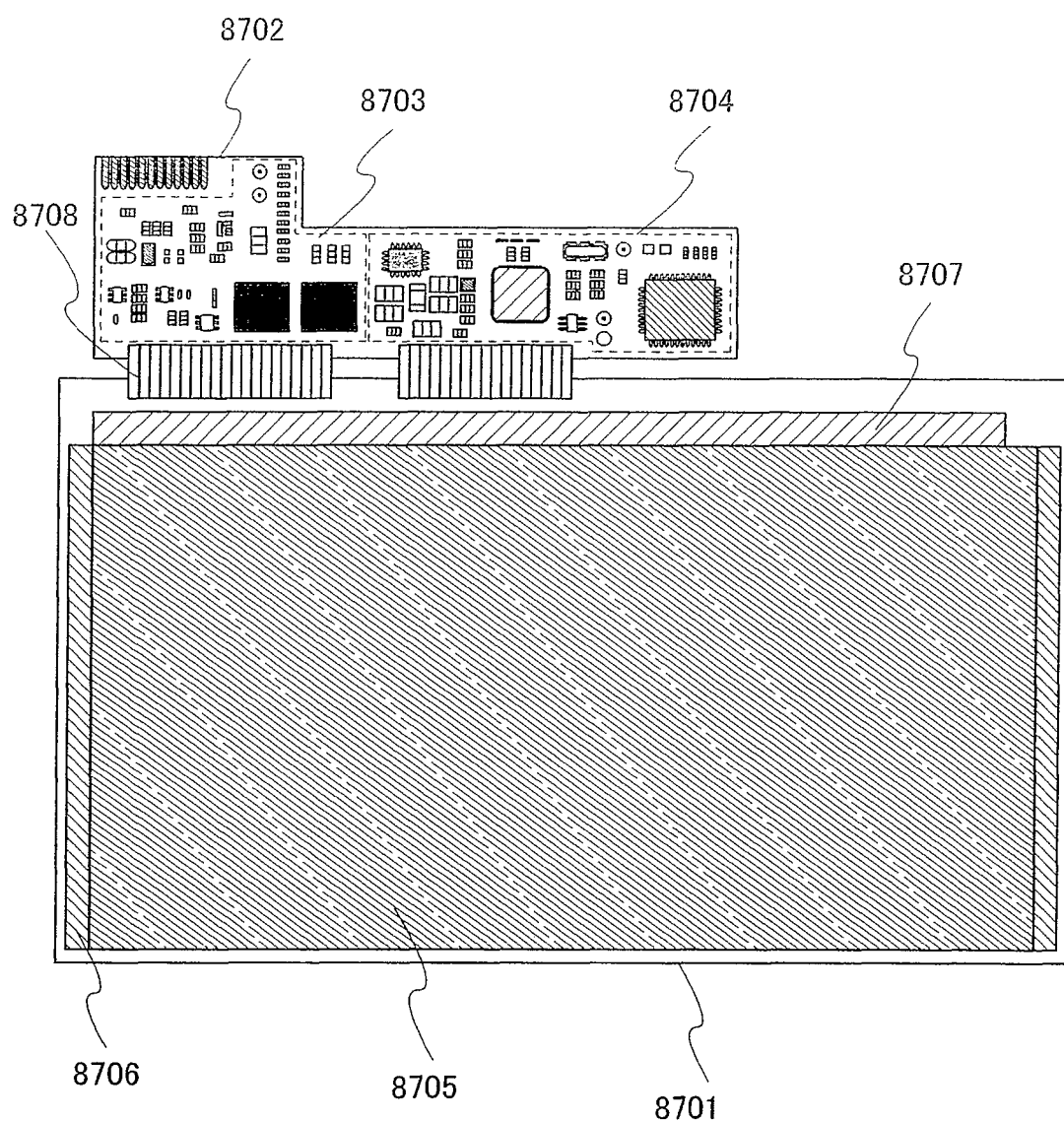
FIG. 87 illustrates Embodiment Mode 18.

FIG. 87 shows a display module combining a display panel 8701 and a circuit hoard 8702. The circuit board 8702 is provided with a control circuit 8703, a signal dividing circuit 8704, and the like, for example. The display panel 8701 and the circuit board 8702 are connected to each other by a connection wiring 8708.

The display panel 8701 includes a pixel portion 8705 in which each pixel is provided with a display element, a scan line driver circuit 8706, and a signal line driver circuit 8707 which supplies a video signal to a selected pixel. The pixel is similar to that in Embodiment Modes 9 and 10. The scan line driver circuit 8706 is similar to that, in Embodiment Modes 1 to 8. The signal line driver circuit 8707 is similar to that in Embodiment Mode 11.

As has been described above, the signal line driver circuit 8707 is not always needed, and a video signal may be supplied from the circuit board 8702 to the selected pixel through the connection wiring 8708. Further, the scan line driver circuit 8706 may be provided on opposite sides of the pixel portion 8705.

Figure 88:
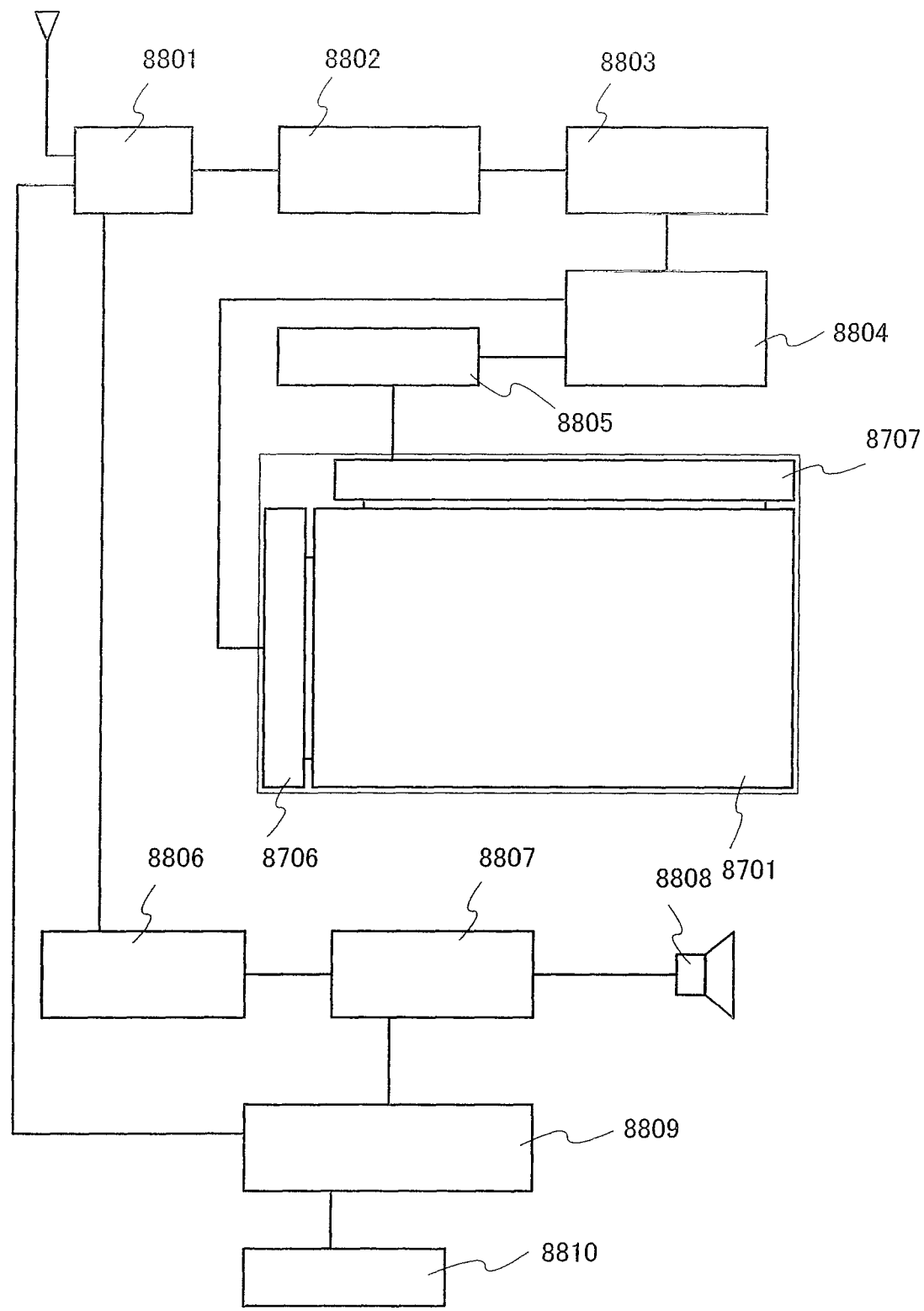
FIG. 88 illustrates Embodiment Mode 18.

A liquid crystal television receiver or an EL television receiver can be completed with this display module. FIG. 88 is a block diagram showing a main structure of a television receiver. A tuner 8801 receives a video signal and an audio signal. The video signals are processed by a video signal amplifier circuit 8802; a video signal processing circuit 8803 which converts a signal output from the video signal amplifier circuit 8802 into a color signal corresponding to each color of red, green and blue; and a control circuit 8804 which converts the video signal into the input specification of a driver IC The control circuit 8804 outputs a signal to each of a scan line and a signal line. When performing digital drive, a structure may be employed in which a signal dividing circuit 8805 is provided on the signal line side so that an input digital signal is divided into m signals to be supplied.

Among the signals received by the tuner 8801, an audio signal is transmitted to that audio signal amplifier circuit 8806, and an output thereof is supplied to a speaker 8808 through an audio signal processing circuit 8807. A control circuit 8809 receives control information on receiving station (receiving frequency) and volume from an input portion 8810 and transmits signals to the toner 8801 and the audio signal processing circuit 8807.

Figure 89:
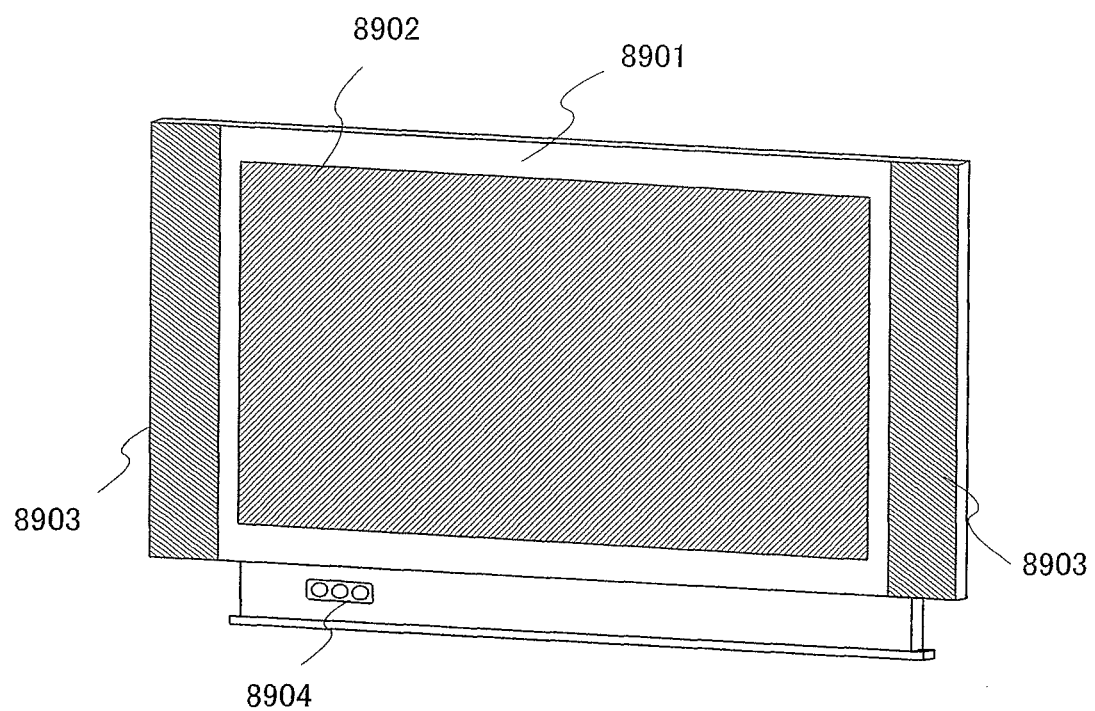
FIG. 89 illustrates Embodiment Mode 18.

As shown in FIG. 89, the display module is incorporated in a housing 8901, so that a television receiver can be completed. A display panel 8902 is formed using the display module. The television receiver is provided with a speaker 8903, an operation switch 8904, and the like as appropriate.

Since this television receiver is formed including the display panel 8902, the number of components can be reduced. Therefore, the television receiver can be manufactured at low cost.

It is needless to say that the invention is not limited to the television receiver and can be applied to various uses, especially as a large display medium such as a monitor of a personal computer, an information display board at the train station, the airport, or the like, or an advertisement display board on the street.

Note that the structures of the display panel and the display module shown in this embodiment mode can be implemented in free combination with the structure of each display device shown in other embodiment modes in this specification. Further, the structures of the display panel and the display module shown in this embodiment mode can be implemented in free combination with each other.

Embodiment Mode 19

Figure 90A:
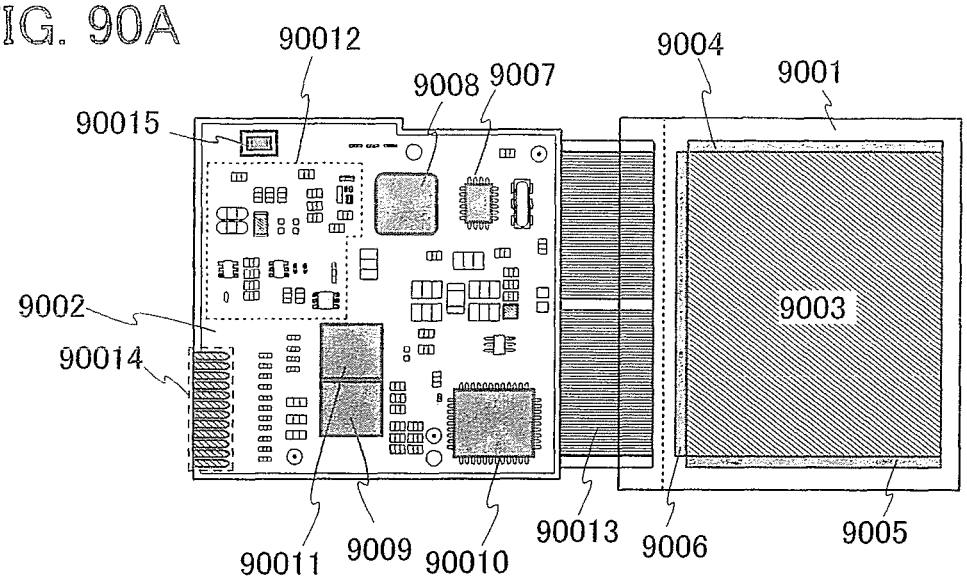
FIGS. 90A and 90B illustrate Embodiment Mode 19.

FIG. 90A shows a module combining a display panel 9001 and a printed wiring board 9002. The display panel 9001 includes a pixel portion 9003 provided with a plurality of pixels, a first scan line driver circuit 9004, a second scan line driver circuit 9005, and a signal line driver circuit 9006. It is needless to say that a structure of the display panel 9001 may be similar to the structure shown in FIGS. 9, 11, 12, and 44.

The printed wiring board 9002 is provided with a controller 9007, a central processing unit (CPU) 9008, a memory 9009, a power supply circuit 90010, an audio processing circuit 90011, a transmitting/receiving circuit 90012, and the like. The printed wiring board 9002 and the display panel 9001 are connected through a FPC (Flexible Printed Circuit) 90013. The FPC 90013 may have a structure where a capacitor, a buffer circuit, or the like is provided to prevent noise on a power supply voltage or a signal, or dull signal rising. Further, the controller 9007, the audio processing circuit 90011, the memory 9009, the CPU 9008, the power supply circuit 90010, and the like can be mounted to the display panel 9001 by using a COG (Chip On Glass) method. By using a COG method, the size of the printed wiring board 9002 can be reduced.

Various control signals are input and output through an interface (I/F) portion 90014 included in the printed wiring board 9002. An antenna port 90015 for transmitting and receiving a signal to/from an antenna is included in the printed wiring board 9002.

Figure 90B:
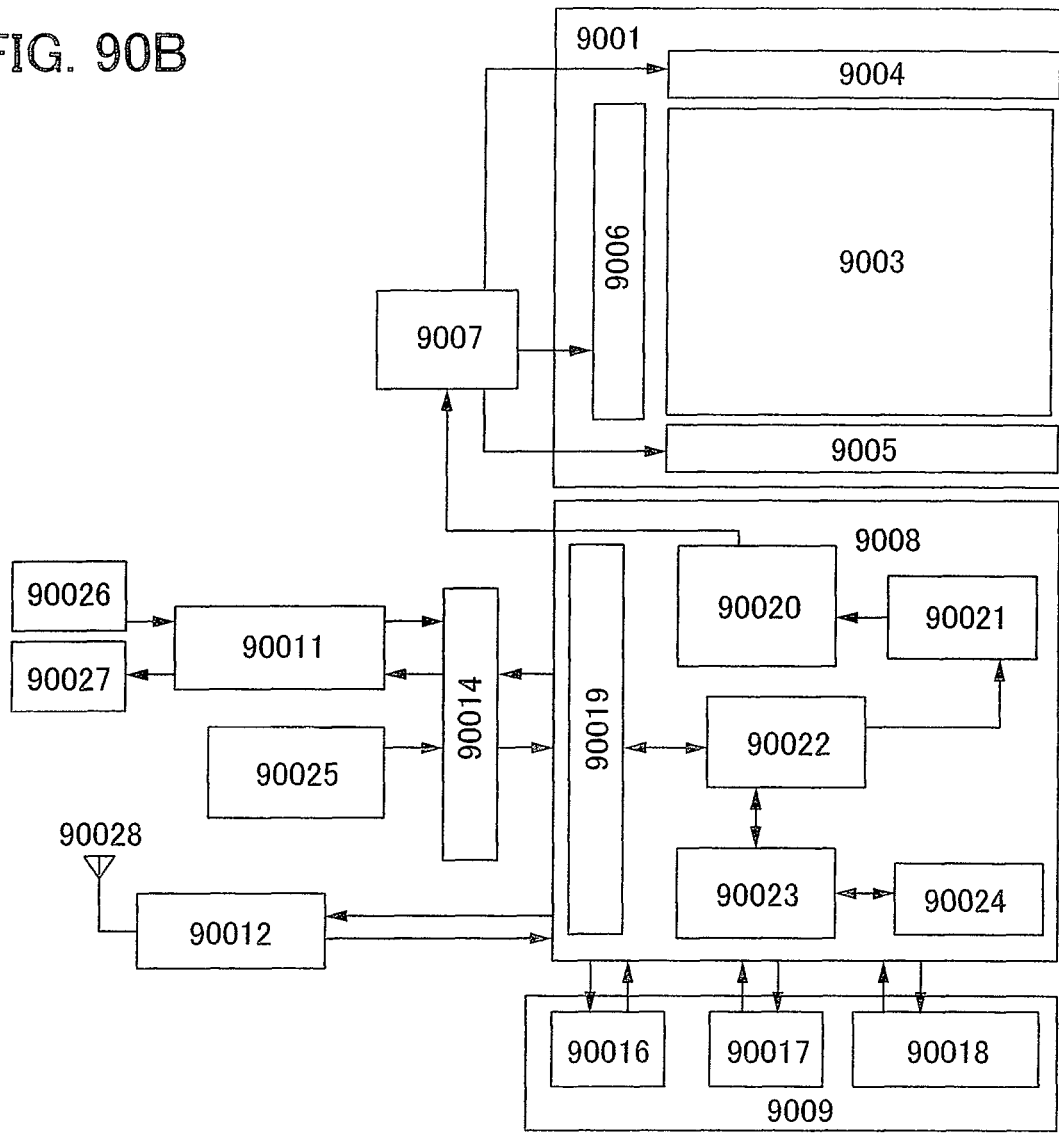

FIG. 90B is a block diagram of the module shown in FIG. 90A. The module includes a VRAM 90016, a DRAM 90017, a flash memory 90018, and the like as the memory 9009. The VRAM 90016 stores data on an image displayed on a panel, the DRAM 90017 stores video data or audio data, and the flash memory 90018 stores various programs.

The power supply circuit 90010 supplies electric power for operating the display panel 9001, the controller 9007, the CPU 9008, the audio processing circuit 90011, the memory 9009, and the transmitting/receiving circuit 90012. Depending on a panel specification, the power supply circuit 90010 is provided with a current source in some cases.

The CPU 9008 includes a control signal generation circuit 90020, a decoder 90021, a register 90022, an arithmetic circuit 90023, a RAM 90024, an interface 90019 for the CPU 9008, and the like. Various signals input to the CPU 9008 via the interface 90019 are once stored in the register 90022, and subsequently input to the arithmetic circuit 90023, the decoder 90021, or the like. The arithmetic circuit 90023 performs operation based on the signal input thereto so as to designate a location to which various instructions are sent. On the other hand, the signal input to the decoder 90021 is decoded and input to the control signal generation circuit 90020. The control signal generation circuit 90020 generates a signal including various instructions based on the signal input thereto, and transmits the signal to the designated location by the arithmetic circuit 90023, specifically the location such as the memory 9009, the transmitting/receiving circuit 90012, the audio processing circuit 90011, and the controller 9007.

The memory 9009, the transmitting/receiving circuit 90012, the audio processing circuit 90011, and the controller 9007 are operated in accordance with the instructions received thereby. Hereinafter, the operation is briefly described.

A signal input from an input means 90025 is sent to the CPU 9008 mounted to the printed wiring board 9002 via the interface portion 90014. The control signal generation circuit 90020 converts video data stored in the VRAM 90016 into a predetermined format depending on the signal sent from the input means 90025 such as a pointing device or a keyboard, and transmits the converted data to the controller 9007.

The controller 9007 performs data processing of the signal including the video data sent from the CPU 9008 in accordance with the panel specification and supplies the signal to the display panel 9001. Further, the controller 9007 generates an Hsync signal, a Vsync signal, a clock signal CLK, an alternating voltage (AC Cont), and a switching signal L/R based on a power supply voltage from the power supply circuit 90010 and various signals input from the CPU 9008 and supplies the signals to the display panel 9001.

The transmitting/receiving circuit 90012 processes a signal which is to be received and sent by an antenna 90028 as an electric wave. Specifically, the transmitting/receiving circuit 90012 includes a high-frequency circuit such as isolator, a band pass filter, a VCO (Voltage Controlled Oscillator), an LPF (Low Pass Filter), a coupler, or a balun. A signal including audio information among signals transmitted and received in the transmitting/receiving circuit 90012 is sent to the audio processing circuit 90011 in accordance with an instruction from the CPU 9008.

The signal including audio information which is sent in accordance with the instruction from the CPU 9008 is demodulated into an audio signal by the audio processing circuit 90011 and sent to a speaker 90027. Further, an audio signal sent from a microphone 90026 is modulated by the audio processing circuit 90011 and sent to the transmuting/receiving circuit 90012 in accordance with an instruction from the CPU 9008.

The controller 9007, the CPU 9008, the power supply circuit 90010, the audio processing circuit 90011, and the memory 9009 can be mounted as a package of this embodiment mode. This embodiment mode can be applied to any circuit other than a high-frequency circuit such as isolator, a baud pass filter, a VCO (Voltage Controlled Oscillator), an LPF (Low Pass Filter), a coupler, or a balun.

Note that the structures of the display panel and the display module shown in this embodiment mode can be implemented in free combination with the structure of each display device shown in other embodiment modes in this specification. Further, the structures of the display panel and the display module shown in this embodiment mode can be implemented in free combination with each other.

Embodiment Mode 20

Figure 91:
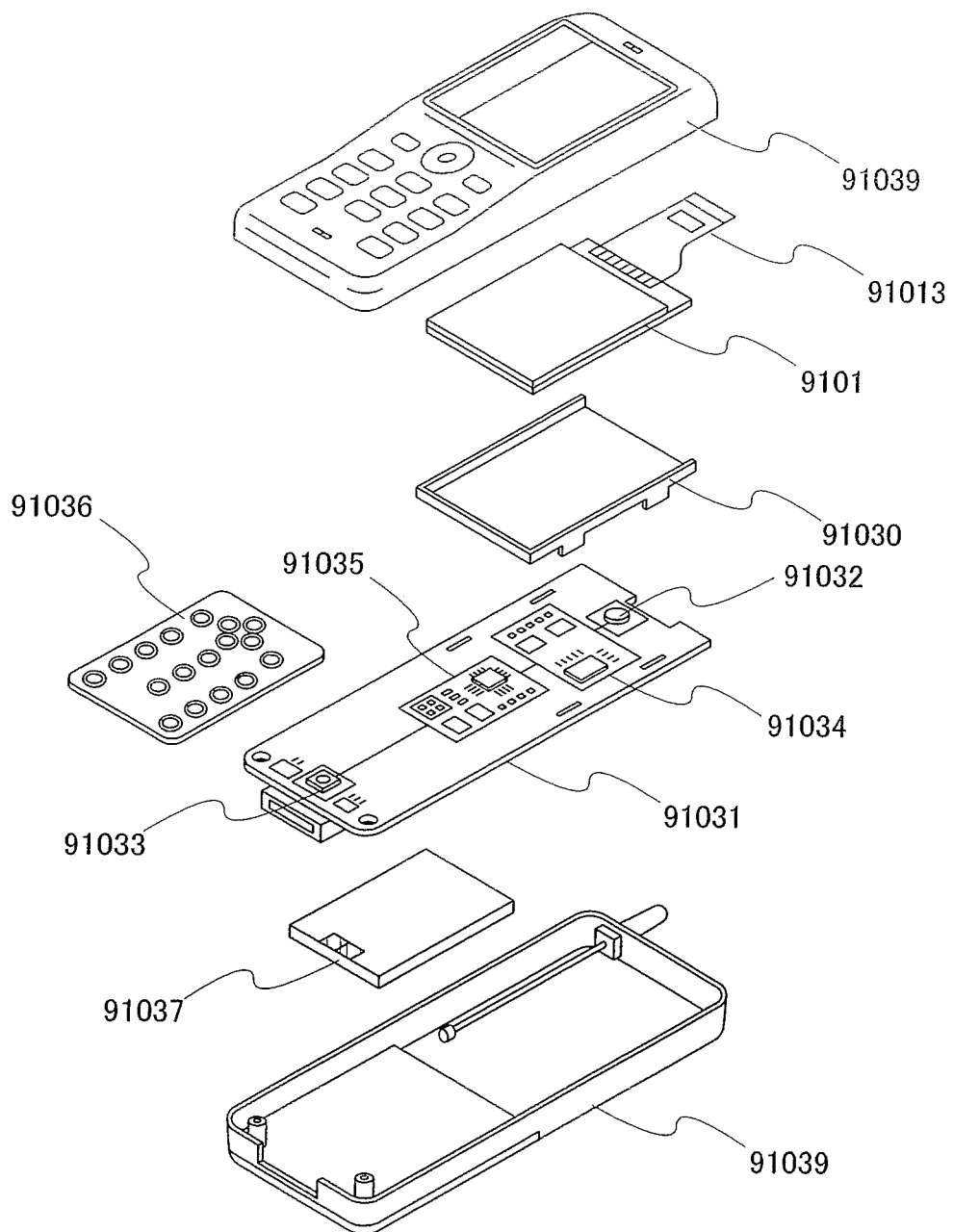
FIG. 91 illustrates Embodiment Mode 20.

FIG. 91 shows one mode of a mobile phone including the module in Embodiment Mode 19. A display panel 9101 is detachably incorporated in a housing 91030. The shape and the size of the housing 91030 can be changed as appropriate in accordance with the size of the display panel 9101. The housing 91030 which fixes the display panel 9101 is fitted in a printed circuit board 91031 to be assembled as a module.

The display panel 9101 is connected to the printed circuit board 91031 through an FPC 91013. A speaker 91032, a microphone 91033, a transmitting/receiving circuit 91034, and a signal processing circuit 91035 including a CPU, a controller, and the like are formed over the printed circuit board 91031. Such a module, an input means 91036, and a battery 91037 are combined and stored in a housing 91039. A pixel portion of the display panel 9101 is provided to be seen from an opening window formed in the housing 91039.

The display panel 9101 includes a pixel portion including a plurality of pixels and a scan line driver circuit. The mobile phone in FIG. 91 can be manufactured at low cost by forming the scan line driver circuit over the same substrate as the pixel portion. Further, the number of components in the display module can be reduced, so that advantages such as increase in yield and reduction in weight and size can be obtained.

The mobile phone according to this embodiment mode can be changed in various modes depending on the function or application thereof. For example, when the mobile phone is provided with a plurality of display panels or when the housing is divided into a plurality of parts as appropriate and can be opened and closed with a hinge, the aforementioned effect can be obtained.

Note that the structures of the display panel and the display module shown In this embodiment mode can be implemented in free combination with the structure of each display device shown in other embodiment modes in this specification. Further, the structures of the display panel and the display module shown in this embodiment mode can be implemented in free combination with each other.

Embodiment Mode 21

This embodiment shows an example where a mobile phone 10300 including the display module in Embodiment Mode 19 is completed.

Figure 103:
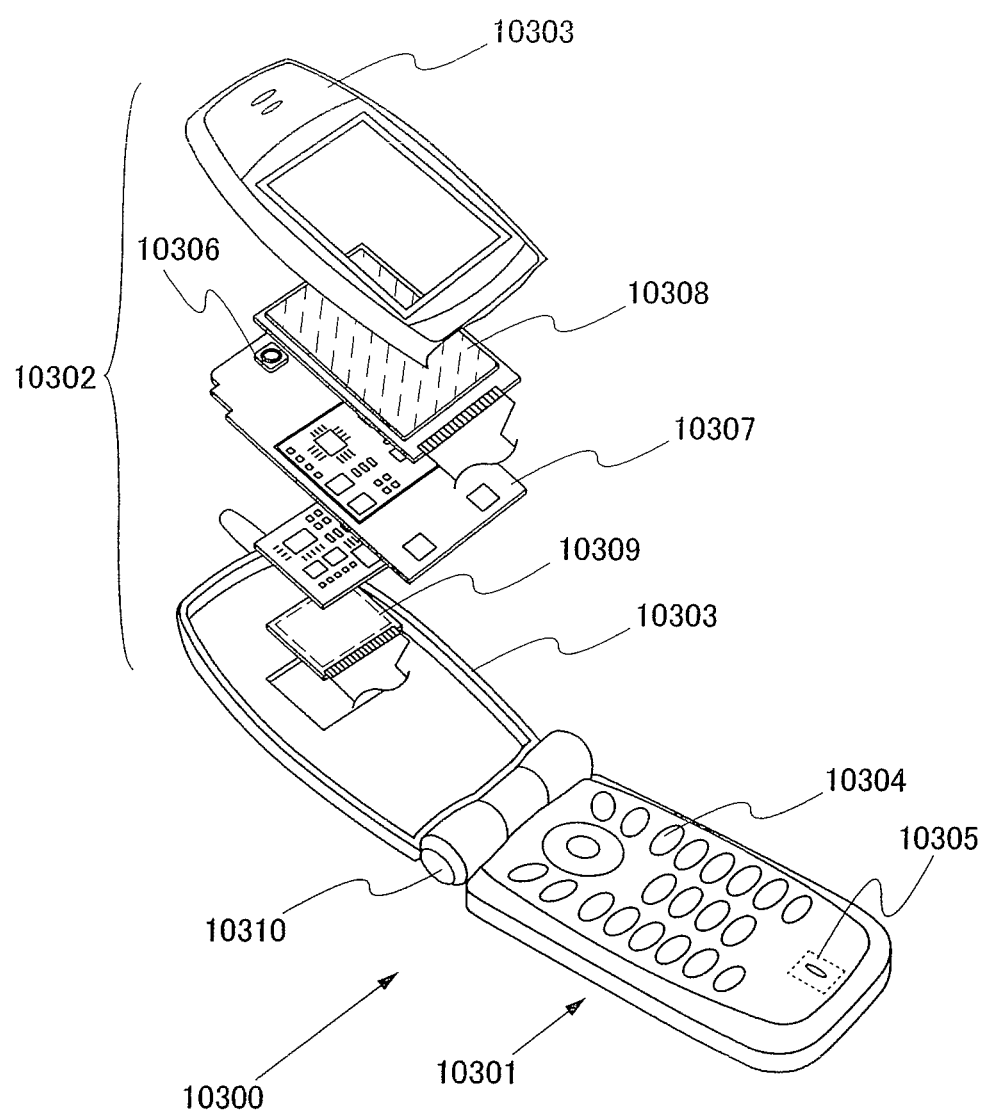
FIG. 103 illustrates Embodiment Mode 21.

In the mobile phone shown in FIG. 103, a main body (A) 10301 provided with operation switches 10304, a microphone 10305, and the like is connected to a main body (B) 10302 provided with a display panel (A) 10308, a display panel (B) 10309, a speaker 10306, and the like by using a hinge 10310 so that the mobile phone can be opened and closed. The display panel (A) 10308 and the display panel (B) 10309 are placed in a housing 10303 of the main body (B) 10302 together with a circuit board 10307. Pixel portions or the display panel (A) 10308 and the display panel (B) 10309 are arranged to the seen from an opening window formed in the housing 10303.

Specifications of the display panel (A) 10308 and the display panel (B) 10309, such as the number of pixels, can be set as appropriate in accordance with functions of the mobile phone 10300. For example, the display panel (A) 10308 used as a main screen and the display panel (B) 10309 used as a sub-screen can be combined.

The display panel (A) 10308 and the display panel (B) 10309 each include a pixel portion including a plurality of pixels and a scan line driver circuit. The mobile phone in FIG. 103 can be manufactured at low cost by forming the scan line driver circuit over the same substrate as the pixel portion. Further, the number of components in the display module can be reduced, so that advantages such as increase in yield and reduction in weight and site can be obtained.

By using such a display panel, the display panel (A) 10308 can function as a color display screen with high definition, which displays characters or images, and the display panel (B) 10309 can function as an information display screen of a single color, which displays text information. In particular, when the display panel (B) 10309 is an active matrix type panel so that higher definition is achieved, various pieces of text information can be displayed; thus, the density of information display per screen can be increased. For example, when the display panel (A) 10308 is a panel with a size of 2 to 2.5 inches, 64 gray scales, and QVGA (320 dots by 240 dots) with two-hundred and sixty thousand colors, and the display panel (B) 10309 is a high definition panel with a single color, 2 to 8 gray scales, and 180 to 220 ppi, Chinese characters, Arabic letters, and the like can be displayed as well as Roman letters, biragana, and katakana.

The mobile phone according to this embodiment mode can be changed in various modes depending on functions or applications thereof. For example, it may be a camera-equipped mobile phone by incorporating an imaging element in the hinge 10310. When the operation switches 10304, the display panel (A) 10308, and the display panel (B) 10309 are placed in one housing, the aforementioned effects can be obtained. Further, a similar effect can be obtained when the structure of this embodiment mode is applied to an information display terminal equipped with a plurality of display portions.

Note that the structures of the display panel and the display module shown In this embodiment mode can be implemented in free combination with the structure of each display device shown in other embodiment modes in this specification. Further, the structures of the display panel and the display module shown in this embodiment mode can be implemented in free combination with each other.

Embodiment Mode 22

The invention can be applied to various electronic devices, specifically to display portions of electronic devices. Such electronic devices include cameras such as a video camera and a digital camera, a goggle-type display, a navigation system, an audio reproducing device (such as a cm audio system and audio components), a computer, a game machine, a portable information terminal (such as a mobile computer, a mobile phone, a mobile game machine, and an electronic book), an image reproducing device provided with a recording medium (specifically, a device for reproducing content of a recording medium such as a digital versatile disc (DVD) and having a light-emitting device for displaying the reproduced image), and the like.

Figure 93A:
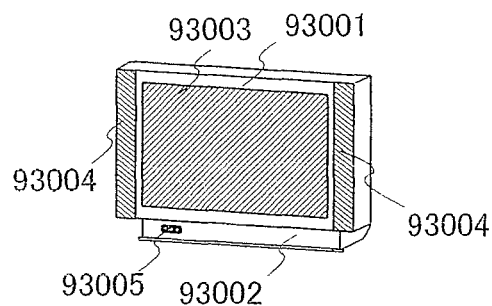
FIGS. 93A to 93H illustrate Embodiment Mode 22.

FIG. 93A shows a light-emitting device, which includes a housing 93001, a support base 93002, a display portion 93003, speaker portions 93004, a video input terminal 93005, and the like. The display device of the invention can be used as the display portion 93003. Note that the light-emitting device includes various light-emitting devices for displaying information, for example, for a personal computer, a television broadcast reception, and advertisement. The light-emitting device using the display device of the invention as the display portion 93903 can reduce slight light emission generated by oft current and perform a clear display.

Figure 93B:
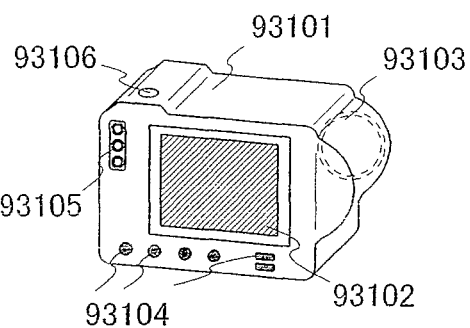

FIG. 93B shows a camera, which includes a main body 93101, a display portion 93102, an image receiving portion 93103, operation keys 93194, an external connection port 93105, a shutter button 93106, and the like.

The digital camera using the invention as the display portion 93102 can reduce slight light emission generated by off current and perform a clear display.

Figure 93C:
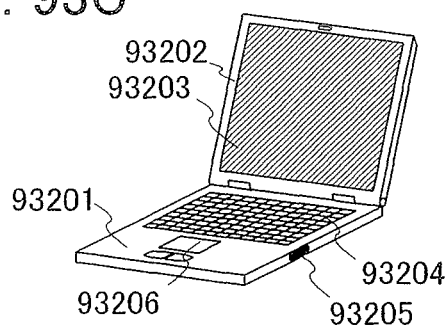

FIG. 93C shows a computer, which includes a main body 93201, a housing 93202, a display portion 93203, a keyboard 93204, an external connection port 93205, a pointing device 93206, and the like. The computer using the invention as the display portion 93203 can reduce slight light emission generated by off current and perform a clear display.

Figure 93D:
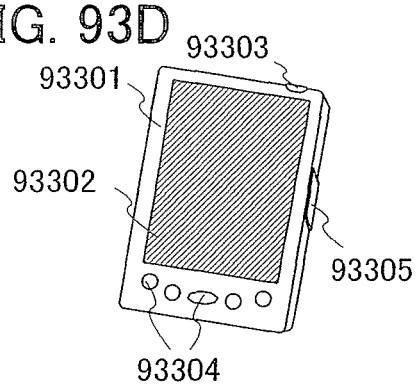

FIG. 93D shows a mobile computer, which includes a main body 93301, a display portion 93302, a switch 93303, operation keys 93304, art infrared port 93305, and the like. The mobile computer using the invention as the display portion 93302 can reduce slight light emission generated by off current and perform a clear display.

Figure 93E:
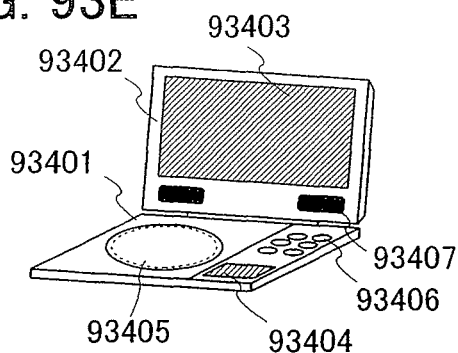

FIG. 93E shows a portable image reproducing device having a recording medium (specifically, a DVD player), which includes a main body 93401, a housing 93402, a display portion A 93403, a display portion B 93404, a recording medium (e.g. DVD) reading portion 93405, operation keys 93406, a speaker portion 93407, and the like. The display portion A 93403 can mainly display image information and the display portion B 93404 can mainly display text information. The image reproducing device using the invention as the display portion A 93403 and the display portion B 93404 can reduce slight light emission generated by off current and perform a clear display.

Figure 93F:
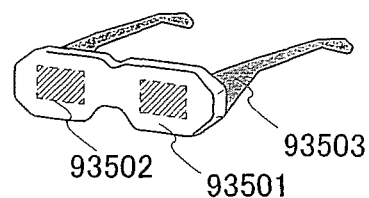

FIG. 93F shows a goggle-type display, which includes a main body 93501, a display portion 93502, and an arm portion 93503. The goggle-type display using the invention as the display portion 93502 can reduce slight light emission generated by off current and perform a clear display.

Figure 93G:
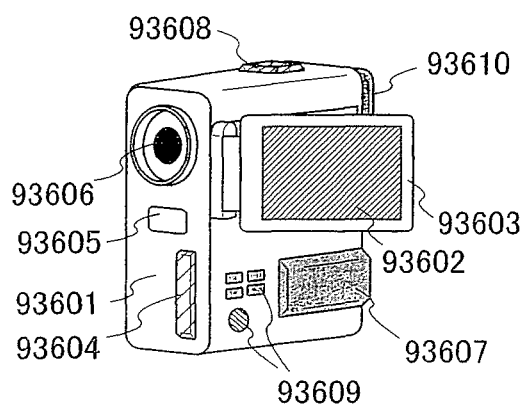

FIG. 93G shows a video camera, which includes a main body 93601, a display portion 93602, a housing 93603, an external connection port 93604, a remote controller receiving portion 93605, an image receiving portion 93606, a battery 93607, an audio input portion 93608, operating keys 93609, and the like. The video camera using the invention as the display portion 93602 can reduce slight light emission generated by off current and perform a clear display.

Figure 93H:
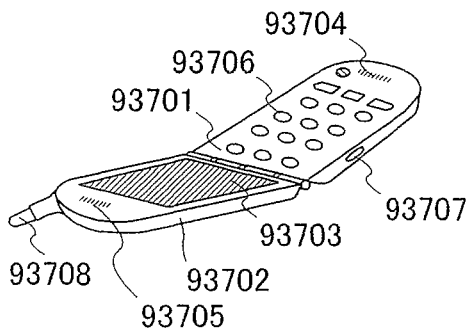

FIG. 93H shows a mobile phone, which includes a main body 93701, a housing 93702, a display portion 93703, an audio input portion 93704, an audio output portion 93705, operating keys 93706, an external connection portion 93707, an antenna 93708, and the like. The mobile phone using the invention as the display portion 93703 can reduce slight light emission generated by off current and perform a clear display.

As described above, the invention can be applied to various electronic devices.

Note that each structure of the electronic device shown in this embodiment mode can be implemented in free combination with the structure of each display device shown in other embodiment modes in this specification.

Embodiment Mode 23

In this embodiment mode, an application example using a display panel in which a pixel structure of the display device of the invention is used in a display portion is described with reference to drawings of application modes. The display panel in which the pixel structure of the display device of the invention is used in the display portion can also be incorporated with a moving object, a constructed object, and the like.

Figure 94A:
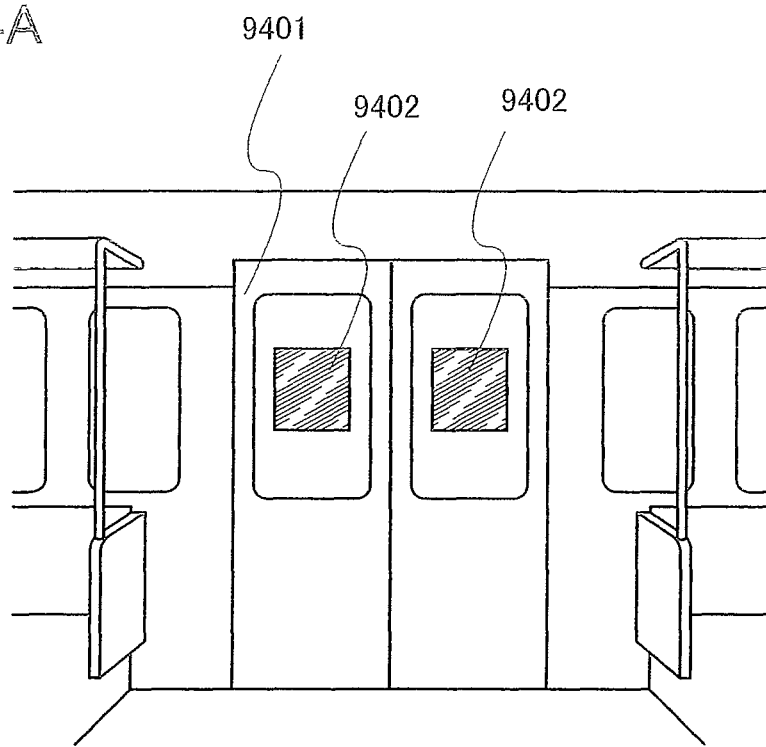
FIGS. 94A and 94B illustrate Embodiment Mode 23.
Figure 94B:
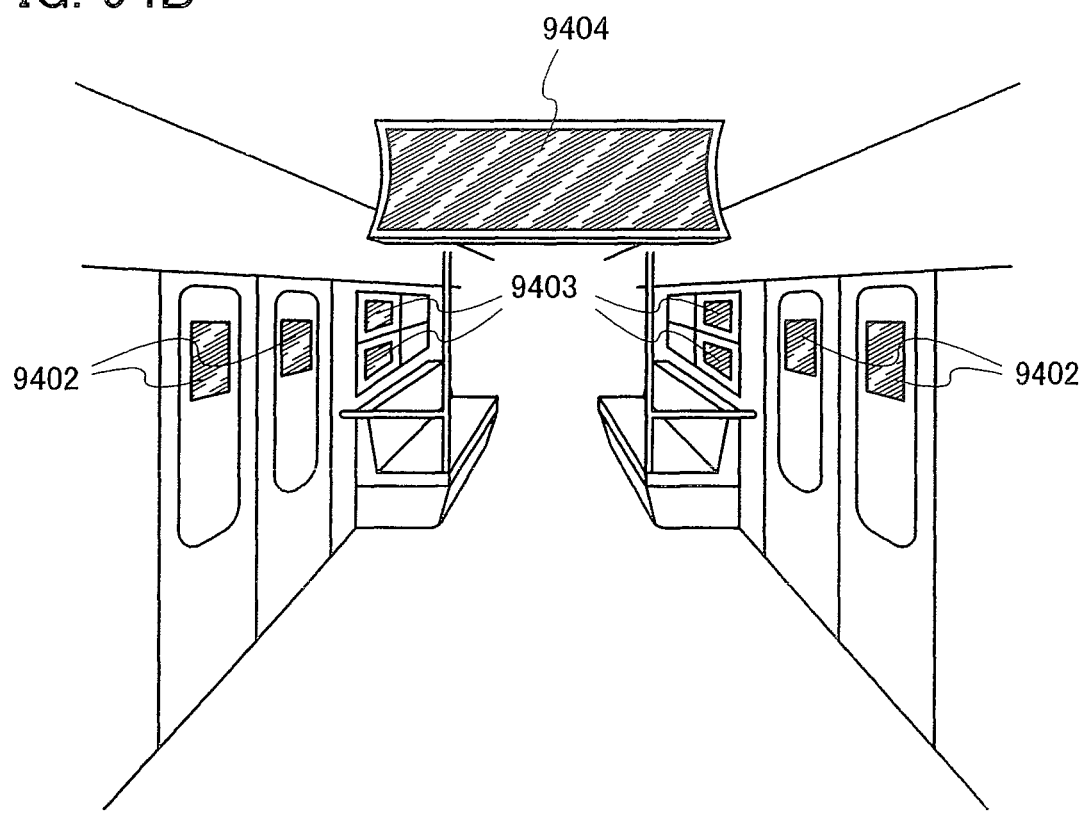

FIGS. 94A and 94B show a moving object incorporated with a display device as a an example of a display panel which includes the pixel structure of the display device of the invention in a display portion. As an example of a moving object incorporated with a display device. FIG. 94A shows a display panel 9402 used for a glass portion of a door in a train car 9401. In the display panel 9402 in FIG. 94A, in which the pixel structure of the display device of the invention is used in a display portion, images displayed on the display portion can be easily switched by a signal from the outside. Therefore, images on the display panel are switched in every time period when types of passengers on the train are changed, and more effective advertisement can be realized.

Note that the display panel which includes the pixel structure of the display device of the invention in the display portion is not limited to be applied to a glass portion of a door in a train car in FIG. 94A, and can be applied to any place by being changed into various shapes. An example thereof is described with reference to FIG. 94B.

FIG. 94B shows the inside of the train car. In FIG. 94B, a display panel 9403 provided in a glass window and a display panel 9404 suspended from a ceiling are shown in addition to the display panel 9402 in the glass portion of the door shown in FIG. 94A. The display panel 9403 having the pixel structure of the display device in the invention includes a self-luminous display element; therefore, when an advertisement image is displayed during rush hours and not displayed during non-rush hours, a view from a train window can also be seen. Further, in the display panel 9404 having the pixel structure of the display device in the invention, when a switching element such as an organic transistor is provided over a film-shaped substrate and the self-luminous display element is driven, the display panel can also perform a display in a bent state.

Figure 95:
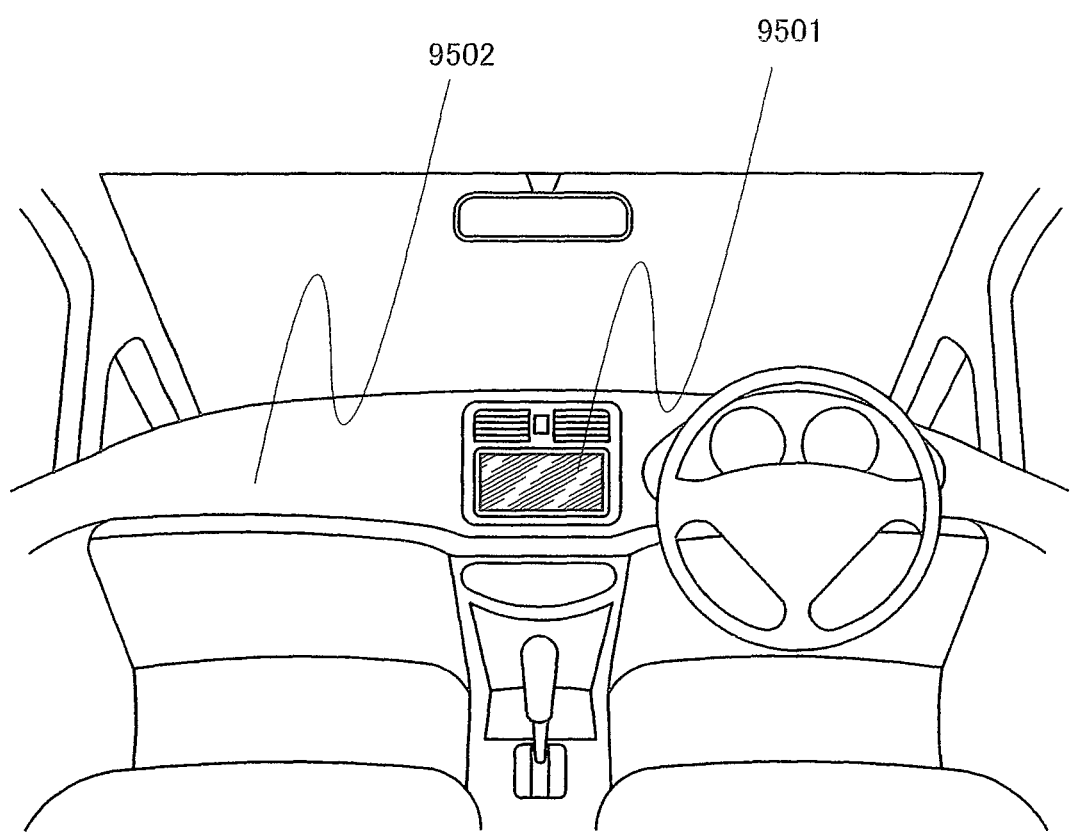
FIG. 95 illustrates Embodiment Mode 23.

FIG. 95 shows another application mode as air example of a moving object incorporated with a display device using a display panel which includes the pixel structure of the display device of the invention in a display portion.

FIG. 95 shows a moving object incorporated with a display device as an example of a display panel which includes the pixel structure of the display device of the invention in a display portion. As an example of a moving object incorporated with a display device, FIG. 95 shows a display panel 9502 incorporated into a body 9501 of a car. The display panel 9502 in FIG. 95, which includes the pixel structure of the display device of the invention in a display portion, is incorporated into the body of the car, and has a function of on-demand display of an operation of the car body and data input from inside or outside the car body and a function to navigate the car to its destination.

Note that a display panel which includes the pixel structure of the display device of the invention in a display portion is not limited to be applied to a front part of the car body in FIG. 95, and can be applied to any place such as a glass window or a door by being changed into various shapes.

Figure 96A:
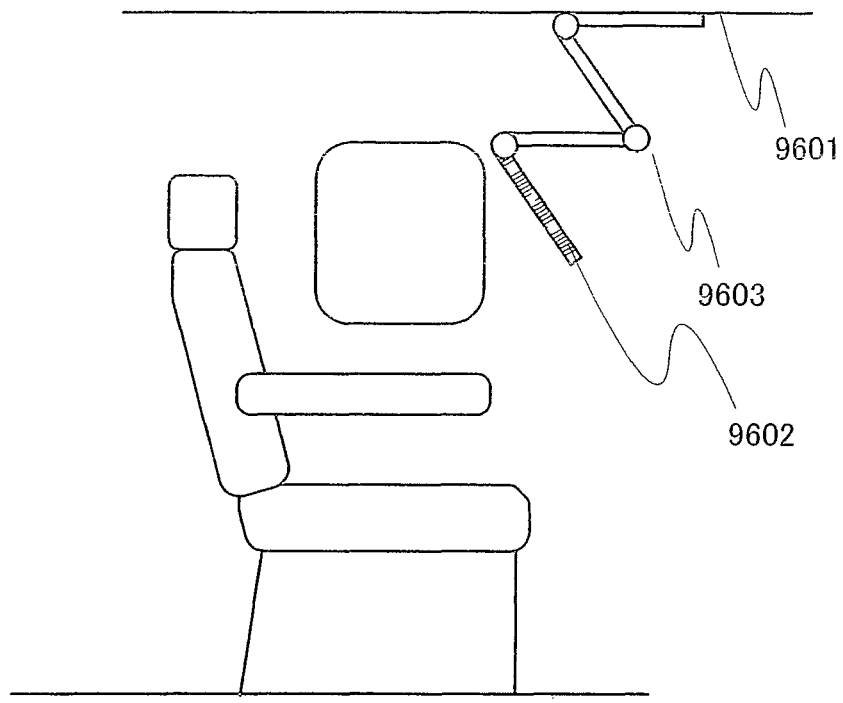
FIGS. 96A and 96B illustrate Embodiment Mode 23.
Figure 96B:
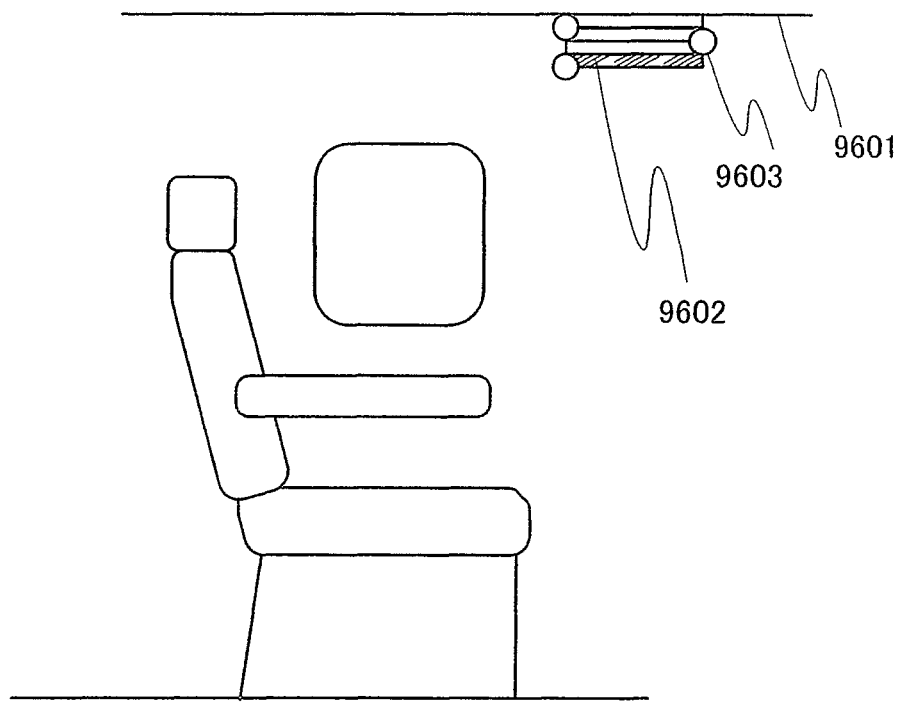

FIGS. 96A and 96B show another application mode as an example of a moving object incorporated with display device using a display panel which includes the pixel structure of the display device of the invention in a display portion.

FIGS. 96A and 96B show a moving object incorporated with a display device as an example of a display panel which includes the pixel structure of the display device of the invention in a display portion. As an example of a moving object incorporated with a display device, FIG. 96A shows a display panel 9602 attached to a ceiling above a passenger seal of a body 9601 of an airplane. The display panel 9502 shown in FIG. 96A, which includes the pixel structure of the display device of the invention in a display portion, is incorporated with the body 9601 of the airplane using a hinge portion 9603, and the passengers can view the display panel 9602 by stretching of the hinge portion 9603. The display panel 9602 has functions to display data and to be used as advertisement or an entertainment means by an operation by the passengers. In addition, when the hinge portion is bent and put in the body 9601 of the airplane as shown in FIG. 96B, safety in taking-off and landing can be assured. Further, when a display element in the display panel is lighted in an emergency, the display panel can also be used as an evacuation light in the body 9601 of the airplane.

Note that a display panel which includes the pixel structure of the display device of the invention in a display portion is not limited to be applied to the ceiling of the body 9601 of the airplane in FIGS. 96A and 96B, and can be applied to any place such as a seat or a door by being changed into various shapes. For example, a display panel is provided on a back side of a seat and is operated and viewed.

Note that in this embodiment mode, bodies of a train car, a car, and an airplane are shown as a moving object; however, the moving object is not limited thereto and includes various objects such as a motorcycle, an four-wheel drive car (including a car, a bus, and the like), a train (including a monorail, a railroad car, and the like), and a vessel. By employing the pixel structure of the display device in the invention, reduction in size and power consumption of the display panel can be achieved and a moving object including a display medium which operates favorably can be provided. In particular, since display on the display panel in a moving object can be easily switched at once by a signal from the outside, the display panel is highly useful for an advertisement display board for an unspecified number of customers or an information display board in an emergency or disaster, FIG. 97 shows an application mode of a constructed object as an example using a display panel which includes the pixel structure of the display device of the invention in a display portion.

Figure 97:
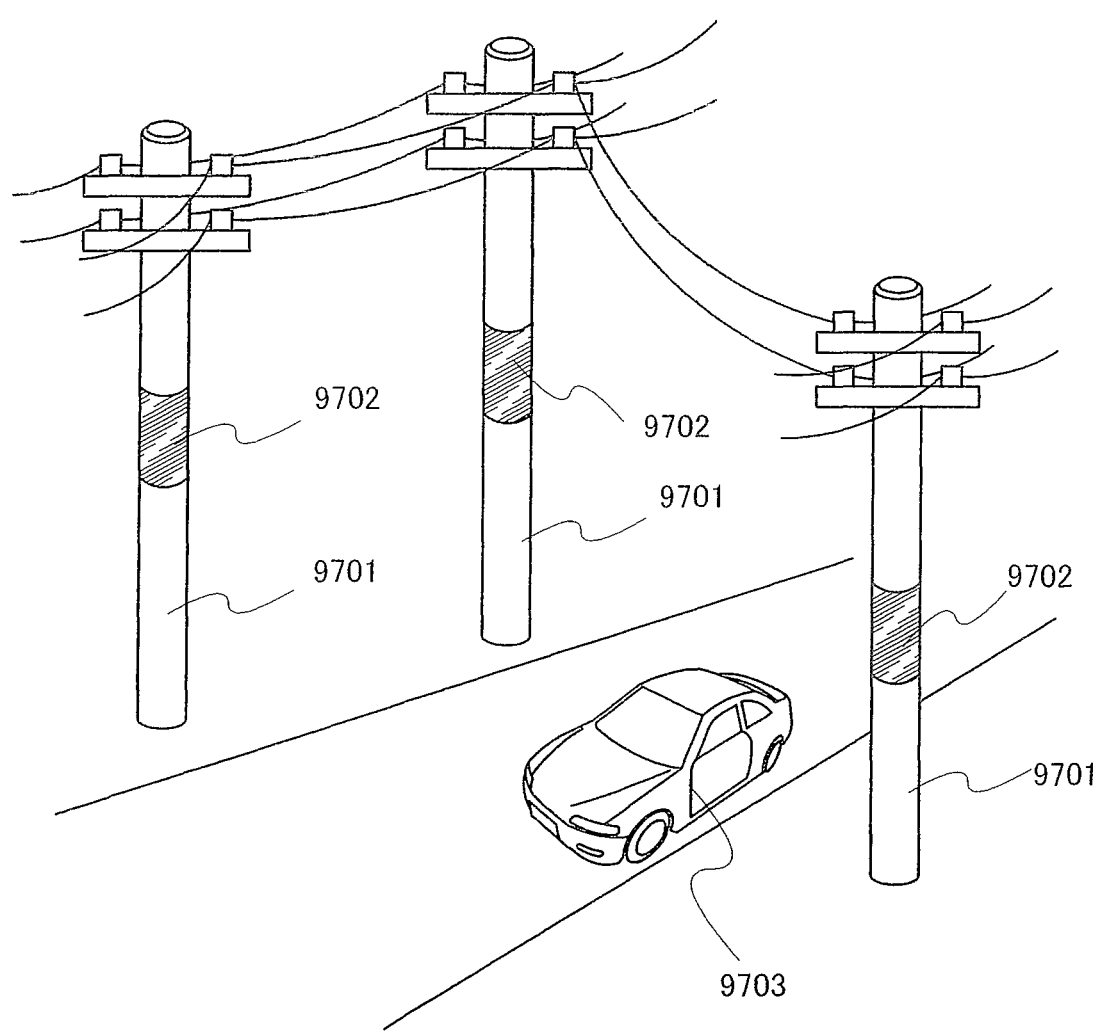
FIG. 97 illustrates Embodiment Mode 23.

FIG. 97 shows an application example of a display panel in which a switching element such as an organic transistor is provided over a film-shaped substrate, and the self-luminous display element is driven, so that the display panel can perform a display in a bent state, as an example of the display panel which includes the pixel structure of the display device of the invention lit a display portion. In FIG. 97, a display panel is provided on a curved surface of a column-shaped object provided outside, such as a power pole, as a constructed object Here, as a column shaped object, a power pole 9701 provided with a display panel 9702 is described.

The display panel 9702 shown in FIG. 97 is positioned around the middle of the height of the power pole and is provided at a position higher than a human viewpoint. Thus, from a moving object 9703, an image on the display panel 9702 can be viewed. When the same images are displayed on the display panels 9702 provided in outside power poles which stand together in large numbers, viewers can view information display and advertisement display. Since it is easy to display the same images from the outside on the display panels 9702 provided in the power poles 9701 in FIG. 97, highly effective information display and advertisement effect can be realized. In addition, when self-luminous display elements are provided as the display elements in the display panel of the display device of the invention, the display panel can be effectively used as a highly visible display medium even at night.

Figure 98:
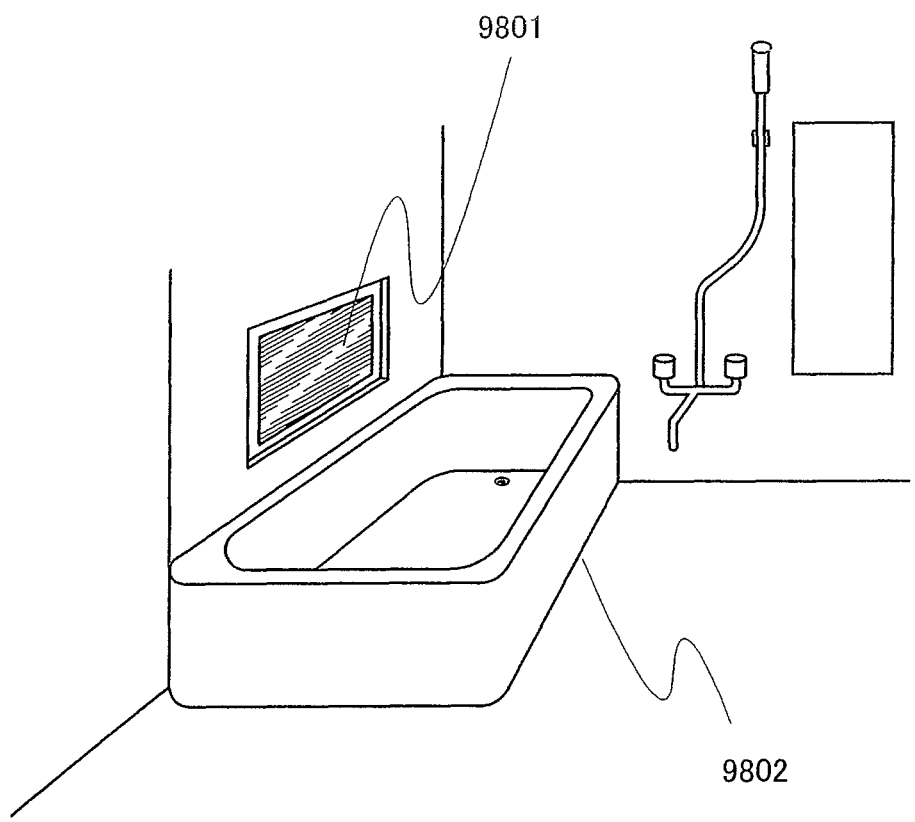
FIG. 98 illustrates Embodiment Mode 23.

FIG. 98 shows another application mode of a constructed object, which is different from FIG. 97, as an example using a display panel in which the display device having the pixel structure of the display device of the invention is used in a display portion.

FIG. 98 shows an application example of a display panel in which includes the pixel structure of the display device of the invention in a display portion. FIG. 98 shows a display panel 9802 incorporated into a side wall of a prefabricated bath 9801 as an example of a constructed object incorporated with a display device. The display panel 9802 in FIG. 98, which includes a display portion having the pixel structure of the display device of the invention, is incorporated with the prefabricated bath 9801, and a person who takes a bath can view the display panel 9802. The display panel 9802 has functions to display data and to be used as advertisement or an entertainment means by an operation by a person who takes a bath.

Note that the display panel which includes the pixel structure of the display device of the invention in a display portion is not limited to be applied to the side wall of the prefabricated bath 9801 in FIG. 98, and can be applied to any place such as part of a mirror or a bathtub by being changed into various shapes.

Figure 99:
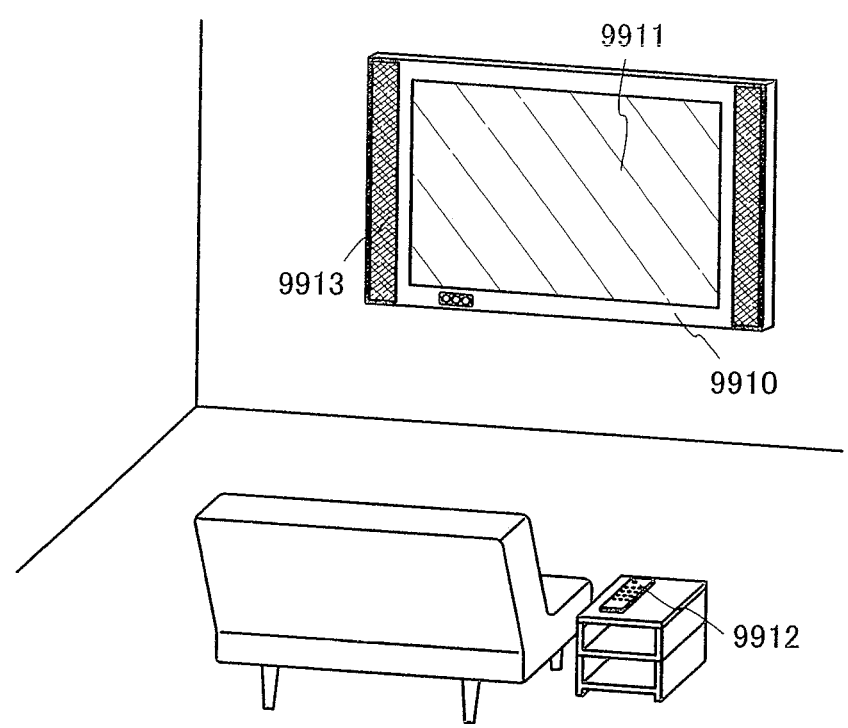
FIG. 99 illustrates Embodiment Mode 23.

FIG. 99 shows an example in which a television device having a large display portion is provided inside a constructed object. The television device in FIG. 99 includes a housing 9910, a display portion 9911, a remote control device 9912 which is an operation portion, a speaker portion 9913, and the like. The display panel which includes the pixel structure of the display device of the invention in a display portion is applied to form the display portion 9911. The television device in FIG. 99 is incorporated with the constructed object as a wall-hanging type and can be provided without requiring a large space.

In this embodiment mode, a power pole as a column-shaped body, a prefabricated bath, and the like are shown as examples of as a constructed object; however, this embodiment mode is not limited thereto, and any constructed object which can be provided with a display panel may be employed. When the pixel structure of the display device of the invention is applied, reduction in size and power consumption of the display device can be achieved and a moving object including a display medium which operates favorably can be provided.

Note that each structure of the display panel shown in this embodiment mode can be implemented in free combination with the structure of each display device shown in other embodiment modes in this specification.

This application is based on Japanese Patent Application serial No. 2006-236392 filed in Japan Patent Office on Aug. 31, 2006, the entire contents of which are hereby incorporated by reference.

What is claimed is:

1. A semiconductor device comprising:
   first to seventh transistors; and
   first to fourth wirings,
   wherein one of a source and a drain of the first transistor is electrically connected to one of a source and a drain of the second transistor,
   wherein the one of the source and the drain of the first transistor is electrically connected to the first wiring,
   wherein one of a source and a drain of the third transistor is electrically connected to one of a source and a drain of the fourth transistor,
   wherein the one of the source and the drain of the third transistor is electrically connected to a gate of the first transistor,
   wherein one of a source and a drain of the fifth transistor is electrically connected to a gate of the second transistor,
   wherein the one of the source and the drain of the fifth transistor is electrically connected to a gate of the fourth transistor,
   wherein one of a source and a drain of the sixth transistor is electrically connected to one of a source and a drain of the seventh transistor,
   wherein the one of the source and the drain of the sixth transistor is electrically connected to a gate of the fifth transistor,
   wherein the other of the source and the drain of the first transistor and the other of the source and the drain of the fifth transistor are electrically connected to the second wiring,
   wherein the other of the source and the drain of the second transistor is electrically connected to the third wiring,
   wherein the other of the source and the drain of the third transistor is electrically connected to the fourth wiring,
   wherein the other of the source and the drain of the third transistor is electrically connected to a gate of the third transistor, and
   wherein the other of the source and the drain of the sixth transistor is electrically connected to a gate of the sixth transistor.

2. A semiconductor device comprising:
   first to fourteenth transistors; and
   first to sixth wirings,
   wherein one of a source and a drain of the first transistor is electrically connected to one of a source and a drain of the second transistor,
   wherein one of a source and a drain of the third transistor is electrically connected to one of a source and a drain of the fourth transistor,
   wherein the one of the source and the drain of the third transistor is electrically connected to a gate of the first transistor,
   wherein one of a source and a drain of the fifth transistor is electrically connected to a gate of the second transistor,
   wherein the one of the source and the drain of the fifth transistor is electrically connected to a gate of the fourth transistor,
   wherein one of a source and a drain of the sixth transistor is electrically connected to one of a source and a drain of the seventh transistor,
   wherein the one of the source and the drain of the sixth transistor is electrically connected to a gate of the fifth transistor,
   wherein the other of the source and the drain of the first transistor and the other of the source and the drain of the fifth transistor are electrically connected to the second wiring,
   wherein the other of the source and the drain of the third transistor is electrically connected to the fourth wiring,
   wherein the other of the source and the drain of the third transistor is electrically connected to a gate of the third transistor,
   wherein the other of the source and the drain of the sixth transistor is electrically connected to a gate of the sixth transistor,
   wherein one of a source and a drain of the eighth transistor is electrically connected to one of a source and a drain of the ninth transistor,
   wherein the one of the source and the drain of the eighth transistor is electrically connected to the fifth wiring,
   wherein one of a source and a drain of the tenth transistor is electrically connected to one of a source and a drain of the eleventh transistor,
   wherein the one of the source and the drain of the tenth transistor is electrically connected to a gate of the eighth transistor,
   wherein one of a source and a drain of the twelfth transistor is electrically connected to a gate of the ninth transistor,
   wherein the one of the source and the drain of the twelfth transistor is electrically connected to a gate of the eleventh transistor, wherein one of a source and a drain of the thirteenth transistor is electrically connected to one of a source and a drain of the fourteenth transistor,
wherein the one of the source and the drain of the thirteenth transistor is electrically connected to a gate of the twelfth transistor,
wherein the other of the source and the drain of the eighth transistor and the other of the source and the drain of the twelfth transistor are electrically connected to the sixth wiring,
wherein the other of the source and the drain of the second transistor and the other of the source and the drain of the ninth transistor are electrically connected to the third wiring,
wherein the one of the source and the drain of the first transistor and the other of the source and the drain of the tenth transistor are electrically connected to the first wiring,
wherein the other of the source and the drain of the tenth transistor is electrically connected to a gate of the tenth transistor, and
wherein the other of the source and the drain of the thirteenth transistor is electrically connected to a gate of the thirteenth transistor.

3. A semiconductor device comprising:
first to twenty-first transistors,
wherein one of a source and a drain of the first transistor is electrically connected to one of a source and a drain of the second transistor,
wherein the one of the source and the drain of the first transistor is electrically connected to a first wiring,
wherein one of a source and a drain of the third transistor is electrically connected to one of a source and a drain of the fourth transistor,
wherein the one of the source and the drain of the third transistor is electrically connected to a gate of the first transistor,
wherein one of a source and a drain of the fifth transistor is electrically connected to a gate of the second transistor,
wherein the one of the source and the drain of the fifth transistor is electrically connected to a gate of the fourth transistor,
wherein one of a source and a drain of the sixth transistor is electrically connected to one of a source and a drain of the seventh transistor,
wherein the one of the source and the drain of the sixth transistor is electrically connected to a gate of the fifth transistor,
wherein the other of the source and the drain of the first transistor is electrically connected to a second wiring,
wherein the other of the source and the drain of the fifth transistor is electrically connected to the second wiring,
wherein the other of the source and the drain of the second transistor is electrically connected to a third wiring,
wherein the other of the source and the drain of the third transistor is electrically connected to a fourth wiring,
wherein the other of the source and the drain of the third transistor is electrically connected to a gate of the third transistor,
wherein the other of the source and the drain of the sixth transistor is electrically connected to a gate of the sixth transistor,
wherein one of a source and a drain of the eighth transistor is electrically connected to one of a source and a drain of the ninth transistor,
wherein the one of the source and the drain of the eighth transistor is electrically connected to a fifth wiring,
wherein one of a source and a drain of the tenth transistor is electrically connected to one of a source and a drain of the eleventh transistor,
wherein the one of the source and the drain of the tenth transistor is electrically connected to a gate of the eighth transistor,
wherein one of a source and a drain of the twelfth transistor is electrically connected to a gate of the ninth transistor,
wherein the one of the source and the drain of the twelfth transistor is electrically connected to a gate of the eleventh transistor,
wherein one of a source and a drain of the thirteenth transistor is electrically connected to one of a source and a drain of the fourteenth transistor,
wherein the one of the source and the drain of the thirteenth transistor is electrically connected to a gate of the twelfth transistor,
wherein the other of the source and the drain of the eighth transistor is electrically connected to a sixth wiring,
wherein the other of the source and the drain of the twelfth transistor is electrically connected to the sixth wiring,
wherein the other of the source and the drain of the ninth transistor is electrically connected to the third wiring,
wherein the other of the source and the drain of the tenth transistor is electrically connected to the first wiring,
wherein the other of the source and the drain of the tenth transistor is electrically connected to a gate of the tenth transistor, and
wherein the other of the source and the drain of the thirteenth transistor is electrically connected to a gate of the thirteenth transistor,
wherein one of a source and a drain of the fifteenth transistor is electrically connected to one of a source and a drain of the sixteenth transistor,
wherein the one of the source and the drain of the fifteenth transistor is electrically connected to a seventh wiring,
wherein one of a source and a drain of the seventeenth transistor is electrically connected to one of a source and a drain of the eighteenth transistor,
wherein the one of the source and the drain of the seventeenth transistor is electrically connected to a gate of the fifteenth transistor,
wherein one of a source and a drain of the nineteenth transistor is electrically connected to a gate of the sixteenth transistor,
wherein the one of the source and the drain of the nineteenth transistor is electrically connected to a gate of the eighteenth transistor,
wherein one of a source and a drain of the twentieth transistor is electrically connected to one of a source and a drain of the twenty-first transistor,
wherein the one of the source and the drain of the twentieth transistor is electrically connected to a gate of the nineteenth transistor,
wherein the other of the source and the drain of the fifteenth transistor is electrically connected to an eighth wiring,
wherein the other of the source and the drain of the nineteenth transistor is electrically connected to the eighth wiring,
wherein the other of the source and the drain of the sixteenth transistor is electrically connected to the third wiring, wherein the other of the source and the drain of the seventeenth transistor is electrically connected to the fifth wiring, wherein the other of the source and the drain of the seventeenth transistor is electrically connected to a gate of the seventeenth transistor, and wherein the other of the source and the drain of the twentieth transistor is electrically connected to a gate of the twentieth transistor.

4. A semiconductor device comprising:

first to seventh transistors; and first to fourth wirings, wherein one of a source and a drain of the first transistor is directly connected to one of a source and a drain of the second transistor, wherein the one of the source and the drain of the first transistor is directly connected to the first wiring, wherein one of a source and a drain of the third transistor is directly connected to one of a source and a drain of the fourth transistor, wherein the one of the source and the drain of the third transistor is directly connected to a gate of the first transistor, wherein one of a source and a drain of the fifth transistor is directly connected to a gate of the second transistor, wherein the one of the source and the drain of the fifth transistor is directly connected to a gate of the fourth transistor, wherein one of a source and a drain of the sixth transistor is directly connected to one of a source and a drain of the seventh transistor, wherein the one of the source and the drain of the sixth transistor is directly connected to a gate of the fifth transistor, wherein the other of the source and the drain of the first transistor and the other of the source and the drain of the fifth transistor are directly connected to the second wiring, wherein the other of the source and the drain of the second transistor is directly connected to the third wiring, wherein the other of the source and the drain of the third transistor is directly connected to the fourth wiring, wherein the other of the source and the drain of the third transistor is directly connected to a gate of the third transistor, and wherein the other of the source and the drain of the sixth transistor is directly connected to a gate of the sixth transistor.

5. A semiconductor device comprising:

first to fourteenth transistors; and first to sixth wirings, wherein one of a source and a drain of the first transistor is directly connected to one of a source and a drain of the second transistor, wherein one of a source and a drain of the third transistor is directly connected to one of a source and a drain of the fourth transistor, wherein the one of the source and the drain of the third transistor is directly connected to a gate of the first transistor, wherein one of a source and a drain of the fifth transistor is directly connected to a gate of the second transistor, wherein the one of the source and the drain of the fifth transistor is directly connected to a gate of the fourth transistor, wherein one of a source and a drain of the sixth transistor is directly connected to one of a source and a drain of the seventh transistor, wherein the one of the source and the drain of the sixth transistor is directly connected to a gate of the fifth transistor, wherein the other of the source and the drain of the first transistor and the other of the source and the drain of the fifth transistor are directly connected to the second wiring, wherein the other of the source and the drain of the third transistor is directly connected to the fourth wiring, wherein the other of the source and the drain of the third transistor is directly connected to a gate of the third transistor, wherein the other of the source and the drain of the sixth transistor is directly connected to a gate of the sixth transistor, wherein one of a source and a drain of the eighth transistor is directly connected to one of a source and a drain of the ninth transistor, wherein the one of the source and the drain of the eighth transistor is directly connected to the fifth wiring, wherein one of a source and a drain of the tenth transistor is directly connected to one of a source and a drain of the eleventh transistor, wherein the one of the source and the drain of the tenth transistor is directly connected to a gate of the eighth transistor, wherein one of a source and a drain of the twelfth transistor is directly connected to a gate of the ninth transistor, wherein the one of the source and the drain of the twelfth transistor is directly connected to a gate of the eleventh transistor, wherein one of a source and a drain of the thirteenth transistor is directly connected to one of a source and a drain of the fourteenth transistor, wherein the one of the source and the drain of the thirteenth transistor is directly connected to a gate of the twelfth transistor, wherein the other of the source and the drain of the eighth transistor and the other of the source and the drain of the twelfth transistor are directly connected to the sixth wiring, wherein the other of the source and the drain of the second transistor and the other of the source and the drain of the ninth transistor are directly connected to the third wiring, wherein the one of the source and the drain of the first transistor and the other of the source and the drain of the tenth transistor are directly connected to the first wiring, wherein the other of the source and the drain of the tenth transistor is directly connected to a gate of the tenth transistor, and wherein the other of the source and the drain of the thirteenth transistor is directly connected to a gate of the thirteenth transistor.

6. A semiconductor device comprising:

first to twenty-first transistors, wherein one of a source and a drain of the first transistor is directly connected to one of a source and a drain of the second transistor, wherein the one of the source and the drain of the first transistor is directly connected to a first wiring, wherein one of a source and a drain of the third transistor is directly connected to one of a source and a drain of the fourth transistor, wherein the one of the source and the drain of the third transistor is directly connected to a gate of the first transistor, wherein one of a source and a drain of the fifth transistor is directly connected to a gate of the second transistor, wherein the one of the source and the drain of the fifth transistor is directly connected to a gate of the fourth transistor, wherein one of a source and a drain of the sixth transistor is directly connected to one of a source and a drain of the seventh transistor, wherein the one of the source and the drain of the sixth transistor is directly connected to a gate of the fifth transistor, wherein the other of the source and the drain of the first transistor is directly connected to a second wiring, wherein the other of the source and the drain of the fifth transistor is directly connected to the second wiring, wherein the other of the source and the drain of the second transistor is directly connected to a third wiring, wherein the other of the source and the drain of the third transistor is directly connected to a fourth wiring, wherein the other of the source and the drain of the third transistor is directly connected to a gate of the third transistor, wherein the other of the source and the drain of the sixth transistor is directly connected to a gate of the sixth transistor, wherein one of a source and a drain of the eighth transistor is directly connected to one of a source and a drain of the ninth transistor, wherein the one of the source and the drain of the eighth transistor is directly connected to a fifth wiring, wherein one of a source and a drain of the tenth transistor is directly connected to one of a source and a drain of the eleventh transistor, wherein the one of the source and the drain of the tenth transistor is directly connected to a gate of the eighth transistor, wherein one of a source and a drain of the twelfth transistor is directly connected to a gate of the ninth transistor, wherein the one of the source and the drain of the twelfth transistor is directly connected to a gate of the eleventh transistor, wherein one of a source and a drain of the thirteenth transistor is directly connected to one of a source and a drain of the fourteenth transistor, wherein the one of the source and the drain of the thirteenth transistor is directly connected to a gate of the twelfth transistor, wherein the other of the source and the drain of the eighth transistor is directly connected to a sixth wiring, wherein the other of the source and the drain of the twelfth transistor is directly connected to the sixth wiring, wherein the other of the source and the drain of the ninth transistor is directly connected to the third wiring, wherein the other of the source and the drain of the tenth transistor is directly connected to the first wiring, wherein the other of the source and the drain of the tenth transistor is directly connected to a gate of the tenth transistor, and wherein the other of the source and the drain of the thirteenth transistor is directly connected to a gate of the thirteenth transistor, wherein one of a source and a drain of the fifteenth transistor is directly connected to one of a source and a drain of the sixteenth transistor, wherein the one of the source and the drain of the fifteenth transistor is directly connected to a seventh wiring, wherein one of a source and a drain of the seventeenth transistor is directly connected to one of a source and a drain of the eighteenth transistor, wherein the one of the source and the drain of the seventeenth transistor is directly connected to a gate of the fifteenth transistor, wherein one of a source and a drain of the nineteenth transistor is directly connected to a gate of the sixteenth transistor, wherein the one of the source and the drain of the nineteenth transistor is directly connected to a gate of the eighteenth transistor, wherein one of a source and a drain of the twentieth transistor is directly connected to one of a source and a drain of the twenty-first transistor, wherein the one of the source and the drain of the twentieth transistor is directly connected to a gate of the nineteenth transistor, wherein the other of the source and the drain of the fifteenth transistor is directly connected to an eighth wiring, wherein the other of the source and the drain of the nineteenth transistor is directly connected to the eighth wiring, wherein the other of the source and the drain of the sixteenth transistor is directly connected to the third wiring, wherein the other of the source and the drain of the seventeenth transistor is directly connected to the fifth wiring, wherein the other of the source and the drain of the seventeenth transistor is directly connected to a gate of the seventeenth transistor, and wherein the other of the source and the drain of the twentieth transistor is directly connected to a gate of the twentieth transistor.

* * * * *